United States Patent
Mikhaylik et al.

(10) Patent No.: US 12,374,913 B2
(45) Date of Patent: Jul. 29, 2025

(54) CHARGE/DISCHARGE MANAGEMENT IN ELECTROCHEMICAL CELLS, INCLUDING PARTIAL CYCLE CONTROL

(71) Applicant: Sion Power Corporation, Tucson, AZ (US)

(72) Inventors: Yuriy V. Mikhaylik, Tucson, AZ (US); Chariclea Scordilis-Kelley, Tucson, AZ (US)

(73) Assignee: Sion Power Corporation, Tucson, AZ (US)

( * ) Notice: Subject to any disclaimer, the term of this patent is extended or adjusted under 35 U.S.C. 154(b) by 676 days.

(21) Appl. No.: 17/592,398

(22) Filed: Feb. 3, 2022

(65) Prior Publication Data
US 2022/0271537 A1 Aug. 25, 2022

Related U.S. Application Data

(60) Provisional application No. 63/240,859, filed on Sep. 3, 2021, provisional application No. 63/184,639, filed
(Continued)

(51) Int. Cl.
| | |
|---|---|
| *H02J 7/00* | (2006.01) |
| *G01R 31/382* | (2019.01) |
| *G01R 31/396* | (2019.01) |
| *H01M 10/42* | (2006.01) |
| *H01M 10/44* | (2006.01) |
| *H01M 10/48* | (2006.01) |

(52) U.S. Cl.
CPC ............ *H02J 7/007* (2013.01); *G01R 31/382* (2019.01); *G01R 31/396* (2019.01); *H01M 10/425* (2013.01); *H01M 10/441* (2013.01); *H01M 10/482* (2013.01); *H02J 7/0068* (2013.01); *H01M 2010/4271* (2013.01)

(58) Field of Classification Search
CPC ...... H02J 7/007; G01R 31/396; H01M 10/425
USPC ....................................................... 320/128
See application file for complete search history.

(56) References Cited

U.S. PATENT DOCUMENTS

| | | |
|---|---|---|
| 5,506,068 A | 4/1996 | Dan et al. |
| 5,543,245 A | 8/1996 | Andrieu et al. |
| (Continued) | | |

FOREIGN PATENT DOCUMENTS

| | | |
|---|---|---|
| BR | 102016009787 A2 | 11/2017 |
| CN | 101292380 A | 10/2008 |
| (Continued) | | |

OTHER PUBLICATIONS

Liu et al., Dynamic spatial progression of isolated lithium during battery operations. Nature. Dec. 2021; 600; pp. 659-663. Includes supplemental information.
(Continued)

*Primary Examiner* — Jack Chiang
*Assistant Examiner* — Suchin Parihar
(74) *Attorney, Agent, or Firm* — Wolf, Greenfield & Sacks, P.C.

(57) ABSTRACT

Electrochemical cell and battery management systems are generally provided. The systems can comprise an electrochemical cell and a controller. In some cases, the controller can be used to control various aspects of the charge and/or discharge of the electrochemical cell. In some cases, the system can comprise one or more strings of cells.

14 Claims, 65 Drawing Sheets

Related U.S. Application Data on May 5, 2021, provisional application No. 63/146,512, filed on Feb. 5, 2021.

(56) References Cited

U.S. PATENT DOCUMENTS

| | | |
|---|---|---|
| 5,648,187 A | 7/1997 | Skotheim |
| 5,764,030 A | 6/1998 | Gaza |
| 5,808,371 A | 9/1998 | Kon'i et al. |
| 5,818,201 A | 10/1998 | Stockstad et al. |
| 5,914,606 A | 6/1999 | Becker-Irvin |
| 5,919,587 A | 7/1999 | Mukherjee et al. |
| 5,961,672 A | 10/1999 | Skotheim et al. |
| 5,998,966 A | 12/1999 | Gaza |
| 6,002,237 A | 12/1999 | Gaza |
| 6,137,265 A | 10/2000 | Cummings et al. |
| 6,238,821 B1 | 5/2001 | Mukherjee et al. |
| 6,329,789 B1 | 12/2001 | Gavrilov et al. |
| 6,377,030 B1 | 4/2002 | Asao et al. |
| 6,605,375 B2 | 8/2003 | Ovshinsky et al. |
| 6,653,819 B2 | 11/2003 | Nagata et al. |
| 6,733,924 B1 | 5/2004 | Skotheim et al. |
| 6,746,804 B2 | 6/2004 | Gan et al. |
| 6,797,428 B1 | 9/2004 | Skotheim et al. |
| 6,936,381 B2 | 8/2005 | Skotheim et al. |
| 7,193,392 B2 | 3/2007 | King et al. |
| 7,245,108 B2 | 7/2007 | Chertok et al. |
| 7,247,408 B2 | 7/2007 | Skotheim et al. |
| 7,250,745 B2 | 7/2007 | Yasukouchi et al. |
| 7,378,818 B2 | 5/2008 | Fowler et al. |
| 7,400,113 B2 | 7/2008 | Osborne |
| 7,494,729 B2 | 2/2009 | Odaohhara |
| 7,579,112 B2 | 8/2009 | Chiang et al. |
| 7,579,842 B2 | 8/2009 | Hunter et al. |
| 7,646,170 B2 | 1/2010 | Gan et al. |
| 7,659,692 B2 | 2/2010 | Sainomoto et al. |
| 7,688,075 B2 | 3/2010 | Kelley et al. |
| 7,719,134 B2 | 5/2010 | Hashimoto et al. |
| 7,728,555 B2 | 6/2010 | Seo et al. |
| 7,771,870 B2 | 8/2010 | Affinito et al. |
| 7,785,730 B2 | 8/2010 | Affinito et al. |
| 7,790,315 B2 | 9/2010 | Mukherjee et al. |
| 7,830,168 B2 | 11/2010 | Newman |
| 7,939,198 B2 | 5/2011 | Mukherjee et al. |
| 7,952,385 B2 | 5/2011 | Newman |
| 7,988,746 B2 | 8/2011 | Chiang et al. |
| 8,076,024 B2 | 12/2011 | Affinito et al. |
| 8,084,102 B2 | 12/2011 | Affinito |
| 8,087,309 B2 | 1/2012 | Kelley et al. |
| 8,105,717 B2 | 1/2012 | Skotheim et al. |
| 8,168,326 B2 | 5/2012 | Chiang et al. |
| 8,197,971 B2 | 6/2012 | Skotheim et al. |
| 8,198,862 B2 | 6/2012 | Zhang et al. |
| 8,203,309 B2 | 6/2012 | Maegawa |
| 8,206,468 B2 | 6/2012 | Chiang et al. |
| 8,206,469 B2 | 6/2012 | Chiang et al. |
| 8,241,789 B2 | 8/2012 | Chiang et al. |
| 8,242,745 B2 | 8/2012 | Zhang et al. |
| 8,264,205 B2 | 9/2012 | Kopera |
| 8,288,992 B2 | 10/2012 | Kramer et al. |
| 8,330,419 B2 | 12/2012 | Kim et al. |
| 8,338,034 B2 | 12/2012 | Affinito et al. |
| 8,405,349 B2 | 3/2013 | Kikinis et al. |
| 8,405,351 B2 | 3/2013 | Chaturvedi et al. |
| 8,415,054 B2 | 4/2013 | Skotheim et al. |
| 8,427,106 B2 | 4/2013 | Kim et al. |
| 8,508,191 B2 | 8/2013 | Kim et al. |
| 8,518,578 B2 | 8/2013 | Swan |
| 8,519,670 B2 | 8/2013 | Castelaz et al. |
| 8,547,065 B2 | 10/2013 | Trigiani |
| 8,580,430 B2 | 11/2013 | Chiang et al. |
| 8,586,238 B2 | 11/2013 | Chiang et al. |
| 8,603,680 B2 | 12/2013 | Affinito et al. |
| 8,617,748 B2 | 12/2013 | Mikhaylik et al. |
| 8,623,557 B2 | 1/2014 | Skotheim et al. |
| 8,723,480 B2 | 5/2014 | Lim et al. |
| 8,728,661 B2 | 5/2014 | Skotheim et al. |
| 8,753,771 B2 | 6/2014 | Skotheim et al. |
| 8,760,118 B2 | 6/2014 | Christensen et al. |
| 8,798,832 B2 | 8/2014 | Kawahara et al. |
| 8,810,201 B2 | 8/2014 | Yun et al. |
| 8,823,323 B2 | 9/2014 | Troxel et al. |
| 8,871,387 B2 | 10/2014 | Wang et al. |
| 8,884,585 B2 | 11/2014 | Troxel et al. |
| 8,928,286 B2 | 1/2015 | Amiruddin et al. |
| 8,936,870 B2 | 1/2015 | Affinito et al. |
| 8,942,075 B2 | 1/2015 | Yoda |
| 8,968,928 B2 | 3/2015 | Wang et al. |
| 9,000,727 B2 | 4/2015 | Castelaz et al. |
| 9,005,311 B2 | 4/2015 | Safont et al. |
| 9,005,809 B2 | 4/2015 | Wilkening et al. |
| 9,034,421 B2 | 5/2015 | Mikhaylik et al. |
| 9,035,496 B2 | 5/2015 | Kang |
| 9,040,197 B2 | 5/2015 | Affinito et al. |
| 9,040,201 B2 | 5/2015 | Affinito et al. |
| 9,065,149 B2 | 6/2015 | Skotheim et al. |
| 9,077,041 B2 | 7/2015 | Burnside et al. |
| 9,077,184 B2 | 7/2015 | Fujita et al. |
| 9,088,164 B2 | 7/2015 | Shim |
| 9,105,938 B2 | 8/2015 | Scordilis-Kelley et al. |
| 9,130,379 B2 | 9/2015 | Sakabe et al. |
| 9,197,081 B2 | 11/2015 | Finberg et al. |
| 9,214,678 B2 | 12/2015 | Mikhaylik |
| 9,306,252 B2 | 4/2016 | Kristofek et al. |
| 9,325,190 B2 | 4/2016 | Suzuki |
| 9,397,342 B2 | 7/2016 | Skotheim et al. |
| 9,419,274 B2 | 8/2016 | Wilkening et al. |
| 9,490,478 B2 | 11/2016 | Mikhaylik et al. |
| 9,527,402 B2 | 12/2016 | Wyatt et al. |
| 9,531,009 B2 | 12/2016 | Kumaresan et al. |
| 9,537,132 B2 | 1/2017 | Butzmann |
| 9,537,326 B2 | 1/2017 | Troxel et al. |
| 9,548,492 B2 | 1/2017 | Affinito et al. |
| 9,559,348 B2 | 1/2017 | Kumaresan et al. |
| 9,564,763 B2 | 2/2017 | Finberg et al. |
| 9,564,767 B2 | 2/2017 | Takahashi et al. |
| 9,577,243 B2 | 2/2017 | Schmidt et al. |
| 9,577,267 B2 | 2/2017 | Scordilis-Kelley et al. |
| 9,577,289 B2 | 2/2017 | Liao et al. |
| 9,583,757 B2 | 2/2017 | Park et al. |
| 9,653,735 B2 | 5/2017 | Skotheim et al. |
| 9,653,750 B2 | 5/2017 | Laramie et al. |
| 9,696,383 B2 | 7/2017 | Kikuchi et al. |
| 9,711,784 B2 | 7/2017 | Kelley et al. |
| 9,728,768 B2 | 8/2017 | Mikhaylik et al. |
| 9,735,411 B2 | 8/2017 | Viner et al. |
| 9,742,218 B2 | 8/2017 | Tochigi et al. |
| 9,755,268 B2 | 9/2017 | Fleischmann et al. |
| 9,780,404 B2 | 10/2017 | Scordilis-Kelley et al. |
| 9,806,328 B2 | 10/2017 | Park et al. |
| 9,812,732 B2 | 11/2017 | Jiang et al. |
| 9,819,201 B2 | 11/2017 | Suzuki |
| 9,825,328 B2 | 11/2017 | Du et al. |
| 9,853,287 B2 | 12/2017 | Mikhaylik et al. |
| 9,876,367 B2 | 1/2018 | Trigiani |
| 9,899,846 B2 | 2/2018 | Carver et al. |
| 9,914,368 B1 | 3/2018 | Marcicki et al. |
| 9,947,963 B2 | 4/2018 | Du et al. |
| 9,966,780 B2 | 5/2018 | Sherstyuk et al. |
| 9,994,959 B2 | 6/2018 | Laramie et al. |
| 9,994,960 B2 | 6/2018 | Laramie et al. |
| 9,997,765 B2 | 6/2018 | Park et al. |
| 10,020,479 B2 | 7/2018 | Mikhaylik et al. |
| 10,020,485 B2 | 7/2018 | Wyatt et al. |
| 10,020,512 B2 | 7/2018 | Gronwald et al. |
| 10,050,308 B2 | 8/2018 | Liao et al. |
| 10,062,892 B2 | 8/2018 | Wyatt et al. |
| 10,069,135 B2 | 9/2018 | Fleischmann et al. |
| 10,069,146 B2 | 9/2018 | Skotheim et al. |
| 10,088,529 B2 | 10/2018 | Joe |
| 10,099,562 B2 | 10/2018 | Jin et al. |
| 10,122,043 B2 | 11/2018 | Du et al. |
| 10,148,105 B2 | 12/2018 | Lei |
| 10,230,246 B2 | 3/2019 | Troxel et al. |
| 10,236,695 B2 | 3/2019 | Weyen |

(56) References Cited

U.S. PATENT DOCUMENTS

| | | |
|---|---|---|
| 10,243,202 B2 | 3/2019 | Fleischmann et al. |
| 10,253,744 B2 | 4/2019 | Garrard et al. |
| 10,259,337 B2 | 4/2019 | Alser et al. |
| 10,279,700 B2 | 5/2019 | Takebayashi et al. |
| 10,298,034 B2 | 5/2019 | Lei |
| 10,312,545 B2 | 6/2019 | Scordilis-Kelley et al. |
| 10,319,988 B2 | 6/2019 | Kelley et al. |
| 10,320,027 B2 | 6/2019 | Scordilis-Kelley et al. |
| 10,320,031 B2 | 6/2019 | Mikhaylik et al. |
| 10,320,204 B2 | 6/2019 | Ishikawa |
| 10,333,134 B2 | 6/2019 | Mikhaylik et al. |
| 10,333,149 B2 | 6/2019 | Affinito et al. |
| 10,388,943 B2 | 8/2019 | Bonhomme et al. |
| 10,388,987 B2 | 8/2019 | Du et al. |
| 10,411,499 B2 | 9/2019 | Hall et al. |
| 10,431,808 B2 | 10/2019 | Park et al. |
| 10,436,850 B2 | 10/2019 | Hatano et al. |
| 10,439,192 B2 | 10/2019 | Wyatt et al. |
| 10,449,870 B2 | 10/2019 | Chang et al. |
| 10,461,333 B2 | 10/2019 | Mikhaylik et al. |
| 10,461,372 B2 | 10/2019 | Laramie et al. |
| 10,468,721 B2 | 11/2019 | Liao et al. |
| 10,490,796 B2 | 11/2019 | Laramie et al. |
| 10,505,234 B2 | 12/2019 | Zhu et al. |
| 10,516,155 B2 | 12/2019 | Park et al. |
| 10,535,902 B2 | 1/2020 | Laramie et al. |
| 10,541,448 B2 | 1/2020 | Mikhaylik et al. |
| 10,553,893 B2 | 2/2020 | Laramie et al. |
| 10,557,893 B2 * | 2/2020 | Fukushima ............ G01R 31/392 |
| 10,573,869 B2 | 2/2020 | Mikhaylik et al. |
| 10,574,063 B2 | 2/2020 | Hellgren et al. |
| 10,591,979 B2 | 3/2020 | Kacker et al. |
| 10,608,278 B2 | 3/2020 | Liao et al. |
| 10,629,947 B2 | 4/2020 | Affinito et al. |
| 10,629,954 B2 | 4/2020 | Mikhaylik et al. |
| 10,720,648 B2 | 7/2020 | Quero-Mieres et al. |
| 10,790,678 B2 | 9/2020 | Zheng et al. |
| 10,833,513 B2 | 11/2020 | Coenen |
| 10,833,523 B2 | 11/2020 | Hikosaka |
| 10,847,833 B2 | 11/2020 | Bunte et al. |
| 10,862,105 B2 | 12/2020 | Gronwald et al. |
| 10,868,306 B2 | 12/2020 | Mudalige et al. |
| 10,868,344 B2 | 12/2020 | Masias et al. |
| 10,879,527 B2 | 12/2020 | Laramie et al. |
| 10,897,152 B2 | 1/2021 | Takahashi et al. |
| 10,919,403 B2 | 2/2021 | Ge et al. |
| 10,944,094 B2 | 3/2021 | Liao et al. |
| 10,946,766 B2 | 3/2021 | Hamada et al. |
| 10,964,928 B2 | 3/2021 | Ashrafzadeh |
| 10,965,130 B2 | 3/2021 | Mikhaylik et al. |
| 10,985,361 B2 | 4/2021 | Bonhomme et al. |
| 10,985,563 B2 | 4/2021 | Kuznetsov |
| 10,991,925 B2 | 4/2021 | Wang et al. |
| 10,992,172 B2 | 4/2021 | Li et al. |
| 11,024,923 B2 | 6/2021 | Liao et al. |
| 11,028,973 B2 | 6/2021 | Xiong et al. |
| 11,038,214 B2 | 6/2021 | Rahimian et al. |
| 11,040,624 B2 | 6/2021 | Jin et al. |
| 11,041,248 B2 | 6/2021 | Laramie et al. |
| 11,046,186 B1 | 6/2021 | Appelbaum et al. |
| 11,056,728 B2 | 7/2021 | Mikhaylik et al. |
| 11,063,444 B2 | 7/2021 | Statman |
| 11,075,535 B2 | 7/2021 | Kwak et al. |
| 11,088,395 B2 | 8/2021 | Mikhaylik et al. |
| 11,108,076 B2 | 8/2021 | Scordilis-Kelley et al. |
| 11,108,077 B2 | 8/2021 | Scordilis-Kelley et al. |
| 11,108,251 B2 | 8/2021 | Kirleis et al. |
| 11,121,397 B2 | 9/2021 | Scordilis-Kelley et al. |
| 11,128,158 B2 | 9/2021 | Mulawski |
| 11,165,122 B2 | 11/2021 | Laramie et al. |
| 11,171,507 B2 | 11/2021 | Tihonski et al. |
| 11,177,467 B2 | 11/2021 | Park et al. |
| 11,183,690 B2 | 11/2021 | Wang et al. |
| 11,205,910 B2 | 12/2021 | Walter |
| 11,228,055 B2 | 1/2022 | Liao et al. |
| 11,233,243 B2 | 1/2022 | Affinito et al. |
| 11,239,504 B2 | 2/2022 | Laramie et al. |
| 11,245,103 B2 | 2/2022 | Mikhaylik et al. |
| 11,251,501 B2 | 2/2022 | Schneider et al. |
| 11,289,918 B2 | 3/2022 | Troxel et al. |
| 11,316,204 B2 | 4/2022 | Mikhaylik et al. |
| 11,322,804 B2 | 5/2022 | Laramie et al. |
| 11,367,892 B2 | 6/2022 | Laramie et al. |
| 11,404,876 B2 | 8/2022 | Kuznetsov |
| 11,418,035 B2 | 8/2022 | Kuznetsov |
| 11,424,492 B2 | 8/2022 | Mikhaylik et al. |
| 11,437,686 B2 | 9/2022 | Wyatt et al. |
| 11,456,459 B2 | 9/2022 | Affinito et al. |
| 11,489,348 B2 | 11/2022 | Mikhaylik et al. |
| 11,502,334 B2 | 11/2022 | Liao et al. |
| 11,515,712 B2 | 11/2022 | Lee et al. |
| 11,543,086 B2 | 1/2023 | Xiong et al. |
| 11,557,753 B2 | 1/2023 | Kovalev et al. |
| 11,569,531 B2 | 1/2023 | Mikhaylik et al. |
| 11,575,124 B2 | 2/2023 | Affinito et al. |
| 11,581,530 B2 | 2/2023 | Laramie et al. |
| 11,616,219 B2 | 3/2023 | Park et al. |
| 11,616,382 B2 | 3/2023 | Hale |
| 11,637,353 B2 | 4/2023 | Laramie |
| 11,658,352 B2 | 5/2023 | Mikhaylik et al. |
| 11,664,527 B2 | 5/2023 | Liao et al. |
| 11,695,165 B2 | 7/2023 | Kim |
| 11,710,814 B2 | 7/2023 | Park et al. |
| 11,710,847 B2 | 7/2023 | Laramie et al. |
| 11,728,528 B2 | 8/2023 | Laramie et al. |
| 11,728,661 B2 | 8/2023 | Kirleis et al. |
| 11,735,761 B2 | 8/2023 | Scordilis-Kelley et al. |
| 11,742,477 B2 | 8/2023 | Laramie et al. |
| 11,750,014 B2 | 9/2023 | Burkell et al. |
| 11,784,297 B2 | 10/2023 | Liao et al. |
| 11,784,298 B2 | 10/2023 | Bonhomme et al. |
| 11,811,045 B2 | 11/2023 | Park et al. |
| 11,837,710 B2 | 12/2023 | Bonhomme et al. |
| 11,848,440 B2 | 12/2023 | Frieberg et al. |
| 11,894,545 B2 | 2/2024 | Gronwald et al. |
| 11,906,597 B2 | 2/2024 | Ashrafzadeh |
| 11,990,589 B2 | 5/2024 | Mikhaylik et al. |
| 12,005,810 B2 | 6/2024 | Jin et al. |
| 12,034,327 B2 | 7/2024 | Takahashi et al. |
| 12,074,289 B2 | 8/2024 | Mikhaylik et al. |
| 2002/0012846 A1 | 1/2002 | Skotheim et al. |
| 2002/0055040 A1 | 5/2002 | Mukherjee et al. |
| 2002/0119351 A1 | 8/2002 | Ovshinsky et al. |
| 2002/0167296 A1 | 11/2002 | Nagata et al. |
| 2003/0099884 A1 | 5/2003 | Chiang et al. |
| 2003/0124434 A1 | 7/2003 | Gan et al. |
| 2004/0135544 A1 | 7/2004 | King et al. |
| 2004/0135545 A1 | 7/2004 | Fowler et al. |
| 2004/0135546 A1 | 7/2004 | Chertok et al. |
| 2004/0164706 A1 | 8/2004 | Osborne |
| 2005/0008935 A1 | 1/2005 | Skotheim et al. |
| 2005/0077879 A1 | 4/2005 | Near |
| 2005/0116686 A1 | 6/2005 | Odaohhara |
| 2005/0196672 A1 | 9/2005 | Mukherjee et al. |
| 2005/0285579 A1 | 12/2005 | Yasukouchi et al. |
| 2006/0115579 A1 | 6/2006 | Mukherjee et al. |
| 2006/0193095 A1 | 8/2006 | Hunter et al. |
| 2006/0222954 A1 | 10/2006 | Skotheim et al. |
| 2006/0238203 A1 | 10/2006 | Kelley et al. |
| 2007/0092798 A1 | 4/2007 | Spitler |
| 2007/0108940 A1 | 5/2007 | Sainomoto et al. |
| 2007/0111089 A1 | 5/2007 | Swan |
| 2007/0139015 A1 | 6/2007 | Seo et al. |
| 2007/0221265 A1 | 9/2007 | Affinito et al. |
| 2007/0224502 A1 | 9/2007 | Affinito et al. |
| 2007/0262751 A1 | 11/2007 | Gan |
| 2008/0014501 A1 | 1/2008 | Skotheim et al. |
| 2008/0057397 A1 | 3/2008 | Skotheim et al. |
| 2008/0187663 A1 | 8/2008 | Affinito |
| 2008/0191663 A1 | 8/2008 | Fowler et al. |
| 2008/0213672 A1 | 9/2008 | Skotheim et al. |
| 2008/0309163 A1 | 12/2008 | Hashimoto et al. |
| 2008/0318128 A1 | 12/2008 | Simoneau et al. |
| 2009/0035646 A1 | 2/2009 | Mikhaylik et al. |

(56) References Cited

U.S. PATENT DOCUMENTS

| | | |
|---|---|---|
| 2009/0055110 A1 | 2/2009 | Kelley et al. |
| 2009/0087722 A1 | 4/2009 | Sakabe et al. |
| 2009/0146610 A1 | 6/2009 | Trigiani |
| 2009/0167242 A1 | 7/2009 | Naganuma et al. |
| 2009/0200986 A1 | 8/2009 | Kopera |
| 2009/0291353 A1 | 11/2009 | Affinito et al. |
| 2010/0003603 A1 | 1/2010 | Chiang et al. |
| 2010/0019718 A1* | 1/2010 | Salasoo .................. B60L 58/15 320/128 |
| 2010/0035128 A1 | 2/2010 | Scordilis-Kelley et al. |
| 2010/0104948 A1 | 4/2010 | Skotheim et al. |
| 2010/0129699 A1 | 5/2010 | Mikhaylik et al. |
| 2010/0134070 A1 | 6/2010 | Yun et al. |
| 2010/0164430 A1 | 7/2010 | Lu et al. |
| 2010/0201339 A1 | 8/2010 | Newman |
| 2010/0237828 A1 | 9/2010 | Maegawa |
| 2010/0237830 A1 | 9/2010 | Castelaz et al. |
| 2010/0239914 A1 | 9/2010 | Mikhaylik et al. |
| 2010/0261043 A1 | 10/2010 | Kim et al. |
| 2010/0285339 A1 | 11/2010 | Chaturvedi et al. |
| 2010/0291442 A1 | 11/2010 | Wang et al. |
| 2010/0294049 A1 | 11/2010 | Kelley et al. |
| 2010/0327807 A1 | 12/2010 | Kikinis et al. |
| 2010/0327811 A1 | 12/2010 | Affinito et al. |
| 2011/0005065 A1 | 1/2011 | Chiang et al. |
| 2011/0006738 A1 | 1/2011 | Mikhaylik et al. |
| 2011/0008531 A1 | 1/2011 | Mikhaylik et al. |
| 2011/0014524 A1 | 1/2011 | Skotheim et al. |
| 2011/0025258 A1 | 2/2011 | Kim et al. |
| 2011/0043951 A1 | 2/2011 | Newman |
| 2011/0045346 A1 | 2/2011 | Chiang et al. |
| 2011/0057617 A1 | 3/2011 | Finberg et al. |
| 2011/0059361 A1 | 3/2011 | Wilkening et al. |
| 2011/0068001 A1 | 3/2011 | Affinito et al. |
| 2011/0070491 A1 | 3/2011 | Campbell et al. |
| 2011/0070494 A1 | 3/2011 | Campbell et al. |
| 2011/0076560 A1 | 3/2011 | Scordilis-Kelley et al. |
| 2011/0080139 A1 | 4/2011 | Troxel et al. |
| 2011/0084663 A1 | 4/2011 | Troxel et al. |
| 2011/0089897 A1 | 4/2011 | Zhang et al. |
| 2011/0095725 A1 | 4/2011 | Troxel et al. |
| 2011/0140650 A1 | 6/2011 | Zhang et al. |
| 2011/0151324 A1 | 6/2011 | Chiang et al. |
| 2011/0159376 A1 | 6/2011 | Skotheim et al. |
| 2011/0165471 A9 | 7/2011 | Skotheim et al. |
| 2011/0177398 A1 | 7/2011 | Affinito et al. |
| 2011/0206992 A1 | 8/2011 | Campbell et al. |
| 2011/0256450 A1 | 10/2011 | Campbell et al. |
| 2011/0278170 A1 | 11/2011 | Chiang et al. |
| 2011/0285352 A1 | 11/2011 | Lim et al. |
| 2011/0313613 A1 | 12/2011 | Kawahara et al. |
| 2012/0043940 A1 | 2/2012 | Affinito et al. |
| 2012/0048729 A1 | 3/2012 | Mikhaylik et al. |
| 2012/0052339 A1 | 3/2012 | Mikhaylik et al. |
| 2012/0052397 A1 | 3/2012 | Mikhaylik et al. |
| 2012/0056590 A1 | 3/2012 | Amiruddin et al. |
| 2012/0070746 A1 | 3/2012 | Mikhaylik et al. |
| 2012/0082872 A1 | 4/2012 | Schmidt et al. |
| 2012/0082901 A1 | 4/2012 | Schmidt et al. |
| 2012/0148904 A1 | 6/2012 | Swan |
| 2012/0194139 A1 | 8/2012 | Sasaki et al. |
| 2012/0228939 A1 | 9/2012 | Kaga et al. |
| 2012/0251896 A1 | 10/2012 | Chiang et al. |
| 2012/0261997 A1 | 10/2012 | Kang |
| 2012/0276449 A1 | 11/2012 | Skotheim et al. |
| 2012/0282530 A1 | 11/2012 | Chiang et al. |
| 2012/0306275 A1 | 12/2012 | Christensen et al. |
| 2012/0319493 A1 | 12/2012 | Kim et al. |
| 2012/0319653 A1 | 12/2012 | Kumar et al. |
| 2013/0017441 A1 | 1/2013 | Affinito et al. |
| 2013/0095380 A1 | 4/2013 | Affinito et al. |
| 2013/0119934 A1 | 5/2013 | Suzuki |
| 2013/0143096 A1 | 6/2013 | Affinito et al. |
| 2013/0164635 A1 | 6/2013 | Schmidt et al. |
| 2013/0207616 A1 | 8/2013 | Shim |
| 2013/0216915 A1 | 8/2013 | Affinito et al. |
| 2013/0221918 A1 | 8/2013 | Hill et al. |
| 2013/0224601 A1 | 8/2013 | Burnside et al. |
| 2013/0252103 A1 | 9/2013 | Mikhaylik |
| 2013/0258830 A1 | 10/2013 | Yoda |
| 2013/0280605 A1 | 10/2013 | Affinito et al. |
| 2013/0285613 A1 | 10/2013 | Fujita et al. |
| 2013/0300369 A1 | 11/2013 | Butzmann |
| 2013/0316072 A1 | 11/2013 | Scordilis-Kelley et al. |
| 2013/0330577 A1 | 12/2013 | Kristofek et al. |
| 2014/0028098 A1 | 1/2014 | Trigiani |
| 2014/0045075 A1 | 2/2014 | Skotheim et al. |
| 2014/0062411 A1 | 3/2014 | Mikhaylik et al. |
| 2014/0072873 A1 | 3/2014 | Wang et al. |
| 2014/0079994 A1 | 3/2014 | Affinito et al. |
| 2014/0084870 A1 | 3/2014 | Castelaz et al. |
| 2014/0123477 A1 | 5/2014 | Safont Sempere et al. |
| 2014/0127419 A1 | 5/2014 | Fleischmann et al. |
| 2014/0127577 A1 | 5/2014 | Fleischmann et al. |
| 2014/0136132 A1* | 5/2014 | Maekawa ............ G01R 21/006 702/63 |
| 2014/0170475 A1 | 6/2014 | Park et al. |
| 2014/0170478 A1 | 6/2014 | Liao et al. |
| 2014/0184162 A1 | 7/2014 | Takahashi et al. |
| 2014/0193713 A1 | 7/2014 | Kumaresan et al. |
| 2014/0193723 A1 | 7/2014 | Kumaresan et al. |
| 2014/0205912 A1 | 7/2014 | Skotheim et al. |
| 2014/0255780 A1 | 9/2014 | Mikhaylik et al. |
| 2014/0272565 A1 | 9/2014 | Gronwald et al. |
| 2014/0272594 A1 | 9/2014 | Safont et al. |
| 2014/0272595 A1 | 9/2014 | Cristadoro et al. |
| 2014/0272597 A1 | 9/2014 | Mikhaylik et al. |
| 2014/0295290 A1 | 10/2014 | Park et al. |
| 2014/0354291 A1 | 12/2014 | Kikuchi et al. |
| 2014/0376270 A1 | 12/2014 | Kern et al. |
| 2015/0010804 A1 | 1/2015 | Laramie et al. |
| 2015/0044517 A1 | 2/2015 | Mikhaylik et al. |
| 2015/0048796 A1 | 2/2015 | Sherstyuk et al. |
| 2015/0050527 A1 | 2/2015 | Jiang et al. |
| 2015/0086837 A1 | 3/2015 | Laramie et al. |
| 2015/0155550 A1 | 6/2015 | Wilkening et al. |
| 2015/0162586 A1 | 6/2015 | Fleischmann et al. |
| 2015/0171455 A1 | 6/2015 | Mills |
| 2015/0180037 A1 | 6/2015 | Gronwald et al. |
| 2015/0180084 A1 | 6/2015 | Scordilis-Kelley et al. |
| 2015/0188194 A1 | 7/2015 | Mikhaylik et al. |
| 2015/0202984 A1 | 7/2015 | Wyatt et al. |
| 2015/0236320 A1 | 8/2015 | Laramie et al. |
| 2015/0236322 A1 | 8/2015 | Laramie et al. |
| 2015/0270710 A1 | 9/2015 | Carver et al. |
| 2015/0280277 A1 | 10/2015 | Fleischmann et al. |
| 2015/0287986 A1 | 10/2015 | Affinito et al. |
| 2015/0287998 A1 | 10/2015 | Scordilis-Kelley et al. |
| 2015/0318539 A1 | 11/2015 | Kelley et al. |
| 2015/0318552 A1 | 11/2015 | Skotheim et al. |
| 2015/0349310 A1 | 12/2015 | Viner et al. |
| 2015/0349581 A1 | 12/2015 | Tochigi et al. |
| 2016/0043579 A1 | 2/2016 | Finberg et al. |
| 2016/0072132 A1 | 3/2016 | Liao et al. |
| 2016/0079779 A1 | 3/2016 | Troxel et al. |
| 2016/0107526 A1 | 4/2016 | Jin et al. |
| 2016/0118638 A1 | 4/2016 | Gronwald et al. |
| 2016/0118651 A1 | 4/2016 | Kovalev et al. |
| 2016/0181674 A1 | 6/2016 | Kristofek et al. |
| 2016/0197497 A1 | 7/2016 | Suzuki |
| 2016/0252583 A1 | 9/2016 | Joe |
| 2016/0276843 A1 | 9/2016 | Chang et al. |
| 2016/0291683 A1 | 10/2016 | Kacker et al. |
| 2016/0298590 A1 | 10/2016 | Garrard et al. |
| 2016/0301080 A1 | 10/2016 | Skotheim et al. |
| 2016/0344067 A1 | 11/2016 | Laramie et al. |
| 2016/0352114 A1* | 12/2016 | Kaji ........................ H02J 3/241 |
| 2017/0018815 A1 | 1/2017 | Laramie et al. |
| 2017/0047590 A1 | 2/2017 | Mikhaylik et al. |
| 2017/0047619 A1 | 2/2017 | Zhu et al. |
| 2017/0104350 A1 | 4/2017 | Luerkens et al. |
| 2017/0120772 A1 | 5/2017 | Alser et al. |
| 2017/0141385 A1 | 5/2017 | Scordilis-Kelley et al. |
| 2017/0141402 A1 | 5/2017 | Affinito et al. |

(56) References Cited

U.S. PATENT DOCUMENTS

| | | |
|---|---|---|
| 2017/0141442 A1 | 5/2017 | Mikhaylik et al. |
| 2017/0149086 A1 | 5/2017 | Du et al. |
| 2017/0149089 A1 | 5/2017 | Liao et al. |
| 2017/0149253 A1 | 5/2017 | Takahashi et al. |
| 2017/0162851 A1 | 6/2017 | Wyatt et al. |
| 2017/0163060 A1 | 6/2017 | Zheng et al. |
| 2017/0200975 A1 | 7/2017 | Liao et al. |
| 2017/0201102 A1 | 7/2017 | Hikosaka |
| 2017/0250390 A1 | 8/2017 | Laramie et al. |
| 2017/0261560 A1* | 9/2017 | Goto .................. G01R 31/3648 |
| 2017/0264123 A1 | 9/2017 | Mulawski |
| 2017/0288208 A1 | 10/2017 | Kelley et al. |
| 2017/0338475 A1 | 11/2017 | Laramie et al. |
| 2017/0341520 A1 | 11/2017 | Chang et al. |
| 2017/0352863 A1 | 12/2017 | Mikhaylik et al. |
| 2017/0373321 A1 | 12/2017 | Skotheim et al. |
| 2018/0006303 A1 | 1/2018 | Mikhaylik et al. |
| 2018/0006478 A1 | 1/2018 | Lei |
| 2018/0006490 A1 | 1/2018 | Lei |
| 2018/0034100 A1 | 2/2018 | Du et al. |
| 2018/0040873 A1 | 2/2018 | Park et al. |
| 2018/0048018 A1 | 2/2018 | Scordilis-Kelley et al. |
| 2018/0062154 A1 | 3/2018 | Park et al. |
| 2018/0134173 A1 | 5/2018 | Takebayashi et al. |
| 2018/0138486 A1 | 5/2018 | Wyatt et al. |
| 2018/0138542 A1 | 5/2018 | Bunte et al. |
| 2018/0145519 A1 | 5/2018 | Trigiani |
| 2018/0183261 A1 | 6/2018 | Kwak et al. |
| 2018/0198114 A1 | 7/2018 | Bonhomme et al. |
| 2018/0198162 A1 | 7/2018 | Du et al. |
| 2018/0219211 A1 | 8/2018 | Park et al. |
| 2018/0219391 A1 | 8/2018 | Ishikawa |
| 2018/0230610 A1 | 8/2018 | Laramie et al. |
| 2018/0241236 A1 | 8/2018 | Vasefi et al. |
| 2018/0254516 A1 | 9/2018 | Han et al. |
| 2018/0261820 A1 | 9/2018 | Liao et al. |
| 2018/0269520 A1 | 9/2018 | Scordilis-Kelley et al. |
| 2018/0277850 A1 | 9/2018 | Quero-Mieres et al. |
| 2018/0287122 A1 | 10/2018 | Mikhaylik et al. |
| 2018/0292465 A1 | 10/2018 | Osara et al. |
| 2018/0301697 A1 | 10/2018 | Affinito et al. |
| 2018/0323639 A1 | 11/2018 | Hall et al. |
| 2018/0337406 A1 | 11/2018 | Mudalige et al. |
| 2018/0342766 A1 | 11/2018 | Du et al. |
| 2018/0351148 A1 | 12/2018 | Schneider et al. |
| 2018/0351158 A1 | 12/2018 | Liao et al. |
| 2018/0358651 A1 | 12/2018 | Liao et al. |
| 2018/0358819 A1 | 12/2018 | Hellgren et al. |
| 2018/0366712 A1 | 12/2018 | Wyatt et al. |
| 2018/0366959 A1 | 12/2018 | Coenen |
| 2018/0375155 A1 | 12/2018 | Liao et al. |
| 2018/0375348 A1 | 12/2018 | Weyen |
| 2019/0006699 A1 | 1/2019 | Jones et al. |
| 2019/0036336 A1 | 1/2019 | Kuznetsov |
| 2019/0047421 A1 | 2/2019 | Jin et al. |
| 2019/0074558 A1 | 3/2019 | Masias et al. |
| 2019/0088958 A1 | 3/2019 | Viner et al. |
| 2019/0137573 A1 | 5/2019 | Hatano et al. |
| 2019/0148701 A1 | 5/2019 | Ashrafzadeh |
| 2019/0207394 A1 | 7/2019 | Troxel et al. |
| 2019/0210474 A1* | 7/2019 | Otsuki .................. B60L 50/66 |
| 2019/0229323 A1 | 7/2019 | Mikhaylik et al. |
| 2019/0267632 A1 | 8/2019 | Affinito et al. |
| 2019/0267669 A1 | 8/2019 | Mikhaylik et al. |
| 2019/0344682 A1 | 11/2019 | Ge et al. |
| 2019/0348672 A1 | 11/2019 | Wang et al. |
| 2019/0372088 A1 | 12/2019 | Bonhomme et al. |
| 2019/0386334 A1 | 12/2019 | Scordilis-Kelley et al. |
| 2020/0035978 A1 | 1/2020 | Wyatt et al. |
| 2020/0044460 A1 | 2/2020 | Mikhaylik et al. |
| 2020/0052503 A1 | 2/2020 | Statman |
| 2020/0086761 A1 | 3/2020 | Hamada et al. |
| 2020/0091547 A1 | 3/2020 | Scordilis-Kelley et al. |
| 2020/0099108 A1 | 3/2020 | Laramie et al. |
| 2020/0106139 A1 | 4/2020 | Zhu et al. |
| 2020/0119324 A1 | 4/2020 | Laramie et al. |
| 2020/0185764 A1 | 6/2020 | Liao et al. |
| 2020/0194822 A1 | 6/2020 | Laramie et al. |
| 2020/0212422 A1 | 7/2020 | Park et al. |
| 2020/0220146 A1 | 7/2020 | Laramie et al. |
| 2020/0220149 A1 | 7/2020 | Laramie |
| 2020/0220197 A1 | 7/2020 | Laramie et al. |
| 2020/0220205 A1 | 7/2020 | Affinito et al. |
| 2020/0227785 A1 | 7/2020 | Mikhaylik et al. |
| 2020/0235441 A1 | 7/2020 | Rahimian et al. |
| 2020/0235606 A1 | 7/2020 | Li et al. |
| 2020/0243824 A1 | 7/2020 | Wang et al. |
| 2020/0259341 A1 | 8/2020 | Mikhaylik et al. |
| 2020/0271279 A1 | 8/2020 | Xiong et al. |
| 2020/0274371 A1 | 8/2020 | Kirleis et al. |
| 2020/0313225 A1 | 10/2020 | Scordilis-Kelley et al. |
| 2020/0343736 A1 | 10/2020 | Walter |
| 2020/0350631 A1 | 11/2020 | Mikhaylik et al. |
| 2020/0350779 A1 | 11/2020 | Tikhonski et al. |
| 2020/0373764 A1 | 11/2020 | Lee et al. |
| 2021/0006078 A1 | 1/2021 | Zheng et al. |
| 2021/0075217 A1 | 3/2021 | Kuznetsov |
| 2021/0119277 A1 | 4/2021 | Kim |
| 2021/0135192 A1 | 5/2021 | Gronwald et al. |
| 2021/0135205 A1 | 5/2021 | Laramie et al. |
| 2021/0135294 A1 | 5/2021 | Mikhaylik et al. |
| 2021/0135297 A1 | 5/2021 | Mikhaylik et al. |
| 2021/0151834 A1 | 5/2021 | Ashrafzadeh |
| 2021/0170881 A9 | 6/2021 | Jin et al. |
| 2021/0194264 A1 | 6/2021 | Hale |
| 2021/0218243 A1 | 7/2021 | Hamblin et al. |
| 2021/0226456 A1 | 7/2021 | Takahashi et al. |
| 2021/0239762 A1 | 8/2021 | Zhang et al. |
| 2021/0242445 A1 | 8/2021 | Bonhomme et al. |
| 2021/0249651 A1 | 8/2021 | Laramie et al. |
| 2021/0265610 A1 | 8/2021 | Liao et al. |
| 2021/0281093 A1* | 9/2021 | Elidrissi .................. H02J 7/0071 |
| 2021/0293390 A1 | 9/2021 | Xiong et al. |
| 2021/0309111 A1 | 10/2021 | Jin et al. |
| 2021/0328274 A1 | 10/2021 | Mikhaylik et al. |
| 2021/0376610 A1 | 12/2021 | Kuznetsov |
| 2021/0391731 A1 | 12/2021 | Kirleis et al. |
| 2021/0408550 A1 | 12/2021 | Liao et al. |
| 2021/0408598 A1 | 12/2021 | Mikhaylik et al. |
| 2022/0029191 A1 | 1/2022 | Scordilis-Kelley et al. |
| 2022/0069274 A1 | 3/2022 | Park et al. |
| 2022/0069593 A1 | 3/2022 | Hamblin et al. |
| 2022/0109215 A1 | 4/2022 | Laramie et al. |
| 2022/0140620 A1 | 5/2022 | Kang et al. |
| 2022/0173372 A1 | 6/2022 | Park et al. |
| 2022/0173373 A1 | 6/2022 | Park et al. |
| 2022/0173374 A1 | 6/2022 | Bonhomme et al. |
| 2022/0190396 A1 | 6/2022 | Laramie et al. |
| 2022/0209284 A1 | 6/2022 | Liao et al. |
| 2022/0255188 A1 | 8/2022 | Schneider et al. |
| 2022/0278354 A1 | 9/2022 | Laramie et al. |
| 2022/0278429 A1 | 9/2022 | Laramie et al. |
| 2022/0285951 A1 | 9/2022 | Yoon |
| 2022/0285957 A1* | 9/2022 | Lim .................. H02J 7/007188 |
| 2022/0336872 A1 | 10/2022 | Mikhaylik et al. |
| 2022/0359882 A1 | 11/2022 | Affinito et al. |
| 2022/0407127 A1 | 12/2022 | Mikhaylik et al. |
| 2023/0010942 A1 | 1/2023 | Burkell et al. |
| 2023/0043269 A1* | 2/2023 | Wang .................. H01M 10/441 |
| 2023/0106718 A1 | 4/2023 | Mikhaylik et al. |
| 2023/0120877 A1 | 4/2023 | Mikhaylik et al. |
| 2023/0207908 A1 | 6/2023 | Laramie et al. |
| 2023/0268763 A1 | 8/2023 | Li |
| 2023/0318345 A1 | 10/2023 | Morita |
| 2023/0344247 A1 | 10/2023 | Sessions et al. |
| 2023/0356627 A1 | 11/2023 | Burkell et al. |
| 2024/0010142 A1 | 1/2024 | Morita |
| 2024/0113320 A1 | 4/2024 | Scordilis-Kelley et al. |
| 2024/0142538 A1 | 5/2024 | Ashrafzadeh |
| 2024/0170633 A1 | 5/2024 | Liao et al. |
| 2024/0204539 A1 | 6/2024 | Qiu et al. |
| 2024/0266621 A1 | 8/2024 | Mikhaylik et al. |
| 2024/0266639 A1 | 8/2024 | Niedzwiecki et al. |
| 2024/0291292 A1 | 8/2024 | Mikhaylik et al. |

(56) References Cited

U.S. PATENT DOCUMENTS

FOREIGN PATENT DOCUMENTS

| | | |
|---|---|---|
| CN | 100541969 C | 9/2009 |
| CN | 103825060 A | 5/2014 |
| CN | 104838560 A | 8/2015 |
| CN | 105262155 A | 1/2016 |
| CN | 205960703 U | 2/2017 |
| CN | 205960712 U | 2/2017 |
| CN | 107534189 A | 1/2018 |
| CN | 107852002 A | 3/2018 |
| CN | 108075511 A | 5/2018 |
| CN | 108110815 A | 6/2018 |
| CN | 110311451 A | 10/2019 |
| CN | 111251940 A | 6/2020 |
| CN | 115207334 A | 10/2022 |
| DE | 10 2014 212122 A1 | 1/2016 |
| DE | 102018217382 A1 | 4/2020 |
| EP | 0 981 194 A2 | 2/2000 |
| EP | 1 280 252 A2 | 1/2003 |
| EP | 2 631 663 A1 | 8/2013 |
| GB | 2569140 A | 6/2019 |
| JP | 2000-106219 A | 4/2000 |
| JP | 2002-042896 A | 2/2002 |
| JP | 2003-031267 A | 1/2003 |
| JP | 2009-181907 A | 8/2009 |
| JP | 2012-156025 A | 8/2012 |
| JP | 2013-207844 A | 10/2013 |
| JP | 2015-122151 A | 7/2015 |
| JP | 2015-176829 A | 10/2015 |
| JP | 2017-139841 A | 8/2017 |
| JP | 2017-225350 A | 12/2017 |
| JP | 2018-081807 A | 5/2018 |
| JP | 2020-061004 A | 4/2020 |
| KR | 20000012125 A | 2/2000 |
| KR | 100277654 B1 | 1/2001 |
| KR | 20030006747 A | 1/2003 |
| KR | 2010-0098550 A | 9/2010 |
| KR | 2015-0028775 A | 3/2015 |
| KR | 20150043265 A | 4/2015 |
| KR | 101522858 B1 | 5/2015 |
| RU | 2683235 C1 | 3/2019 |
| RU | 2736777 C1 | 11/2020 |
| WO | WO 2012/167019 A1 | 12/2012 |
| WO | WO 2015/075508 A1 | 5/2015 |
| WO | WO 2015/193041 A1 | 12/2015 |
| WO | WO 2016/100262 A1 | 6/2016 |
| WO | WO 2020/028485 A1 | 2/2020 |
| WO | WO 2021/086377 A1 | 5/2021 |
| WO | WO 2022/051308 A1 | 3/2022 |

OTHER PUBLICATIONS

Louli et al., Exploring the Impact of Mechanical Pressure on the Performance of Anode-Free Lithium Metal Cells. J Electrochem Soc. Apr. 18, 2019;166:A1291-9.
Louli et al., Optimizing Cycling Conditions for Anode-Free Lithium Metal Cells. J Electrochem Soc. Feb. 5, 2021;168:020515. 15 pages.
International Search Report and Written Opinion for International Application No. PCT/US2022/015123 mailed Jul. 15, 2022.
Office Action for U.S. Appl. No. 17/592,406 dated Jan. 28, 2025.
Restriction Requirement for U.S. Appl. No. 17/592,406 dated Oct. 21, 2024.

\* cited by examiner

12,374,913 B2

CHARGE/DISCHARGE MANAGEMENT IN ELECTROCHEMICAL CELLS, INCLUDING PARTIAL CYCLE CONTROL

RELATED APPLICATIONS

This application claims priority under 35 U.S.C. § 119(e) to U.S. Provisional Patent Application No. 63/146,512, filed Feb. 5, 2021, and entitled "Charge/Discharge Management in Electrochemical Cells, Including Partial Cycle Control," U.S. Provisional Patent Application No. 63/184,639, filed May 5, 2021, and entitled "Charge/Discharge Management in Electrochemical Cells, Including Partial Cycle Control," and U.S. Provisional Patent Application No. 63/240,859, filed Sep. 3, 2021, and entitled "Charge/Discharge Management in Electrochemical Cells, Including Partial Cycle Control," each of which is incorporated herein by reference in its entirety for all purposes.

TECHNICAL FIELD

Charge/discharge management of electrochemical cells, and related systems, are generally described.

BACKGROUND

Conventionally, batteries have failed to compete successfully with established power sources such as combustion engines in various industries, such as vehicles. One reason for this failure has been that battery users have been dissatisfied with the longevity and performance that batteries have conventionally provided.

SUMMARY

Disclosed herein are embodiments related to charge/discharge management of electrochemical cells and related systems. The subject matter of the present invention involves, in some cases, interrelated products, alternative solutions to a particular problem, and/or a plurality of different uses of one or more systems and/or articles.

Some embodiments are directed to an electrochemical cell management system comprising an electrochemical cell and at least one controller. The at least one controller may be configured to control the cell such that the cell is charged over a first state of charge range having breadth of at least 20%, wherein an average charging rate over a first portion of the first state of charge range is lower than an average charging rate over a second portion of the first state of charge range, wherein the first portion spans at least 2% of the first state of charge range and the second portion spans at least 2% of the first state of charge range, and wherein the first portion occurs before the second portion.

Some embodiments are directed to an electrochemical cell management method, comprising controlling the cell such that the cell is charged over a first state of charge range having breadth of at least 20%, wherein an average charging rate over a first portion of the first state of charge range is lower than an average charging rate over a second portion of the first state of charge range, wherein the first portion spans at least 2% of the first state of charge range and the second portion spans at least 2% of the first state of charge range, and wherein the first portion occurs before the second portion.

Some embodiments are directed to at least one computer-readable storage medium encoded with executable instructions that, when executed by at least one processor, cause the at least one processor to perform an electrochemical cell management method comprising controlling the cell such that the cell is charged over a first state of charge range having breadth of at least 20%, wherein an average charging rate over a first portion of the first state of charge range is lower than an average charging rate over a second portion of the first state of charge range, wherein the first portion spans at least 2% of the first state of charge range and the second portion spans at least 2% of the first state of charge range, and wherein the first portion occurs before the second portion.

Some embodiments are directed to an electrochemical cell management system comprising an electrochemical cell and at least one controller. The at least one controller may be configured to control the cell such that the cell is charged over a first state of charge range having breadth of at least 2% and at most 90%, and then charged over a second state of charge range, wherein an average charging rate over the first state of charge range is at most 0.5 times an average charging rate over the second state of charge range.

Some embodiments are directed to an electrochemical cell management method, comprising controlling the cell such that the cell is charged over a first state of charge range having breadth of at least 2% and at most 90%, and then charged over a second state of charge range, wherein an average charging rate over the first state of charge range is at most 0.5 times an average charging rate over the second state of charge range.

Some embodiments are directed to at least one computer-readable storage medium encoded with executable instructions that, when executed by at least one processor, cause the at least one processor to perform an electrochemical cell management method comprising controlling the cell such that the cell is charged over a first state of charge range having breadth of at least 2% and at most 90%, and then charged over a second state of charge range, wherein an average charging rate over the first state of charge range is at most 0.5 times an average charging rate over the second state of charge range.

Some embodiments are directed to an electrochemical cell management system comprising an electrochemical cell and at least one controller. The at least one controller may be configured to control the cell such that the cell is charged over a first state of charge range having breadth of at least 2% and at most 40%, then charged over a second state of charge range having breadth of at least 2%, and then charged over a third state of charge range having breadth of at least 2%, wherein the charging rate over the first state of charge range is lower than an average charging rate over the second state of charge range, and wherein the average charging rate over the second state of charge range is lower than an average charging rate over the third state of charge range.

Some embodiments are directed to an electrochemical cell management method, comprising controlling the cell such that the cell is charged over a first state of charge range having breadth of at least 2% and at most 40%, then charged over a second state of charge range having breadth of at least 2%, and then charged over a third state of charge range having breadth of at least 2%, wherein the charging rate over the first state of charge range is lower than an average charging rate over the second state of charge range, and wherein the average charging rate over the second state of charge range is lower than an average charging rate over the third state of charge range.

Some embodiments are directed to at least one computer-readable storage medium encoded with executable instructions that, when executed by at least one processor, cause the at least one processor to perform an electrochemical cell management method comprising controlling the cell such that the cell is charged over a first state of charge range having breadth of at least 2% and at most 40%, then charged over a second state of charge range having breadth of at least 2%, and then charged over a third state of charge range having breadth of at least 2%, wherein the charging rate over the first state of charge range is lower than an average charging rate over the second state of charge range, and wherein the average charging rate over the second state of charge range is lower than an average charging rate over the third state of charge range.

Some embodiments are directed to an electrochemical cell management system comprising an electrochemical cell and at least one controller. The at least one controller may be configured to monitor at least one characteristic of the cell indicating a loss of lithium in the cell, and based on the at least one monitored characteristic of the cell, control a charging rate or a discharging rate of the cell.

Some embodiments are directed to an electrochemical cell management method, comprising monitoring at least one characteristic of the cell indicating a loss of lithium in the cell, and based on the at least one monitored characteristic of the cell, controlling a charging rate or a discharging rate of the cell.

Some embodiments are directed to at least one computer-readable storage medium encoded with executable instructions that, when executed by at least one processor, cause the at least one processor to perform an electrochemical cell management method comprising monitoring at least one characteristic of the cell indicating a loss of lithium in the cell, and based on the at least one monitored characteristic of the cell, controlling a charging rate or a discharging rate of the cell.

Some embodiments are directed to an electrochemical cell management system comprising an electrochemical cell and at least one controller. The at least one controller may be configured to analyze cycle history of the cell and control the cell such that if, for a number of most recent cycles in the cycle history, no cycle within the most recent cycles satisfies a criterion, the cell is discharged to satisfy the criterion, wherein the criterion comprises the cell being discharged, over a state of charge range having breadth of at least 2% and at most 60%, at a discharging rate that is at least 2 times an average charging rate of any of the cycles within the most recent cycles, and wherein the number of most recent cycles is at least 5 cycles.

Some embodiments are directed to an electrochemical cell management method, comprising analyzing cycle history of an electrochemical cell and controlling the cell such that if, for a number of most recent cycles in the cycle history, no cycle within the most recent cycles satisfies a criterion, the cell is discharged to satisfy the criterion. The criterion may comprise the cell being discharged, over a state of charge range having breadth of at least 2% and at most 60%, at a discharging rate that is at least 2 times an average charging rate of any of the cycles within the most recent cycles, and wherein the number of most recent cycles is at least 5 cycles.

Some embodiments are directed to at least one computer-readable storage medium encoded with executable instructions that, when executed by at least one processor, cause the at least one processor to perform an electrochemical cell management method comprising analyzing cycle history of an electrochemical cell and controlling the cell such that if, for a number of most recent cycles in the cycle history, no cycle within the most recent cycles satisfies a criterion, the cell is discharged to satisfy the criterion. The criterion may comprise the cell being discharged, over a state of charge range having breadth of at least 2% and at most 60%, at a discharging rate that is at least 2 times an average charging rate of any of the cycles within the most recent cycles, and wherein the number of most recent cycles is at least 5 cycles.

Some embodiments are directed to an electrochemical cell management system, comprising an electrochemical cell and at least one controller. The at least one controller may be configured to analyze cycle history of the cell and control the cell such that if, for a number of most recent cycles in the cycle history, no cycle within the most recent cycles satisfies a criterion, the cell is discharged to satisfy the criterion, wherein the criterion comprises the cell being discharged, over a state of charge range having breadth of at least 2% and at most 60%, at a discharging rate that is at least 2 times an average discharging rate of any of the cycles within the most recent cycles, wherein the discharging rate is at most 4 times a maximum recommended continuous discharging rate, and wherein the number of most recent cycles is at least 5 cycles.

Some embodiments are directed to an electrochemical cell management method, comprising analyzing cycle history of an electrochemical cell and controlling the cell such that if, for a number of most recent cycles in the cycle history, no cycle within the most recent cycles satisfies a criterion, the cell is discharged to satisfy the criterion, wherein the criterion comprises the cell being discharged, over a state of charge range having breadth of at least 2% and at most 60%, at a discharging rate that is at least 2 times an average discharging rate of any of the cycles within the most recent cycles, wherein the discharging rate is at most 4 times a maximum recommended continuous discharging rate, and wherein the number of most recent cycles is at least 5 cycles.

Some embodiments are directed to at least one computer-readable storage medium encoded with executable instructions that, when executed by at least one processor, cause the at least one processor to perform an electrochemical cell management method comprising analyzing cycle history of an electrochemical cell and controlling the cell such that if, for a number of most recent cycles in the cycle history, no cycle within the most recent cycles satisfies a criterion, the cell is discharged to satisfy the criterion, wherein the criterion comprises the cell being discharged, over a state of charge range having breadth of at least 2% and at most 60%, at a discharging rate that is at least 2 times an average discharging rate of any of the cycles within the most recent cycles, wherein the discharging rate is at most 4 times a maximum recommended continuous discharging rate, and wherein the number of most recent cycles is at least 5 cycles.

Some embodiments are directed to an electrochemical cell management system, comprising an electrochemical cell and at least one controller. The at least one controller may be configured to analyze cycle history of the cell and control the cell such that if, for a number of most recent cycles in the cycle history, no cycle within the most recent cycles satisfies a criterion, the cell is charged to satisfy the criterion, wherein the criterion comprises the cell being charged, over a state of charge range having breadth of at least 2% and at most 60%, at a charging rate that is at most 0.5 times an average discharging rate of any of the 5 cycles, and wherein the number of most recent cycles is at least 5 cycles.

Some embodiments are directed to an electrochemical cell management method, comprising analyzing cycle history of an electrochemical cell and controlling the cell such that if, for a number of most recent cycles in the cycle history, no cycle within the most recent cycles satisfies a criterion, the cell is charged to satisfy the criterion, wherein the criterion comprises the cell being charged, over a state of charge range having breadth of at least 2% and at most 60%, at a charging rate that is at most 0.5 times an average discharging rate of any of the 5 cycles, and wherein the number of most recent cycles is at least 5 cycles.

Some embodiments are directed to at least one computer-readable storage medium encoded with executable instructions that, when executed by at least one processor, cause the at least one processor to perform an electrochemical cell management method comprising analyzing cycle history of an electrochemical cell and controlling the cell such that if, for a number of most recent cycles in the cycle history, no cycle within the most recent cycles satisfies a criterion, the cell is charged to satisfy the criterion, wherein the criterion comprises the cell being charged, over a state of charge range having breadth of at least 2% and at most 60%, at a charging rate that is at most 0.5 times an average discharging rate of any of the 5 cycles, and wherein the number of most recent cycles is at least 5 cycles.

Some embodiments are directed to an electrochemical cell management system, comprising an electrochemical cell and at least one controller. The at least one controller may be configured to control the cell such that the cell is discharged and then charged, wherein, for at least a portion of the discharge that covers a first state of charge range having breadth of at least 2% and at most 60%, an average discharging rate over the portion of the discharge is at least 2 times an average charging rate during at least a portion of the charge.

Some embodiments are directed to an electrochemical cell management method, comprising controlling an electrochemical cell such that the cell is discharged and then charged, wherein, for at least a portion of the discharge that covers a first state of charge range having breadth of at least 2% and at most 60%, the average discharging rate over the portion of the discharge is at least 2 times an average charging rate during at least a portion of the charge.

Some embodiments are directed to at least one computer-readable storage medium encoded with executable instructions that, when executed by at least one processor, cause the at least one processor to perform an electrochemical cell management method comprising controlling an electrochemical cell such that the cell is discharged and then charged, wherein, for at least a portion of the discharge that covers a first state of charge range having breadth of at least 2% and at most 60%, the average discharging rate over the portion of the discharge is at least 2 times an average charging rate during at least a portion of the charge.

Some embodiments are directed to an electrochemical cell management system, comprising an electrochemical cell and at least one controller. The at least one controller may be configured to analyze cycle history of the cell and control the cell such that, once a threshold state of charge is reached while discharging, the discharging rate of the cell is increased to at least 2 times an average charging rate of at least one cycle in the cycle history, wherein the threshold state of charge has a value of less than or equal to 60%.

Some embodiments are directed to an electrochemical cell management method, comprising analyzing cycle history of the cell and controlling the cell such that, once a threshold state of charge is reached while discharging, the discharging rate of the cell is increased to at least 2 times an average charging rate of at least one cycle in the cycle history, wherein the threshold state of charge has a value of less than or equal to 60%.

Some embodiments are directed to at least one computer-readable storage medium encoded with executable instructions that, when executed by at least one processor, cause the at least one processor to perform an electrochemical cell management method comprising analyzing cycle history of the cell and controlling the cell such that, once a threshold state of charge is reached while discharging, the discharging rate of the cell is increased to at least 2 times an average charging rate of at least one cycle in the cycle history, wherein the threshold state of charge has a value of less than or equal to 60%.

Some embodiments are directed to an electrochemical cell management system, comprising an electrochemical cell and at least one controller. The at least one controller may be configured to analyze cycle history of the cell and control the cell such that, once a threshold state of charge is reached while discharging, the discharging rate of the cell is increased to at least 2 times an average charging rate of at least a portion of at least one cycle in the cycle history, wherein the threshold state of charge has a value of less than or equal to 60%.

Some embodiments are directed to an electrochemical cell management method, comprising analyzing cycle history of the cell and controlling the cell such that, once a threshold state of charge is reached while discharging, the discharging rate of the cell is increased to at least 2 times an average charging rate of at least a portion of at least one cycle in the cycle history, wherein the threshold state of charge has a value of less than or equal to 60%.

Some embodiments are directed to at least one computer-readable storage medium encoded with executable instructions that, when executed by at least one processor, cause the at least one processor to perform an electrochemical cell management method comprising analyzing cycle history of the cell and controlling the cell such that, once a threshold state of charge is reached while discharging, the discharging rate of the cell is increased to at least 2 times an average charging rate of at least a portion of at least one cycle in the cycle history, wherein the threshold state of charge has a value of less than or equal to 60%.

Some embodiments are directed to an electrochemical cell management system, comprising an electrochemical cell and at least one controller. The at least one controller may be configured to control the cell such that at a termination state of charge, a charging step is terminated and a discharge is initiated, and during the initiated discharge, the cell is discharged, over a state of charge range having breadth of at least 1%, at a discharging rate that is at least 2 times an average charging rate of the terminated charging step, wherein the termination state of charge has a value of less than or equal to 60%.

Some embodiments are directed to an electrochemical cell management method, comprising controlling an electrochemical cell such that at a termination state of charge, a charging step is terminated and a discharge is initiated, and during the initiated discharge, the cell is discharged, over a state of charge range having breadth of at least 1%, at a discharging rate that is at least 2 times an average charging rate of the terminated charging step, wherein the termination state of charge has a value of less than or equal to 60%.

Some embodiments are directed to at least one computer-readable storage medium encoded with executable instructions that, when executed by at least one processor, cause the at least one processor to perform an electrochemical cell management method comprising controlling an electrochemical cell such that at a termination state of charge, a charging step is terminated and a discharge is initiated, and during the initiated discharge, the cell is discharged, over a state of charge range having breadth of at least 1%, at a discharging rate that is at least 2 times an average charging rate of the terminated charging step, wherein the termination state of charge has a value of less than or equal to 60%.

Some embodiments are directed to an electrochemical cell management system, comprising an electrochemical cell and at least one controller. The at least one controller may be configured to analyze cycle history of the cell and control the cell such that at a termination state of charge, a charging step is terminated and a discharge is initiated, and during the initiated discharge, the cell is discharged, over a state of charge range having breadth of at least 1%, at a discharging rate that is at least 2 times an average charging rate of at least one cycle in the cycle history, wherein the termination state of charge has a value of less than or equal to 60%.

Some embodiments are directed to an electrochemical cell management method, comprising analyzing cycle history of an electrochemical cell; and controlling the cell such that at a termination state of charge, a charging step is terminated and a discharge is initiated, and during the initiated discharge, the cell is discharged, over a state of charge range having breadth of at least 1%, at a discharging rate that is at least 2 times an average charging rate of at least one cycle in the cycle history, wherein the termination state of charge has a value of less than or equal to 60%.

Some embodiments are directed to at least one computer-readable storage medium encoded with executable instructions that, when executed by at least one processor, cause the at least one processor to perform an electrochemical cell management method comprising analyzing cycle history of an electrochemical cell; and controlling the cell such that at a termination state of charge, a charging step is terminated and a discharge is initiated, and during the initiated discharge, the cell is discharged, over a state of charge range having breadth of at least 1%, at a discharging rate that is at least 2 times an average charging rate of at least one cycle in the cycle history, wherein the termination state of charge has a value of less than or equal to 60%.

Some embodiments are directed to an electrochemical cell management system, comprising an electrochemical cell and at least one controller. The at least one controller may be configured to analyze cycle history of the cell and control the cell such that at a termination state of charge, a charging step is terminated and a discharge is initiated, and during the initiated discharge, the cell is discharged, over a state of charge range having breadth of at least 1%, at a discharging rate that is at least 2 times an average charging rate of at least a portion of at least one cycle in the cycle history, wherein the termination state of charge has a value of less than or equal to 60%.

Some embodiments are directed to an electrochemical cell management method, comprising analyzing cycle history of an electrochemical cell; and controlling the cell such that at a termination state of charge, a charging step is terminated and a discharge is initiated, and during the initiated discharge, the cell is discharged, over a state of charge range having breadth of at least 1%, at a discharging rate that is at least 2 times an average charging rate of at least a portion of at least one cycle in the cycle history, wherein the termination state of charge has a value of less than or equal to 60%.

Some embodiments are directed to at least one computer-readable storage medium encoded with executable instructions that, when executed by at least one processor, cause the at least one processor to perform an electrochemical cell management method comprising analyzing cycle history of an electrochemical cell; and controlling the cell such that at a termination state of charge, a charging step is terminated and a discharge is initiated, and during the initiated discharge, the cell is discharged, over a state of charge range having breadth of at least 1%, at a discharging rate that is at least 2 times an average charging rate of at least a portion of at least one cycle in the cycle history, wherein the termination state of charge has a value of less than or equal to 60%.

Some embodiments are directed to an electrochemical cell management system, comprising an electrochemical cell and at least one controller. The at least one controller may be configured to control the cell such that the cell is discharged over a state of charge range having breadth of at least 2% and at most 60%, and then charged. In some examples, the discharging rate over the discharge is at least 2 times an average charging rate during the charge.

Some embodiments are directed to an electrochemical cell management method, comprising controlling an electrochemical cell such that the cell is discharged over a state of charge range having breadth of at least 2% and at most 60%, and then charged. In some embodiments, the discharging rate over the discharge is at least 2 times an average charging rate during the charge.

Some embodiments are directed to at least one computer-readable storage medium encoded with executable instructions that, when executed by at least one processor, cause the at least one processor to perform an electrochemical cell management method comprising controlling an electrochemical cell such that the cell is discharged over a state of charge range having breadth of at least 2% and at most 60%, and then charged. In some embodiments, the discharging rate over the discharge is at least 2 times an average charging rate during the charge.

Some embodiments are directed to an electrochemical cell management system, comprising an electrochemical cell and at least one controller. The at least one controller may be configured to determine whether a fast charging request has been received; and if the fast charging request has not been received, control the cell such that the cell is charged over a first state of charge range having breadth of at least 2% and at most 60%, and then charged over a second state of charge range. In some embodiments, the charging rate over the first state of charge range is at most 0.5 times an average charging rate over the second state of charge range.

Some embodiments are directed to an electrochemical cell management method, comprising determining whether a fast charging request has been received; and if the fast charging request has not been received, control an electrochemical cell such that the cell is charged over a first state of charge range having breadth of at least 2% and at most 60%, and then charged over a second state of charge range. According to some embodiments, the charging rate over the first state of charge range is at most 0.5 times an average charging rate over the second state of charge range.

Some embodiments are directed to at least one computer-readable storage medium encoded with executable instructions that, when executed by at least one processor, cause the at least one processor to perform an electrochemical cell management method comprising determining whether a fast charging request has been received; and if the fast charging request has not been received, control an electrochemical cell such that the cell is charged over a first state of charge range having breadth of at least 2% and at most 60%, and then charged over a second state of charge range. According to some embodiments, the charging rate over the first state of charge range is at most 0.5 times an average charging rate over the second state of charge range.

Some embodiments are directed to an electrochemical cell management system, comprising an electrochemical cell and at least one controller. The at least one controller may be configured to control the cell such that the cell is discharged, and then immediately charged over a first state of charge range having breadth of at least 2% and at most 60%, and a future charging schedule is set such that by an end of 4 cycles proceeding a cycle including the first state of charge range, a criterion is satisfied; and execute the future charging schedule. In some examples, the criterion comprises the cell being charged, over a second state of charge range, such that the charging rate over the first state of charge range is at most 0.5 times an average charging rate over the second state of charge range.

Some embodiments are directed to an electrochemical cell management method, comprising controlling an electrochemical cell such that the cell is discharged, and then immediately charged over a first state of charge range having breadth of at least 2% and at most 60%, and a future charging schedule is set such that by an end of 4 cycles proceeding a cycle including the first state of charge range, a criterion is satisfied; and executing the future charging schedule. According to some embodiments the criterion may comprise the cell being charged, over a second state of charge range, such that the charging rate over the first state of charge range is at most 0.5 times an average charging rate over the second state of charge range.

Some embodiments are directed to at least one computer-readable storage medium encoded with executable instructions that, when executed by at least one processor, cause the at least one processor to perform an electrochemical cell management method comprising controlling an electrochemical cell such that the cell is discharged, and then immediately charged over a first state of charge range having breadth of at least 2% and at most 60%, and a future charging schedule is set such that by an end of 4 cycles proceeding a cycle including the first state of charge range, a criterion is satisfied; and executing the future charging schedule. According to some embodiments the criterion may comprise the cell being charged, over a second state of charge range, such that the charging rate over the first state of charge range is at most 0.5 times an average charging rate over the second state of charge range.

Some embodiments of the invention are directed to a battery management system comprising: at least one battery comprising two or more strings of cells, each string of cells comprising two or more cells; a multiplexing switch apparatus connected to each string of cells; and at least one controller configured to use the multiplexing switch apparatus to transition between discharging of a first string of cells and discharging of a second string of cells while keeping a voltage difference between the first string and the second string below a threshold voltage difference.

Some other embodiments are directed to a battery management system comprising: at least one battery comprising two or more strings of cells, each string of cells comprising two or more cells; a multiplexing switch apparatus connected to each string of cells; and at least one controller configured to use the multiplexing switch apparatus to transition between discharging of a first string of cells and discharging of a second string of cells while keeping an overall output voltage of the battery within a window.

Further embodiments are directed to a battery management system comprising: at least one battery comprising two or more strings of cells, each string of cells comprising two or more cells; a multiplexing switch apparatus connected to each string of cells; and at least one controller configured to use the multiplexing switch apparatus to transition between discharging of a first string of cells and discharging of a second string of cells while keeping an in-rush current resulting from the transition below a threshold current.

Some other embodiments are directed to a battery management system comprising: at least one battery comprising two or more strings of cells, each string of cells comprising two or more cells; a multiplexing switch apparatus connected to each string of cells; and at least one controller configured to use the multiplexing switch apparatus to control a duration of pulse discharge of at least one string of the strings of cells based on at least one criterion.

Further embodiments are directed to a battery pack comprising: at least one battery comprising two or more strings of cells, each string of cells comprising two or more cells; and an integrated switching control system comprising at least one switch connected to each string of cells, wherein the integrated switching control system is configured to control the at least one switch to discharge a first string having a first voltage at a time of measurement while discharging the first string and not a second string, and then to discharge the second string having a second voltage that is closest to the first voltage at the time of measurement.

Some other embodiments are directed to a battery management method comprising: using a multiplexing switch apparatus, which is connected to two or more strings of cells of at least one battery, to transition between discharging of a first string of cells and discharging of a second string of cells while keeping a voltage difference between the first string and the second string below a threshold voltage difference, wherein each string of cells comprises two or more cells.

Further embodiments are directed to a battery management method comprising: using a multiplexing switch apparatus, which is connected to two or more strings of cells of at least one battery, to transition between discharging of a first string of cells and discharging of a second string of cells while keeping an overall output voltage of the battery within a window, wherein each string of cells comprises two or more cells.

Some other embodiments are directed to a battery management method comprising: using a multiplexing switch apparatus, which is connected to two or more strings of cells of at least one battery, to transition between discharging of a first string of cells and discharging of a second string of cells while keeping an in-rush current resulting from the transition below a threshold current, wherein each string of cells comprises two or more cells.

Some embodiments of the invention are directed to a battery management system comprising: at least one battery comprising two or more strings of cells, each string of cells comprising two or more cells; a multiplexing switch apparatus connected to each string of cells; and at least one controller configured to use the multiplexing switch apparatus to selectively discharge the strings of cells.

Some other embodiments are directed to a battery pack comprising: at least one battery comprising two or more strings of cells, each string of cells comprising two or more cells; and an integrated switching control system comprising at least one switch connected to each string of cells, wherein the integrated switching control system is configured to control the at least one switch to discharge the strings of cells.

Further embodiments are directed to a battery management method. The method may comprise using a multiplexing switch apparatus, which is connected to two or more strings of cells of at least one battery, to selectively discharge each string of cells, wherein each string of cells comprises two or more cells.

Some other embodiments are directed to a electrochemical cell management system comprising an electrochemical cell; and at least one controller configured to control the cell such that: during a charging step, the cell is charged over a first state of charge range having breadth of at least 2% at a first charging rate, during the charging step, the cell is charged, over a second state of charge range having breadth of at least 2%, at a second charging rate, during a discharging step, the cell is discharged, over a third state of charge range having breadth of at least 2%, at a first discharging rate that is at least 2 times the first or second charging rate, and during the discharging step, the cell is discharged, over a fourth state of charge range having breadth of at least 2%, at a second discharging rate that is less than 2 times the first or second charging rate.

Further embodiments are directed to an electrochemical cell management method comprising controlling an electrochemical cell such that: during a charging step, the cell is charged over a first state of charge range having breadth of at least 2% at a first charging rate, during the charging step, the cell is charged, over a second state of charge range having breadth of at least 2%, at a second charging rate, during a discharging step, the cell is discharged, over a third state of charge range having breadth of at least 2%, at a first discharging rate that is at least 2 times the first or second charging rate, and during the discharging step, the cell is discharged, over a fourth state of charge range having breadth of at least 2%, at a second discharging rate that is less than 2 times the first or second charging rate.

Some embodiments are directed to at least one computer-readable storage medium encoded with executable instructions that, when executed by at least one processor, cause the at least one processor to perform an electrochemical cell management method comprising controlling an electrochemical cell such that: during a charging step, the cell is charged over a first state of charge range having breadth of at least 2% at a first charging rate, during the charging step, the cell is charged, over a second state of charge range having breadth of at least 2%, at a second charging rate, during a discharging step, the cell is discharged, over a third state of charge range having breadth of at least 2%, at a first discharging rate that is at least 2 times the first or second charging rate, and during the discharging step, the cell is discharged, over a fourth state of charge range having breadth of at least 2%, at a second discharging rate that is less than 2 times the first or second charging rate.

Some other embodiments are directed to an electrochemical cell management system comprising an electrochemical cell; and at least one controller configured to control the cell such that: during a discharging step, the cell is discharged, over a first state of charge range having breadth of at least 2%, at a first discharging rate, during the discharging step, the cell is discharged, over a second state of charge range having breadth of at least 2%, at a second discharging rate, the first discharging rate may be at least 2 times a corresponding charging rate, and the second discharging rate is less than 2 times the corresponding charging rate.

Further embodiments are directed to an electrochemical cell management method comprising controlling an electrochemical cell such that: during a discharging step, the cell is discharged, over a first state of charge range having breadth of at least 2%, at a first discharging rate, during the discharging step, the cell is discharged, over a second state of charge range having breadth of at least 2%, at a second discharging rate, the first discharging rate may be at least 2 times a corresponding charging rate, and the second discharging rate is less than 2 times the corresponding charging rate.

Some embodiments are directed to at least one computer-readable storage medium encoded with executable instructions that, when executed by at least one processor, cause the at least one processor to perform an electrochemical cell management method comprising controlling an electrochemical cell such that: during a discharging step, the cell is discharged, over a first state of charge range having breadth of at least 2%, at a first discharging rate, during the discharging step, the cell is discharged, over a second state of charge range having breadth of at least 2%, at a second discharging rate, the first discharging rate may be at least 2 times a corresponding charging rate, and the second discharging rate is less than 2 times the corresponding charging rate.

Some other embodiments are directed to an electrochemical cell management system comprising an electrochemical cell; and at least one controller configured to control the cell such that: during a charging step, the cell is charged, over a first state of charge range having breadth of at least 2%, at a first charging rate, during the charging step, the cell is charged, over a second state of charge range having breadth of at least 2%, at a second charging rate, the first charging rate is at most 0.5 times a corresponding discharging rate, and the second charging rate is greater than 0.5 times the corresponding discharging rate.

Further embodiments are directed to an electrochemical cell management method comprising controlling an electrochemical cell such that: during a charging step, the cell is charged, over a first state of charge range having breadth of at least 2%, at a first charging rate, during the charging step, the cell is charged, over a second state of charge range having breadth of at least 2%, at a second charging rate, the first charging rate is at most 0.5 times a corresponding discharging rate, and the second charging rate is greater than 0.5 times the corresponding discharging rate.

Some embodiments are directed to at least one computer-readable storage medium encoded with executable instructions that, when executed by at least one processor, cause the at least one processor to perform an electrochemical cell management method comprising controlling an electrochemical cell such that: during a charging step, the cell is charged, over a first state of charge range having breadth of at least 2%, at a first charging rate, during the charging step, the cell is charged, over a second state of charge range having breadth of at least 2%, at a second charging rate, the first charging rate is at most 0.5 times a corresponding discharging rate, and the second charging rate is greater than 0.5 times the corresponding discharging rate.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
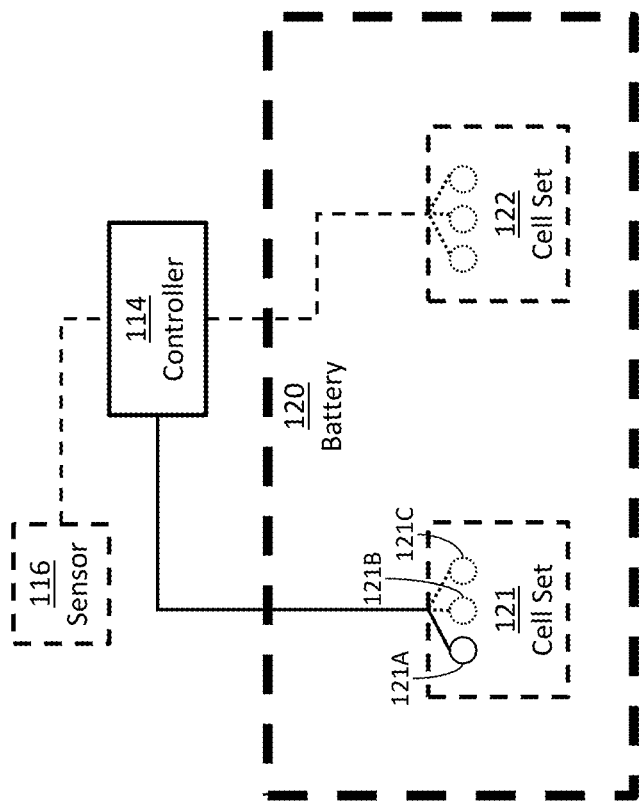
FIG. 1A is a block diagram illustrating a representative electrochemical cell management system, according to some embodiments.

The inventors have recognized and appreciated that conventional techniques for management and operation of rechargeable electrochemical cells have resulted in the previously poor longevity and performance of cells (and batteries in which they may be included). For example, cells have suffered a short cycle life (e.g., a low number of complete cycles before capacity falls below 80% of original capacity, as cells typically do at some point after sufficient usage), particularly where charge and discharge rates are similar, or where the charge rate is higher than the discharge rate. For example, many users of cells in batteries have desired the batteries to have nearly identical charge and discharge rates (e.g., 4 hours to charge and 4 hours to discharge), and battery manufacturers have provided batteries and battery management systems that provide such nearly identical rates. Many users have also desired batteries to charge at higher rates than they discharge (e.g., 30 minutes to charge and 4 hours to discharge) for various reasons, such as to reduce inconvenience of waiting for charging to use the batteries and extended runtimes.

The term "complete charge cycle" is used herein to generally refer to a period of time during which about 100% of a cell's re-charge capacity is charged, and the term "complete discharge cycle" is used to generally refer to a period of time during which about 100% of the cell's discharge capacity (which may be different from its re-charge capacity) is discharged. On the other hand, the term "charging step" is used herein to generally refer to a continuous period of time during which charging is performed without discharging, and the term "discharging step" is used herein to generally refer to a continuous period during which discharging is performed without charging. A charging step coupled with a discharging step may form a cycle, but the cycle may not necessarily be a complete cycle.

The term "charge cycle" is used to generally refer to a period of time during which the cell is charged, and it need not be a complete charge cycle. The term "discharge cycle" is used to generally refer to a period of time during which the cell is discharged, and it need not be a complete discharge cycle. The term "previous discharge cycle" is used to generally refer to a period of time during which the cell has been or is being discharged. For example, this "previous" discharge cycle may have been completed or may still be in progress—it need not refer to the most recent completed discharging steps that sum to about 100% of the cell's discharge capacity. If no complete discharge cycle has been performed, the previous discharge cycle may refer to any previously completed discharging steps.

The term "capacity" is used to generally refer to an amount of electrical charge a cell or cells can deliver at a given or rated voltage and is often measured in amp-hours (such as milliamp-hours or mAh). In some embodiments, capacity may be the mAh a cell or cells can hold at a given point in time (which may change over multiple cycles), it may be the mAh remaining in a cell or cells at a given point in time, or it may be the mAh a cell or cells need to fully re-charge.

The term "state of charge" (SOC) is used herein to refer to a level of charge of the cell relative to its capacity and is measured as a percentage. As examples, a state of charge of 100% refers to a fully charged cell, a state of charge of 40% refers to a cell that retains 40% of its capacity, and a state of charge of 0% refers to a fully discharged cell.

The term "state of charge range" (SOC range) is used herein to refer to a range of states of charge. For example, a state of charge range of 10% to 50% would include the states of charge of 10%, 50%, and all states of charge between 10% and 50%.

The "breadth" of the state of charge range is used herein to refer to the absolute value of the difference between the end points of a state of charge range. To illustrate, a state of charge range of 10% to 50% would have a breadth of 40% (because 50% minus 10% is 40%). As another example, a state of charge range of at least 2% and at most 5% would have a breadth of 3% (because 5% minus 2% is 3%).

The inventors have recognized and appreciated that the cycle life of a cell (and a battery including the cell), and consequently the longevity and performance of the cell (and battery), may be greatly improved by employing higher ratios of discharge rate to charge rate, higher ratios of charge rate to other charge rate(s) (such as a preceding or proceeding rate(s)), and/or higher ratios of discharge rate to other discharge rate(s). Furthermore, the inventors have recognized and appreciated that these ratios may be employed by providing a cell and/or battery management system that controls the cell or cells to provide such ratios.

The inventors have recognized and appreciated that the cycle life of cells (and batteries including the cells), and consequently the longevity and performance of the cells (and batteries), may be greatly improved by employing higher ratios of discharge rate to charge rate. Furthermore, the inventors have recognized and appreciated that these ratios may be employed even in high voltage (e.g., 60 volts and higher) applications by providing a battery management system that controls strings of cells or modules within the batteries to provide such ratios. For example, some embodiments are directed to a battery management system that multiplexes strings of cells such that the strings can be charged all at once or with multiple at a time and discharged individually or in smaller sets. This may result in actual ratios of discharge rate to charge rate for the cells that improve their cycle life, while providing whatever output rates that are desired or required for particular loads and applications. Furthermore, the inventors have recognized and appreciated that discharging some but not all of the strings at once with homogeneous current distribution may also improve their cycle life.

For example, with a battery having 4 strings of cells, 1 string could be discharged at a time at 0.5 amps for 3 hours each, and then all 4 strings could be charged at 0.5 amps for 12 hours—such a configuration would provide an actual ratio of discharge rate to charge rate of 4:1, while the ratio from the user's perspective would be 1:1 because the strings are discharged individually for 3 hours each (totaling 12 hours of discharge time). The inventors have recognized and appreciated that such a battery management system may actually improve the cycle life of batteries while still providing users what they desire or need from the batteries. In some embodiments, the functionality of providing this duo of benefits may be hidden from users and may be integrated into strings, cell blocks, and/or batteries themselves. In some embodiments, a given string may include at least 15 cells.

The inventors have recognized and appreciated that even high voltage applications may be possible by using such a battery management system with strings of cells or modules. For example, by connecting individual cells or modules of cells in series as strings, the total voltage of a given string and/or that applied to a load can be far higher than the 4.1 volts that might otherwise be available from an individual cell. For example, the inventors have recognized and appreciated that some applications require voltages of 60 volts, 80 volts, 110 volts, 220 volts, 300 volts, 400 volts, or even 800-2000 volts, and such a battery management system with strings of cells or modules may provide any or all of these and other voltages.

The inventors have recognized and appreciated that many applications require uninterrupted power and nearly constant voltage, such as electric vehicles. For example, an electric vehicle may not be able to provide the acceleration or performance needed without uninterrupted power and nearly constant voltage. In such applications, when one string or cell is being discharged, the inventors have recognized and appreciated that transitioning to the next string or cell should not be performed simply by ending discharge of that first string and thereafter starting discharge of a second string, as that would create an interruption in power delivery and drastic voltage fluctuations. Rather, the second string should start discharging before the first string stops discharging to avoid this total interruption.

The inventors have recognized and appreciated that voltage fluctuations could be further reduced or avoided by carefully selecting the string(s) to discharge. The first string (the string away from which the system is transitioning) will typically have different voltage than the second string (e.g., the first string may have lower voltage in many cases due to greater usage, but the first string may also have higher voltage). This change in voltage transitioning between the first string and second string leads to an in-rush current. The inventors have recognized and appreciated the importance of minimizing such an in-rush current, as the circuitry and electronic components of many battery management systems are not designed to sustain high current without burning up. The inventors have recognized and appreciated that carefully selecting the string(s) to discharge to minimize the voltage delta is the most desirable way of minimizing such in-rush current. Other ways to handle such an in-rush current include using a pre-charge circuit or similar components. However, such additional components add cost, complexity, volume, and weight to a battery system, which may be either prohibitive or greatly disadvantageous in various applications, such as in an electric vehicle. The inventors have recognized and appreciated that such disadvantages can be avoided using embodiments discussed herein to carefully select string(s) for discharging that minimize voltage fluctuation and resulting in-rush current.

The inventors have recognized and appreciated that such improvements and others described herein, such as improved cell cycle life, can be had even if not every charging step and/or every discharging step satisfies a target ratio, and/or even if the ratios are employed over only a portion of a charging step and/or a discharging step, and/or even if the ratios are employed over a state of charge range that constitutes only a portion of the full SOC range.

For example, some embodiments are directed to a cell management system that controls a cell such that the cell is discharged or charged over a SOC range (e.g., a range having breadth of at least 2% and at most 60%, or at most 50%, or at most 30%, or at most 20%) to satisfy a rate ratio (such as by discharging at a rate at least 2 times or 4 times an average charging rate before or after, or by charging to establish a similar ratio with discharging rate(s)), and only this SOC range satisfies the rate ratio. In other words, it may be that outside this SOC range, the rate ratios are radically different and not beneficial to cell health, but inside this SOC range, the rate ratios are beneficial to cell health. Other mentions herein of a SOC range having breadth of at most a given percentage also mean that, in some embodiments, outside that SOC range, the rate ratio(s) described above are not satisfied.

As another example, some embodiments are directed to a cell management system that controls a cell such that the cell is discharged or charged over a SOC range (e.g., a range having breadth of at least 2% and at most 60%) to satisfy a rate ratio (such as by discharging at a rate at least 2 times an average charging rate of any of the last 5 cycles, or by charging to establish a similar ratio with discharging rate(s)) if the ratio has not been satisfied within the last 5 cycles. As another example, in some embodiments the cell is discharged over a SOC range to satisfy another rate ratio (such as by discharging at a rate at least 2 times an average discharging rate of any of the last 5 cycles, but discharging at at most 4 times a maximum recommended continuous discharging rate) if the ratio has not been satisfied within the last 5 cycles.

As a further example, in some embodiments the cell is charged over a SOC range to provide increasing charging rates over that range. For example, charging rates may increase linearly, parabolically, or exponentially. The inventors have recognized and appreciated that charging a cell or cells more slowly at the beginning of a charging step and increasing (e.g., gradually or otherwise) the charging rate over time can deliver significantly longer cycle life (e.g., 50% longer cycle life compared with constant rate or decreasing rate charge conditions). Charging at increasing rates until the end of the charging step may be especially beneficial. On the other hand, fast charging can be particularly harmful to cycle life, especially for lithium-metal electrode active material. Moreover, the inventors have recognized and appreciated that increasing charging rates can still be used while providing an average, overall charging rate demanded by the application or user. The inventors have also recognized and appreciated that many benefits described herein can be attained irrespective of discharging rates or any ratio between charging and discharging rates by controlling charging rates in such manners. The inventors have further recognized and appreciated that charging rates can be more easily controlled than discharging rates to follow a profile beneficial to the cells (e.g., discharging demands of a load may be far outside ideal cell conditions but still must be met quickly, while charging may have much more time for better cell treatment and be more likely controlled by an algorithm).

In some embodiments, the cell(s) may be discharged over additional SOC ranges to provide decreasing rates of discharge over those ranges. The inventors have recognized and appreciated that decreasing discharging rates over a discharging step, especially in combination with increasing charging rates over a charging step, can further improve cell cycle life.

As an additional example, in some embodiments, once a threshold SOC (e.g., 60% or less) is reached while discharging, the discharging rate is increased to at least 2 times an average charging rate of at least one cycle in the cycle history. In some embodiments, a charging step is terminated (e.g., at 60% SOC) and a discharge is initiated, whereupon the cell is discharged, over a SOC range having breadth of at least 1%, at a rate at least 2 times an average charging rate of the terminated charging step or of at least one cycle in the cycle history. In additional embodiments, the cell is discharged over a SOC range (e.g., a range having breadth of at least 2% and at most 60%, or at most 50%, or at most 30%, or at most 20%), and then charged such that the discharging rate is at least 2 times the average charging rate.

As an additional example, in some embodiments, once a threshold SOC (e.g., 60% or less) is reached while discharging, the discharging rate is increased to at least 2 times an average charging rate of at least a portion of at least one cycle in the cycle history. In some embodiments, a charging step is terminated (e.g., at 60% SOC) and a discharge is initiated, whereupon the cell is discharged, over a SOC range having breadth of at least 1%, at a rate at least 2 times an average charging rate of the terminated charging step or of at least a portion of at least one cycle in the cycle history. In additional embodiments, the cell is discharged over a SOC range (e.g., a range having breadth of at least 2% and at most 60%, or at most 50%, or at most 30%, or at most 20%), and then charged such that the discharging rate is at least 2 times the average charging rate.

In further embodiments, if a fast charging request has not been received, the cell is charged over a first SOC range (e.g., a range having breadth of at least 2% and at most 60%, or at most 50%, or at most 30%, or at most 20%), and then charged over a second SOC range such that the rate over the first SOC range is at most 0.5 times the average rate over the second SOC range. In some embodiments, the cell is discharged, and then immediately charged over a first SOC range (e.g., a range having breadth of at least 2% and at most 60%, or at most 50%, or at most 30%, or at most 20%), and a future charging schedule is set and executed such that by an end of the next 4 cycles, the cell is charged over a second SOC range such that the rate over the first SOC range is at most 0.5 times the average rate over the second SOC range.

Furthermore, the inventors have recognized and appreciated that analysis and control as described herein may be performed by a cell and/or battery management system.

Some embodiments, such as embodiments having multiple cells, are directed to a battery management system that multiplexes cells such that the cells can be charged all at once (or with multiple cells discharged at the same time) and discharged individually or in smaller sets. This may result in actual ratios of discharge rate to charge rate (or discharge rate to other discharge rate(s), or charge rate to other charge rate(s)) for the cells that improve their cycle life, while providing whatever output rates that are desired or required for particular loads and applications. Furthermore, the inventors have recognized and appreciated that discharging some but not all of the cells at once with homogeneous current distribution may also improve their cycle life.

For example, with a battery having 4 cells, 1 cell could be discharged at a time at 0.5 amps for 3 hours each, and then all 4 cells could be charged at 0.5 amps for 12 hours—such a configuration would provide an actual ratio of discharge rate to charge rate of 4:1, while the ratio from the user's perspective would be 1:1 because the cells are discharged individually for 3 hours each (totaling 12 hours of discharge time). The inventors have recognized and appreciated that such a battery management system may actually improve the cycle life of batteries while still providing users what they desire or need from the batteries. In some embodiments, the functionality providing this duo of benefits may be hidden from users and may be integrated into the cell blocks and/or batteries themselves.

The inventors have recognized and appreciated that the cycle life of batteries may be further improved by monitoring the cycles of the cells and various properties (such as the duration of a connection between a load and a cell or cells currently connected to the load, or a more complex function considering multiple parameters) and selecting which cells to discharge when based on this monitoring, especially compared to conventional techniques, which relied on much simpler selection processes like "round robin" or considering a number of prior cycles.

FIG. 1A depicts a representative cell management system 100. In some embodiments, representative system 100 may include a controller (e.g., 114) and an electrochemical cell (e.g., 121A). In some embodiments, cell 121A may be present alone. In other embodiments, additional cells (e.g., optional cells 121B and 121C in FIG. 1A) and/or additional cell sets (e.g., optional cell set 122 in FIG. 1A) may be present (e.g., to form battery 120). Optionally, system 100 may include one or more sensors (e.g., 116). It should be appreciated that although only a single controller 114 and a single sensor 116 are shown in FIG. 1A, any suitable number of these components may be used. Any of numerous different modes of implementation may be employed.

According to some embodiments, the cell 121A may include at least one lithium-metal electrode active material. Additionally, each set of cells (e.g., cell set 121) may include one or more cells (e.g., 121A-121C). In some embodiments, each set of cells may have a single cell. Alternatively, each set of cells may include multiple cells and may form a cell "block," or multiple sets of cells may together form a cell block. Additionally, each cell (either in a battery, all the batteries in a battery pack, or in a set of cells) or set of cells may utilize the same electrochemistry. That is to say, in some embodiments, each cell may make use of the same anode active material and the same cathode active material.

In some embodiments, such as embodiments having multiple cells, a multiplexing switch apparatus (not shown in FIG. 1A) may be included and may include an array of switches, such as those further described in relation to FIGS. 3A and 3B below. Additionally, the multiplexing switch apparatus may be connected to each set of cells and/or to each cell individually. In some embodiments, the controller, such as 114, may use the multiplexing switch apparatus to selectively discharge the cells or sets of cells.

In some embodiments, the controller (e.g., 114) may include one or more processors, which may be of whatever complexity is suitable for the application. Alternatively or additionally, the controller may include an analog circuit and/or a less complex logic device than a processor or microprocessor.

In some embodiments, the controller may control the cell such that, for at least a portion of a charging step of the cell, the cell is charged at a charging rate or current that is lower than a discharging rate or current of at least a portion of a previous discharging step. For example, the controller may cause the cell to be charged for some state of charge range (e.g., over a range having breadth of anywhere from 1% to 100%) at a charging rate or current that is on average at least 2 times lower than the discharging rate or current that has been used on average discharging for some state of charge range (e.g., over a range having breadth of anywhere from 1% to 100%) (i.e., the charging rate or current may be half as fast as the discharging rate or current). Alternatively or additionally, the controller may cause the cell to be charged at a charging rate or current that is at least 4 times lower than the discharging rate (e.g., as a result of this controlling, over the last cycle, the cell is charged for some range one-fourth as fast as the cell has been discharged for some range). The inventors have recognized and appreciated that such ratios of charge rate to discharge rate may improve the performance and cycle life of a cell.

In some embodiments, controlling the cell may include controlling when and how to start and stop charging and discharging, induce discharging, increase or decrease the rate or current of charging or discharging, and so on. For example, controlling charging or discharging of the cell may include, respectively, starting charging or discharging, stopping charging or discharging, increasing or decreasing the rate or current of charging or discharging, and so on.

In some embodiments, the cell is charged such that, over a period of time during which at least 5% (or at least 1%, or at least 10%, or at least 15%, or at least 25%, or anywhere between) of the capacity of the cell is charged, the average charge rate or current is lower than the average discharge rate or current used to discharge at least 5% (or at least 10%, or at least 15%, or at least 25%, or anywhere between) of the cell's capacity during a previous discharging step, which may be, for example, the immediately preceding discharging step or an earlier discharging step.

In some embodiments, a charging step is performed such that, for at least 5% (or at least 10%, at least 25%, at least 50%, or at least 75%) of the cell's or battery's capacity, the average of the charging rate and/or current is less than 50% (or less than 35%, or less than 25%) of an average discharging rate and/or current at which at least 5% (or at least 10%, at least 25%, at least 50%, or at least 75%) of the cell's or battery's capacity was discharged during a previous discharging step.

In certain embodiments, a charging step is performed such that, for at least 5% (or at least 10%, at least 25%, at least 50%, or at least 75%) of the cell's or battery's capacity, average of the charging rate and/or current is less than 50% (or less than 35%, or less than 25%) of an average discharging rate and/or current at which at least 5% (or at least 10%, at least 25%, at least 50%, or at least 75%) of the cell's or battery's capacity was discharged during the immediately preceding discharging step.

In some embodiments, an average discharging rate or current during the previous discharging step may be equal to or less than an average charging rate or current during the charging step, and an average discharging rate or current during discharge of a state of charge range have breadth of at least 5% during the previous discharging step may be at least 2 times higher (or may be 4 times higher) than the average charging rate or current during the charging step. The inventors have recognized and appreciated that improvements described herein, such as improved cell cycle life, can still be had even if the average discharge rate for the cell is the same or even lower than the charge rate, so long as during discharge of at least a portion (such as state of charge range having breadth of 5%) during the previous discharging step, an average discharging rate or current is sufficiently higher than (such as at least double, triple, or quadruple) the average charging rate or current during that time.

As used herein, when a cell is charged at multiple different rates over a given period of time (e.g., over a portion of a charging step, over an entire charging step, or over a series of charging steps), the average charging rate over that given period of time is calculated as follows:

$$CR_{Avg} = \sum_{i=1}^{n} \frac{CCap_i}{CCap_{Total}} CR_i$$

where $CR_{Avg}$ is the average charging rate over the given period of time, n is the number of different rates at which the cell is charged, $CR_i$ is the charging rate, $CCap_i$ is the portion of the cell's capacity that is charged at charging rate $CR_i$ during the given period of time, and $CCap_{Total}$ is the total of the cell's capacity that is charged over the entire period of time. To illustrate, if, during a charging step, a cell is charged from 0% to 50% of its capacity at a rate of 20 mAh/minute and then from 50% to 80% of its capacity at a rate of 10 mAh/minute, then the average charging rate during the charging step would be calculated as:

$$CR_{Avg} = \frac{50\%}{80\%}(20 \text{ mAh/min}) + \frac{30\%}{80\%}(10 \text{ mAh/min}) = 16.25 \text{ mAh/min}.$$

As used herein, when a cell is discharged at multiple different rates over a given period of time (e.g., over a given charging step or series of charging steps), the average discharging rate over that given period of time is calculated as follows:

$$DR_{Avg} = \sum_{i=1}^{n} \frac{DCap_i}{DCap_{Total}} DR_i$$

where $DR_{Avg}$ is the average discharging rate over the given period of time, n is the number of different rates at which the cell is discharged, $DR_i$ is the discharging rate, $DCap_i$ is the portion of the cell's capacity that is discharged at discharging rate $DR_i$ during the given period of time, and $DCap_{Total}$ is the total of the cell's capacity that is discharged over the entire period of time. To illustrate, if, during a discharging step, a cell is discharged from 90% to 50% of its capacity at a rate of 25 mAh/minute and then from 50% to 20% of its capacity at a rate of 15 mAh/minute, then the average discharging rate during the discharging step would be calculated as:

$$DR_{Avg} = \frac{40\%}{70\%}(25 \text{ mAh/min}) + \frac{30\%}{70\%}(15 \text{ mAh/min}) = 20.71 \text{ mAh/min}.$$

The inventors have recognized and appreciated that a number of factors may go into determining charge rates that may improve the performance and cycle life of a cell such as a lithium metal cell, which may include rate of discharge, cell impedance, and/or cell State of Health (SOH). In some embodiments, the controller may be aware of these factors because it may measure parameters or characteristics (such as via sensor 116) that can be used to determine each of them. The controller may directly or indirectly measure charge and discharge current, Coulombs added or removed, cell impedance (capacitive and resistive), and/or cell pressure, size, and/or thickness.

In some embodiments, the controller may monitor such characteristic(s) of the cell. For example, the characteristic(s) may include at least a portion of a discharge history of the cell. Alternatively or additionally, the characteristic(s) may include at least one morphological characteristic of the cell. The controller may monitor any of these using sensor 116, such as a pressure sensor, a gauge to measure thickness, a sensor to measure or determine surface roughness and/or pits (such as pits in an anode), and/or a memory for storing cell charge/discharge history. For example, a pressure sensor may be included to measure uniaxial pressure and/or gas pressure (such as to determine if the cell generates an excessive amount of gas). Alternatively or additionally, a gauge may be included to measure a thickness of the cell, and the controller may determine and monitor at least one rate of increase of the thickness.

In some embodiments, the controller may use this information, such as the characteristic(s), to determine the charge method and/or rate to be used, which may include controlling rates or other parameters as described herein.

Figure 1B:
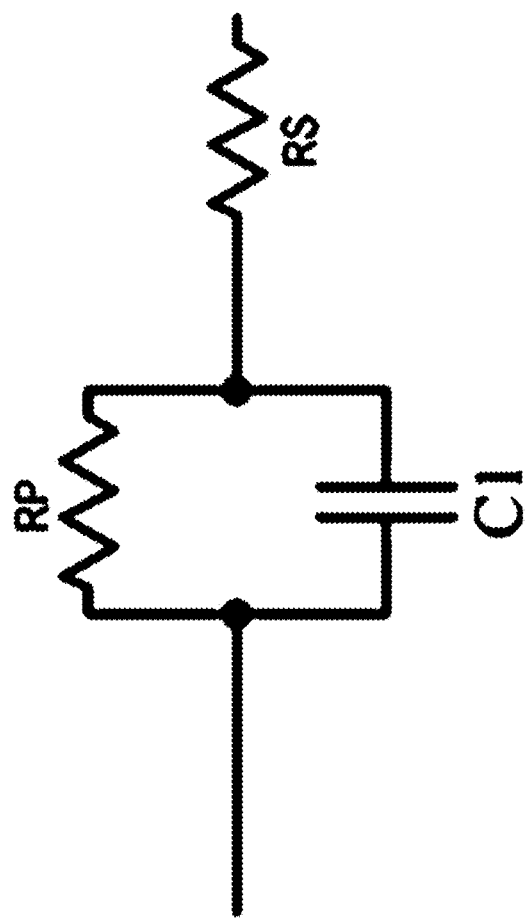
FIG. 1B is a circuit diagram illustrating a representative simplified electrochemical cell model, according to some embodiments.

In some embodiments, the controller may consider any of several factors when determining the cell state of charge and State of Health (SOH). For example, for cell impedance, the cell model can be simplified as shown in FIG. 1B, which shows a resistor in series (RS) with the parallel combination of a resistor (RP) and a capacitor (C1). An impedance measurement may have two components: real and imaginary. The real component may be simply the DC resistance R=RS+RP. The imaginary (or reactive) component in this case may be XC, which may be affected inversely by frequency:

$$XC = \frac{1}{2\pi fc}$$

where f is frequency and c is capacitance. Impedance (Z) may be found at any particular frequency, and the phase angle may be known or determined as follows: $Z=\sqrt{R^2+XC^2}$. Impedance may change both with SOC and SOH. The inventors have recognized and appreciated that these relationships may allow the controller to determine how to charge the cell in order to provide improvements described herein.

The inventors have also recognized and appreciated that, in certain instances, pulses of cycles and/or charging/discharging steps should not be applied faster than a rate equal to about double or triple RC time constants, because at a faster rate, most of the energy may not be effective in charging or discharging the cell. Rather, it may be mostly reactive in nature and most of the energy may be returned by the capacitance or dissipated in the resistance.

The inventors have further recognized and appreciated that a cell grows and shrinks in thickness with every cycle and that a portion of the growth is retained each cycle. This growth and shrinkage can be measured by monitoring the pressure and/or size change of the cell directly. These are additional inputs that may be used when determining SOC and SOH, and they can also be used in determining how to charge the cell.

In some embodiments, the controller may control charging of the cell based on the characteristic(s) of the cell. For example, if the cell has had a discharging step or history of discharging at a certain discharge rate or current (such as 300 mA) at least for a portion of the previous discharging step, the cell may be controlled to charge at a lower rate or current (such as at 150 mA or 75 mA) for at least a portion of the charging step.

In some embodiments including an induced discharge, the controller may control the cell such that, for at least a portion of the charging step (such as 5% of the cycle), the cell is charged at a charging rate or current that is lower than a discharging rate or current of at least a portion of a previous discharging step other than (i.e., not including) the induced discharge.

As another example, the controller may terminate usage of the cell if an applied anisotropic pressure falls below a threshold, which may indicate that the pressure applying system (examples of which are described in more detail below) is damaged. For example, in some embodiments such a threshold may be 1% to 50% of nominal applied anisotropic pressure. Alternatively or additionally, the controller may terminate usage of the cell if pressure is too high or the thickness has been increasing faster than a threshold rate. For example, in some embodiments such a threshold rate may be 1% to 3% of thickness increase or more per cycle.

Figure 1C:
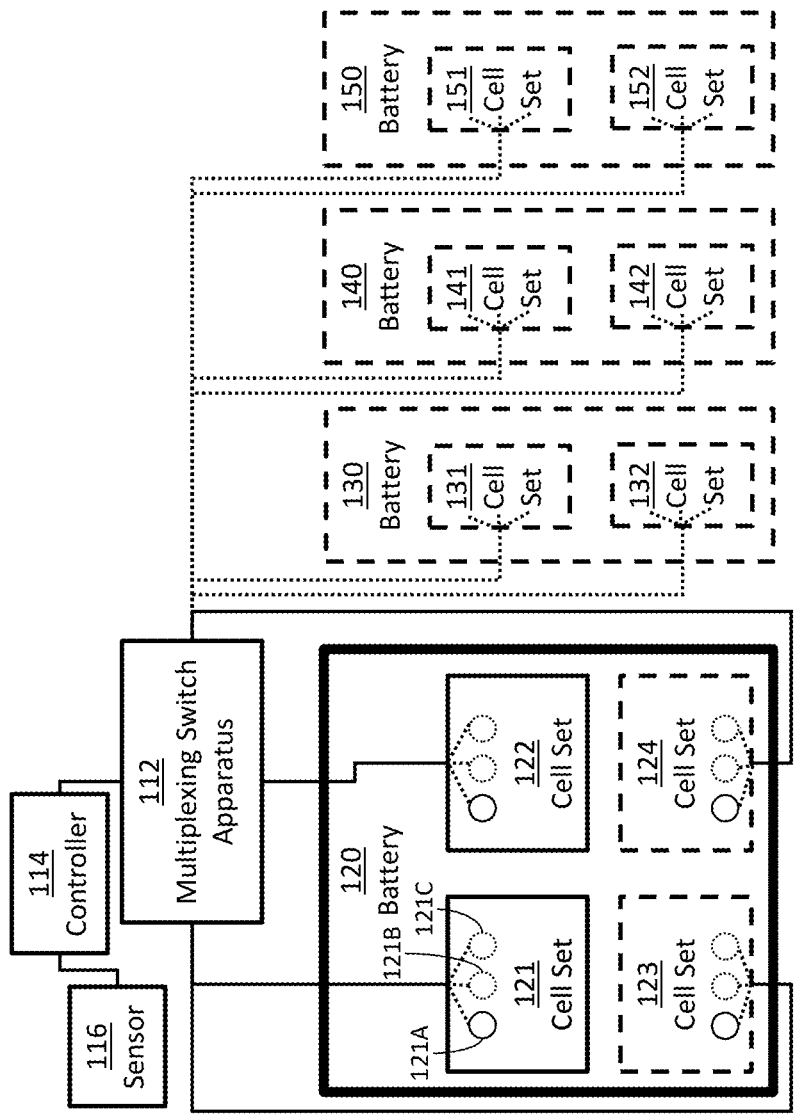
FIG. 1C is a block diagram illustrating a representative battery management system, according to some embodiments.

FIG. 1C depicts a representative battery management system 100. In some embodiments, such as embodiments having multiple cells, representative system 100 may include a multiplexing switch apparatus (e.g., 112), a controller (e.g., 114), one or more sensors (e.g., 116), and one or more batteries (e.g., 120, 130, 140, 150, and so on). It should be appreciated that although only a single multiplexing switch apparatus 112, controller 114, sensor 116, and only four batteries 120-150 are shown in FIG. 1C, any suitable number of these components may be used. Any of numerous different modes of implementation may be employed. Furthermore, although a label in the singular is used herein to reference a multiplexing switch apparatus, it should be appreciated that the components used for the multiplexing and switching described herein may be distributed across any suitable number of devices (e.g., switches).

According to some embodiments, the battery or batteries may include at least one lithium-metal battery. Additionally, the battery or batteries (e.g., 120-150) may respectively include one or more cell sets (e.g., 121-124, 131-132, 141-142, 151-152, and so on), referred to also as sets of cells. In some embodiments, one or more cell sets or sets of cells may form strings of cells or cell strings, as discussed herein (in some embodiments, 121-124 may be referred to as strings). For example, strings of cells may comprise modules of cells or individual cells connected in series. In some embodiments, the cells of a module may be connected to each other in parallel within the module, while modules may be connected to each other in series. Alternatively or additionally, the cells of a module may be connected to each other in series within the module. Alternatively or additionally, modules may be connected to each other in parallel.

In some embodiments, two or more strings or sets of cells are included in each battery, such as 121-122 and so on. Additionally, each string or set of cells (e.g., cell set 121) may include one or more cells or modules of cells (e.g., 121A-121C). According to some embodiments, the cell(s) may include at least one lithium-metal electrode active material. In some embodiments, each module or each set of cells may have a single cell. Alternatively, each module or each set of cells may include multiple cells and may form a cell "block," or multiple modules or sets of cells may together form a cell block. Additionally, each cell (either in a battery, all the batteries in a battery pack, or in a set of cells) or set of cells may utilize the same electrochemistry. That is to say, in some embodiments, each cell may make use of the same anode active material and the same cathode active material.

In some embodiments, a multiplexing switch apparatus (e.g., 112) may include an array of switches, such as those further described in relation to FIGS. 9A and 9B below. Additionally, the multiplexing switch apparatus may be connected to each set of cells and/or to each cell individually. In some embodiments, the controller, such as 114, may use the multiplexing switch apparatus to selectively discharge the cells or sets of cells based on at least one criterion.

In some embodiments, the controller may use the multiplexing switch apparatus to selectively pulse discharge modules one at a time, sequentially moving through all modules within a battery.

For example, the criterion may include a sequence in which to discharge the strings, cells, or sets of cells, such as a predefined numbering or order associated with the strings or sets of cells (e.g., starting with a first string or set, switching through each string or set to the last string or set, and then starting over with the first string or set), and/or an order based on the string(s), cell(s)), or set(s) of cells with the next highest voltage or some other measure indicating the next strongest. The inventors have recognized and appreciated that using a sequence, especially a predefined numbering, may reduce the complexity of the operations performed by the system (e.g., a controller that is not a microprocessor) and may be usable by a wider array of systems.

In some embodiments, a controller, such as 114, may include at least one cell string controller (e.g., a cell string microcontroller) that monitors and manages at least one of the strings of cells. Additionally, the controller may include at least one battery management controller (e.g., a battery management microcontroller) configured to monitor and manage at least one parameter of at least one of the batteries. For example, a cell string microcontroller may monitor all the strings of the battery management system and control multiplexing between (and charging and discharging of) the strings in some embodiments. Additionally, a battery management microcontroller may monitor a single string and multiple battery management microcontrollers may communicate with a single cell string microcontroller, in some embodiments.

In some embodiments, the cell string microcontroller may include its own separate high voltage controller to connect and disconnect strings. Alternatively, individual battery management microcontrollers may include an integrated switch for their respective entire string that can turn string on or off via a command from the cell string microcontroller. In some embodiments, each battery management microcontroller may include at least one CAN bus and/or serial bus.

In some embodiments, the positions and roles of the battery management microcontroller(s) and cell string microcontroller may be interchanged. For example, a cell string microcontroller may determine the required state of a given string by monitoring its voltage and current, as well as by monitoring communication from a battery management microcontroller. In some embodiments, switching waveforms generated by the cell string microcontroller may ensure that overlap and dead band requirements for the switching is appropriate for the application of the battery management system (e.g., load requirements—the battery management system may include the switch multiplexing required to connect the cell strings in the series, parallel, or serial/parallel topology required to meet the voltage and current requirements of the application). Additionally, the battery management microcontroller may monitor and control the charging and discharging of the strings and cells to ensure the safe operation of all components. The battery management microcontroller may also communicate with the end user as well as internal production, calibration, and test equipment.

In some embodiments, the controller, such as 114, may use the multiplexing switch apparatus to transition between discharging of a first string of cells (e.g., 121) and discharging of a second string of cells (e.g., any of 122-124) while keeping a voltage difference between the first string and the second string below a threshold voltage difference. For example, the threshold voltage difference may be such that an in-rush current resulting from the transition is at most 15 amperes. In some embodiments, the threshold voltage difference may be such that the in-rush current resulting from the transition is at most 10 amperes or at most 8 amperes. In accordance with some embodiments, keeping the voltage difference between the strings below such a threshold can reduce voltage fluctuation, leading to improved or ensured performance for the load (e.g., of an electric vehicle) without relying on a pre-charge circuit or similar component and their associated cost, complexity, volume, and weight.

In some embodiments, the threshold voltage difference may be at most 8% of a maximum total voltage of the first string or the second string. In some embodiments, the threshold voltage difference may be at most 5% of the maximum total voltage of the first string or the second string. In some embodiments, the maximum total voltage of a string may be the maximum voltage for which the string is rated and/or that the string can have, which may be its voltage at full charge. In accordance with some embodiments, using such voltage difference thresholds can reduce voltage fluctuation, leading to improved or ensured performance for the load (e.g., of an electric vehicle) without relying on a pre-charge circuit or similar component and their associated cost, complexity, volume, and weight.

In some embodiments, the controller, such as 114, may use the multiplexing switch apparatus to transition between discharging of the first string of cells and discharging of the second string of cells while keeping an overall output voltage of the battery within a window. For example, the window may be plus or minus 10% of the output voltage demanded by the load, such as 60 volts. In accordance with some embodiments, keeping the overall output voltage within such a window can reduce voltage fluctuation, leading to improved or ensured performance (e.g., of an electric vehicle) without relying on a pre-charge circuit or similar component and their associated cost, complexity, volume, and weight.

In some embodiments, the controller, such as 114, may use the multiplexing switch apparatus to transition between discharging of the first string of cells and discharging of the second string of cells while keeping an in-rush current resulting from the transition below a threshold current. For example, the threshold current may be at most 15 amperes. In some embodiments, the threshold current may be at most 10 amperes.

In some embodiments, the threshold voltage difference is such that an in-rush current resulting from the transition may be at most 15 amperes. In some embodiments, the threshold voltage difference is such that an in-rush current resulting from the transition may be at most 10 amperes.

In accordance with some embodiments, keeping the in-rush current resulting from the transition below a threshold current can reduce voltage fluctuation, leading to improved or ensured performance (e.g., of an electric vehicle) without relying on a pre-charge circuit or similar component and their associated cost, complexity, volume, and weight.

In some embodiments, the controller may determine which string of cells to transition to from the first string based on a comparison between respective voltages of the two or more strings of cells. For example, the controller may transition to a string of cells having a lowest voltage difference, of the strings of cells being considered or available, from the first string, at a time of measurement while discharging solely the first string. In some embodiments, the controller may transition to a string of cells having the highest voltage of the strings of cells at the time of measurement. In some embodiments, the controller may transition to a string of cells having the lowest voltage of the strings of cells at the time of measurement. The inventors have recognized and appreciated that transitioning to the nearest voltage string may provide the best chance of the lowest delta in many situations, while being more computationally expensive, whereas transitioning to the highest or lowest voltage string may be a less computationally expensive but less accurate alternative.

In some embodiments, the controller may transition between discharging of the first string and discharging of the second string when a voltage of the first string decreases to a threshold voltage. For example, the threshold voltage may be such that an in-rush current resulting from the transition may be at most 15 amperes or 10 amperes, or such that the voltage difference between the first string and the second string may be at most 8% or 5% of a maximum total voltage of the first string or the second string. In accordance with some embodiments, transitioning to another string when the currently discharging string decreases to a threshold voltage can reduce voltage fluctuation, leading to improved or ensured performance (e.g., of an electric vehicle) without relying on a pre-charge circuit or similar component and their associated cost, complexity, volume, and weight.

In some embodiments, the controller may temporally overlap the discharge of the first string and the second string, similar to the overlap discussed herein regarding cell sets. In some embodiments, the controller may continue to provide power from the strings of cells during switching between different strings, similar to the continued provision of power discussed herein regarding cell sets. The inventors have recognized and appreciated that this temporal overlap of discharging and continuation of power may maintain the power requirements of the load even during transition between different strings of cells, which may further improve the cycle life of the cells compared to conventional techniques. Accordingly, multiple strings may discharge simultaneously during such an overlap. Additionally, such an overlap may provide smoother transition of voltage than has been possible with conventional techniques.

In some embodiments, the controller may use the multiplexing switch apparatus to control a duration of pulse discharge of at least one of the strings of cells based on at least one criterion. For example, a criterion may comprise a demand of a load (e.g., a power demand of the load), or a voltage difference between the at least one string of the strings of cells and at least one other string of the strings of cells.

In some embodiments, the criterion may comprise the demand of the load, and the controller may use the multiplexing switch apparatus to control the duration of the pulse discharge to be longer when the demand of the load decreases and to be shorter when the demand of the load increases. For example, if the power demand of the load is low (e.g., less than 50% of rated power), the pulse discharge may be controlled to run for 1 minute, whereas if the power demand is high (e.g., 90% or more of rated power), the pulse discharge may be controlled to be less than a second, or numerous strings may be discharged simultaneously in extremely high demand cases (such as an electric vehicle starting). In accordance with some embodiments, making pulse discharge duration inversely proportional to load demand can reduce voltage fluctuation, leading to improved or ensured performance (e.g., of an electric vehicle) without relying on a pre-charge circuit or similar component and their associated cost, complexity, volume, and weight.

In some embodiments, the controller, such as 114, may use the multiplexing switch apparatus to discharge a first string (e.g., 121) having a first voltage at a time of measurement while discharging the first string, and not discharge the second string yet, and then to discharge the second string as well, which may have a second voltage that is closest to the first voltage (at the same time of measurement, or at another time within 1 minute of the previous time) out of other strings being considered or available. In accordance with some embodiments, transitioning to the closest voltage string can reduce voltage fluctuation, leading to improved or ensured performance (e.g., of an electric vehicle) without relying on a pre-charge circuit or similar component and their associated cost, complexity, volume, and weight.

In some embodiments, the criterion may be context-sensitive, such as by considering any one or more of the following: a duration of a connection between a load and a set of cells currently connected to the load (which may be at least 0.01 seconds in some embodiments), a delivered capacity at the connection, and the value of a function having one or more parameters. In certain embodiments, the criterion may not include a number of prior discharging steps of the set of cells.

In some embodiments, the function may have parameters such as any one or more of the following: a capacity accumulated over several connections between the load and the set of cells, the delivered capacity at the connection, a current of the set of cells, a voltage of the set of cells and/or of at least one other set of cells, a cutoff discharge voltage of the set of cells, a power of the set of cells, an energy of the set of cells, a number of charging or discharging steps of the set of cells, an impedance of the set of cells, a rate of voltage fading of the set of cells during the connection, a temperature of the set of cells, and a pressure of the set of cells (e.g., the pressure on the cell(s) from their physical enclosure, which may indicate cell capacity and is discussed further below). According to some embodiments, the delivered capacity at a single connection may be in the range from 0.01% of nominal capacity to 100% (e.g., 95%) of set nominal capacity.

In some embodiments, a sensor (e.g., 116) may measure the criterion and/or any of the parameters of the function. For example, the sensor may include a current sensor that measures the current in amperes of a given set of cells. It should be appreciated that the criterion may be plural or singular and may relate to the currently discharging set of cells and/or may determine the next set of cells.

In some embodiments, the controller (e.g., 114) may include one or more processors, which may be of whatever complexity is suitable for the application. For example, evaluating the function of the criterion in some embodiments may rely on a microprocessor forming part or all of the controller.

In some embodiments, the controller may use the multiplexing switch apparatus to selectively discharge and charge the cells or sets of cells at different, programmable rates. For example, the controller may use the multiplexing switch apparatus to selectively discharge the strings, cells, or sets of cells at a first rate at least 2 times higher than a second rate of charging the sets of cells (i.e., discharging twice as fast as charging). Alternatively or additionally, the first rate of discharging may be at least 4 times higher than the second rate of charging the sets of cells (i.e., discharging four times as fast as charging). The inventors have recognized and appreciated that such ratios of discharge rate to charge rate may improve the performance and cycle life of the cells.

According to some embodiments, the controller may temporally overlap the discharge of the sets of cells. For example, before a given cell or set of cells ceases discharging, another cell or set of cells may begin discharging. In some embodiments, the controller may continue to provide power from the sets of cells during switching between different sets. The inventors have recognized and appreciated that this temporal overlap of discharging and continuation of power may maintain the power requirements of the load even during transition between different cells or sets of cells, which may further improve the cycle life of the cell(s) compared to conventional techniques. Accordingly, multiple cells may discharge simultaneously during such an overlap. Additionally, such an overlap may provide smoother transition of voltage than has been possible with conventional techniques.

In some embodiments, the load may be at least one component of a vehicle. The vehicle may be any suitable vehicle, adapted for travel on land, sea, and/or air. For example, the vehicle may be an automobile, truck, motorcycle, boat, helicopter, airplane, and/or any other suitable type of vehicle.

In some embodiments, the electrochemical cells and batteries (e.g., rechargeable batteries) described in this disclosure can be used to provide power to an electric vehicle or otherwise be incorporated into an electric vehicle. As a non-limiting example, stacks of electrochemical cells and/or batteries described in this disclosure (e.g., comprising lithium metal and/or lithium alloy electrochemical cells, phase change materials, and/or multiplexing switch apparatuses) can, in certain embodiments, be used to provide power to a drive train of an electric vehicle. The vehicle may be any suitable vehicle, adapted for travel on land, sea, and/or air. For example, the vehicle may be an automobile, truck, motorcycle, boat, helicopter, airplane, and/or any other suitable type of vehicle.

Alternatively or additionally, the controller may use the multiplexing switch apparatus (e.g., 112) to connect the sets of cells to a load in a topology employed or required by the load.

In some embodiments, the controller may use the multiplexing switch apparatus (e.g., 112) to isolate a single set of cells for discharging while other sets of cells are not discharging. Alternatively or additionally, a single cell may be isolated at a time. For example, the controller may use the multiplexing switch apparatus to isolate a single set of cells or a single cell for discharging while the other cells or sets of cells are not discharging. For a given cycle, each cell may be discharged once before any cell is discharged twice, according to some embodiments (e.g., where sequential discharging is used, but not limited to such embodiments).

As for charging, in some embodiments the controller may use the multiplexing switch apparatus to charge the sets of cells, and/or cells within a set, in parallel. For example, all the cells in the cell block, battery, or batteries may be charged in parallel at a rate one-fourth of the rate of discharge.

Figure 1D:
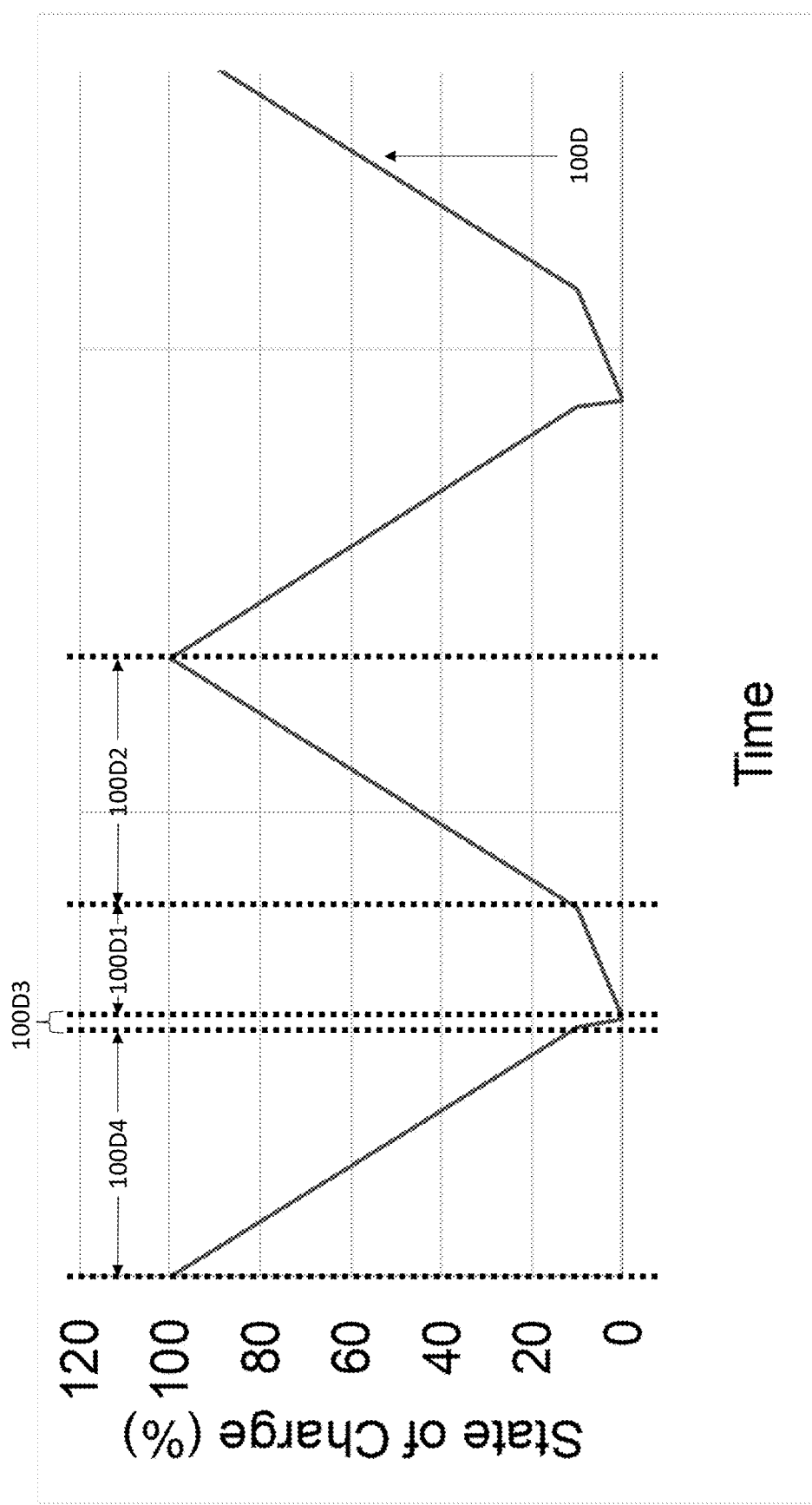
FIG. 1D is a charge-time graph for a representative electrochemical cell management system, according to some embodiments.

FIG. 1D is a charge-time graph 100D illustrating a charging scheme for a representative electrochemical cell management system, according to some embodiments. The graph 100D includes state of charge ranges 100D1, 100D2, 100D3, and 100D4.

In some embodiments, during a charging step, a cell may be charged over a first SOC range 100D1 having breadth of at least 2% at a first charging rate, and also during the charging step, the cell may be charged, over a second state of charge 100D2 range having breadth of at least 2%, at a second charging rate. Additionally, during a discharging step, the cell may be discharged, over a third state of charge range 100D3 having breadth of at least 2%, at a first discharging rate that is at least 2 times the first (in 100D1) or second (in 100D2) charging rate, and also during the discharging step, the cell may be discharged, over a fourth state of charge range 100D4 having breadth of at least 2%, at a second discharging rate that is less than 2 times the first (in 100D1) or second (in 100D2) charging rate.

In some embodiments, during a charging step, a cell may be charged over a first SOC range 100D1 having breadth of at least 2% at a first charging rate, and also during the charging step, the cell may be charged, over a second state of charge 100D2 range having breadth of at least 2%, at a second charging rate. Additionally, during a discharging step, the cell may be discharged, over a third state of charge range 100D3 having breadth of at least 2%, at a first discharging rate that is at least 2 times the first charging rate (in 100D1), and also during the discharging step, the cell may be discharged, over a fourth state of charge range 100D4 having breadth of at least 2%, at a second discharging rate that is less than 2 times the first charging rate (in 100D1).

In some embodiments, during a charging step, a cell may be charged over a first SOC range 100D1 having breadth of at least 2% at a first charging rate, and also during the charging step, the cell may be charged, over a second state of charge 100D2 range having breadth of at least 2%, at a second charging rate. Additionally, during a discharging step, the cell may be discharged, over a third state of charge range 100D3 having breadth of at least 2%, at a first discharging rate that is at least 2 times the second charging rate (in 100D2), and also during the discharging step, the cell may be discharged, over a fourth state of charge range

100D4 having breadth of at least 2%, at a second discharging rate that is less than 2 times the second charging rate (in 100D2).

In some embodiments, during a charging step, a cell may be charged over a first SOC range 100D1 having breadth of at least 2% at a first charging rate, and also during the charging step, the cell may be charged, over a second state of charge 100D2 range having breadth of at least 2%, at a second charging rate. Additionally, during a discharging step, the cell may be discharged, over a third state of charge range 100D3 having breadth of at least 2%, at a first discharging rate that is at least 2 times the first charging rate (in 100D1), and also during the discharging step, the cell may be discharged, over a fourth state of charge range 100D4 having breadth of at least 2%, at a second discharging rate that is less than 2 times the second charging rate (in 100D2).

In some embodiments, during a charging step, a cell may be charged over a first SOC range 100D1 having breadth of at least 2% at a first charging rate, and also during the charging step, the cell may be charged, over a second state of charge 100D2 range having breadth of at least 2%, at a second charging rate. Additionally, during a discharging step, the cell may be discharged, over a third state of charge range 100D3 having breadth of at least 2%, at a first discharging rate that is at least 2 times the second charging rate (in 100D2), and also during the discharging step, the cell may be discharged, over a fourth state of charge range 100D4 having breadth of at least 2%, at a second discharging rate that is less than 2 times the first charging rate (in 100D1).

In some embodiments, during a discharging step, the cell may be discharged, over a third state of charge range 100D3 having breadth of at least 2%, at a first discharging rate, and also during the discharging step, the cell may be discharged, over a fourth state of charge range 100D4 having breadth of at least 2%, at a second discharging rate. In some embodiments, the first discharging rate (in 100D3) may be at least 2 times the corresponding charging rate, and the second discharging rate (in 100D4) may be less than 2 times the corresponding charging rate. In some embodiments, the corresponding charging rate may be a charging rate over at least a SOC range of a previous or a later charging step. For example, the corresponding charging rate may be a charging rate over at least a SOC range of the immediately preceding charging step. In some embodiments, the breadth of that SOC range is 100%. In some embodiments, the breadth of that SOC range is at most 90%. In some embodiments, the breadth of that SOC range is at most 80%. In some embodiments, the breadth of that SOC range is at most 70%. In some embodiments, the breadth of that SOC range is at most 60%. In some embodiments, the breadth of that SOC range is at most 50%. In some embodiments, the breadth of that SOC range is at most 40%. In some embodiments, the breadth of that SOC range is at most 30%. In some embodiments, the breadth of that SOC range is at most 20%. In some embodiments, the breadth of that SOC range is at most 10%. For example, that SOC range may be some or all of 100D1. Alternatively, that SOC range may be some or all of 100D2 or any combination of SOC ranges, such as the corresponding charging rate being an average of the charging rates over 100D1 and 100D2. In some embodiments, the controller may analyze any number of previous charging steps and perform the discharge in response to that analysis.

In some embodiments, during a charging step, a cell may be charged over a first SOC range 100D1 having breadth of at least 2% at a first charging rate, and also during the charging step, the cell may be charged, over a second SOC range 100D2 having breadth of at least 2%, at a second charging rate. In some embodiments, the first charging rate (in 100D1) may be at most 0.5 times the corresponding discharging rate, and the second charging rate (in 100D2) may be greater than 0.5 times the corresponding discharging rate. In some embodiments, the corresponding discharging rate may be a discharging rate over at least a SOC range of a previous or a later discharging step. For example, the corresponding discharging rate may be a discharging rate over at least a SOC range of the immediately preceding discharging step. In some embodiments, the breadth of that SOC range is at most 40%. In some embodiments, the breadth of that SOC range is at most 30%. In some embodiments, the breadth of that SOC range is at most 20%. In some embodiments, the breadth of that SOC range is at most 10%. For example, that SOC range may be some or all of 100D4. Alternatively, that SOC range may be some or all of 100D3 or any combination of SOC ranges, such as the corresponding discharging rate being an average of the discharging rates over 100D3 and 100D4. In some embodiments, the controller may analyze any number of previous discharging steps and perform the charge in response to that analysis.

FIG. 1D shows an example in which, outside specific SOC ranges, the rate ratios are radically different and not necessarily beneficial to cell health, but inside these specific SOC ranges, the rate ratios are beneficial to cell health. For example, as illustrated in FIG. 1D, the rate ratio(s) between SOC ranges 100D4 and 100D2 do not satisfy rate ratio(s) beneficial to cell health (such as the discharging rate being at least 2 times or 4 times an average charging rate, whereas in this example discharging and charging rates appear to be nearly symmetrical), whereas the rate ratio(s) between SOC ranges 100D3 and 100D1 do satisfy such beneficial rate ratio(s).

In some embodiments, these SOC ranges can be in various orders temporally. For example, the second SOC range may occur before the first SOC range. Alternatively, the second SOC range may occur after the first SOC range. In some embodiments, the fourth SOC range may occur before the third SOC range. Alternatively, the fourth SOC range may occur after the third state of charge range.

In some embodiments, the breadth of the first SOC range 100D1 is at most 40%. In some embodiments, the breadth of the first SOC range is at most 30%. In some embodiments, the breadth of the first SOC range is at most 20%. In some embodiments, the breadth of the first SOC range is at most 10%.

In some embodiments, the breadth of the second SOC range is at most 40%. In some embodiments, the breadth of the second SOC range is at most 30%. In some embodiments, the breadth of the second SOC range is at most 20%. In some embodiments, the breadth of the second SOC range is at most 10%.

In some embodiments, the breadth of the third SOC range is at most 40%. In some embodiments, the breadth of the third SOC range is at most 30%. In some embodiments, the breadth of the third SOC range is at most 20%. In some embodiments, the breadth of the third SOC range is at most 10%.

In some embodiments, the breadth of the fourth SOC range is at most 40%. In some embodiments, the breadth of the fourth SOC range is at most 30%. In some embodiments, the breadth of the fourth SOC range is at most 20%. In some embodiments, the breadth of the fourth SOC range is at most 10%.

Figure 1E:
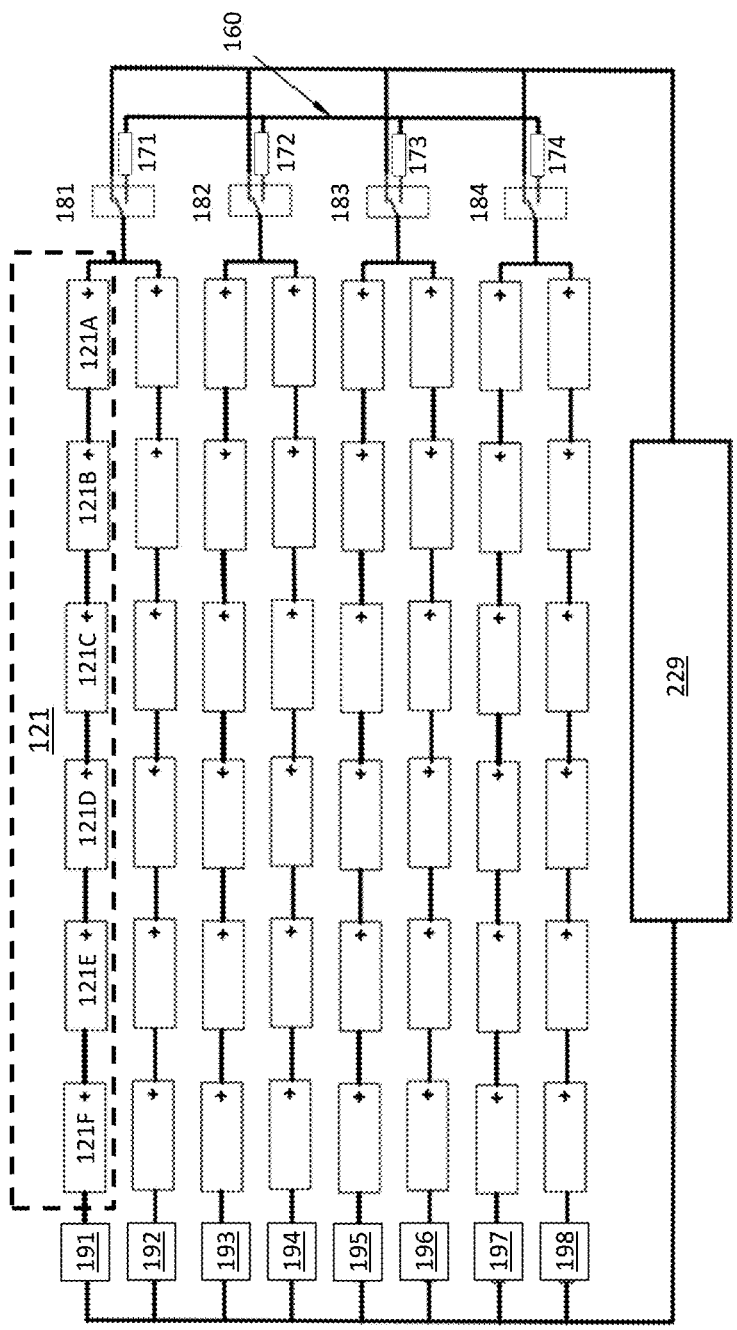
FIG. 1E is a block diagram illustrating a representative battery management system with cell strings, according to some embodiments.

FIG. 1E depicts a representative battery management system with cell strings. In some embodiments, a battery management system may include a collection of strings (e.g., 121) of cells or modules (e.g., 121A-F) with cells within them. For example, each string of cells may include two or more cells, either arranged separately or grouped together in modules. In some embodiments, the two or more strings of cells may include a multiple of four strings of cells, such as 8 strings, 12 strings, 16 strings, and so on.

In some embodiments, a representative battery management system may include an array of switches (e.g., 181-184) disposed between one or more strings, an input/output bus connected to a load (e.g., 229), and a balance such as a balance rail (e.g., 160), and the switches may be connected to each of these. For example, a switch (e.g., 181) may be connected permanently to a string (e.g., 121) and be switchably connected to an input/output bus and a balance (e.g., 160). In some embodiments, the switch array may connect or isolate cell strings from the battery pack input/output bus, it may connect cell strings to or disconnect cell strings from a balance resistor that may share the balance rail with other strings.

In some embodiments, a balance rail may include resistors (e.g., 171-174) disposed between the switches and the main balance rail. In some embodiments, the switches may be part of a multiplexing switch apparatus (e.g., 112 shown in FIG. 1A). Additionally, the balance rail may be connected to the multiplexing switch apparatus. In some embodiments, a balance rail may not be included or needed, such as in the system shown in FIG. 17B.

In some embodiments, a representative battery management system may include fuses (e.g., 191-198), for example on the ends of strings opposite the switches.

In some embodiments, a representative battery management system may include at least one controller (e.g., 114 shown in FIG. 1A) that may use a multiplexing switch apparatus (e.g., 112 shown in FIG. 1A) to selectively discharge the strings of cells. Additionally, the controller may use the multiplexing switch apparatus to selectively connect or disconnect the strings of cells to the balance rail.

In some embodiments, at least one of the strings of cells may have a nominal voltage of at least 60 volts, which may classify it as "high voltage." Alternatively or additionally, at least one of the strings may have a nominal voltage of between 200 volts and 2000 volts.

In some embodiments, a controller (e.g., 114 shown in FIG. 1A) may use the multiplexing switch apparatus (e.g., 112 shown in FIG. 1A) to maintain an equivalent state of charge between the strings of cells by adjusting switching times and/or switching states. In some embodiments, the controller may use the multiplexing switch apparatus to keep at least one of the strings of cells connected to the balance rail during use of the at least one battery. In some embodiments, all strings of cells may be disconnected when the battery management system is shipped or in storage.

FIGS. 1F-1J depict a representative battery management system during a representative charge sequence. In some embodiments, a battery management system may include a collection of sets or strings (e.g., 121) of cells or modules with cells within them, as described herein. In some embodiments, a representative battery management system may include an array of switches (e.g., 181-184) disposed between one or more strings and a balance such as a balance rail (e.g., 160), and the switches may be connected to each of these, as described herein. In some embodiments, a balance rail may include resistors (e.g., 171-174) disposed between the switches and the main balance rail. In some embodiments, the switches may be part of a multiplexing switch apparatus (e.g., 112 shown in FIG. 1A). Additionally, the balance rail may be connected to the multiplexing switch apparatus.

Figure 1F:
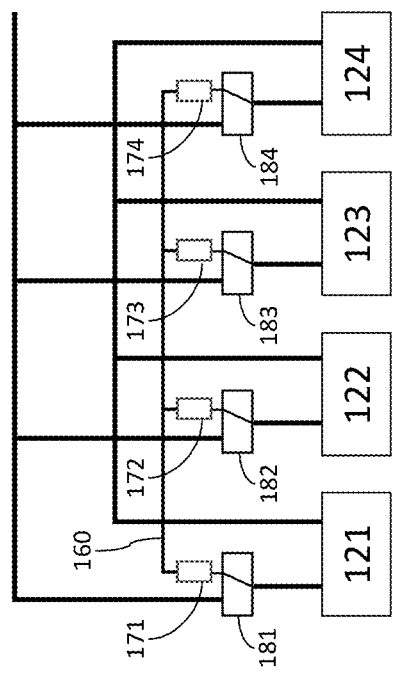
FIGS. 1F-1J are block diagrams illustrating a representative battery management system during a representative charge sequence, according to some embodiments.
Figure 1G:
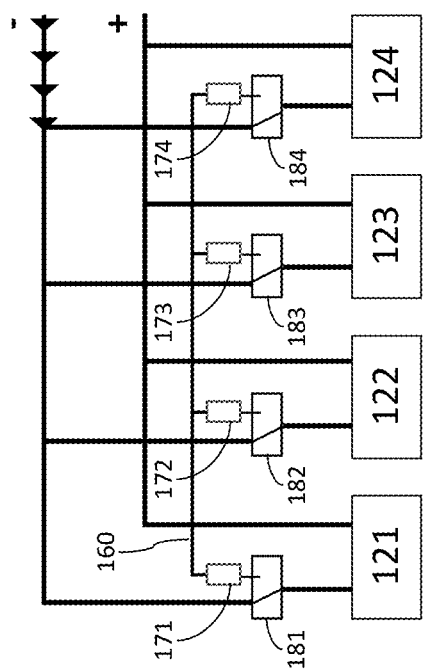
Figure 1H:
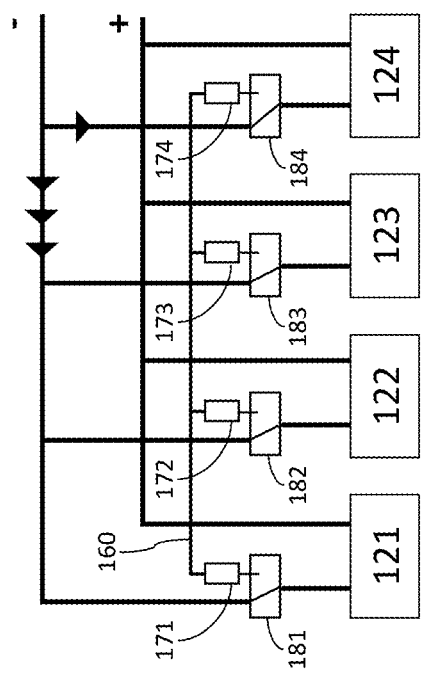
Figure 1I:
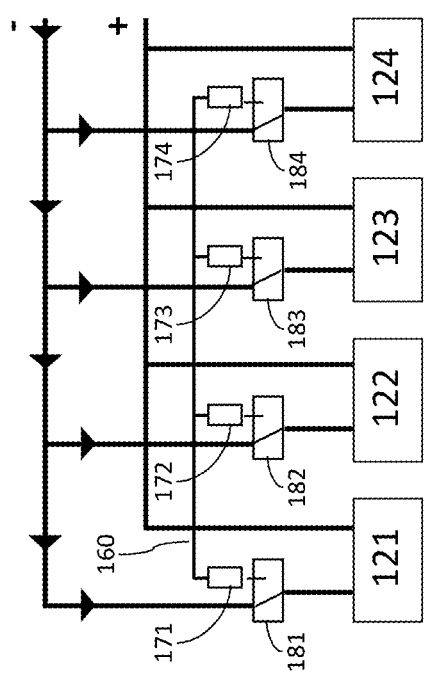
Figure 1J:
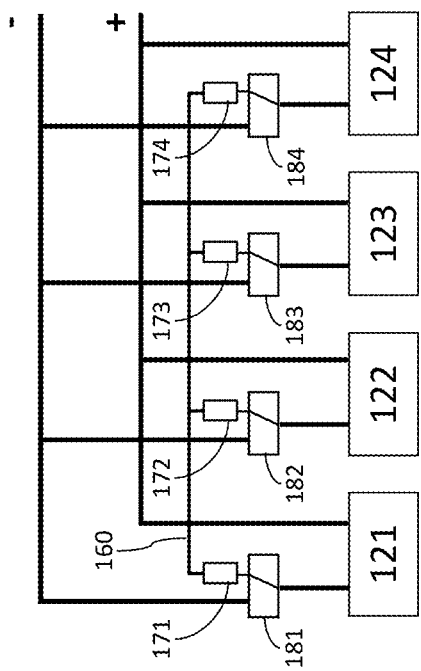

FIG. 1F depicts the battery management system starting in idle mode, with all switches (e.g., 181-184) connected to the balance rail (e.g., 160). FIG. 1G depicts the battery management system at start-of-charge, where the switches may move from balance rail to the negative bus in some embodiments. In some embodiments, energy for charging may enter negative circuitry, charging all cell sets or strings simultaneously. FIG. 1H depicts energy charging all cell sets or strings at once. FIG. 1I depicts energy charging all cell sets or strings at once, at a later stage such as when the cell sets or strings are charged to approximately 25% to 50% each. FIG. 1J depicts the battery management system at completion of charging (e.g., the cell sets or strings are charged to approximately 100%), when the switches may be connected to the balance rail in some embodiments (e.g., the switches may move from negative bus to balance rail).

Figure 1K:
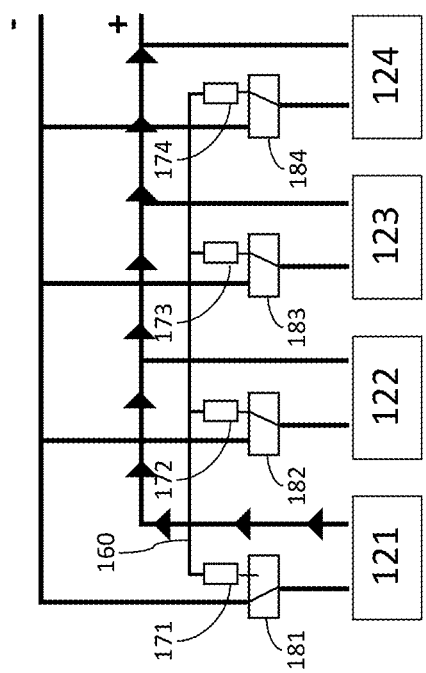
FIGS. 1K-1N are block diagrams illustrating a representative battery management system during a representative discharge sequence, according to some embodiments.
Figure 1L:
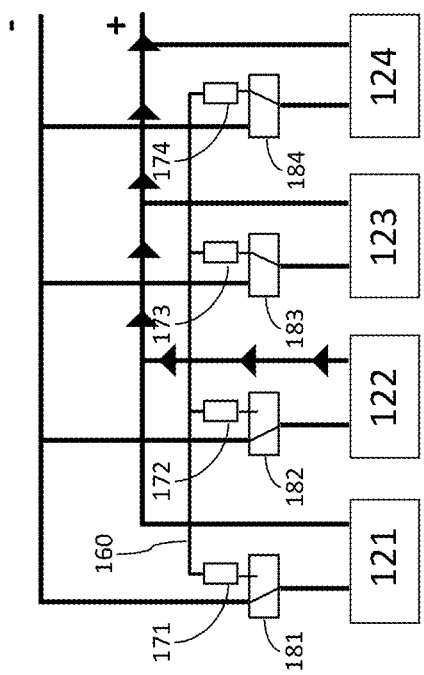
Figure 1M:
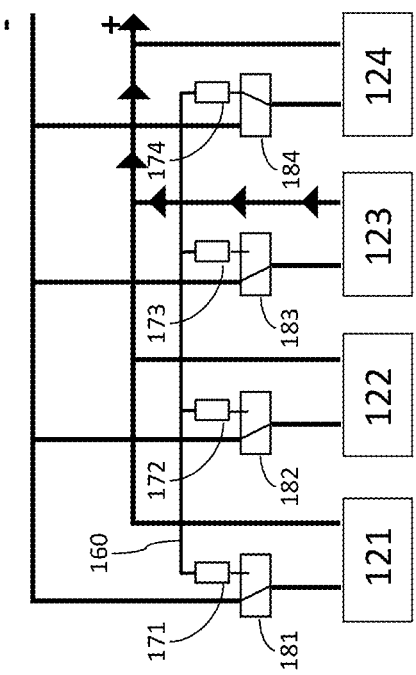
Figure 1N:
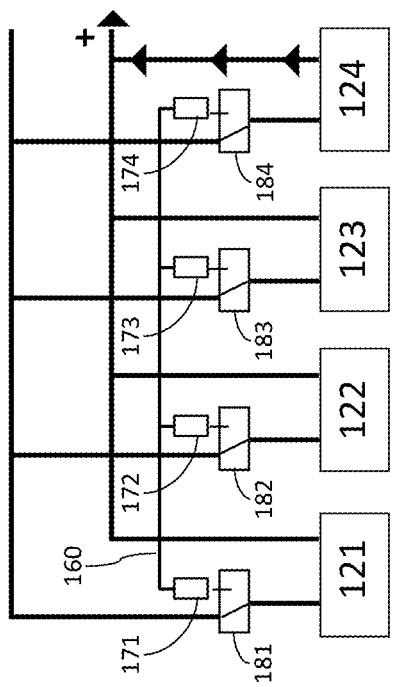

FIGS. 1K-1N depicts the representative battery management system during a representative discharge sequence. FIG. 1K depicts the representative battery management system when, for example, one cell set or string may be discharged (e.g., via pulse discharge) for 10 to 30 seconds while other cell sets or strings are idle. FIG. 1L depicts the representative battery management system after discharge on the first cell set or string, when a next cell set or string in series is discharged for 10 to 30 seconds while other cell sets or strings are idle. FIG. 1M depicts the representative battery management system when, for example, a next cell set or string may be discharged for 10 to 30 seconds while other cell sets or strings are idle. FIG. 1N depicts the representative battery management system when, for example, a final cell set or string may be discharged for 10 to 30 seconds while other cell sets or strings are idle. In some embodiments, discharge may continue until a charge sequence is needed, which may occur at various levels of charge.

Figure 2A:
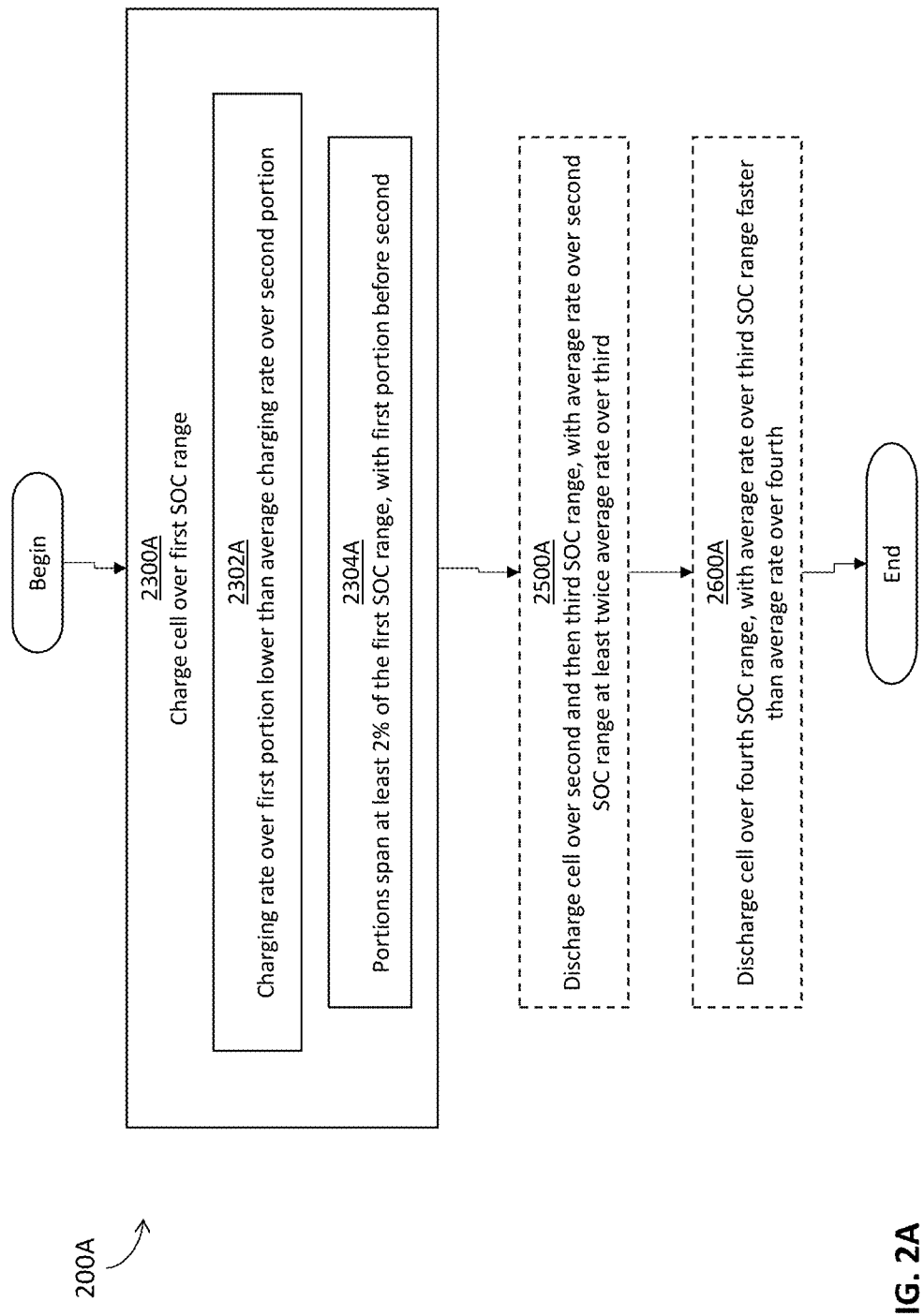
FIG. 2A is a flow chart depicting a representative process for managing an electrochemical cell, according to some embodiments.

FIG. 2A is a representative high-level process 200A of managing an electrochemical cell, according to some embodiments. The electrochemical cell can be, for example, the electrochemical cell 121A of exemplary FIG. 1A. The acts of representative process 200A are described in detail in the paragraphs that follow.

In some embodiments, representative process 200A may include act 2300A, wherein an electrochemical cell is controlled such that the cell may be charged over a first state of charge range having breadth of at least 20%.

In some embodiments, the breadth of the first state of charge range is at most 50%. In some embodiments, the breadth of the first state of charge range is at most 30%. In some embodiments, the breadth of the first state of charge range is at most 20%. In some embodiments, the first state of charge range has a lowest value of 5% state of charge or less. In some embodiments, the first state of charge range may be uninterrupted by a discharging step.

In some embodiments, the first state of charge range comprises a single charging step. In certain embodiments, the first state of charge range is separated by no more than 25 (or no more than 15, no more than 10, no more than 5, no more than 3, no more than 2, or no more than 1) discharging steps performed over a state of charge range having breadth of at least 5%.

In some embodiments, the charging rate over the first state of charge range is controlled based on at least one monitored characteristic of the cell comprising cell impedance and/or cell resistance.

In some embodiments, act 2300A may include act 2302A, wherein the average charging rate over a first portion of the first state of charge range may be lower than the average charging rate over a second portion of the first state of charge range. In some embodiments, act 2300A may include act 2304A, wherein the first portion may span at least 2% of the first state of charge range and the second portion may span at least 2% of the first state of charge range. In some embodiments, the first portion may span at most 98% of the first state of charge range and the second portion may span at most 98% of the first state of charge range.

In some embodiments, the first portion may occur before the second portion. For example, the charging of the first portion of the first state of charge range may occur before the charging of the second portion of the first state of charge range.

In some embodiments, representative process 200A may then proceed to act 2500A, wherein the electrochemical cell is controlled such that the cell may be discharged over a second state of charge range having breadth of at least 2%, and then discharged over a third state of charge range having breadth of at least 2%. In some embodiments, the second state of charge range may have a breadth of at most 90%, or at most 50%, or at most 30%, or at most 20%. In some embodiments, the third state of charge range may have a breadth of at most 90%, or at most 50%, or at most 30%, or at most 20%. In some embodiments, the average discharging rate over the second state of charge range may be higher than the average discharging rate over the third state of charge range. In some embodiments, the average discharging rate over the second state of charge range may be at least 2 times the average discharging rate over the third state of charge range.

In some embodiments, the third state of charge range and the fourth state of charge range are part of the same discharging step. In certain embodiments, the third state of charge range and the fourth state of charge range are separated by no more than 25 (or no more than 15, no more than 10, no more than 5, no more than 3, no more than 2, or no more than 1) charging steps performed over a state of charge range having breadth of at least 5%.

In some embodiments, representative process 200A may then proceed to act 2600A, wherein the electrochemical cell may be controlled such that the cell may be discharged over a fourth state of charge range having breadth of at least 2%. In some embodiments, the fourth state of charge range may have a breadth of at most 90%, or at most 50%, or at most 30%, or at most 20%. In some embodiments, the average discharging rate over the third state of charge range may be higher than the average discharging rate over the fourth state of charge range.

For example, the electrochemical cell may be controlled such that the cell may be discharged over a second state of charge range having breadth of at least 2%, then discharged over a third state of charge range having breadth of at least 2%, and then discharged over a fourth state of charge range having breadth of at least 2%. In some embodiments, the second state of charge range may have a breadth of at most 90%, or at most 50%, or at most 30%, or at most 20%. In some embodiments, the third state of charge range may have a breadth of at most 90%, or at most 50%, or at most 30%, or at most 20%. In some embodiments, the fourth state of charge range may have a breadth of at most 90%, or at most 50%, or at most 30%, or at most 20%.

In some embodiments, the cell is discharged over the third state of charge range after the cell is charged over the second state of charge range.

In some embodiments, the second state of charge range and the third state of charge range are part of the same discharging step. In certain embodiments, the second state of charge range and the third state of charge range are separated by no more than 25 (or no more than 15, no more than 10, no more than 5, no more than 3, no more than 2, or no more than 1) charging steps performed over a state of charge range having breadth of at least 5%.

In some embodiments, the third state of charge range and the fourth state of charge range are part of the same discharging step. In certain embodiments, the third state of charge range and the fourth state of charge range are separated by no more than 25 (or no more than 15, no more than 10, no more than 5, no more than 3, no more than 2, or no more than 1) charging steps performed over a state of charge range having breadth of at least 5%.

In some embodiments, the cell is charged or discharged as described in acts 2300A, 2500A, and/or 2600A (e.g., charged over the first state of charge range) based on a time interval, such as one set by a user. For example, a user may select how much time they want the battery pack to charge (e.g., when they want it to stop charging for use again, such as at a charging station for an electric vehicle) and the battery management system may change its algorithm accordingly. One example would be the user selecting 15 minutes of charging. In such an example, the controller may cause charging at constantly (or periodically) increasing charging rates to span the selected 15 minutes. The inventors have recognized and appreciated that controlling charging and/or discharging as described herein based on a selected time interval can provide a user with the experience and performance they need while still providing the cells with conditions that benefit their cycle life.

In some embodiments, the cell is charged or discharged as described in acts 2300A, 2500A, and/or 2600A (e.g., charged over the first state of charge range) based on a time of day, such as one set by a user or determined by the controller. For example, a user may select at what time they want the battery pack to be as close to fully charged as possible (e.g., when they want it to stop charging for use again, such as at a charging station for an electric vehicle) and the battery management system may change its algorithm accordingly. One example would be the user selecting 8:00 AM for the start of their commute to work. In such an example, the controller may cause charging at constantly (or periodically) increasing charging rates to span at least some portion of the time left until the set time of day. In some embodiments, the controller may learn the behavior of the user and set times itself based on the user and a collection of data regarding other users. The inventors have recognized and appreciated that controlling charging and/or discharging as described herein based on a time of day can provide a user with the experience and performance they need while still providing the cells with conditions that benefit their cycle life.

In some embodiments, the controller may determine the state of charge of the cell (e.g., for use in determining any of the above states of charge and ranges) based on the voltage of the cell. For example, certain voltages correspond to certain states of charge, depending on many factors, which may be known to the controller.

According to some embodiments, a controller (e.g., controller 114 of FIG. 1A) may perform acts 2300A, 2500A, and/or 2600A.

Some examples of some embodiments are provided in FIG. 2D and the description thereof below.

Figure 2B:
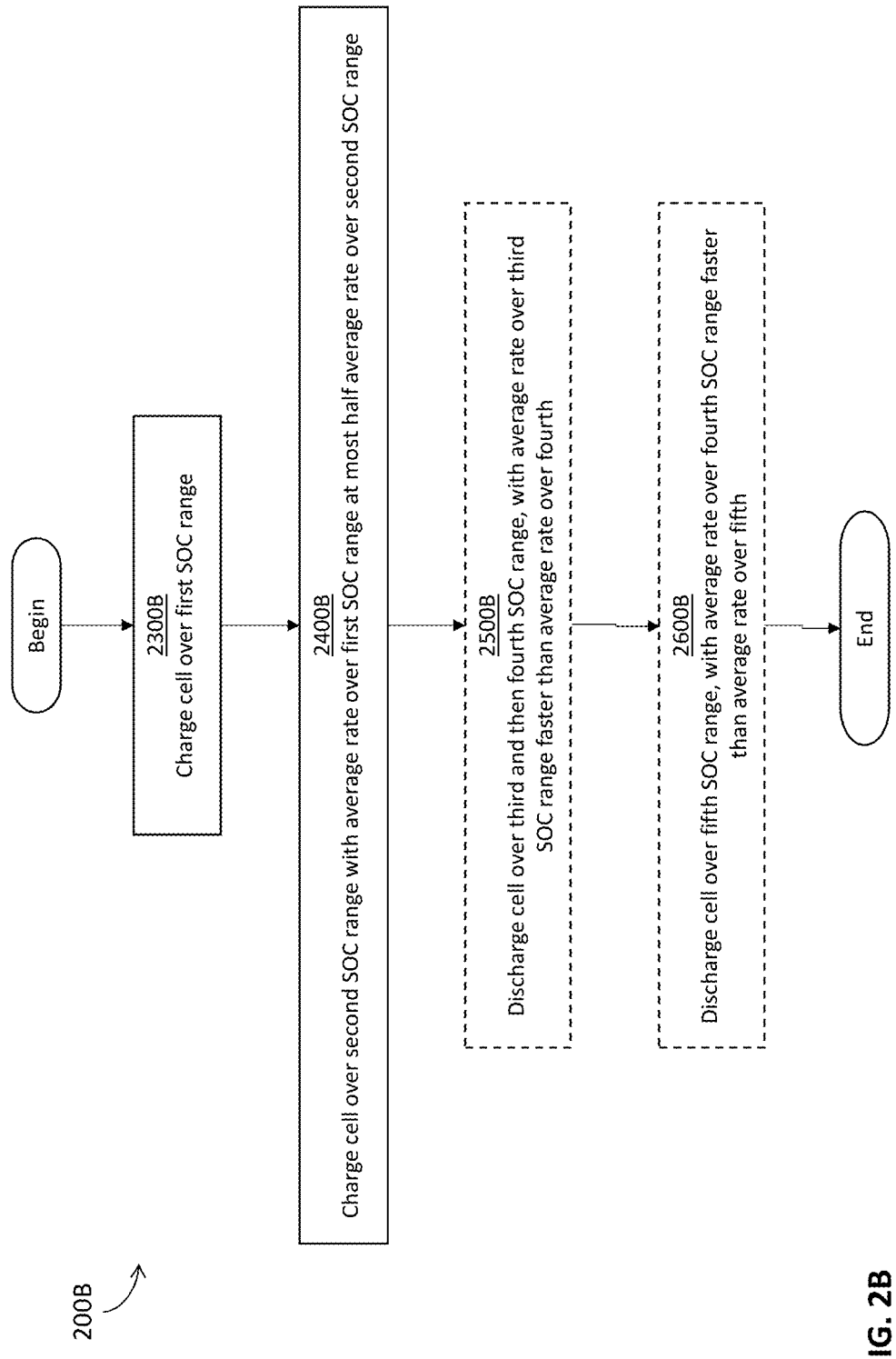
FIG. 2B is a flow chart depicting an additional representative process for managing an electrochemical cell, according to some embodiments.

FIG. 2B is a representative high-level process 200B of managing an electrochemical cell, according to some embodiments. The electrochemical cell can be, for example, the electrochemical cell 121A of exemplary FIG. 1A. The acts of representative process 200B are described in detail in the paragraphs that follow.

In some embodiments, representative process 200B may include act 2300B, wherein an electrochemical cell is controlled such that the cell may be charged over a first state of charge range having breadth of at least 2% and at most 90%, or at most 50%, or at most 30%, or at most 20%.

In some embodiments, the breadth of the first state of charge range is at most 50%. In some embodiments, the breadth of the first state of charge range is at most 30%. In some embodiments, the breadth of the first state of charge range is at most 20%. In some embodiments, the first state of charge range has a lowest value of 5% state of charge or less. In some embodiments, the first state of charge range may be uninterrupted by a discharging step. In some embodiments, the charging rate over the first state of charge range is controlled based on at least one monitored characteristic of the cell comprising cell impedance and/or cell resistance.

In some embodiments, representative process 200B may then proceed to act 2400B, wherein the electrochemical cell is controlled such that the cell may be charged over a second state of charge range. In some embodiments, the average charging rate over the first state of charge range may be at most 0.5 times the average charging rate over the second state of charge range. In some embodiments, the average charging rate over the first state of charge range may be at most 0.25 times the average charging rate over the second state of charge range.

In some embodiments, the first state of charge range and the second state of charge range are part of the same charging step. In certain embodiments, the first state of charge range and the second state of charge range are separated by no more than 25 (or no more than 15, no more than 10, no more than 5, no more than 3, no more than 2, or no more than 1) discharging steps performed over a state of charge range having breadth of at least 5%.

In some embodiments, representative process 200B may then proceed to act 2500B, wherein the electrochemical cell is controlled such that the cell may be discharged over a third state of charge range having breadth of at least 2%, and then discharged over a fourth state of charge range having breadth of at least 2%. In some embodiments, the third state of charge range may have a breadth of at most 90%, or at most 50%, or at most 30%, or at most 20%. In some embodiments, the fourth state of charge range may have a breadth of at most 90%, or at most 50%, or at most 30%, or at most 20%. In some embodiments, the average discharging rate over the third state of charge range may be higher than the average discharging rate over the fourth state of charge range. In some embodiments, the average discharging rate over the third state of charge range may be at least 2 times the average discharging rate over the fourth state of charge range.

In some embodiments, the third state of charge range and the fourth state of charge range are part of the same discharging step. In certain embodiments, the third state of charge range and the fourth state of charge range are separated by no more than 25 (or no more than 15, no more than 10, no more than 5, no more than 3, no more than 2, or no more than 1) charging steps performed over a state of charge range having breadth of at least 5%.

In some embodiments, representative process 200B may then proceed to act 2600B, wherein the electrochemical cell is controlled such that the cell may be discharged over a fifth state of charge range having breadth of at least 2%. In some embodiments, the fifth state of charge range may have a breadth of at most 90%, or at most 50%, or at most 30%, or at most 20%. In some embodiments, the average discharging rate over the second state of charge range may be higher than the average discharging rate over the third state of charge range. In some embodiments, the average discharging rate over the third state of charge range may be higher than the average discharging rate over the fourth state of charge range. In some embodiments, the average discharging rate over the fourth state of charge range may be higher than the average discharging rate over the fifth state of charge range.

In some embodiments, the fourth state of charge range and the fifth state of charge range are part of the same discharging step. In certain embodiments, the fourth state of charge range and the fifth state of charge range are separated by no more than 25 (or no more than 15, no more than 10, no more than 5, no more than 3, no more than 2, or no more than 1) charging steps performed over a state of charge range having breadth of at least 5%.

In some embodiments, the cell may be discharged over the third state of charge range after the cell is charged over the second state of charge range.

In some embodiments, the cell is charged or discharged as described in acts 2300B, 2400B, 2500B, and/or 2600B (e.g., charged over the first state of charge range) based on a time interval, such as one set by a user. For example, a user may select how much time they want the battery pack to charge (e.g., when they want it to stop charging for use again, such as at a charging station for an electric vehicle) and the battery management system may change its algorithm accordingly. One example would be the user selecting 15 minutes of charging. In such an example, the controller may cause charging at constantly (or periodically) increasing charging rates to span the selected 15 minutes. The inventors have recognized and appreciated that controlling charging and/or discharging as described herein based on a selected time interval can provide a user with the experience and performance they need while still providing the cells with conditions that benefit their cycle life.

In some embodiments, the cell is charged or discharged as described in acts 2300B, 2400B, 2500B, and/or 2600B (e.g., charged over the first state of charge range) based on a time of day, such as one set by a user or determined by the controller. For example, a user may select at what time they want the battery pack to be as close to fully charged as possible (e.g., when they want it to stop charging for use again, such as at a charging station for an electric vehicle) and the battery management system may change its algorithm accordingly. One example would be the user selecting 8:00 AM for the start of their commute to work. In such an example, the controller may cause charging at constantly (or periodically) increasing charging rates to span at least some portion of the time left until the set time of day. In some embodiments, the controller may learn the behavior of the user and set times itself based on the user and a collection of data regarding other users. The inventors have recognized and appreciated that controlling charging and/or discharging as described herein based on a time of day can provide a user with the experience and performance they need while still providing the cells with conditions that benefit their cycle life.

In some embodiments, the controller may determine the state of charge of the cell (e.g., for use in determining any of the above states of charge and ranges) based on the voltage of the cell. For example, certain voltages correspond to certain states of charge, depending on many factors, which may be known to the controller.

According to some embodiments, a controller (e.g., controller 114 of FIG. 1A) may perform acts 2300B, 2400B, 2500B, and/or 2600B.

Some examples of some embodiments are provided in FIG. 2D and the description thereof below.

Figure 2C:
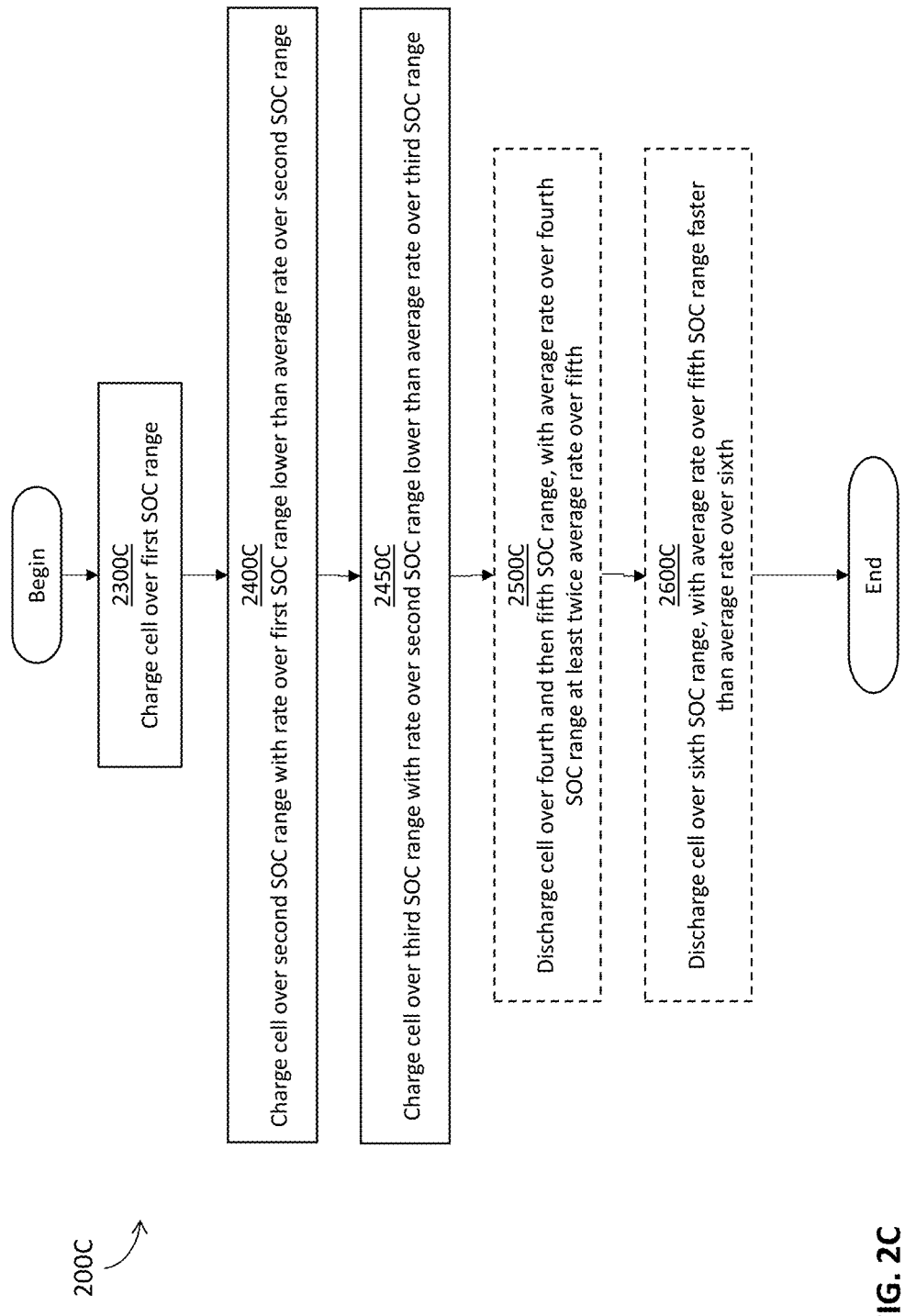
FIG. 2C is a flow chart depicting an additional representative process for managing an electrochemical cell, according to some embodiments.

FIG. 2C is a representative high-level process 200C of managing an electrochemical cell, according to some embodiments. The electrochemical cell can be, for example, the electrochemical cell 121A of exemplary FIG. 1A. The acts of representative process 200C are described in detail in the paragraphs that follow.

In some embodiments, representative process 200C may include act 2300C, wherein an electrochemical cell is controlled such that the cell may be charged over a first state of charge range having breadth of at least 2% and at most 40%, or at most 50%, or at most 30%, or at most 20%.

In some embodiments, the breadth of the first state of charge range is at most 30%. In some embodiments, the breadth of the first state of charge range is at most 20%. In some embodiments, the first state of charge range has a lowest value of 5% state of charge or less. In some embodiments, the first state of charge range may be uninterrupted by a discharging step. In some embodiments, the charging rate over the first state of charge range is controlled based on at least one monitored characteristic of the cell comprising cell impedance and/or cell resistance.

In some embodiments, representative process 200C may then proceed to act 2400C, wherein the electrochemical cell is controlled such that the cell may be charged over a second state of charge range having breadth of at least 2%. In some embodiments, the second state of charge range may have a breadth of at most 90%, or at most 50%, or at most 30%, or at most 20%. In some embodiments, the charging rate over the first state of charge range may be lower than the average charging rate over the second state of charge range. In some embodiments, the charging rate over the first state of charge range may be an average charging rate. In some embodiments, the charging rate over the first state of charge range may be a constant charging rate.

In some embodiments, the first state of charge range and the second state of charge range are part of the same charging step. In certain embodiments, the first state of charge range and the second state of charge range are separated by no more than 25 (or no more than 15, no more than 10, no more than 5, no more than 3, no more than 2, or no more than 1) discharging steps performed over a state of charge range having breadth of at least 5%.

In some embodiments, representative process 200C may then proceed to act 2450C, wherein the electrochemical cell is controlled such that the cell may be charged over a third state of charge range having breadth of at least 2%. In some embodiments, the third state of charge range may have a breadth of at most 90%, or at most 50%, or at most 30%, or at most 20%. In some embodiments, the average charging rate over the second state of charge range may be lower than the average charging rate over the third state of charge range.

In some embodiments, the second state of charge range and the third state of charge range are part of the same charging step. In certain embodiments, the second state of charge range and the third state of charge range are separated by no more than 25 (or no more than 15, no more than 10, no more than 5, no more than 3, no more than 2, or no more than 1) discharging steps performed over a state of charge range having breadth of at least 5%.

In some embodiments, representative process 200C may then proceed to act 2500C, wherein the electrochemical cell is controlled such that the cell may be discharged over a fourth state of charge range having breadth of at least 2%, and then discharged over a fifth state of charge range having breadth of at least 2%. In some embodiments, the fourth state of charge range may have a breadth of at most 90%, or at most 50%, or at most 30%, or at most 20%. In some embodiments, the fifth state of charge range may have a breadth of at most 90%, or at most 50%, or at most 30%, or at most 20%. In some embodiments, the average discharging rate over the fourth state of charge range may be higher than the average discharging rate over the fifth state of charge range. In some embodiments, the average discharging rate over the fourth state of charge range may be at least 2 times the average discharging rate over the fifth state of charge range.

In some embodiments, the fourth state of charge range and the fifth state of charge range are part of the same discharging step. In certain embodiments, the fourth state of charge range and the fifth state of charge range are separated by no more than 25 (or no more than 15, no more than 10, no more than 5, no more than 3, no more than 2, or no more than 1) charging steps performed over a state of charge range having breadth of at least 5%.

In some embodiments, representative process 200C may then proceed to act 2600C, wherein the electrochemical cell is controlled such that the cell may be discharged over a sixth state of charge range having breadth of at least 2%. In some embodiments, the sixth state of charge range may have a breadth of at most 90%, or at most 50%, or at most 30%, or at most 20%. In some embodiments, the average discharging rate over the fifth state of charge range may be higher than the average discharging rate over the sixth state of charge range.

In some embodiments, the fifth state of charge range and the sixth state of charge range are part of the same discharging step. In certain embodiments, the fifth state of charge range and the sixth state of charge range are separated by no more than 25 (or no more than 15, no more than 10, no more than 5, no more than 3, no more than 2, or no more than 1) charging steps performed over a state of charge range having breadth of at least 5%.

In some embodiments, the cell may be discharged over the fourth state of charge range after the cell is charged over the third state of charge range.

In some embodiments, the cell is charged or discharged as described in acts 2300C, 2400C, 2450C, 2500C, and/or 2600C (e.g., charged over the first state of charge range) based on a time interval, such as one set by a user. For example, a user may select how much time they want the battery pack to charge (e.g., when they want it to stop charging for use again, such as at a charging station for an electric vehicle) and the battery management system may change its algorithm accordingly. One example would be the user selecting 15 minutes of charging. In such an example, the controller may cause charging at constantly (or periodically) increasing charging rates to span the selected 15 minutes. The inventors have recognized and appreciated that controlling charging and/or discharging as described herein based on a selected time interval can provide a user with the experience and performance they need while still providing the cells with conditions that benefit their cycle life.

In some embodiments, the cell is charged or discharged as described in acts 2300C, 2400C, 2450C, 2500C, and/or 2600C (e.g., charged over the first state of charge range) based on a time of day, such as one set by a user or determined by the controller. For example, a user may select at what time they want the battery pack to be as close to fully charged as possible (e.g., when they want it to stop charging for use again, such as at a charging station for an electric vehicle) and the battery management system may change its algorithm accordingly. One example would be the user selecting 8:00 AM for the start of their commute to work. In such an example, the controller may cause charging at constantly (or periodically) increasing charging rates to span at least some portion of the time left until the set time of day. In some embodiments, the controller may learn the behavior of the user and set times itself based on the user and a collection of data regarding other users. The inventors have recognized and appreciated that controlling charging and/or discharging as described herein based on a time of day can provide a user with the experience and performance they need while still providing the cells with conditions that benefit their cycle life.

In some embodiments, the controller may determine the state of charge of the cell (e.g., for use in determining any of the above states of charge and ranges) based on the voltage of the cell. For example, certain voltages correspond to certain states of charge, depending on many factors, which may be known to the controller.

According to some embodiments, a controller (e.g., controller 114 of FIG. 1A) may perform acts 2300C, 2400C, 2450C, 2500C, and/or 2600C.

Some examples of some embodiments are provided in FIG. 2D and the description thereof below.

Figure 2D:
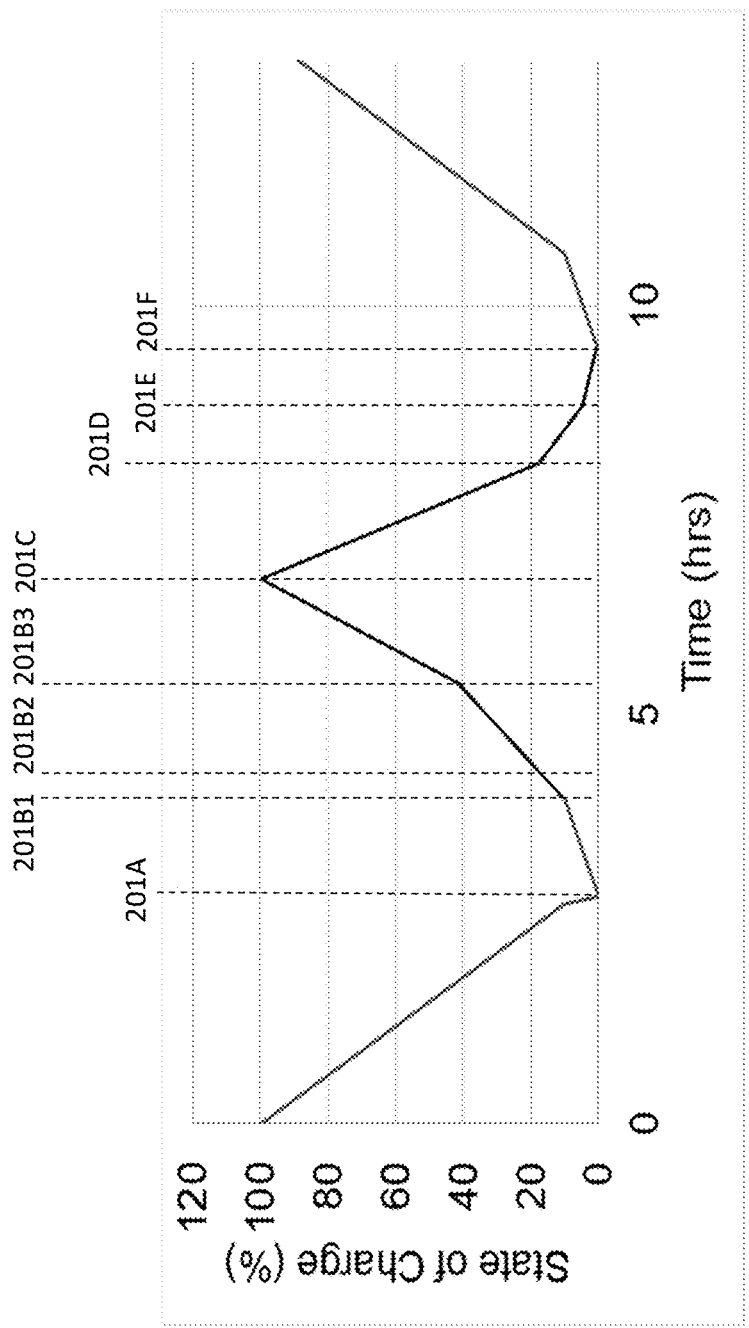
FIG. 2D is a charge-time graph for a representative electrochemical cell management system, according to some embodiments.

FIG. 2D is an exemplary charge-time graph for a representative electrochemical cell management system managing an electrochemical cell (e.g., electrochemical cell 121A) in relation to the methods described in FIGS. 2A-2C.

One example of a first state of charge range of FIG. 2A is shown in FIG. 2D, from point 201A to 201B2. One example of a first portion of such a range of FIG. 2A is shown in FIG. 2D, from point 201A to 201B1. One example of a second portion of such a range of FIG. 2A is shown in FIG. 2D, from point 201B1 to 201B2. As FIG. 2D illustrates, the cell is charged from 201A to 201B1, then charged from 201B1 to 201C at a faster rate, before another cycle of discharging and charging begins. In this example, the first state of charge range from 201A to 201B2 is approximately 0% to 20%, having breadth of 20%. In this example, the first portion of the first state of charge range from 201A to 201B1 is approximately 0% to 10%, having breadth of 10%. In this example, the second portion of the first state of charge range from 201B1 to 201B2 is approximately 10% to 20%, having breadth of 10%.

One example of a second state of charge range of FIG. 2A is shown in FIG. 2D, from point 201C to 201D. One example of a third state of charge range of FIG. 2A is shown in FIG. 2D, from point 201D to 201E. One example of a fourth state of charge range of FIG. 2A is shown in FIG. 2D, from point 201E to 201F. As FIG. 2D illustrates, the cell is discharged from 201C to 201D, then discharged from 201D to 201E at a slower rate, then discharged from 201D to 201E at an even slower rate, before another charging step begins after 201F. In this example, the second state of charge range from 201C to 201D is approximately 100% to 20%, having breadth of 80%. In this example, the third state of charge range from 201D to 201E is approximately 20% to 5%, having breadth of 15%. In this example, the fourth state of charge range from 201E to 201F is approximately 5% to 0%, having breadth of 5%.

One example of a first state of charge range of FIG. 2B is shown in FIG. 2D, from point 201A to 201B1. One example of a second state of charge range of FIG. 2B is shown in FIG. 2D, from point 201B3 to 201C. As FIG. 2D illustrates, the cell is charged from 201A to 201B1, then charged from 201B1 to 201B3 at a faster rate, then charged from 201B3 to 201C at an even faster rate, before another cycle of discharging and charging begins. In this example, the first state of charge range from 201A to 201B1 is approximately 0% to 10%, having breadth of 10%. In this example, the second state of charge range from 201B3 to 201C is approximately 40% to 100%, having breadth of 60%.

One example of a third state of charge range of FIG. 2B is shown in FIG. 2D, from point 201C to 201D. One example of a fourth state of charge range of FIG. 2B is shown in FIG. 2D, from point 201D to 201E. One example of a fifth state of charge range of FIG. 2B is shown in FIG. 2D, from point 201E to 201F. As FIG. 2D illustrates, the cell is discharged from 201C to 201D, then discharged from 201D to 201E at a slower rate, then discharged from 201D to 201E at an even slower rate, then discharged from 201E to 201F at a yet even slower rate, before another charging step begins after 201F. In this example, the third state of charge range from 201C to 201D is approximately 100% to 20%, having breadth of 80%. In this example, the fourth state of charge range from 201D to 201E is approximately 20% to 5%, having breadth of 15%. In this example, the fifth state of charge range from 201E to 201F is approximately 5% to 0%, having breadth of 5%.

One example of a first state of charge range of FIG. 2C is shown in FIG. 2D, from point 201A to 201B1. One example of a second state of charge range of FIG. 2C is shown in FIG. 2D, from point 201B1 to 201B3. One example of a third state of charge range of FIG. 2C is shown in FIG. 2D, from point 201B3 to 201C. As FIG. 2D illustrates, the cell is charged from 201A to 201B1, then charged from 201B1 to 201B3 at a faster rate, then charged from 201B3 to 201C at an even faster rate, before another cycle of discharging and charging begins. In this example, the first state of charge range from 201A to 201B1 is approximately 0% to 10%, having breadth of 10%. In this example, the second state of charge range from 201B1 to 201B3 is approximately 10% to 40%, having breadth of 30%. In this example, the third state of charge range from 201B3 to 201C is approximately 40% to 100%, having breadth of 60%.

One example of a fourth state of charge range of FIG. 2C is shown in FIG. 2D, from point 201C to 201D. One example of a fifth state of charge range of FIG. 2C is shown in FIG. 2D, from point 201D to 201E. One example of a sixth state of charge range of FIG. 2C is shown in FIG. 2D, from point 201E to 201F. As FIG. 2D illustrates, the cell is discharged from 201C to 201D, then discharged from 201D to 201E at a slower rate, then discharged from 201D to 201E at an even slower rate, then discharged from 201E to 201F at a yet even slower rate, before another charging step begins after 201F. In this example, the fourth state of charge range from 201C to 201D is approximately 100% to 20%, having breadth of 80%. In this example, the fifth state of charge range from 201D to 201E is approximately 20% to 5%, having breadth of 15%. In this example, the sixth state of charge range from 201E to 201F is approximately 5% to 0%, having breadth of 5%.

In some embodiments, the breadth of any of the state of charge ranges described above is at most 50%. In some embodiments, the breadth is at most 40%. In some embodiments, the breadth is at most 30%. In some embodiments, the breadth is at most 20%. In some embodiments, the breadth is at most 10%.

In some embodiments, the breadth of the state of charge ranges described above is at least 5%. In some embodiments, the breadth is at least 10%.

In some embodiments, the state of charge ranges described above have a lowest value of 5% state of charge or less. The inventors have recognized and appreciated that a state of charge having a lowest value of a certain percentage state of charge or less, for example 5%, can be particularly effective at providing improvements described herein.

In some embodiments, the rate over any of the state of charge ranges described above comprises an average rate. For example, the rate may be an average of multiple constant rates, of a modulating rate, or of some combination of both or other suitable rates. In some embodiments, the rate over the state of charge ranges comprises a constant rate.

In some embodiments, a discharging or charging rate can vary, as long as it is at least 2 times (or 4 times) the reference rate (e.g., the rate to which it is being compared) over the entirety of the state of charge range. Alternatively, the rate can be constant. Alternatively, the rate can fall below at least 2 times (or 4 times) the reference rate so long as the rate is on average at least 2 times (or 4 times) the reference rate.

In some embodiments, the rate over the state of charge ranges described above is controlled based on at least one monitored characteristic of the cell comprising cell impedance and/or cell resistance. For example, impedance and/or cell resistance may be measured and, if satisfying a threshold condition or value, the controller may start, end, or modify any of the charging and discharging profiles discussed above.

Figure 3A:
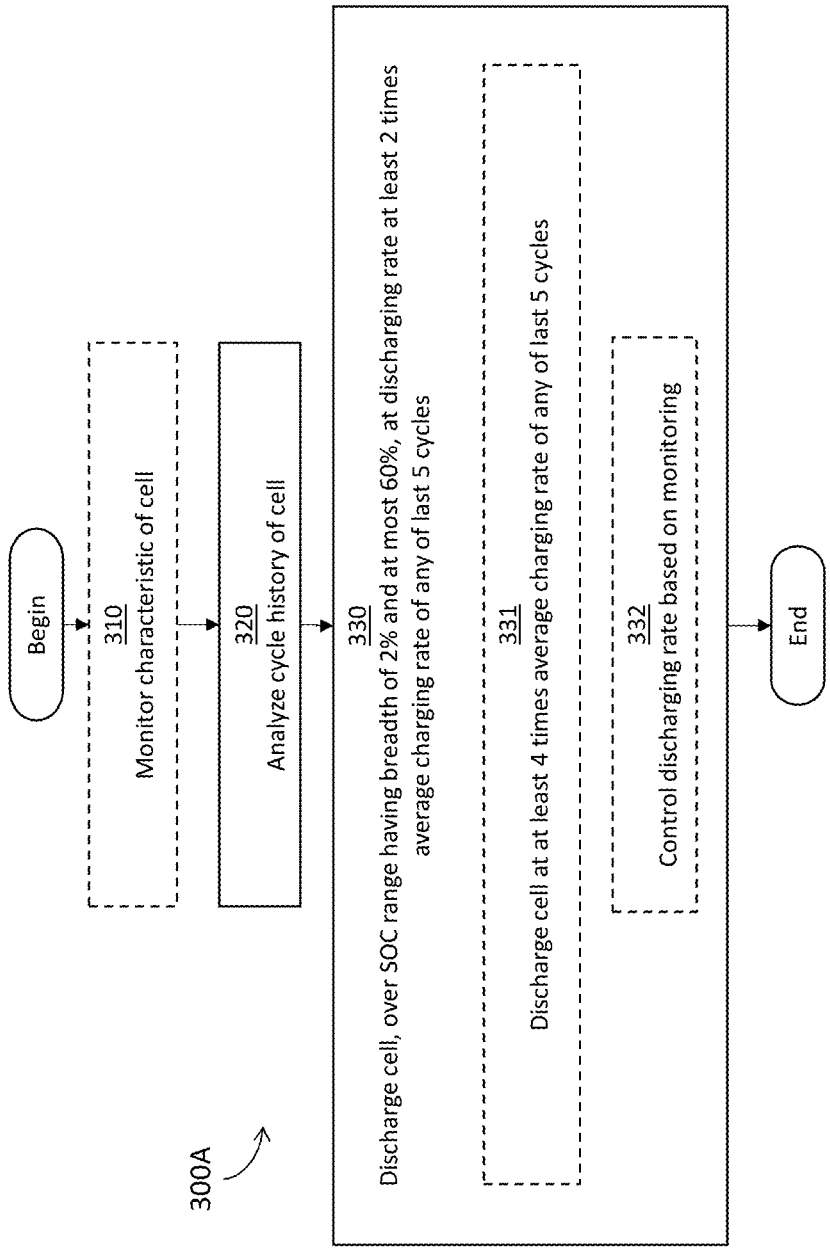
FIG. 3A is a flow chart depicting a representative process for managing an electrochemical cell, according to some embodiments.

FIG. 3A is a representative high-level process 300A of managing an electrochemical cell, according to some embodiments. The electrochemical cell can be, for example, the electrochemical cell 121A of exemplary FIG. 1A. The acts of representative process 300A are described in detail in the paragraphs that follow.

In some embodiments, representative process 300A may include act 320, wherein a cycle history of an electrochemical cell may be analyzed. In some embodiments, representative process 300A may include act 330, wherein the electrochemical cell is controlled such that if, for a number of most recent cycles in the cycle history, no cycle within the most recent cycles satisfies a criterion, the cell is discharged to satisfy the criterion. The criterion could comprise, for example, the cell being discharged, over a state of charge range having breadth of at least 2% and at most 60%, at a discharging rate that is at least 2 times an average charging rate of any of the cycles within the most recent cycles. The number of most recent cycles may be, for example, at least 5 cycles. According to some embodiments, a controller (e.g., controller 114 of FIG. 1A) may perform acts 320 and/or 330.

In some embodiments, representative process 300A may also begin with optional act 310, which comprises monitoring of characteristics of the cell. The act 330 may also further include act 331, wherein the discharging rate over the state of charge range may be at least 4 times the average charging rate of any of the cycles within the most recent cycles. The act 330 may also further include act 332, wherein the discharging rate over the state of charge range may be controlled based on at least one monitored characteristic of the cell, such as cell impedance and/or cell resistance.

In some embodiments, the breadth of the state of charge range is at most 50%. In some embodiments, the breadth is at most 40%. In some embodiments, the breadth is at most 30%. In some embodiments, the breadth is at most 20%. In some embodiments, the breadth is at most 10%.

In some embodiments, the breadth of the state of charge range is at least 5%. In some embodiments, the breadth is at least 10%.

In some embodiments, the state of charge range has a lowest value of 5% state of charge or less. The inventors have recognized and appreciated that the state of charge having a lowest value of a certain percentage state of charge or less, for example 5%, can be particularly effective at providing improvements described herein.

In some embodiments, the discharging rate over the state of charge range comprises an average discharging rate. For example, the discharging rate may be an average of multiple constant rates, of a modulating rate, or of some combination of both or other suitable rates. In some embodiments, the discharging rate over the state of charge range comprises a constant discharging rate.

In some embodiments, a discharging or charging rate can vary, as long as it is at least 2 times (or 4 times) the reference rate (e.g., the rate to which it is being compared) over the entirety of the state of charge range. Alternatively, the rate can be constant. Alternatively, the rate can fall below at least 2 times (or 4 times) the reference rate so long as the rate is on average at least 2 times (or 4 times) the reference rate.

In some embodiments, the discharging rate over the state of charge range is at least 4 times the average charging rate of any of the cycles within the most recent cycles.

In some embodiments, the discharging rate over the state of charge range is controlled based on at least one monitored characteristic of the cell comprising cell impedance and/or cell resistance.

In some embodiments, the discharging rate over the state of charge range is at least 4 times the average charging rate of any of the cycles within the most recent cycles.

Figure 3B:
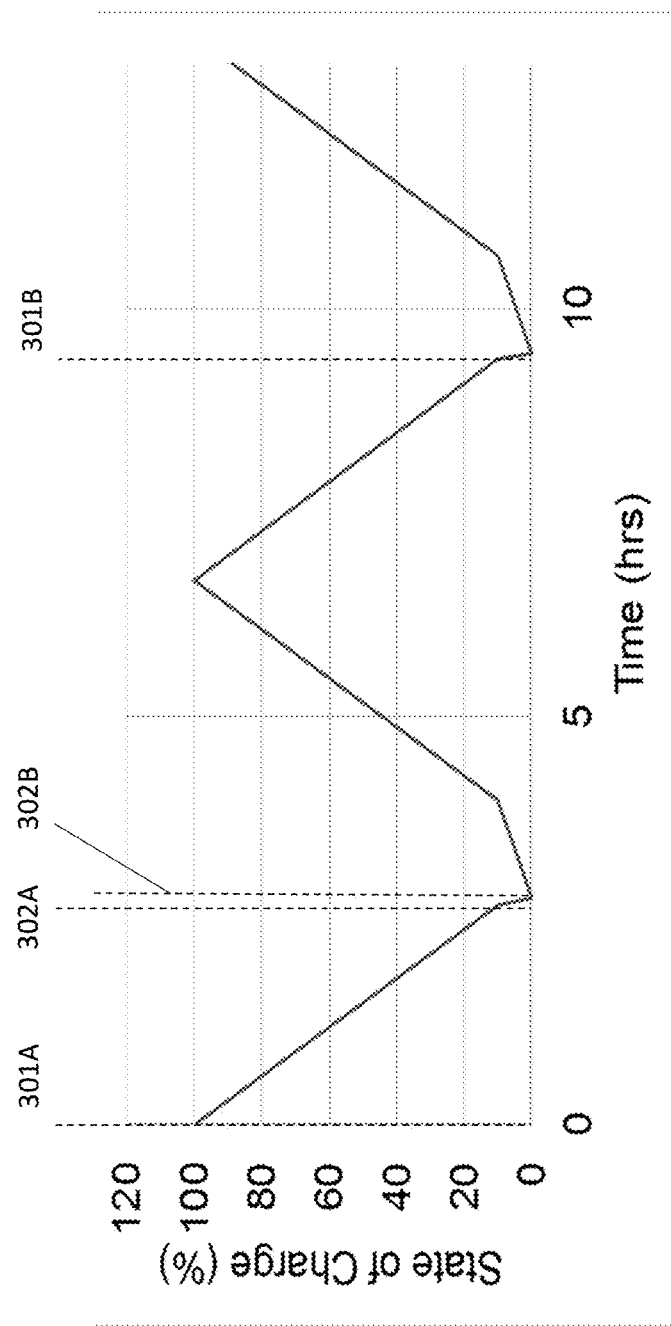
FIG. 3B is a charge-time graph for a representative electrochemical cell management system, according to some embodiments.

FIG. 3B is an exemplary charge-time graph for a representative electrochemical cell management system managing an electrochemical cell (e.g., electrochemical cell 121A) in relation to the method described in FIG. 3A. One example of a cycle history of FIG. 3A is shown in FIG. 3B, over the variation of state of charge shown from time point 301A to 301B. One example of a state of charge range of FIG. 3A is shown in FIG. 3B, from point 302A to 302B. As FIG. 3B illustrates, the cell is discharged from 301A to 302A and then discharged faster from 302A to 302B. In this example, the state of charge range from 302A to 302B is approximately 10% to 0%, having breadth of 10%.

As described in FIG. 3A, the cycle history may be analyzed. If no cycle of a number of most recent cycles satisfies the criterion, the cell may be discharged to satisfy the criterion. The range defined between 302A and 302B shows an example of satisfying the criterion of the cell being discharged, over a state of charge range having breadth of at least 2% and at most 60%, at a discharging rate that is at least 2 times an average charging rate of any of the cycles within the most recent cycles.

Figure 3C:
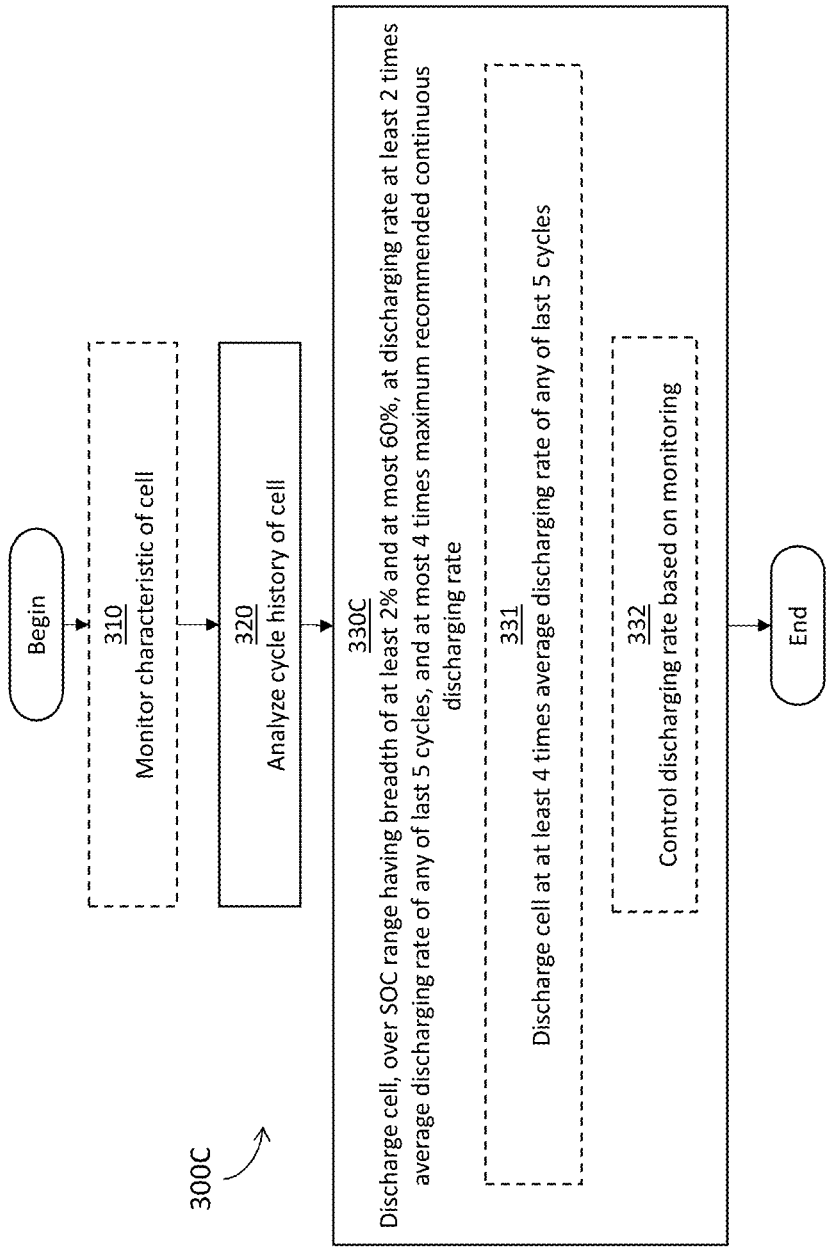
FIG. 3C is a flow chart depicting an additional representative process for managing an electrochemical cell, according to some embodiments.

FIG. 3C is a representative high-level process 300C of managing an electrochemical cell, according to some embodiments. The electrochemical cell can be, for example, the electrochemical cell 121A of exemplary FIG. 1A. The acts of representative process 300C are described in detail in the paragraphs that follow.

In some embodiments, representative process 300C may include act 320, wherein a cycle history of an electrochemical cell may be analyzed. In some embodiments, representative process 300C may include act 330C, wherein the electrochemical cell is controlled such that if, for a number of most recent cycles in the cycle history, no cycle within the most recent cycles satisfies a criterion, the cell is discharged to satisfy the criterion. The criterion could comprise, for example, the cell being discharged, over a state of charge range having breadth of at least 2% and at most 60% (or at most 50%, or at most 30%, or at most 20%), at a discharging rate that is at least 2 times an average discharging rate of any of the cycles within the most recent cycles, wherein the discharging rate is at most 4 times a maximum recommended continuous discharging rate. In some embodiments, the discharging rate can be within 50-200% of the manufacturer's maximum recommended continuous discharge rate. The inventors have recognized and appreciated that manufacturers set such recommended charge and discharge rates, primarily based on the capability of the battery after various performance tests. If, for example, a battery can handle 3C discharge, but falls short at 4C, they would recommend 3C max continuous discharge. The shortfalls can be based on performance (e.g., very little capacity obtained at 4C) or expectation of future performance (e.g., after one or repeated cycles at 4C, the cell performance/capacity rapidly declines even at lower rates) or, more importantly safety: for example, after 4C discharge the cell produces unacceptable amount of gas or after fast charge its safety profile is compromised (more likely to short or go into thermal runaway). The recommended charge and discharge rates are meant to maximize cycle life, performance, and safety and discourage users from abusing the cell.

The number of most recent cycles may be, for example, at least 5 cycles. Alternatively, the number of most recent cycles may be, for example, at least 2 cycles. According to some embodiments, a controller (e.g., controller 114 of FIG. 1A) may perform acts 320 and/or 330C.

In some embodiments, representative process 300C may also begin with optional act 310, which comprises monitoring of characteristics of the cell. The act 330C may also further include act 331, wherein the discharging rate over the state of charge range may be at least 4 times the average discharging rate of any of the cycles within the most recent cycles. The act 330C may also further include act 332, wherein the discharging rate over the state of charge range may be controlled based on at least one monitored characteristic of the cell, such as cell impedance and/or cell resistance.

In some embodiments, the breadth of the state of charge range is at most 50%. In some embodiments, the breadth is at most 40%. In some embodiments, the breadth is at most 30%. In some embodiments, the breadth is at most 20%. In some embodiments, the breadth is at most 10%.

In some embodiments, the breadth of the state of charge range is at least 5%. In some embodiments, the breadth is at least 10%.

In some embodiments, the state of charge range has a lowest value of 5% state of charge or less. The inventors have recognized and appreciated that the state of charge having a lowest value of a certain percentage state of charge or less, for example 5%, can be particularly effective at providing improvements described herein.

In some embodiments, the discharging rate over the state of charge range comprises an average discharging rate. In some embodiments, the discharging rate over the state of charge range is at least 4 times the average charging rate of any of the cycles within the most recent cycles.

In some embodiments, the discharging rate over the state of charge range comprises a constant discharging rate.

In some embodiments, the discharging rate over the state of charge range is controlled based on at least one monitored characteristic of the cell comprising cell impedance and/or cell resistance. In some embodiments, the discharging rate over the state of charge range is at least 4 times the average charging rate of any of the cycles within the most recent cycles.

Figure 3D:
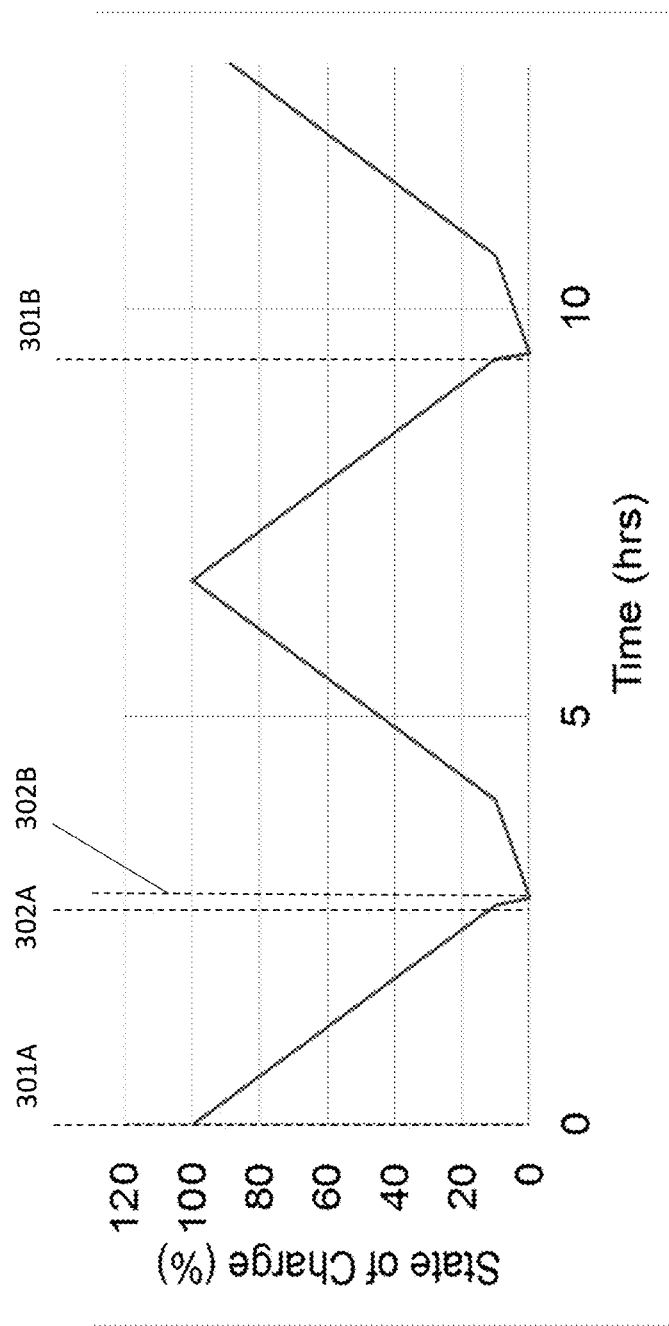
FIG. 3D is a charge-time graph for a representative electrochemical cell management system, according to some embodiments.

FIG. 3D is an exemplary charge-time graph for a representative electrochemical cell management system managing an electrochemical cell (e.g., electrochemical cell 121A) in relation to the method described in FIG. 3C. One example of a cycle history of FIG. 3C is shown in FIG. 3D, over the variation of state of charge shown from time point 301A to 301B. One example of a state of charge range of FIG. 3C is shown in FIG. 3D, from point 302A to 302B. As FIG. 3D illustrates, the cell is discharged from 301A to 302A and then discharged faster from 302A to 302B. In this example, the state of charge range from 302A to 302B is approximately 10% to 0%, having breadth of 10%.

As described in FIG. 3C, the cycle history may be analyzed. If no cycle of a number of most recent cycles satisfies the criterion, the cell may be discharged to satisfy the criterion. The range defined between elements 302A and 302B shows an example of satisfying the criterion of the cell being discharged, over a state of charge range having breadth of at least 2% and at most 60%, at a discharging rate that is at least 2 times an average charging rate of any of the cycles within the most recent cycles, wherein the discharging rate is at most 4 times a maximum recommended continuous discharging rate.

Figure 4A:
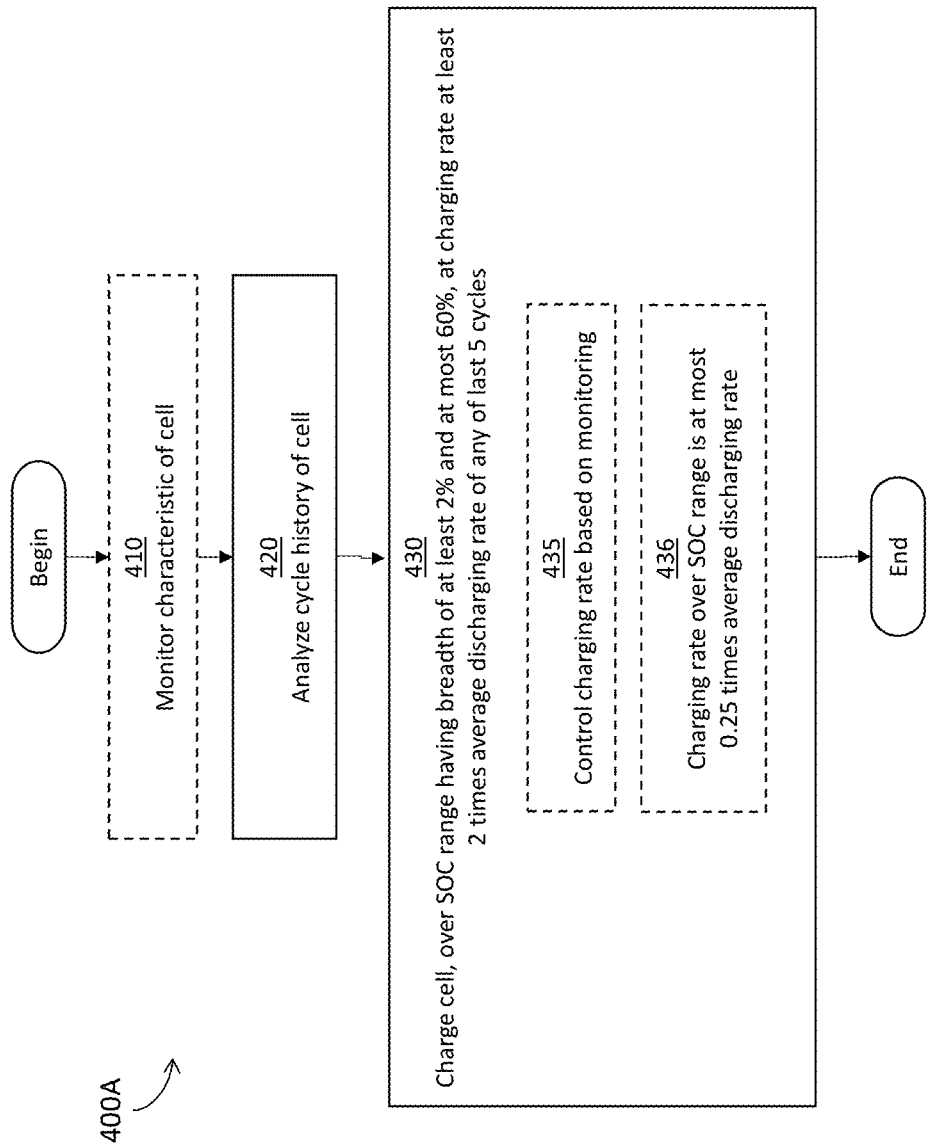
FIG. 4A is a flow chart depicting an additional representative process for managing an electrochemical cell, according to some embodiments.

FIG. 4A is a flow chart depicting an additional representative process for managing an electrochemical cell, according to some embodiments. The electrochemical cell can be, for example, the electrochemical cell 121A of exemplary FIG. 1A. The acts of representative process 400A are described in detail in the paragraphs that follow.

In some embodiments, representative process 400A may include act 420, wherein a cycle history of an electrochemical cell may be analyzed. In some embodiments, representative process 400A may include act 430, wherein the electrochemical cell is controlled such that if, for a number of most recent cycles in the cycle history, no cycle within the most recent cycles satisfies a criterion, the cell is charged to satisfy the criterion. The criterion could comprise, for example, the cell being charged, over a state of charge range having breadth of at least 2% and at most 60%, at a charging rate that is at most 0.5 times an average discharging rate of any of the cycles within the most recent cycles. The number of most recent cycles may be, for example, at least 5 cycles. According to some embodiments, a controller (e.g., controller 114 of FIG. 1A) may perform acts 420 and/or 430.

In some embodiments, the representative process 400A may also include optional act 410, which comprises monitoring of characteristics of the cell. In act 435, the charging rate over the state of charge range may be controlled based on at least one monitored characteristic of the cell, as described herein. The representative process 400A may also include optional act 436, wherein the charging rate over the state of charge range is at most 0.25 times the average discharging rate of any of the cycles within the most recent cycles.

In some embodiments, the breadth is at most 50%. In some embodiments, the breadth is at most 40%. In some embodiments, the breadth is at most 30%. In some embodiments, the breadth is at most 20%. In some embodiments, the breadth is at most 10%. In some embodiments, the state of charge range has a lowest value of 5% state of charge or less.

In some embodiments, the breadth is at least 5%. In some embodiments, the breadth is at least 10%.

In some embodiments, the charging rate over the state of charge range comprises an average charging rate. In some embodiments, the charging rate over the state of charge range comprises a constant charging rate.

According to some embodiments, the charging rate over the state of charge range is at most 0.25 times the average discharging rate of any of the cycles within the most recent cycles.

In some examples, the charging rate over the state of charge range is controlled based on at least one monitored characteristic of the cell comprising cell impedance and/or cell resistance.

Figure 4B:
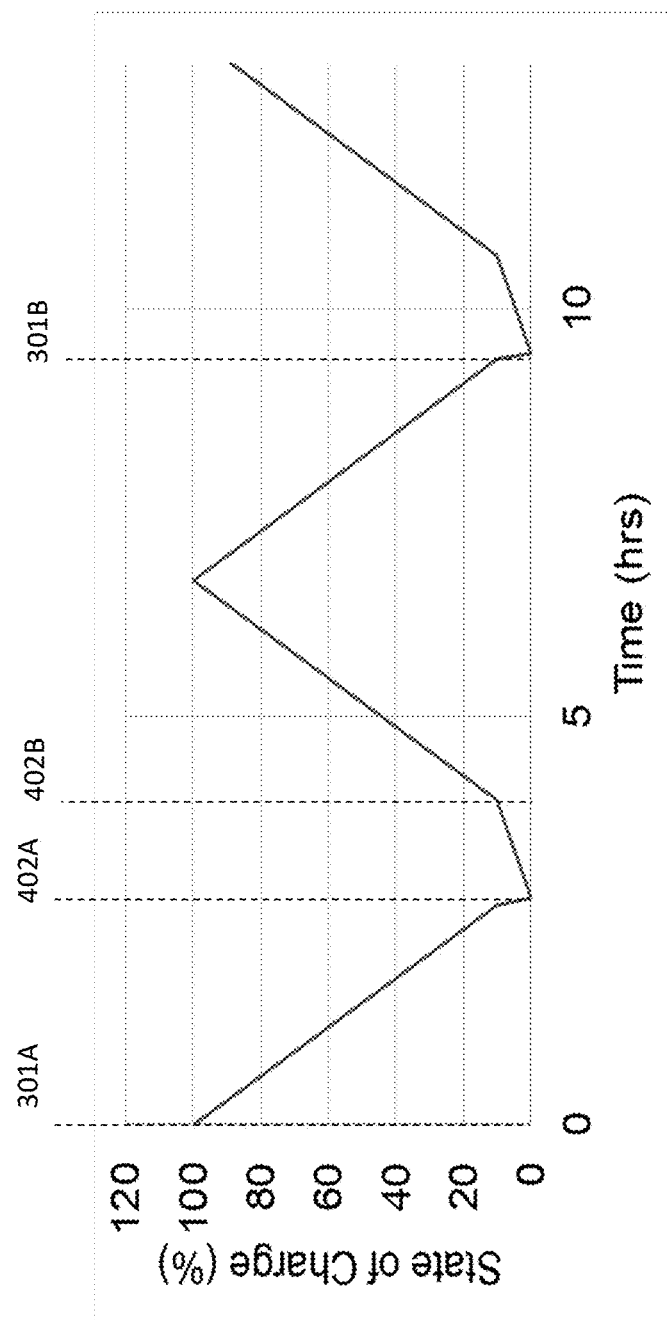
FIG. 4B is a charge-time graph for a representative electrochemical cell management system, according to some embodiments.

FIG. 4B is an exemplary charge-time graph for a representative electrochemical cell management system managing an electrochemical cell (e.g., electrochemical cell 121A) in relation to the method described in FIG. 4A. One example of a cycle history of FIG. 4A is shown in FIG. 4B, over the variation of state of charge shown from time point 301A to 301B. One example of a state of charge range of FIG. 4A is shown in FIG. 4B, from point 402A to 402B. As FIG. 4B illustrates, the cell is discharged from 301A to 402A at multiple rates from about 100% to 0% state of charge, and then the cell is charged from 402A to 402B from about 0% to 10% state of charge, after which it is charged at a higher rate. In this example, the state of charge range from 402A to 402B is approximately 0% to 10%, having breadth of 10%.

As described in FIG. 4A, the cycle history (e.g., time period between 301A and 301B) may be analyzed. If no cycle of a number of most recent cycles satisfies the criterion, the cell may be charged to satisfy the criterion. The range defined between elements 402A and 402B show an example of a period of time that satisfies the criterion of the electrochemical cell being charged, over a state of charge range having breadth of at least 2% and at most 60%, at a charging rate that is at most 0.5 times an average discharging rate of any of the cycles within the most recent cycles.

Figure 5A:
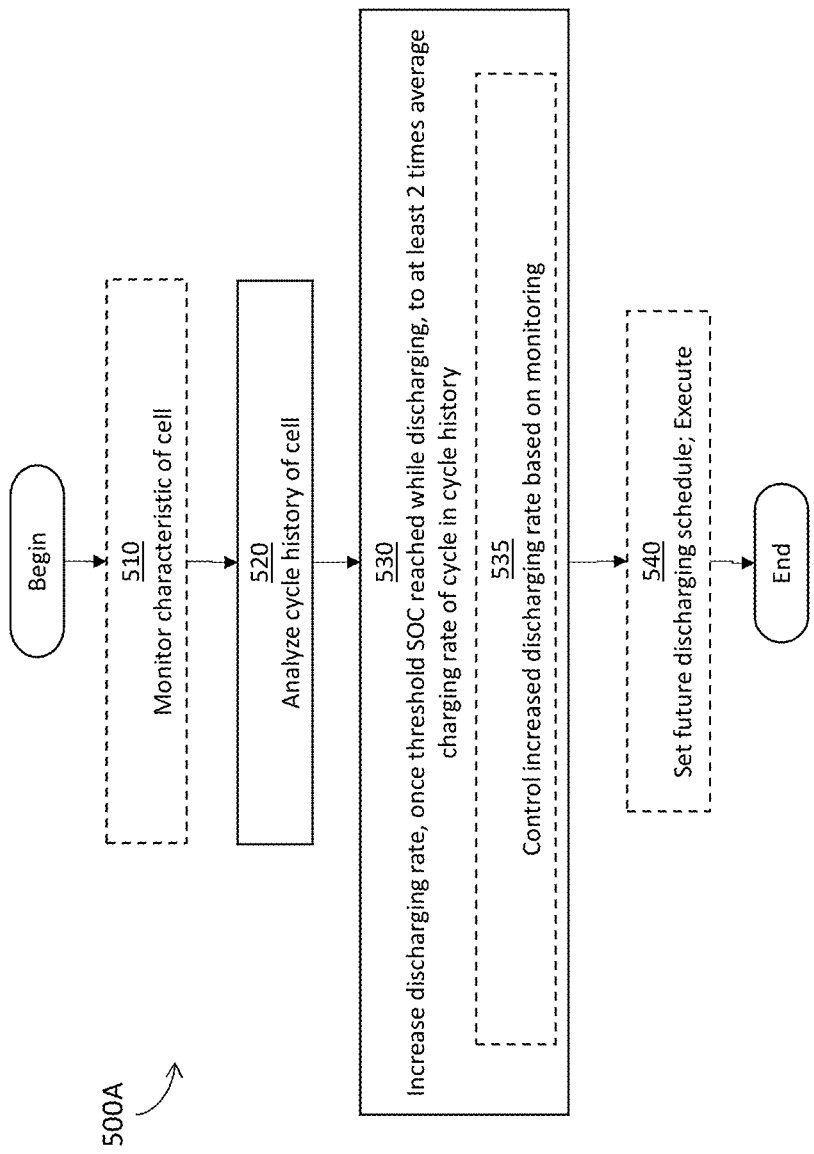
FIG. 5A is a flow chart depicting an additional representative process for managing an electrochemical cell, according to some embodiments.

FIG. 5A is a flow chart depicting an additional representative process for managing an electrochemical cell, according to some embodiments. The electrochemical cell can be, for example, the electrochemical cell 121A of exemplary FIG. 1A. The acts of representative process 500A are described in detail in the paragraphs that follow.

In some embodiments, representative process 500A may include act 520, wherein a cycle history of an electrochemical cell may be analyzed. In some embodiments, representative process 500A may include act 530, wherein the electrochemical cell is controlled such that if a threshold state of charge is reached while discharging, the discharging rate of the cell is increased to at least 2 times an average charging rate of at least one cycle in the cycle history.

In some embodiments, in act 530, the electrochemical cell is controlled such that if a threshold state of charge is reached while discharging, the discharging rate of the cell is increased to at least 2 times an average charging rate of at least a portion of at least one cycle in the cycle history. In some embodiments, the portion comprises a first state of charge range having breadth of at least 2% and at most 60%.

According to some embodiments, a controller (e.g., controller 114 of FIG. 1A) may perform acts 520 and/or 530. In some embodiments, the threshold state of charge has a value of less than or equal to 60%. According to some embodiments, an average charging/discharging rate may be calculated using techniques described herein.

In some embodiments, representative process 500A may also include optional act 510, which comprises monitoring of characteristics of the cell. In act 535, the discharging rate may be controlled based on at least one monitored characteristic of the cell. In some embodiments, the monitored characteristic may comprise cell impedance and/or cell resistance as described herein. Additionally, representative process 500A may also include optional act 540, in which a future discharging schedule may be set and executed. For example, the future discharging schedule could be set and executed such that for the at least 5 cycles and less than 50 cycles of every 100 cycles, the discharging rate is increased to at least 2 times the average charging rate of the at least one cycle in the cycle history. Alternatively or additionally, the future discharging schedule could be set and executed such that for the at least 5 cycles and less than 50 cycles of every 100 cycles, the discharging rate is increased to at least 2 times the average charging rate of at least a portion of the at least one cycle in the cycle history.

In some embodiments, the threshold state of charge has a value of less than or equal to 50%. In some embodiments, the threshold state of charge has a value of less than or equal to 40%. In some embodiments, the threshold state of charge has a value of less than or equal to 30%. In some embodiments, the threshold state of charge has a value of less than or equal to 20%. In some embodiments, the threshold state of charge has a value of less than or equal to 10%.

In some embodiments, the breadth of the first state of charge range is at most 50%. In some embodiments, the breadth of the first state of charge range is at most 40%. According to some embodiments, the breadth of the first state of charge range is at most 30%. In some embodiments, the breadth of the first state of charge range is at most 20%. In some embodiments, the breadth of the first state of charge range is at most 10%.

In some embodiments, the breadth of the first state of charge range is at least 5%. In some embodiments, the breadth of the first state of charge range is at least 10%.

In some embodiments, the increased discharging rate comprises an average discharging rate. In some embodiments, the increased discharging rate comprises a constant discharging rate.

In some embodiments, the charging rate over the first state of charge range comprises an average charging rate. In some embodiments, the charging rate over the first state of charge range comprises a constant charging rate.

According to some embodiments, the increased discharging rate is at least 4 times the average charging rate of the at least one cycle in the cycle history.

According to some embodiments, the increased discharging rate is at least 4 times the average charging rate of at least a portion of the at least one cycle in the cycle history.

In some examples, the increased discharging rate is controlled based on at least one monitored characteristic of the cell, such as described herein.

In some examples, a future discharging schedule is set and executed such that for the at least 5 cycles and less than 50 cycles of every 100 cycles, the discharging rate is increased to at least 2 times the average charging rate of the at least one cycle in the cycle history.

In some examples, a future discharging schedule is set and executed such that for the at least 5 cycles and less than 50 cycles of every 100 cycles, the discharging rate is increased to at least 2 times the average charging rate of at least a portion of the at least one cycle in the cycle history.

In some embodiments, the at least one cycle in the cycle history comprises a most recent cycle.

Figure 5B:
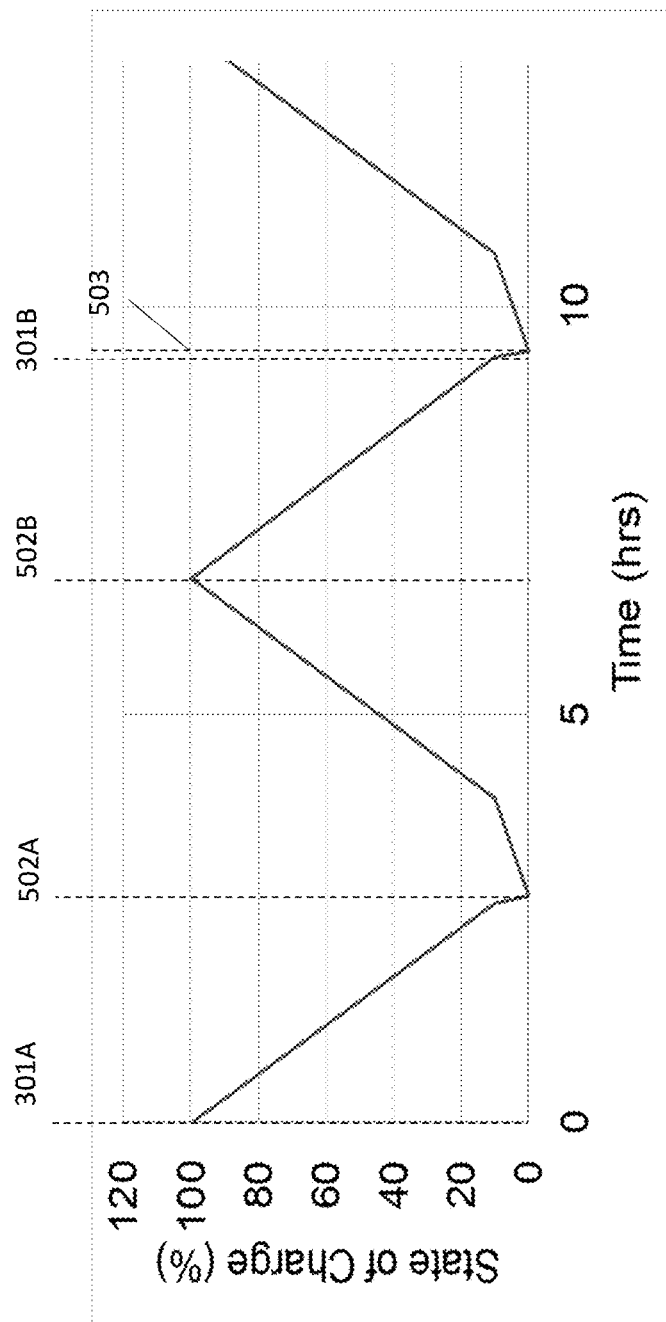
FIG. 5B is a charge-time graph for a representative electrochemical cell management system, according to some embodiments.

FIG. 5B is an exemplary charge-time graph for a representative electrochemical cell management system managing an electrochemical cell (e.g., electrochemical cell 121A) in relation to the method described in FIG. 5A. One example of a cycle history of FIG. 5A is shown in FIG. 5B, over the variation of state of charge shown from time point 301A to 301B. One example of a cycle of the cycle history of FIG. 5A is shown in relevant part (the charging) in FIG. 5B, from 502A to 502B. One example of a threshold state of charge of FIG. 5A is shown in FIG. 5B, at point 301B. As FIG. 5B illustrates, the cell is discharged from 301A to 502A at multiple rates from about 100% to 0% state of charge, and then the cell is charged from 502A to 502B at multiple rates from about 0% to 100% state of charge, after which it is discharged to 301B and then discharged at a higher rate to point 503.

For example, as described in FIG. 5A, the cycle history may be analyzed. In the example illustrated in FIG. 5B, a threshold state of charge, in this case 10%, is reached while discharging at time 301B. Thus, the discharging rate of the cell is increased to at least 2 times an average charging rate of at least one cycle in the cycle history. For example, the average charging rate of the at least one cycle of the cycle history, can be over the period of time between times 502A and 502B. Alternatively or additionally, the average charging rate of the at least one cycle of the cycle history, can be over any portion of the period of time between times 502A and 502B. The time period between 301B and 503 illustrates the increase of the discharging rate to at least 2 times the average charging rate of the charging represented between times 502A and 502B.

Figure 6A:
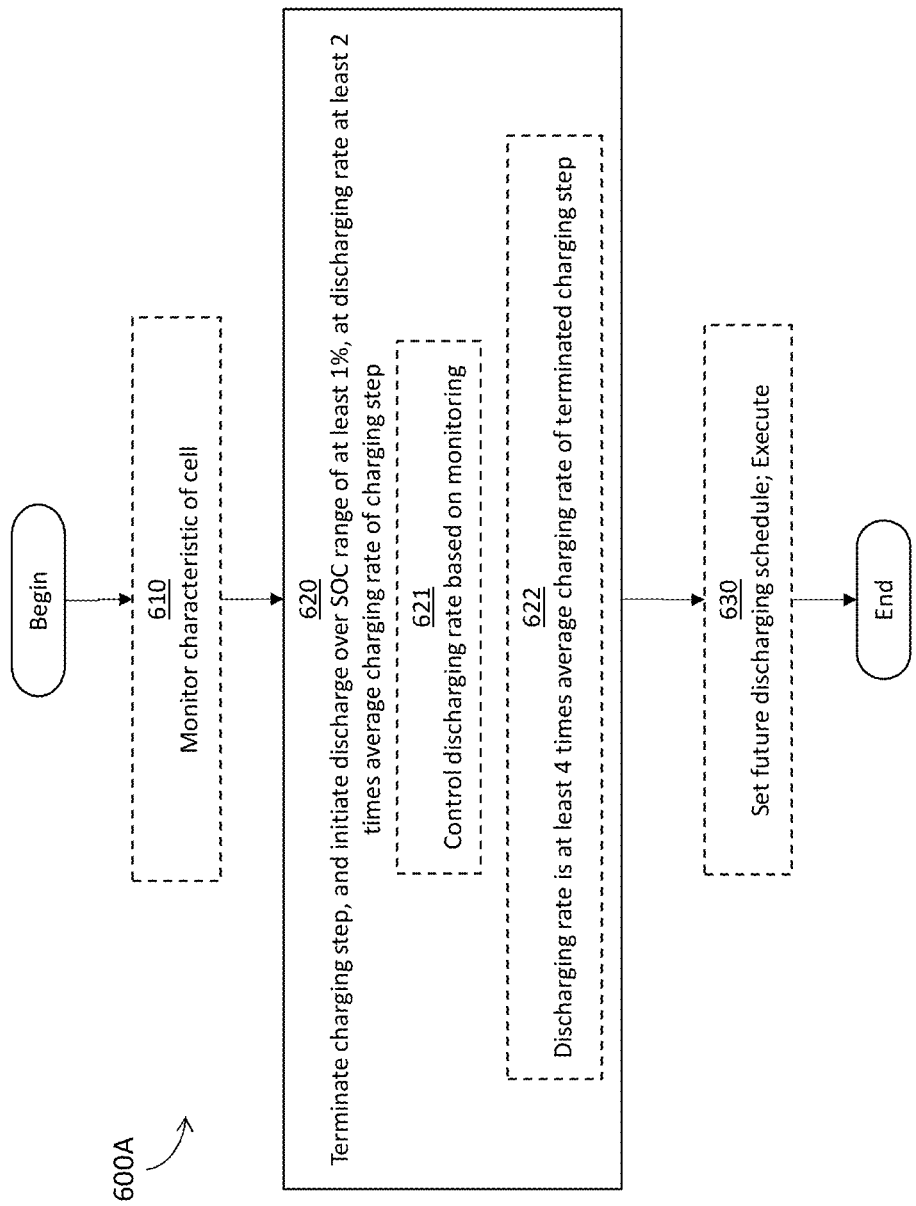
FIG. 6A is a flow chart depicting an additional representative process for managing an electrochemical cell, according to some embodiments.

FIG. 6A is a flow chart depicting an additional representative process for managing an electrochemical cell, according to some embodiments. The electrochemical cell can be, for example, the electrochemical cell 121A of exemplary FIG. 1A. The acts of representative process 600A are described in detail in the paragraphs that follow.

In some embodiments, representative process 600A may include act 620, wherein the electrochemical cell is controlled such that at a termination state of charge, a charging step is terminated and a discharge is initiated, and during the initiated discharge, the cell is discharged, over a state of charge range having breadth of at least 1%, at a discharging rate that is at least 2 times an average charging rate of the terminated charging step. This may be referred to as a conditioning cycle or "mini-cycle."

In some embodiments, in act 620, the electrochemical cell is controlled such that at a termination state of charge, a charging step is terminated and a discharge is initiated, and during the initiated discharge, the cell is discharged, over a state of charge range having breadth of at least 1%, at a discharging rate that is at least 2 times an average charging rate of at least a portion of the terminated charging step. In some embodiments, the portion comprises a first state of charge range having breadth of at least 2% and at most 60%.

According to some embodiments, a conditioning cycle may be performed at the beginning of any or every charging step. For example, the cell may be controlled to be charged to a state of charge of 10% (or charged 10% above its present state of charge) and then discharged to a state of charge near 0% (or discharged 10% below the state of charge post-charging) at 2 or 4 times the charging rate. According to some embodiments, a conditioning cycle may be performed between a discharge and charge of a cell. In some embodiments of the techniques and methods provided herein, a discharge rate and/or charge rate may be predetermined. According to some embodiments, a constant current may be used, for example between the discharge and charge of a cell. According to some embodiments, a modulated current may be used. The inventors have recognized and appreciated that these conditioning or "mini" cycles may allow for predetermined discharge and charge rates, whether constant or modulating.

According to some embodiments, a conditioning cycle may be performed as part of an otherwise typical discharging step that would not by itself satisfy a target ratio. For example, the cell may be controlled such that the "bottom" of a discharging step is 4 times faster than the beginning of the next charging step (such as may be performed when feeding power back to a charger). As another example, the cell may be controlled such that the beginning of a charging step is 4 times slower than the last discharging rate (in an example where the cell discharge history has been stored). In some embodiments, a combination of charging and discharging may be used at fixed rates (such as when continuing discharge beyond where a user left the cell).

According to some embodiments, a controller (e.g., controller 114 of FIG. 1A) may perform act 620. In some embodiments, the termination state of charge has a value of less than or equal to 60%. According to some embodiments, an average charging/discharging rate may be calculated using techniques described herein.

In some embodiments, representative process 600A may also include optional act 610, which comprises monitoring of characteristics of the cell. In act 621, the discharging rate over the state of charge range is controlled based on at least one monitored characteristic of the cell. In some embodiments, the monitored characteristic may comprise cell impedance and/or cell resistance. In act 622, the discharging rate may also optionally be at least 4 times the average charging rate of terminated charging step. Alternatively or additionally, the discharging rate may optionally be at least 4 times the average charging rate of at least a portion of the terminated charging step.

Additionally, representative process 600A may also include optional act 630, in which a future discharging schedule may be set and executed. For example, the future discharging schedule could be set and executed such that for the at least 5 cycles and less than 50 cycles of every 100 cycles, the charging step is terminated and the discharge is initiated.

In some embodiments, the termination state of charge has a value of less than or equal to 50%. In some embodiments, the termination state of charge has a value of less than or equal to 40%. In some embodiments, the termination state of charge has a value of less than or equal to 30%. In some embodiments, the termination state of charge has a value of less than or equal to 20%. In some embodiments, the termination state of charge has a value of less than or equal to 10%.

In some embodiments, the breadth of the first state of charge range is at most 50%. In some embodiments, the breadth of the first state of charge range is at most 40%. According to some embodiments, the breadth of the first state of charge range is at most 30%. In some embodiments, the breadth of the first state of charge range is at most 20%. In some embodiments, the breadth of the first state of charge range is at most 10%.

In some embodiments, the breadth of the first state of charge range is at least 5%. In some embodiments, the breadth of the first state of charge range is at least 10%.

In some embodiments, the discharging rate over the state of charge range comprises an average discharging rate. In some embodiments, the discharging rate over the state of charge range comprises a constant discharging rate.

In some embodiments, the charging rate over the first state of charge range comprises an average charging rate. In some embodiments, the charging rate over the first state of charge range comprises a constant charging rate.

In some embodiment, the discharging rate is at least 4 times the average charging rate of the terminated charging step.

In some examples, the discharging rate is controlled based on at least one monitored characteristic of the cell.

In some embodiments, a future discharging schedule is set and executed such that for the at least 5 cycles and less than 50 cycles of every 100 cycles, the charging step is terminated and the discharge is initiated.

Figure 6B:
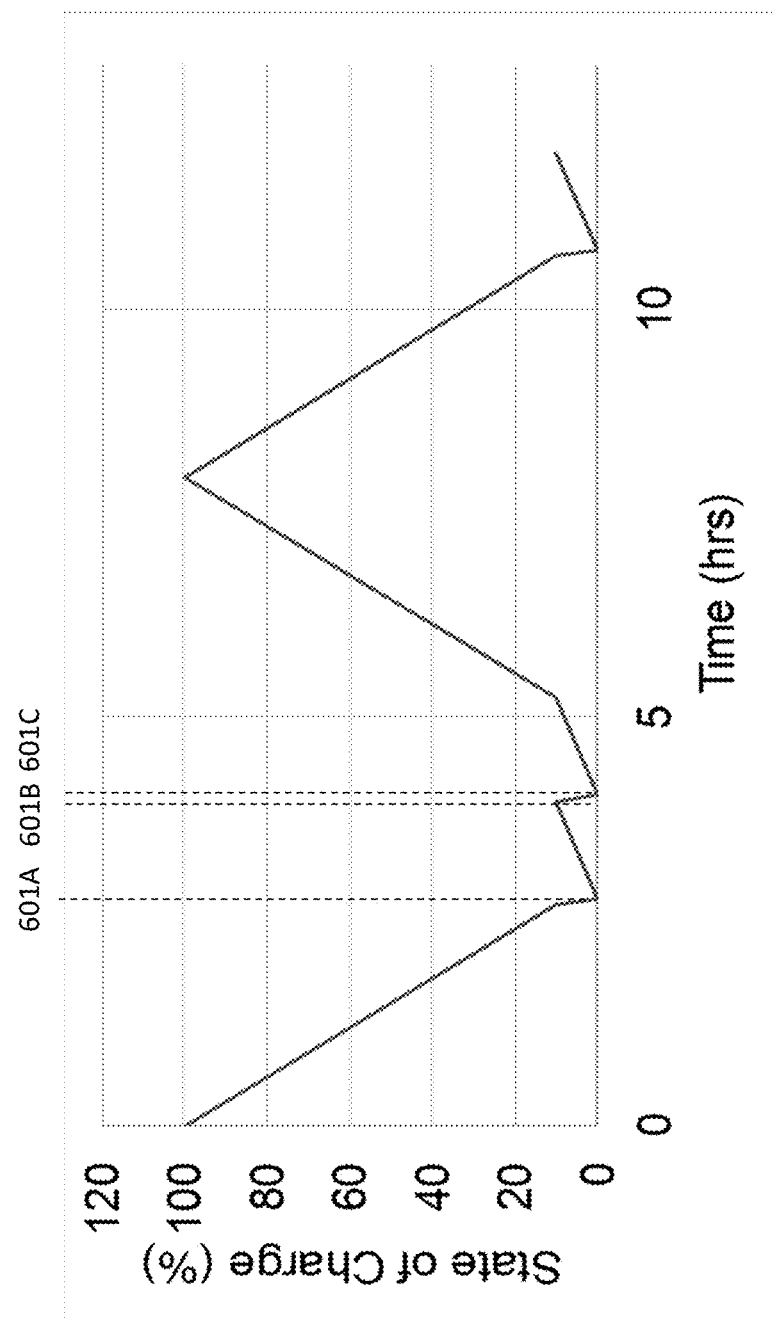
FIG. 6B is a charge-time graph for a representative electrochemical cell management system, according to some embodiments.

FIG. 6B is an exemplary charge-time graph for a representative electrochemical cell management system managing an electrochemical cell (e.g., electrochemical cell 121A) in relation to the method described in FIG. 6A. One example of a terminated charging step of FIG. 6A is shown in FIG. 6B, from point 601A to 601B. One example of a termination state of charge of FIG. 6A is shown in FIG. 6B, at point 601B. One example of a state of charge range of FIG. 6A is shown in FIG. 6B, from point 601B to 601C. As FIG. 6B illustrates, the cell is discharged to 601A at multiple rates from about 100% to 0% state of charge, and then the cell is charged from 601A to 601B from about 0% to 10% state of charge, where the charging step is terminated and the cell is then discharged to 601C, before a more typical cycle of charging and discharging begins.

As described in the flowchart of FIG. 6A, an electrochemical cell is controlled such that at a termination state of charge, for example at time 601B of FIG. 6B, a charging step, such as between times 601A and 601B, is terminated and a discharge is initiated. During the initiated discharge, the cell is discharged for example from time 601B to 601C, at a discharging rate that is at least 2 times an average charging rate of the terminated charging step. In some embodiments, during the initiated discharge, the cell is discharged for example from time 601B to 601C, at a discharging rate that is at least 2 times an average charging rate of at least a portion of the terminated charging step.

Figure 7A:
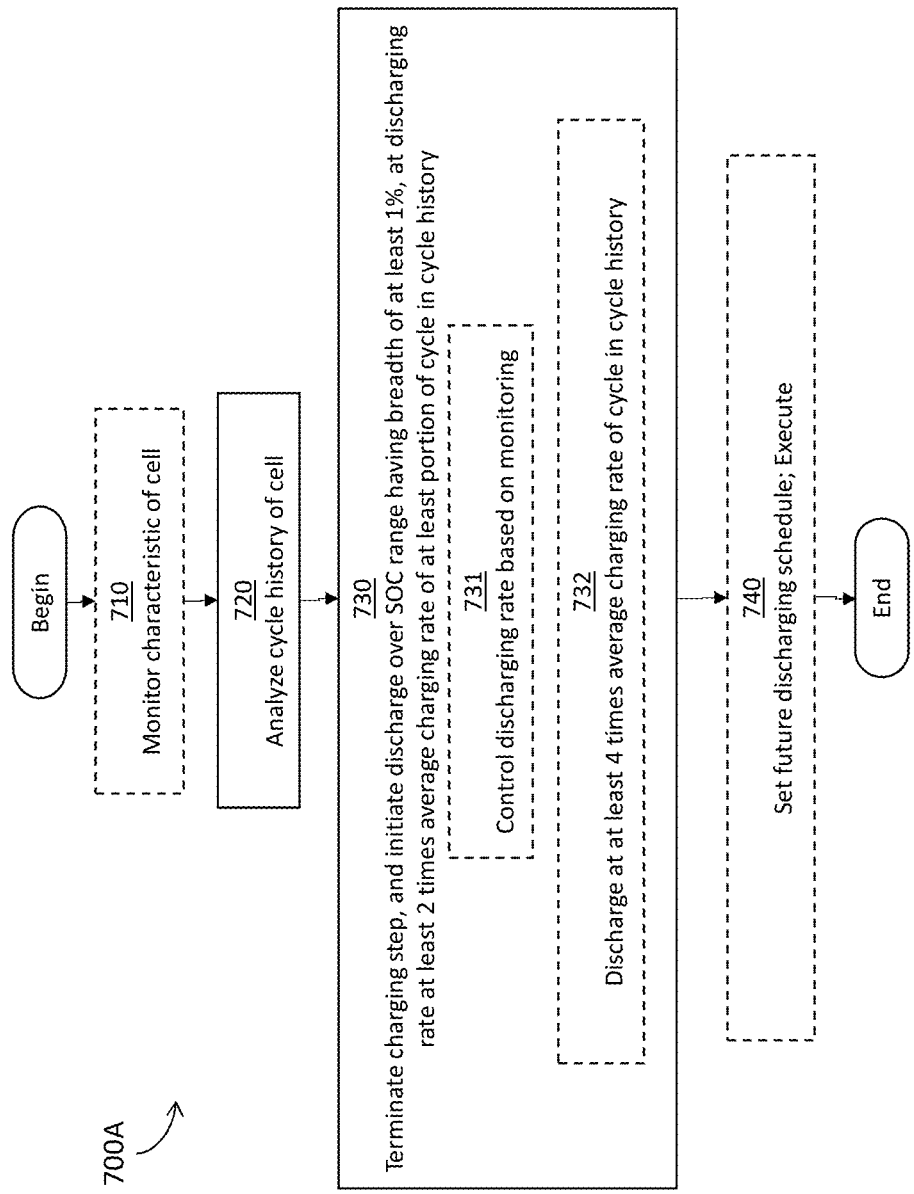
FIG. 7A is a flow chart depicting an additional representative process for managing an electrochemical cell, according to some embodiments.

FIG. 7A is a flow chart depicting an additional representative process for managing an electrochemical cell, according to some embodiments. The electrochemical cell can be, for example, the electrochemical cell 121A of exemplary FIG. 1A. The acts of representative process 700A are described in detail in the paragraphs that follow.

In some embodiments, representative process 700A may include act 720, wherein a cycle history of an electrochemical cell may be analyzed. In some embodiments, representative process 700A may include act 730, wherein the electrochemical cell is controlled such that at a termination state of charge, a charging step is terminated and a discharge is initiated, and during the initiated discharge, the cell is discharged, over a state of charge range having breadth of at least 1%, at a discharging rate that is at least 2 times an average charging rate of at least one cycle in the cycle history. This may also be referred to as a conditioning cycle or "mini-cycle."

According to some embodiments, a controller (e.g., controller 114 of FIG. 1A) may perform acts 720 and/or 730. In some embodiments, the termination state of charge has a value of less than or equal to 60%. According to some embodiments, an average charging/discharging rate may be calculated using techniques described herein.

In some embodiments, representative process 700A may also include optional act 710, which comprises monitoring of characteristics of the cell. In act 731, the discharging rate over state of charge range is controlled based on at least one monitored characteristic of the cell. In some embodiments, the monitored characteristic may comprise cell impedance and/or cell resistance. In act 732, the discharging rate over the state of charge range may optionally be at least 4 times the average charging rate of a cycle in the cycle history. Additionally, the flow chart may also include optional act 740, in which a future discharging schedule may be set and executed. For example, the future discharging schedule could be set and executed such that for the at least 5 cycles and less than 50 cycles of every 100 cycles, the charging step is terminated and the discharge is initiated.

In some embodiments, the termination state of charge has a value of less than or equal to 50%. In some embodiments, the termination state of charge has a value of less than or equal to 40%. In some embodiments, the termination state of charge has a value of less than or equal to 30%. In some embodiments, the termination state of charge has a value of less than or equal to 20%. In some embodiments, the termination state of charge has a value of less than or equal to 10%.

In some embodiments, the discharging rate over the state of charge range comprises an average discharging rate. In some embodiments, the discharging rate over the state of charge range comprises a constant discharging rate.

In some embodiments, the discharging rate over the state of charge range is at least 4 times the average charging rate of the at least one cycle in the cycle history.

In some embodiments, a future discharging schedule is set and executed such that for the at least 5 cycles and less than 50 cycles of every 100 cycles, the charging step is terminated and the discharge is initiated.

In some embodiments, the discharging rate over the state of charge range is controlled based on at least one monitored characteristic of the cell comprising cell impedance and/or cell resistance.

In some embodiments, act 730 may include the electrochemical cell being controlled such that at a termination state of charge, a charging step is terminated and a discharge is initiated, and during the initiated discharge, the cell is discharged, over a first state of charge range having breadth of at least 1%, at a discharging rate that is at least 2 times an average charging rate of at least a portion of at least one cycle in the cycle history. In some embodiments, the portion comprises a second state of charge range having breadth of at least 2% and at most 60%.

In some embodiments, the breadth of the second state of charge range is at most 50%. In some embodiments, the breadth of the second state of charge range is at most 40%. According to some embodiments, the breadth of the second state of charge range is at most 30%. In some embodiments, the breadth of the second state of charge range is at most 20%. In some embodiments, the breadth of the second state of charge range is at most 10%.

In some embodiments, the breadth of the second state of charge range is at least 5%. In some embodiments, the breadth of the second state of charge range is at least 10%.

In some embodiments, the charging rate over the first state of charge range comprises an average charging rate. In some embodiments, the charging rate over the first state of charge range comprises a constant charging rate.

In some embodiments, the discharging rate over the first state of charge range is at least 4 times the average charging rate over the second state of charge range.

Figure 7B:
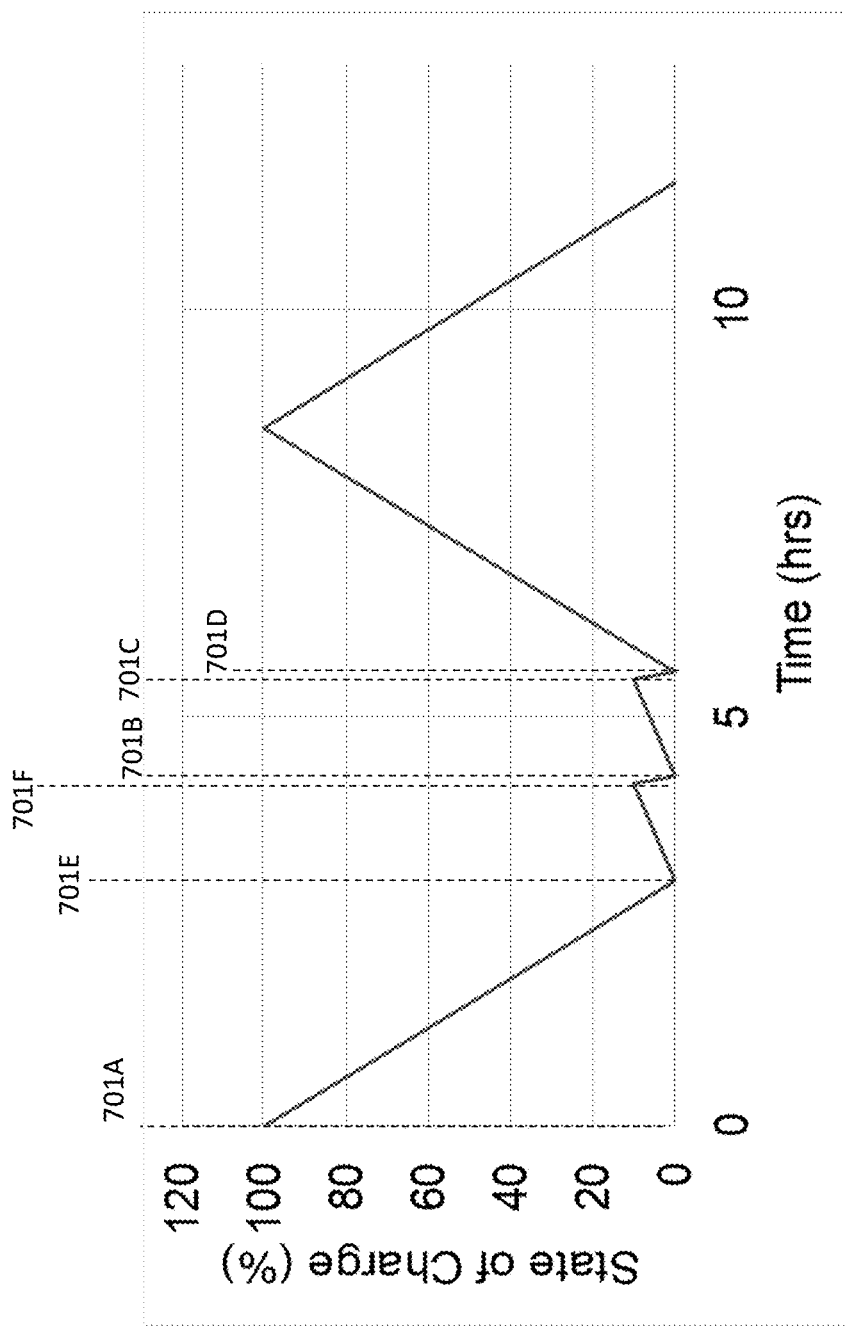
FIG. 7B is a charge-time graph for a representative electrochemical cell management system, according to some embodiments.

FIG. 7B is an exemplary charge-time graph for a representative electrochemical cell management system managing an electrochemical cell (e.g., electrochemical cell 121A) in relation to the method described in FIG. 7A. One example of a terminated charging step of FIG. 7A is shown in FIG. 7B, from point 701B to 701C, and another is from 701E to 701F. One example of a termination state of charge of FIG. 7A is shown in FIG. 7B, at point 701C. One example of a state of charge range of FIG. 7A is shown in FIG. 7B, from point 701C to 701D. One example of a cycle history of FIG. 7A is shown in FIG. 7B, from point 701A to 701D. As FIG. 7B illustrates, the cell is discharged from 701A to 701E from about 100% to 0% state of charge, then charged from 701E to 701F from about 0% to 10% state of charge, then discharged from 701F to 701B (potentially after termination of the charging step from 701E to 701F) from about 10% to 0% state of charge, then charged from 701B to 701C from about 0% to 10% state of charge, where the charging step is terminated and the cell is then discharged to 701D from about 10% to 0% state of charge, before a more typical cycle of charging and discharging begins.

As described in the flowchart of FIG. 7A, an electrochemical cell is controlled such that at a termination state of charge, for example at time 701C of FIG. 7B, a charging step, such as between times 701B and 701C, is terminated and a discharge is initiated. During the initiated discharge, the cell is discharged, for example, from time 701C to 701D, at a discharging rate that is at least 2 times an average charging rate of the terminated charging step.

Figure 8A:
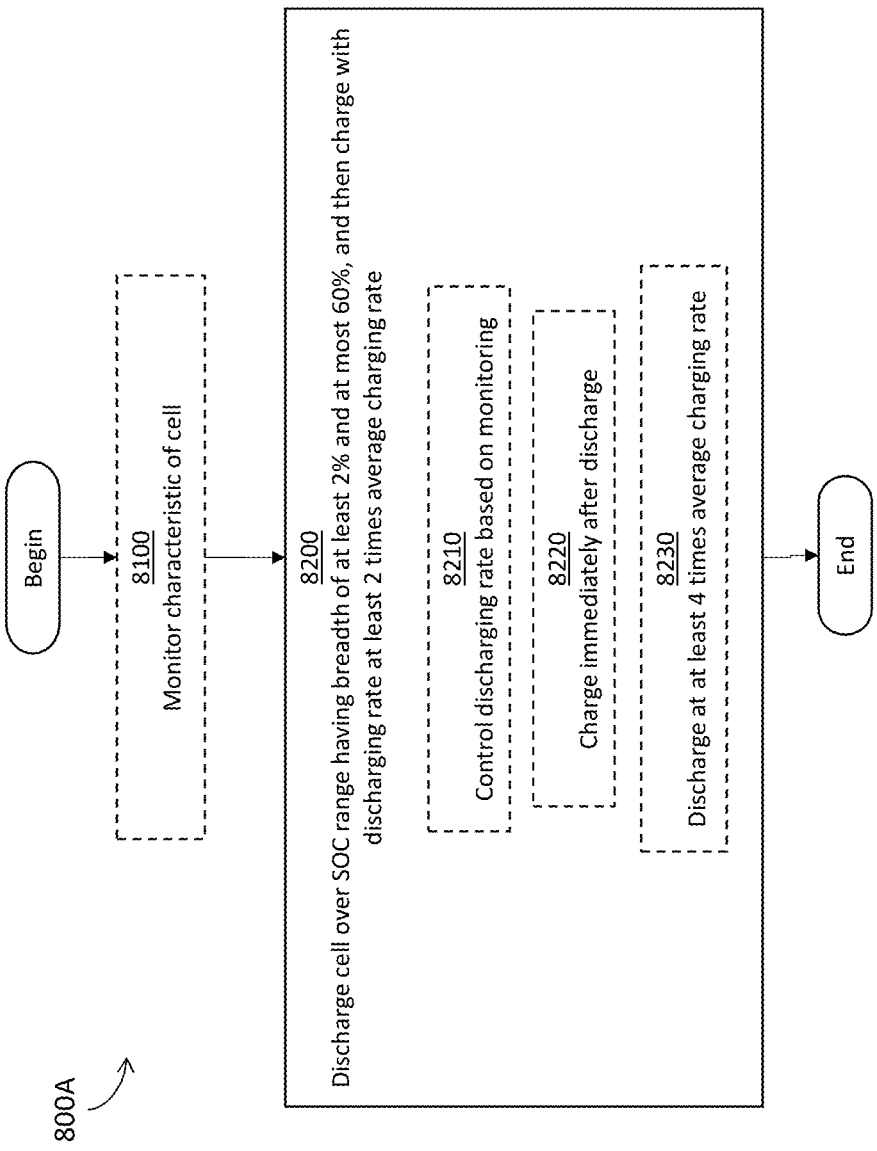
FIG. 8A is a flow chart depicting an additional representative process for managing an electrochemical cell, according to some embodiments.

FIG. 8A is a flow chart depicting an additional representative process for managing an electrochemical cell, according to some embodiments. The electrochemical cell can be, for example, the electrochemical cell 121A of exemplary FIG. 1A. The acts of representative process 800A are described in detail in the paragraphs that follow.

In some embodiments, representative process 800A may include act 8200, wherein the electrochemical cell is controlled such that the cell is discharged over a state of charge range having breadth of at least 2% and at most 60%, and then charged. According to some embodiments, a controller (e.g., controller 114 of FIG. 1A) may perform act 8200. In some embodiments, the discharging rate over the discharge is at least 2 times an average charging rate during the charge. According to some embodiments, an average charging/discharging rate may be calculated using techniques described herein.

In some embodiments, representative process 800A may also include optional act 8100, which comprises monitoring of characteristics of the cell. In act 8210, the discharging rate over the state of charge range is controlled based on at least one monitored characteristic of the cell. In some embodiments, the monitored characteristic may comprise cell impedance and/or cell resistance.

In act 8220, the cell may optionally also be controlled such that the charge occurs immediately after the discharge. In act 8230, the discharging rate over the state of charge range may optionally be at least 4 times the average charging rate during the charge.

In some embodiments, act 8200 may include the electrochemical cell being controlled such that the cell is discharged and then charged, and for at least a portion of the discharge that covers a first state of charge range having breadth of at least 2% and at most 60%, an average discharging rate over the portion of the discharge is at least 2 times an average charging rate during at least a portion of the charge. In some embodiments, the portion of the charge may comprise a second state of charge range having breadth of at least 2% and at most 60%.

In some embodiments, controlling the electrochemical cell comprises performing the discharge in response to analysis of a previous charging step. Alternatively or additionally, controlling the electrochemical cell comprises performing the charge in response to analysis of a previous discharging step.

In some embodiments, act 8230 may include the discharging rate over the first state of charge range optionally being at least 4 times the average charging rate over the second state of charge range.

In some embodiments, the breadth of the first state of charge range is at most 50%. In some embodiments, the breadth of the first state of charge range is at most 40%. According to some embodiments, the breadth of the first state of charge range is at most 30%. In some embodiments, the breadth of the first state of charge range is at most 20%. In some embodiments, the breadth of the first state of charge range is at most 10%.

In some embodiments, the breadth of the second state of charge range is at most 50%. In some embodiments, the breadth of the second state of charge range is at most 40%. According to some embodiments, the breadth of the second state of charge range is at most 30%. In some embodiments, the breadth of the second state of charge range is at most 20%. In some embodiments, the breadth of the second state of charge range is at most 10%.

In some embodiments, the breadth of the first state of charge range is at least 5%. In some embodiments, the breadth of the first state of charge range is at least 10%.

In some embodiments, the breadth of the second state of charge range is at least 5%. In some embodiments, the breadth of the second state of charge range is at least 10%.

In some embodiments, the first state of charge range has a lowest value of 5% state of charge or less. In some embodiments, the first state of charge range may be uninterrupted by a discharging step. In some embodiments, the second state of charge range has a lowest value of 5% state of charge or less.

The inventors have recognized and appreciated that the state of charge range having a lowest value of a certain percentage state of charge or less, for example 5%, can be particularly effective at providing improvements described herein.

In some embodiments, the discharging rate over the first state of charge range comprises an average discharging rate. In some embodiments, the discharging rate over the first state of charge range comprises a constant discharging rate.

In some embodiments, the charging rate over the second state of charge range comprises an average discharging rate. In some embodiments, the charging rate over the second state of charge range comprises a constant charging rate.

Figure 8B:
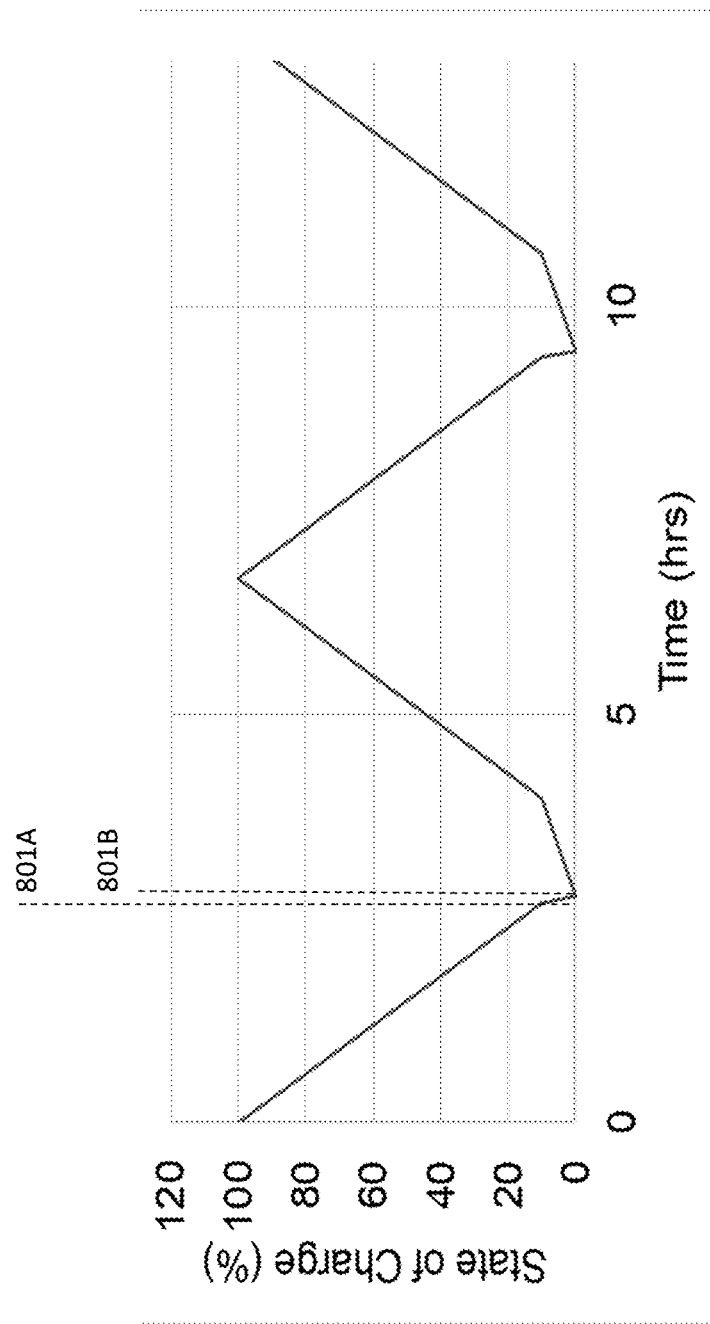
FIG. 8B is a charge-time graph for a representative electrochemical cell management system, according to some embodiments.

FIG. 8B is an exemplary charge-time graph for a representative electrochemical cell management system managing an electrochemical cell (e.g., electrochemical cell 121A)

in relation to the method described in FIG. 8A. One example of a state of charge range of FIG. 8A is shown in FIG. 8B, from point 801A to 801B. As FIG. 8B illustrates, the cell is discharged to 801A and then discharged faster from 801A to 801B, before more typical cycles of charging and discharging begin. In this example, the state of charge range from 801A to 801B is approximately 10% to 0%, having breadth of 10%.

Figure 9A:
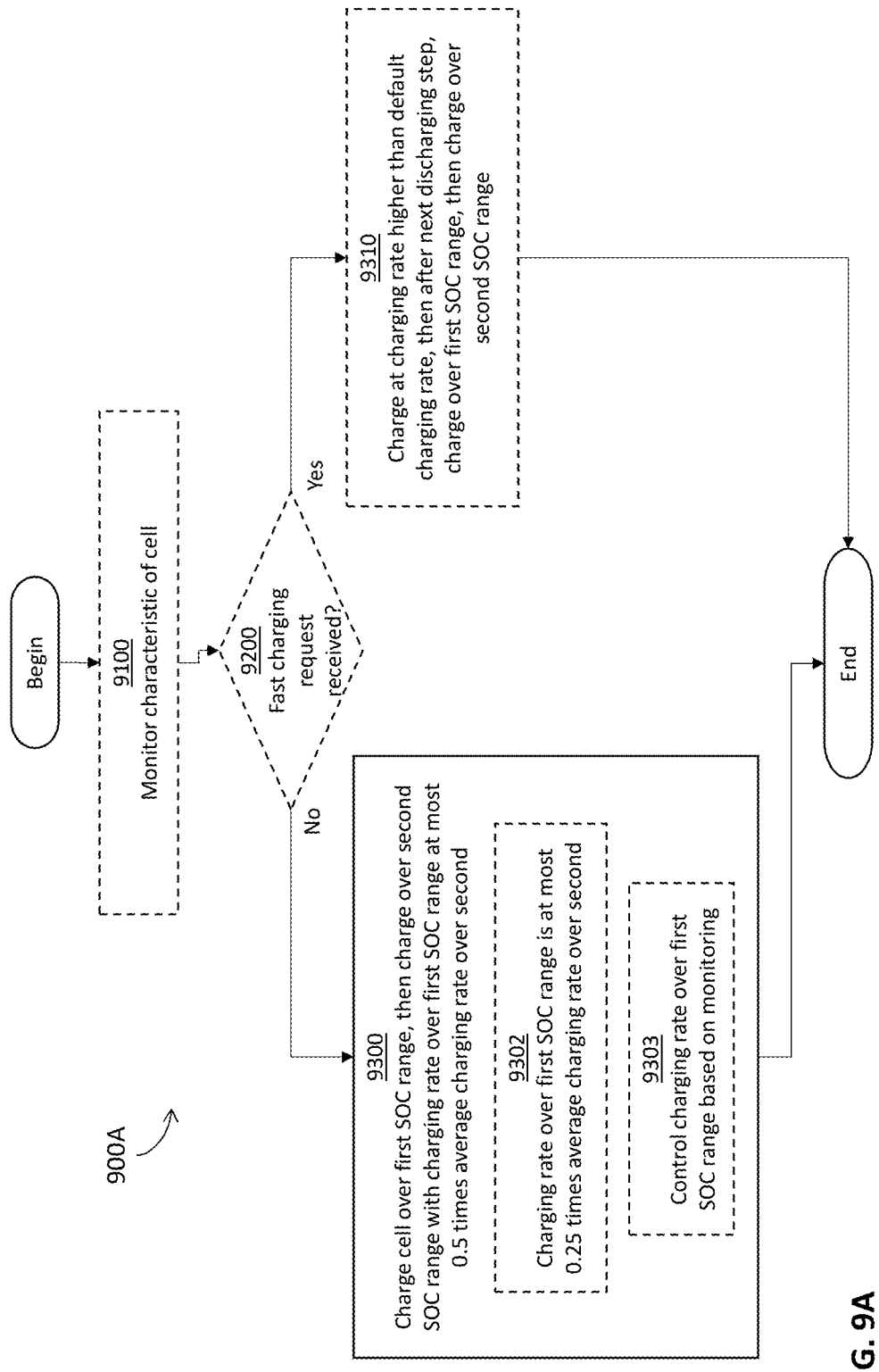
FIG. 9A is a flow chart depicting an additional representative process for managing an electrochemical cell, according to some embodiments.

FIG. 9A is a flow chart depicting an additional representative process for managing an electrochemical cell, according to some embodiments. The electrochemical cell can be, for example, the electrochemical cell 121A of exemplary FIG. 1A. The acts of representative process 900A are described in detail in the paragraphs that follow.

In some embodiments, representative process 900A may include act 9200, wherein it is determined whether a fast charging request has been received. For example, it may be determined whether the fast charging request has been received since the immediately preceding discharging step. In some embodiments, the representative process 900A may include act 9300, wherein if the fast charging request has not been received (or if the system has not been placed into a fast charging mode), the cell is controlled such that the cell is charged over a first state of charge range having breadth of at least 2% and at most 60%, and then charged over a second state of charge range. According to some embodiments, a controller (e.g., controller 114 of FIG. 1A) may perform acts 9200 and/or 9300. In some embodiments, the fast charging request comprises a request to charge at a charging rate higher than a default charging rate.

In some embodiments, the second state of charge range has breadth of at least 2% and at most 60%.

According to some embodiments, an average charging/discharging rate may be calculated using techniques described herein. According to some embodiments, the charging rate over the first state of charge range is at most 0.5 times an average charging rate over the second state of charge range. In some embodiments, the first state of charge range may be any portion of a charging step. In some embodiments, the second state of charge range may be any portion of a discharging step.

In some embodiments, representative process 900A may also include optional act 9310, wherein if the fast charging request has been received (or if the system has been placed into a fast charging mode), the cell is controlled to be charged at the charging rate higher than the default charging rate, then after a next discharging step, the cell is controlled such that the cell is charged over a first state of charge range having breadth of at least 2% and at most 60%, and then charged over a second state of charge range.

In some embodiments, representative process 900A may also include optional act 9100, which comprises monitoring of characteristics of the cell. In act 9303, charging rate over first state of charge range is controlled based on at least one monitored characteristic of the cell. In act 9302, the charging rate over the first state of charge range may be at most 0.25 times the average charging rate over the second state of charge range.

In some embodiments, the breadth of the first state of charge range is at most 50%. In some embodiments, the breadth of the first state of charge range is at most 40%. According to some embodiments, the breadth of the first state of charge range is at most 30%. In some embodiments, the breadth of the first state of charge range is at most 20%. In some embodiments, the breadth of the first state of charge range is at most 10%.

In some embodiments, the breadth of the second state of charge range is at most 50%. In some embodiments, the breadth of the second state of charge range is at most 40%. According to some embodiments, the breadth of the second state of charge range is at most 30%. In some embodiments, the breadth of the second state of charge range is at most 20%. In some embodiments, the breadth of the second state of charge range is at most 10%.

In some embodiments, the breadth of the first state of charge range is at least 5%. In some embodiments, the breadth of the first state of charge range is at least 10%.

In some embodiments, the breadth of the second state of charge range is at least 5%. In some embodiments, the breadth of the second state of charge range is at least 10%.

In some embodiments, the first state of charge range has a lowest value of 5% state of charge or less. In some embodiments, the first state of charge range may be uninterrupted by a discharging step. In some embodiments, the second state of charge range has a lowest value of 5% state of charge or less.

In some embodiments, the fast charging request comprises a request to charge at a charging rate higher than a default charging rate.

In some embodiments, the at least one controller is configured to: if the fast charging request has been received, control the cell such that the cell is charged at the charging rate higher than the default charging rate, then after a next discharging step, control the cell such that the cell is charged over a first state of charge range having breadth of at least 2% and at most 60%, and then charged over a second state of charge range.

In some examples, the charging rate over the first state of charge range is controlled based on at least one monitored characteristic of the cell comprising cell impedance and/or cell resistance.

In some embodiments, the charging rate over the first state of charge range comprises an average charging rate. In some embodiments, charging rate over the first state of charge range comprises a constant charging rate.

In some embodiments, the charging rate over the second state of charge range comprises an average discharging rate. In some embodiments, the charging rate over the second state of charge range comprises a constant charging rate.

In some embodiments, the charging rate over the first state of charge range is at most 0.25 times the average charging rate over the second state of charge range.

Figure 9B:
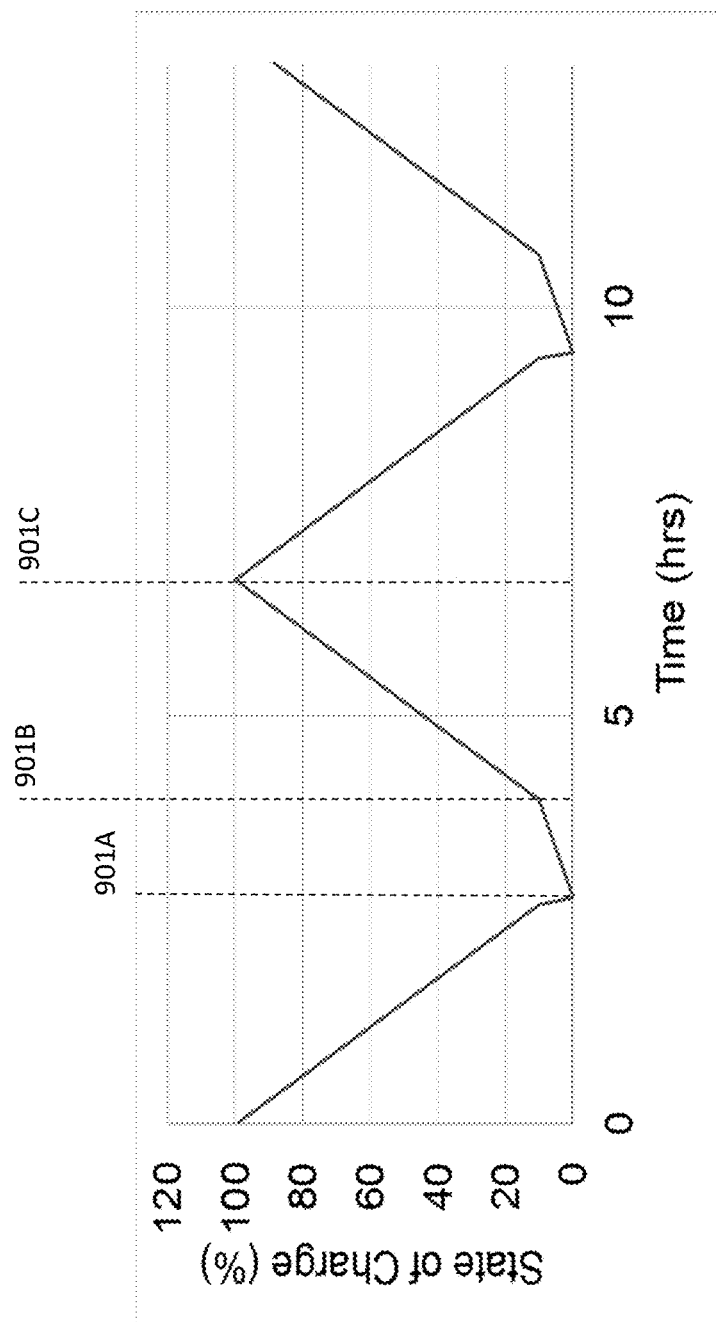
FIG. 9B is a charge-time graph for a representative electrochemical cell management system, according to some embodiments.

FIG. 9B is an exemplary charge-time graph for a representative electrochemical cell management system managing an electrochemical cell (e.g., electrochemical cell 121A) in relation to the method described in FIG. 9A. One example of a first state of charge range of FIG. 9A is shown in FIG. 9B, from point 901A to 901B. One example of a second state of charge range of FIG. 9A is shown in FIG. 9B, from point 901B to 901C. As FIG. 9B illustrates, the cell is discharged at multiple rates to 901A, then charged from 901A to 901B, then charged from 901B to 901C at a faster rate, before another cycle of discharging and charging begins. In this example, the first state of charge range from 901A to 901B is approximately 0% to 10%, having breadth of 10%, and the second state of charge range from 901B to 901C is approximately 10% to 100%, having breadth of 90%.

Figure 10A:
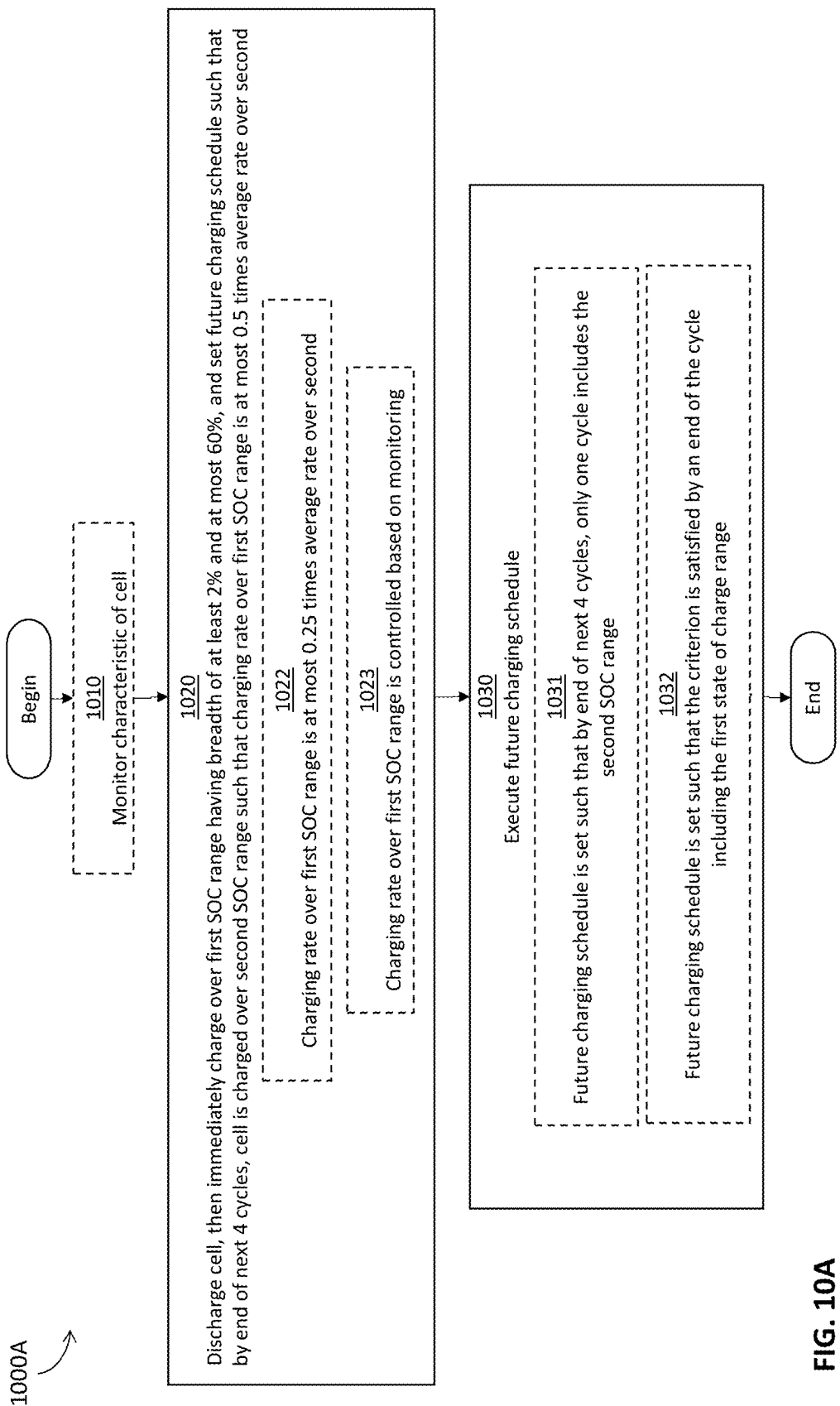
FIG. 10A is a flow chart depicting an additional representative process for managing an electrochemical cell, according to some embodiments.

FIG. 10A is a flow chart depicting an additional representative process for managing an electrochemical cell, according to some embodiments. The electrochemical cell can be, for example, the electrochemical cell 121A of exemplary FIG. 1A. The acts of representative process 1000A are described in detail in the paragraphs that follow.

In some embodiments, representative process 1000A may include act 1020, wherein the cell is controlled such that the cell is discharged, and then immediately charged over a first state of charge range having breadth of at least 2% and at most 60%, and a future charging schedule is set such that by an end of 4 cycles proceeding a cycle including the first state of charge range, a criterion is satisfied. In some embodiments, the representative process 1000A may include act 1030, wherein the future charging schedule is executed. According to some embodiments, the criterion comprises the cell being charged, over a second state of charge range, such that the charging rate over the first state of charge range is at most 0.5 times an average charging rate over the second state of charge range. According to some embodiments, a controller (e.g., controller 114 of FIG. 1A) may perform acts 1020 and/or 1030. According to some embodiments, an average charging/discharging rate may be calculated using techniques described herein.

In some embodiments, representative process 1000A may also include optional act 1010, which comprises monitoring of characteristic(s) of the cell. In act 1023, the charging rate over the first state of charge range may be controlled based on at least one monitored characteristic of the cell. In act 1020, as described in act 1022, the charging rate over the first state of charge range may be at most 0.25 times the average charging rate over the second state of charge range.

Additionally, representative process 1000A may also include optional act 1031, in which the future charging schedule is set such that by the end of the 4 cycles, only one cycle includes the second state of charge range. According to some embodiments, representative process 1000A may also include optional act 1032, in which the future charging schedule is set such that the criterion is satisfied by an end of the cycle including the first state of charge range.

In some embodiments, the breadth is at most 50%. In some embodiments, the breadth is at most 40%. According to some embodiments, the breadth is at most 30%. In some embodiments, the breadth is at most 20%. In some embodiments, the breadth is at most 10%.

In some embodiments, the breadth is at least 5%. In some embodiments, the breadth is at least 10%.

In some embodiments, the state of charge range has a lowest value of 5% state of charge or less.

In some examples, the future charging schedule is set such that by the end of the 4 cycles, only one cycle includes the second state of charge range. According to some embodiments, the future charging schedule is set such that the criterion is satisfied by an end of the cycle including the first state of charge range.

In some examples, the charging rate over the first state of charge range is controlled based on at least one monitored characteristic of the cell comprising cell impedance and/or cell resistance. According to some embodiments, the beginning of the charge over the first state of charge range may include conditioning as determined to be needed or helpful to improve cell health based on this monitoring.

In some embodiments, the charging rate over the first state of charge range comprises an average charging rate. In some embodiments, charging rate over the first state of charge range comprises a constant charging rate.

In some embodiments, the charging rate over the first state of charge range is at most 0.25 times the average charging rate over the second state of charge range.

Figure 10B:
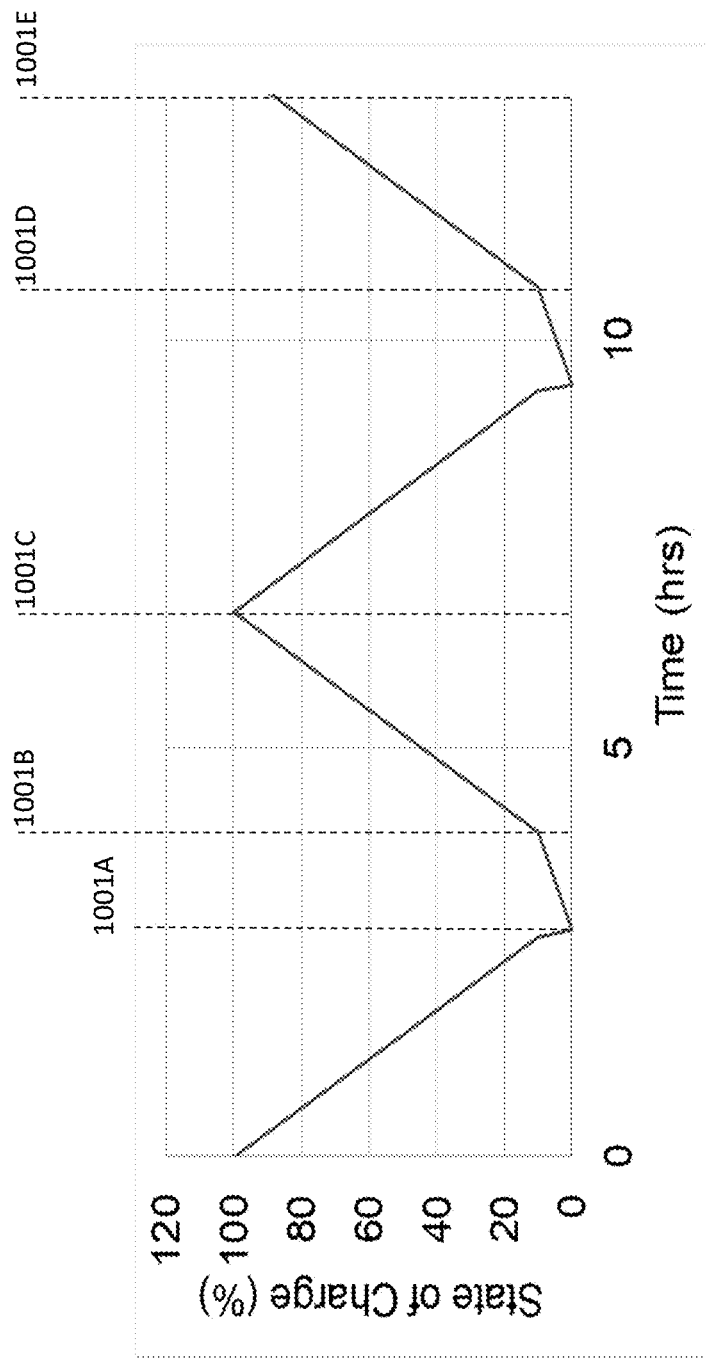
FIG. 10B is a charge-time graph for a representative electrochemical cell management system, according to some embodiments.

FIG. 10B is an exemplary charge-time graph for a representative electrochemical cell management system managing an electrochemical cell (e.g., electrochemical cell 121A) in relation to the method described in FIG. 10A. One example of a first state of charge range of FIG. 10A is shown in FIG. 10B, from point 1001A to 1001B. One example of a second state of charge range of FIG. 10A is shown in FIG. 10B, from point 1001B to 1001C. Another example of a second state of charge range of FIG. 10A is shown in FIG. 10B, from point 1001D to 1001E. As FIG. 10B illustrates, the cell is discharged at multiple rates to 1001A, then charged from 1001A to 1001B, then charged at a higher rate from 1001B to 1001C, then discharged at multiple rates and then charged to 1001D, then charged from 1001D to 1001E. In this example, the first state of charge range from 1001A to 1001B is approximately 10% to 0%, having breadth of 10%.

Figure 10C:
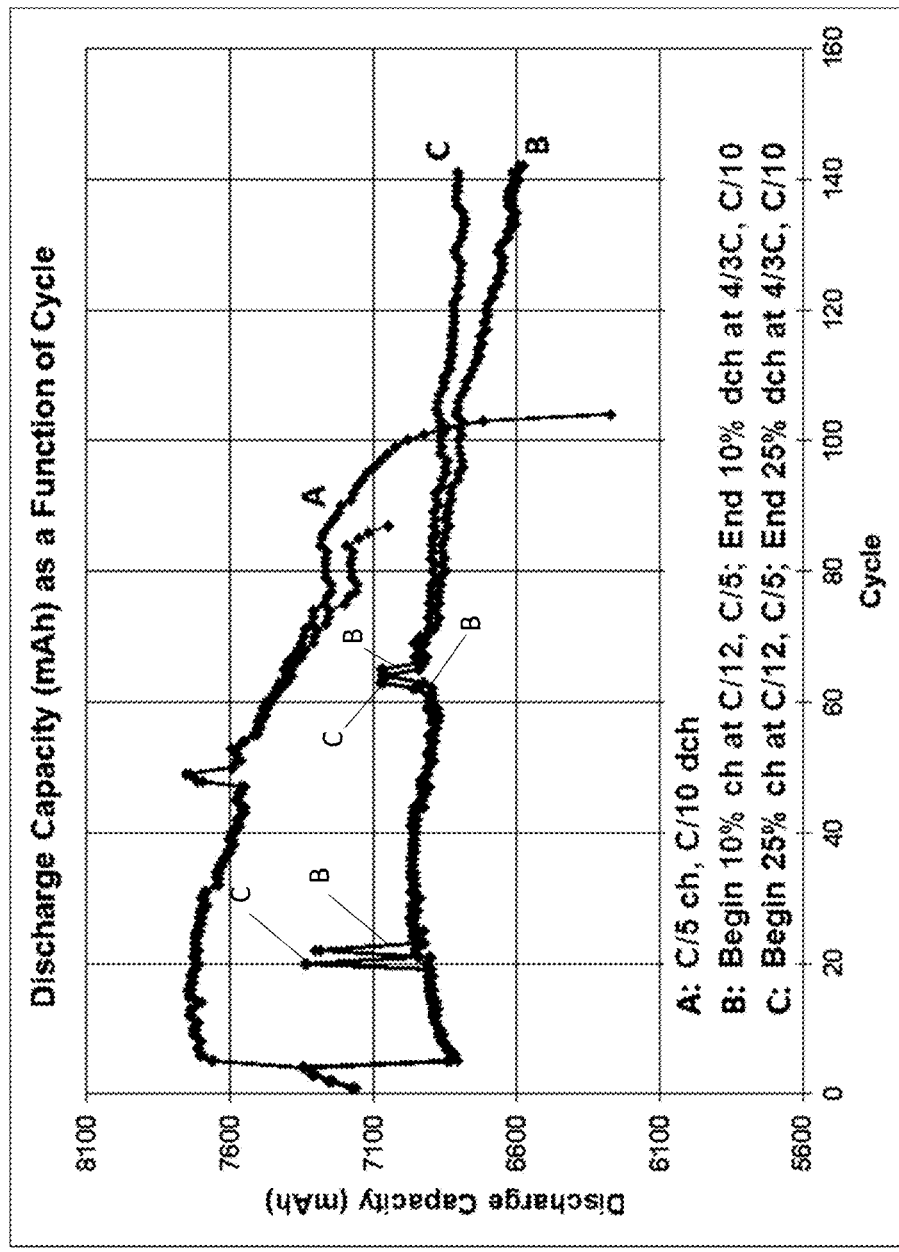
FIG. 10C is a capacity-cycle graph for a representative electrochemical cell management system, according to some embodiments.

FIG. 10C is an exemplary capacity-cycle graph for a representative electrochemical cell management system managing an electrochemical cell (e.g., electrochemical cell 121A). FIG. 10C includes 6 plots, which are grouped into 3 main plots referred to herein as A, B, and C because each pair of plots almost entirely overlaps. The inventors have recognized and appreciated, as FIG. 10C shows in plot A, that unmodified cycling (in this example, where the charging rate is 2 times the discharging rate) may cause a decline in cycle life compared to schemes like shown in plots B and C. On the other hand, in plot B the first 10% of the SOC range of a charging step has a charging rate of C/12, which is followed by a charging rate of C/5, and then a discharging step with a discharging rate of C/10, with the last 10% of the SOC range of the discharging step at 4C/3. In plot C, the first 25% of the SOC range of a charging step has a charging rate of C/12, which is followed by a charging rate of C/5, and then a discharging step with a discharging rate of C/10, with the last 25% of the SOC range of the discharging step at 4C/3. The inventors have recognized and appreciated, as FIG. 10C shows, that improvements to cycle life described herein can be realized at various ratios (e.g., those shown in both plots B and C), some of which may be even less favorable to lithium plating and stripping, and that benefits of using the rate ratios described herein can be especially pronounced when using them at the beginning or ending of charging and discharging steps.

Figure 11A:
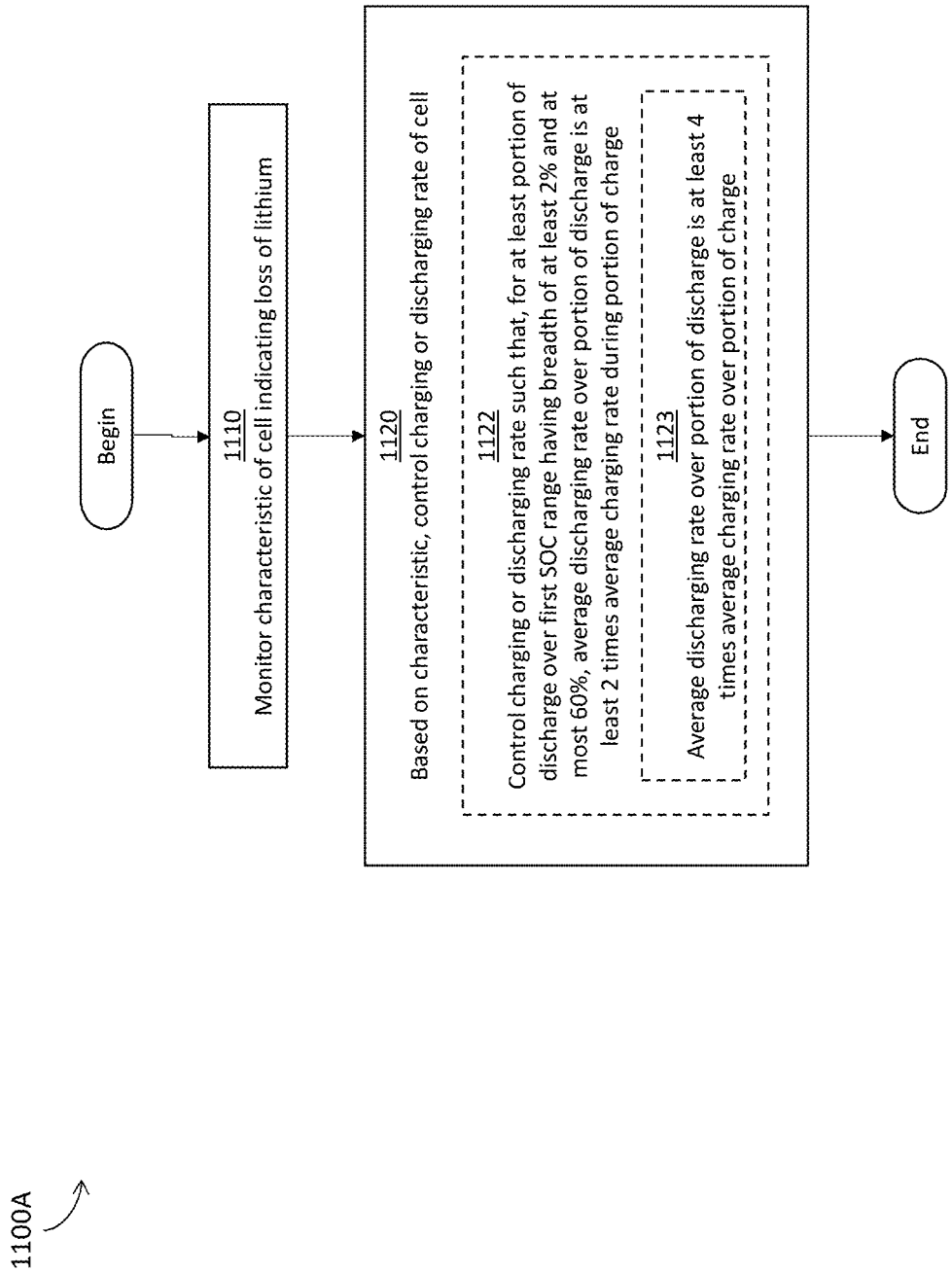
FIG. 11A is a flow chart depicting an additional representative process for managing an electrochemical cell, according to some embodiments.

FIG. 11A is a flow chart depicting an additional representative process for managing an electrochemical cell, according to some embodiments. The electrochemical cell can be, for example, the electrochemical cell 121A of exemplary FIG. 1A. The acts of representative process 1100A are described in detail in the paragraphs that follow.

In some embodiments, representative process 1100A may also include act 1110, which comprises monitoring of characteristic(s) of the cell indicating a loss of lithium. According to some embodiments, a loss of lithium may include a reduction in the amount of lithium in the cell that participates in the electrochemical reactions during charging or discharging. In some embodiments, loss of lithium can be due to undesired reactions between the lithium and other cell materials that may render the lithium no longer able to participate in the electrochemical reactions from which the cell is configured to generate electrical current. For example, the at least one characteristic may indicate a parasitic reaction between the lithium in the cell and at least one other material in the cell. Example of the at least one other material in the cell may comprise part of an electrolyte of the cell or part of a counter electrode of the cell.

According to some embodiments, the loss of lithium in the cell comprises a loss of metallic lithium in the cell. According to some embodiments, the cell comprises metallic lithium at least one point during discharge of the cell. For example, metallic lithium may be in the form of a lithium metal film or foil sheet.

According to some embodiments, the at least one monitored characteristic comprises at least one morphological characteristic of the cell. For example, the at least one morphological characteristic of the cell may comprise a value or change in at least one of: pressure, thickness, volume, deflection, conductivity, resistance, or temperature. The inventors have recognized and appreciated that, at a certain charge or discharge rate, if cell temperature increase (as one example) is higher than expected, that may indicate an increase in resistance, which may indicate lithium loss. For example, if we expect rate of temperature increase of X is expected at charging rate of Y, and the cell increases at 105% of X, that may indicate lithium loss.

In some embodiments, representative process 1100A may also include act 1120, wherein based on the at least one monitored characteristic of the cell, a charging rate or a discharging rate of the cell is controlled.

In some embodiments, representative process 1100A may also include optional act 1122, wherein the charging rate or the discharging rate is controlled such that, for at least a portion of the discharge that covers a first state of charge range having breadth of at least 2% and at most 60%, an average discharging rate over the portion of the discharge is at least 2 times an average charging rate during at least a portion of the charge.

According to some embodiments, a controller (e.g., controller 114 of FIG. 1A) may perform acts 1110, 1120, and/or 1122. According to some embodiments, an average charging/discharging rate may be calculated using techniques described herein.

In some embodiments, representative process 1100A may also include optional act 1123, wherein the average discharging rate over the portion of the discharge is at least 4 times the average charging rate during the portion of the charge.

In some embodiments, the portion of the charge may comprise a second state of charge range having breadth of at least 2% and at most 60%.

In some embodiments, the breadth of the first state of charge range is at most 50%. In some embodiments, the breadth of the first state of charge range is at most 40%. According to some embodiments, the breadth of the first state of charge range is at most 30%. In some embodiments, the breadth of the first state of charge range is at most 20%. In some embodiments, the breadth of the first state of charge range is at most 10%.

In some embodiments, the breadth of the second state of charge range is at most 50%. In some embodiments, the breadth of the second state of charge range is at most 40%. According to some embodiments, the breadth of the second state of charge range is at most 30%. In some embodiments, the breadth of the second state of charge range is at most 20%. In some embodiments, the breadth of the second state of charge range is at most 10%.

In some embodiments, the breadth of the first state of charge range is at least 5%. In some embodiments, the breadth of the first state of charge range is at least 10%.

In some embodiments, the breadth of the second state of charge range is at least 5%. In some embodiments, the breadth of the second state of charge range is at least 10%.

In some embodiments, the first state of charge range has a lowest value of 5% state of charge or less. In some embodiments, the first state of charge range may be uninterrupted by a discharging step. In some embodiments, the second state of charge range has a lowest value of 5% state of charge or less.

In some embodiments, the discharging rate over the first state of charge range comprises an average discharging rate. In some embodiments, the discharging rate over the first state of charge range comprises a constant discharging rate.

In some embodiments, the charging rate over the second state of charge range comprises an average discharging rate. In some embodiments, the charging rate over the second state of charge range comprises a constant charging rate.

To illustrate one example in which pressure is monitored and a charge/discharge scheme is implemented in response to that monitoring, a pressure sensor (e.g., a piezoelectric force transducer or a strain gauge) can be used to determine pressure between cells in a block or within a cell. In some embodiments, if a threshold increase in pressure is detected, then a scheme can be initiated such that the average discharging rate over the portion of the discharge is at least 2 times the average charging rate during the portion of the charge. In some embodiments, the threshold increase may be at least 0.1 $kg/cm^2$ per cycle. For example, the threshold increase may be 0.2 $kg/cm^2$ per cycle. In some embodiments, the threshold increase may be at least 0.5 $kg/cm^2$ above initial pressure. For example, the threshold increase may be 1 or more $kg/cm^2$ above initial pressure. In some embodiments, the threshold increase may be at least 1% per cycle. For example, the threshold increase may be 2% per cycle. In some embodiments, the threshold increase may be at least 5% above initial pressure. For example, the threshold increase may be 10% above initial pressure.

To illustrate one example in which thickness is monitored and a charge/discharge scheme is implemented in response to that monitoring, a thickness sensor (e.g., a strain gauge) can be used to determine thickness of a cell. In some embodiments, if a threshold increase in thickness is detected, then a scheme can be initiated such that the average discharging rate over the portion of the discharge is at least 2 times the average charging rate during the portion of the charge. In some embodiments, the threshold increase may be at least 0.05% per cycle. For example, the threshold increase may be 0.1% per cycle. In some embodiments, the threshold increase may be at least 2.5% above initial thickness. For example, the threshold increase may be at least 5% above initial thickness.

To illustrate one example in which volume is monitored and a charge/discharge scheme is implemented in response to that monitoring, a volume sensor (e.g., a strain gauge) can be used to determine volume of a cell. In some embodiments, if a threshold increase in volume is detected, then a scheme can be initiated such that the average discharging rate over the portion of the discharge is at least 2 times the average charging rate during the portion of the charge. In some embodiments, the threshold increase may be at least 0.05% per cycle. For example, the threshold increase may be 0.1% per cycle. In some embodiments, the threshold increase may be at least 2.5% above initial volume. For example, the threshold increase may be at least 5% above initial volume.

To illustrate one example in which deflection is monitored and a charge/discharge scheme is implemented in response to that monitoring, a deflection sensor (e.g., a strain gauge) can be used to determine deflection of a cell. In some embodiments, if a threshold increase in deflection is detected, then a scheme can be initiated such that the average discharging rate over the portion of the discharge is at least 2 times the average charging rate during the portion of the charge. In some embodiments, the threshold increase may be equivalent to at least 0.2 kg/cm$^2$ per cycle. In some embodiments, the threshold increase may be equivalent to at least 1 kg/cm$^2$ above initial deflection. In some embodiments, the threshold increase may be 2% per cycle or 10% above initial deflection.

To illustrate one example in which conductivity is monitored and a charge/discharge scheme is implemented in response to that monitoring, a conductivity sensor can be used to determine conductivity within a cell. In some embodiments, if a threshold decrease in conductivity is detected, then a scheme can be initiated such that the average discharging rate over the portion of the discharge is at least 2 times the average charging rate during the portion of the charge. In some embodiments, the threshold decrease may be at least 0.25% per cycle. For example, the threshold decrease may be 0.5% per cycle. In some embodiments, the threshold decrease may be at least 2.5% above initial conductivity. For example, the threshold decrease may be 5% above initial conductivity.

To illustrate one example in which resistance is monitored and a charge/discharge scheme is implemented in response to that monitoring, a resistance sensor can be used to determine resistance within a cell. In some embodiments, if a threshold increase in resistance is detected, then a scheme can be initiated such that the average discharging rate over the portion of the discharge is at least 2 times the average charging rate during the portion of the charge. In some embodiments, the threshold increase may be at least 0.25% per cycle. For example, the threshold increase may be 0.5% per cycle. In some embodiments, the threshold increase may be at least 2.5% above initial conductivity. For example, the threshold increase may be 5% above initial conductivity.

To illustrate one example in which temperature is monitored and a charge/discharge scheme is implemented in response to that monitoring, a temperature sensor (e.g., a thermistor or a thermocouple) can be used to determine the temperature or rate of temperature change of a cell. In some embodiments, if a threshold increase in temperature is detected, then a scheme can be initiated such that the average discharging rate over the portion of the discharge is at least 2 times the average charging rate during the portion of the charge. In some embodiments, the threshold increase may be at least 2.5% above the increase expected at a given charging or discharging rate. For example, the threshold increase may be 5% above the increase expected at a given charging or discharging rate.

Figure 11B:
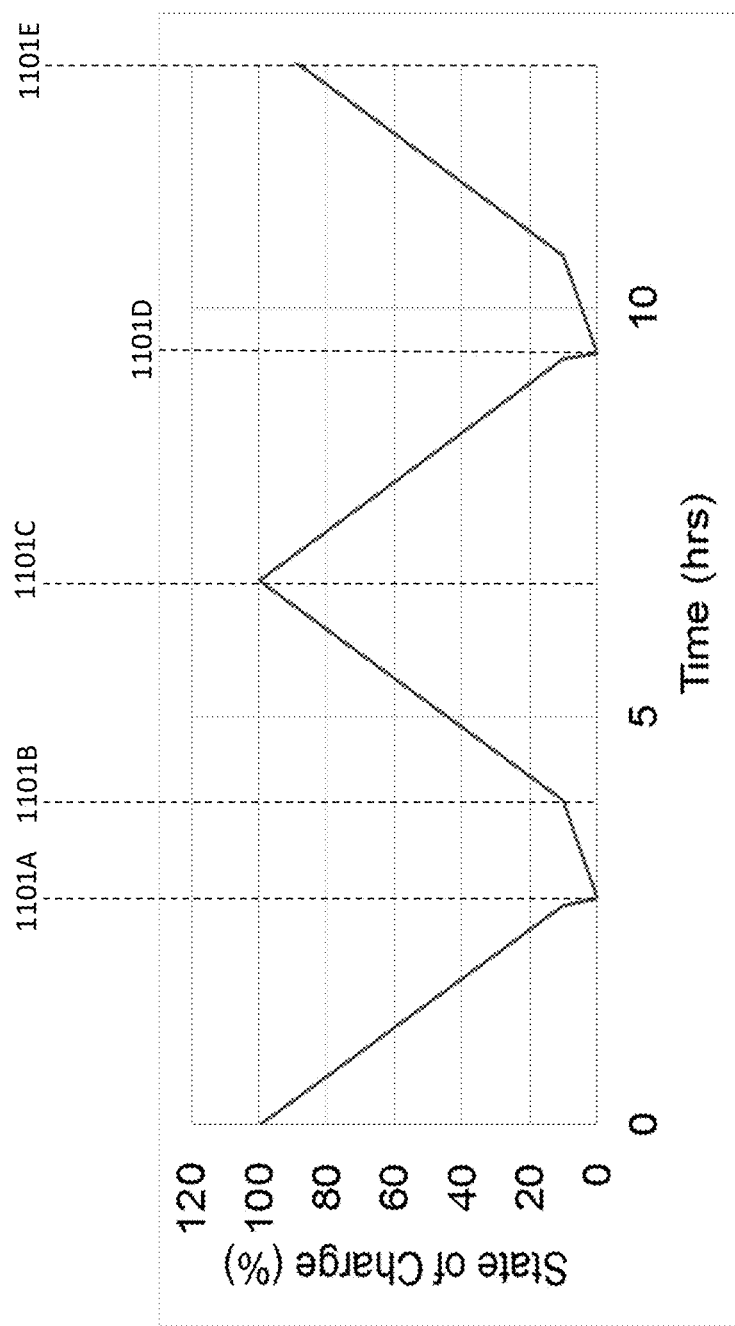
FIG. 11B is a charge-time graph for a representative electrochemical cell management system, according to some embodiments.

FIG. 11B is an exemplary charge-time graph for a representative electrochemical cell management system managing an electrochemical cell (e.g., electrochemical cell 121A) in relation to the method described in FIG. 11A. One example of a first state of charge range of FIG. 11A is shown in FIG. 11B, from point 1101C to 1101D. One example of a second state of charge range of FIG. 11A is shown in FIG. 11B, from point 1101A to 1101C. Another example of a second state of charge range of FIG. 11A is shown in FIG. 11B, from point 1101D to 1101E. As FIG. 11B illustrates, the cell is discharged at multiple rates to 1101A, then charged from 1101A to 1101B, then charged at a higher rate from 1101B to 1101C, then discharged at multiple rates to 1101D, then charged from 1101D to 1101E. In this example, the first state of charge range from 1101A to 1101B is approximately 10% to 0%, having breadth of 10%.

Figure 11C:
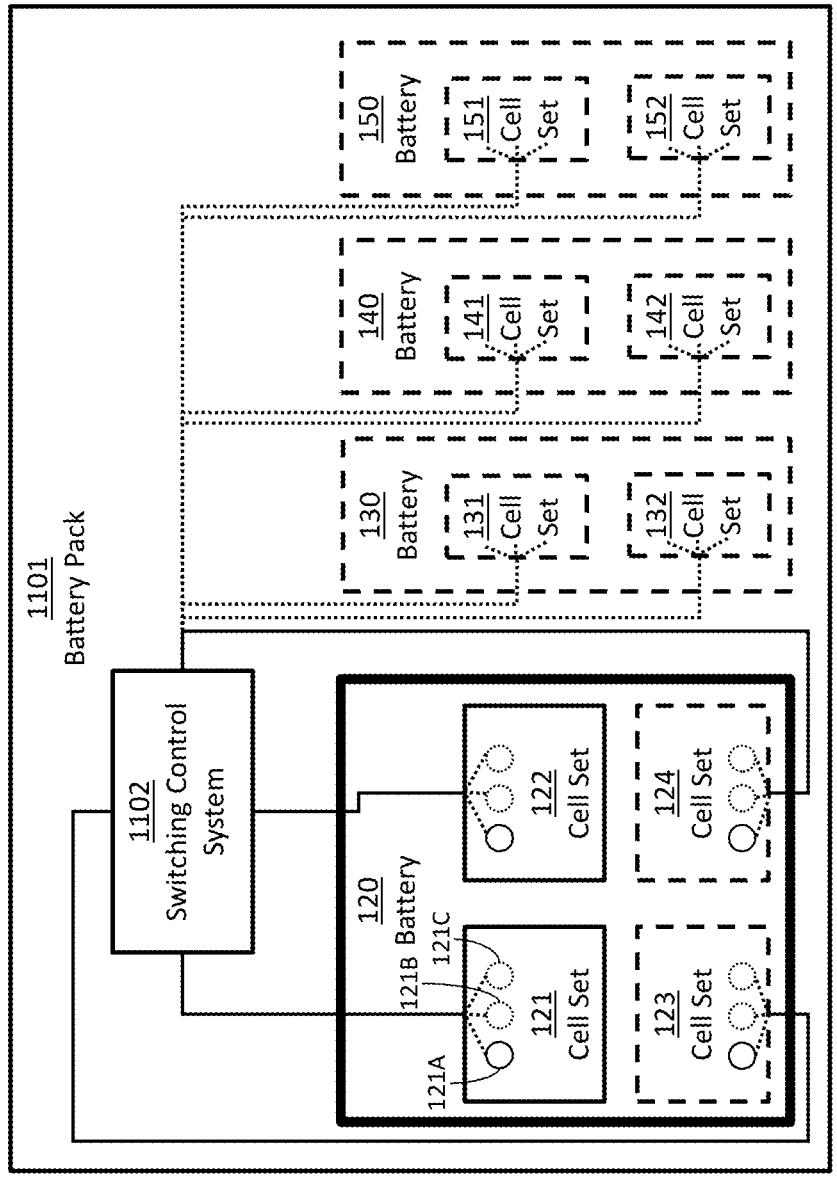
FIG. 11C is a block diagram illustrating a representative battery pack, according to some embodiments.

FIG. 11C depicts a representative battery pack 1101. In some embodiments, representative battery pack 1101 may include a switching control system (e.g., 1102) and one or more batteries (e.g., 120, 130, 140, 150, and so on). It should be appreciated that although only a single switching control system 1102 and only four batteries 120-150 are shown in FIG. 11C, any suitable number of these components may be used. Any of numerous different modes of implementation may be employed. Furthermore, although a label in the singular is used herein to reference a switching control system, it should be appreciated that the components used for the control and switching described herein may be distributed across any suitable number of devices (e.g., switches, controller(s), etc.).

In some embodiments, cycles can be programmed and/or controlled by a charger (such as a wall charger), which may be applied to the pack. In some embodiments, cycles can be programmed and/or controlled by a battery management system (BMS) of the battery pack, which may be applied to one or more modules. In some embodiments, cycles can be programmed and/or controlled by a BMS in the module, which may be applied to the cells. In some examples, the charges may be moved at favorable rates, for example 1:4 charging to discharging rate, and limited depth of discharge (DOD) (for example, 10%), from one module to the other within a pack. In some examples, the charges may be moved at favorable rates, for example 1:4 charging to discharging rate, and limited DOD, for example 10%, from one or more cells to the other within a module.

In some embodiments, a switching control system (e.g., 1102) may include an array of switches, such as those further described in relation to FIGS. 12A and 12B below, and it may include a controller. Additionally, the switching control system may be connected to each set of cells and/or to each cell of the batteries individually, as discussed regarding FIG. 1C above. In some embodiments, the switching control system may be integrated into the battery pack. Additionally, the switching control system may control the switch(es) (such as in a switch array) to discharge the cells or sets of cells sequentially, such as in a predefined order associated with the cells or sets of cells. Alternatively or additionally, the switching control system may control the switch(es) to discharge the cells or sets of cells based on any one or more of the following: a duration of a connection between a load and a set of cells currently connected to the load (which may be at least 0.01 seconds in some embodiments), a delivered capacity at the connection, and the value of a function. In certain embodiments, the basis for the control may not include a number of prior discharging steps of the set of cells.

According to some embodiments, the switching control system may perform any number of other functions, such as those of the controller described in relation to FIGS. 1A and 1C above.

It should be appreciated that any of the components of representative system 100 or representative battery pack 1101 may be implemented using any suitable combination of hardware and/or software components. As such, various components may be considered a controller that may employ any suitable collection of hardware and/or software components to perform the described function.

Figure 12A:
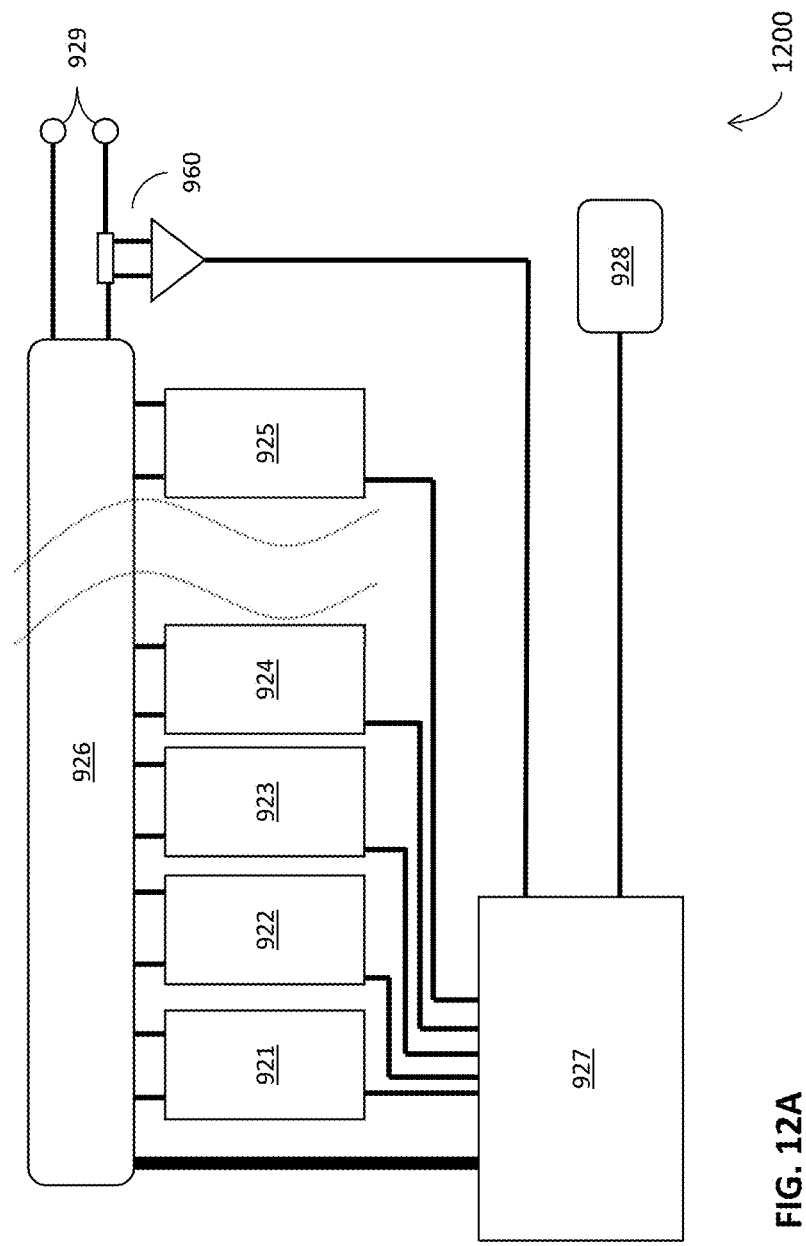
FIG. 12A is a block diagram illustrating a representative battery management system, according to some embodiments.

FIG. 12A depicts a representative battery management system 1200. In some embodiments, representative system 1200 may include any suitable number of multi-cell blocks (e.g., 921-925), which may be cell strings as described herein, a battery cell block arrangement and balance switch configuration (e.g., 926), which may be a string arrangement and balance switch configuration, a battery management microcontroller (e.g., 927), which may be a cell string microcontroller, a battery system interface (e.g., 928), battery power terminals (e.g., 929), and a sensor (e.g., 960). The multi-cell blocks may be connected to the battery cell block arrangement and balance switch configuration. The multi-cell blocks may also be connected to the battery management microcontroller. In some embodiments, cell strings may be connected to the string arrangement and balance switch configuration and to individual battery management microcontrollers, which then may be connected to a string microcontroller, as described herein.

In some embodiments, the battery cell block arrangement and balance switch configuration may include switch multiplexing, which may connect the cell blocks (e.g., 921-925) in the series, parallel, serial/parallel, or any other suitable topology required to meet the voltage and current requirements of a given application or load.

According to some embodiments, the battery management microcontroller may monitor and control the charging and discharging of the battery management system to ensure the safe operation of the system and its components. Additionally, the battery management microcontroller may communicate with a user (e.g., a consumer using the system to power a load) as well as with any suitable internal production, calibration, and test equipment. For example, the battery management microcontroller may be connected to the battery system interface (e.g., 928), which may provide the interface required for the battery management microcontroller to communicate with the user as well as internal production, calibration, and test equipment, and any other suitable entity.

In some embodiments, the sensor may be connected to the battery cell block arrangement and balance switch configuration, the battery management microcontroller, and/or the battery power terminals, and it may the measure attributes of the multi-cell blocks and/or any other component of the system. For example, the sensor may measure attributes of the multi-cell blocks that form a criterion and/or any of the parameters of a function as described above. For example, the sensor may include a current sensor that measures the current in amperes of a given set of cells.

It should be appreciated that although battery cell block arrangement and balance switch configuration 926, battery management microcontroller 927, battery system interface 928, and sensor 960 appear in singular form, and only five multi-cell blocks 921-925 are shown in FIG. 12A, any suitable number of these components may be used and they may represent multiple components. Any of numerous different modes of implementation may be employed. Indeed, although a label in the singular is used herein to reference a battery cell block arrangement and balance switch configuration, it should be appreciated that the components used for the arrangement and balance switching described herein may be distributed across any suitable number of devices (e.g., switches).

Figure 12B:
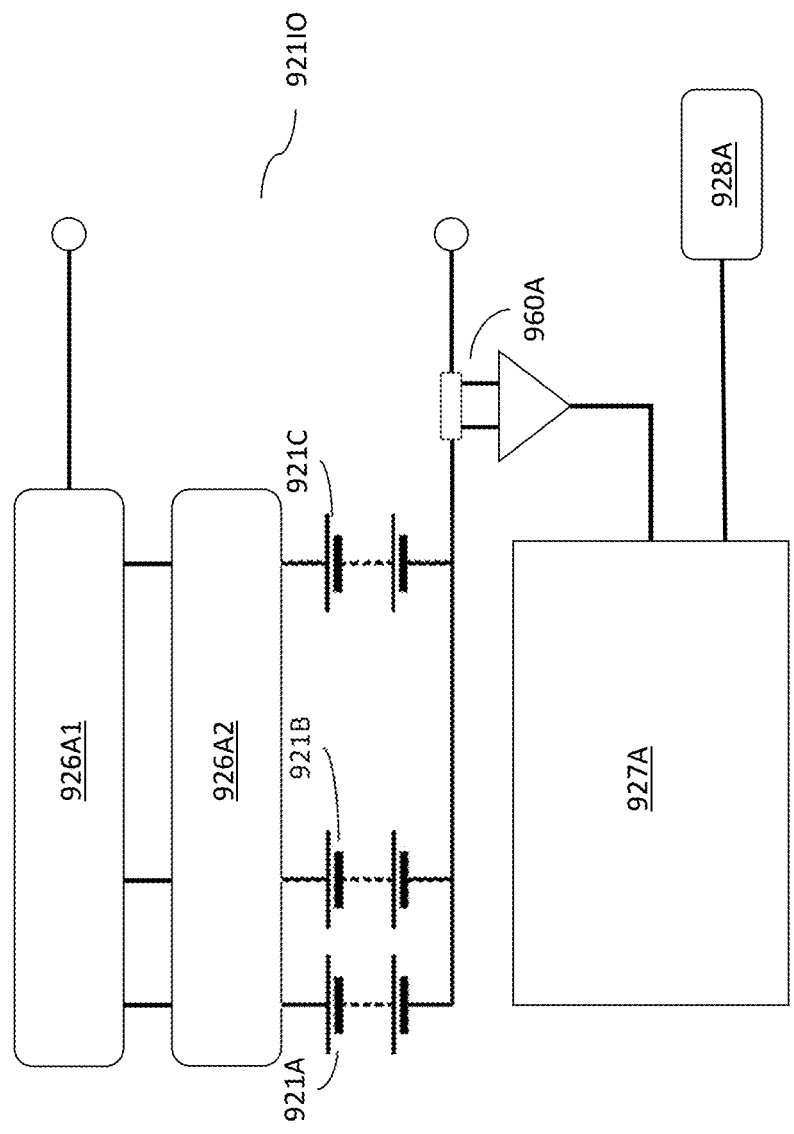
FIG. 12B is a block diagram illustrating a representative cell set and corresponding components, according to some embodiments.

FIG. 12B depicts a representative cell set and corresponding components. In some embodiments, the representative cell set may include any suitable number of cells (e.g., 921A-C) and may constitute a multi-cell block, such as is described above. Additionally, the representative cell set may include cell multiplexing switches (e.g., 926A1), cell balance switches and resistors (e.g., 926A2), a cell block microcontroller (e.g., 927A), a battery management microcontroller interface (e.g., 928A), a sensor (e.g., 960A), and an input/output bus for the cell set (e.g., 92110). In some embodiments, the cells may be connected to the cell balance switches and resistors, which may be connected to the cell multiplexing switches.

In some embodiments, each cell (e.g., each of 921A-C) may be connected to an array of the cell multiplexing switches, which may connect or isolate the given cell(s) from the input/output bus (e.g., 92110), and which may connect or disconnect the given cell(s) to a balance resistor (e.g., one of the resistors in 926A2) that shares the balance bus with the other cells. Additionally, in discharge mode one cell (e.g., 921A) may be connected to the input/output bus and disconnected from the balance resistor. The remaining cells (e.g., 921B-C) may be disconnected from the input/output bus and connected to the corresponding balance resistor(s). Additionally, in charge mode for some embodiments, all cells (e.g., 921A-C) may be connected to the input/output bus and disconnected from the balance resistors 926A2.

According to some embodiments, the cell block microcontroller (e.g., 927A) may generate switching waveforms to ensure that overlap and deadband requirements for the switching is appropriate for the application or load. Additionally, the cell block microcontroller may determine the state required by the application or load by monitoring the cell block's voltage and current, as well as by receiving communication from a battery management microcontroller (e.g., 927 in FIG. 12A), to which the cell block microcontroller may be connected via the battery management microcontroller interface.

Figure 12C:
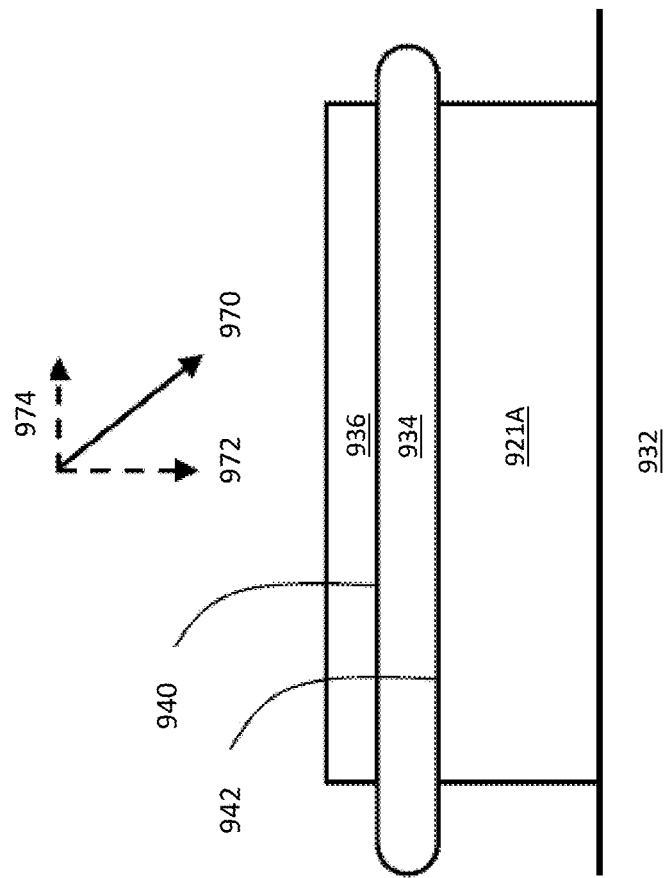
FIG. 12C is a cross-sectional schematic diagram illustrating the application of an anisotropic force to one or more electrochemical cells, according to some embodiments.

FIG. 12C is an exemplary cross-sectional schematic illustration of an electrochemical system in which an anisotropic force is applied to an electrochemical cell (e.g., 921A), according to one set of embodiments. The term "electrochemical cell" is used herein to generally refer to an anode, a cathode, and an electrolyte configured to participate in an electrochemical reaction to produce power. An electrochemical cell can be rechargeable or non-rechargeable.

In FIG. 12C, the system may include electrochemical cell 921A and, in some embodiments, a pressure distributor 934 containing a fluid associated with electrochemical cell 921A. Pressure distributor 934 can be configured such that an anisotropic force is applied to a component of electrochemical cell 921A through pressure distributor 934. For example, in the set of embodiments illustrated in FIG. 12C, pressure transmitter 936 can be configured to apply an anisotropic force to pressure distributor 934, which in turn causes an anisotropic force to be applied to at least one component (e.g., an electrode) of electrochemical cell 921A. The system can also include a substrate 932 on which the electrochemical cell is positioned. Substrate 932 can comprise, for example, a tabletop, a surface of a container in which electrochemical cell 921A is housed, or any other suitable surface.

Pressure distributor 934 can be associated with electrochemical cell 921A in a variety of suitable configurations to produce the inventive systems and methods described herein. As used herein, a pressure distributor is associated with an electrochemical cell when at least a portion of a force that is applied to and/or through the pressure distributor can be transmitted to a component of the electrochemical cell. For example, in certain embodiments, a pressure distributor is associated with an electrochemical cell when the pressure distributor is in direct contact with the electrochemical cell or a component thereof. Generally, a first article and a second article are in direct contact when the first article and the second article are directly touching. For example, in FIG. 12C, pressure distributor 934 and the electrochemical cell 921A are in direct contact.

In certain embodiments, a pressure distributor is associated with the electrochemical cell when the pressure distributor is in indirect contact with at least one component of the electrochemical cell. Generally, a first article and a second article are in indirect contact when a pathway can be traced between the first article and the second article that intersects only solid and/or liquid components. Such a pathway can be in the form of a substantially straight line, in certain embodiments. A pressure distributor can be in indirect contact with an electrochemical cell, in certain embodiments, when one or more solid and/or liquid materials are positioned between them, but a force can still be transmitted to the electrochemical cell through the pressure distributor.

In certain embodiments, a pressure distributor is associated with an electrochemical cell when it is located within the boundaries of a container at least partially (e.g., completely) enclosing the components of the electrochemical cell. For example, in certain embodiments, pressure distributor 934 could be positioned between an electrode and a container at least partially enclosing the electrochemical cell. In certain embodiments, pressure distributor 934 could be positioned between a current collector and a container at least partially enclosing the electrochemical cell. In some embodiments, pressure distributor 934 can be used as a current collector, for example, positioned next to an electrode of the electrochemical cell and within a container at least partially containing the electrodes and electrolyte of the electric cell. This could be achieved, for example, by fabricating pressure distributor 934 from a material (e.g., a metal such as a metal foil, a conductive polymer, and the like) that is sufficiently electrically conductive to transport electrons to and/or from an electrode of the electrochemical cell.

In some embodiments, a pressure distributor is associated with an electrochemical cell when it is located outside the boundaries of a container at least partially (e.g., completely) enclosing the components of the electrochemical cell. For example, in certain embodiments, pressure distributor 934 could be positioned in direct or indirect contact with an exterior surface of a container at least partially enclosing the electrodes and electrolyte of an electrochemical cell.

In certain embodiments, the pressure distributor can be located a relatively short distance from at least one electrode of an electrochemical cell. For example, in certain embodiments, the shortest distance between the pressure distributor and an electrode of the electrochemical cell is less than about 10 times, less than about 5 times, less than about 2 times, less than about 1 time, less than about 0.5 times, or less than about 0.25 times the maximum cross-sectional dimension of that electrode.

In some embodiments, a pressure distributor can be associated with a particular electrode (e.g., an anode) of an electrochemical cell. For example, a pressure distributor can be in direct or indirect contact with an electrode (e.g., an anode such as an anode comprising lithium) of an electrochemical cell. In certain embodiments, the pressure distributor can be positioned outside a container at least partially containing the electrode but still associated with the electrode, for example, when only liquid and/or solid components separate the electrode from the pressure distributor. For example, in certain embodiments in which the pressure distributor is positioned in direct or indirect contact with a container at least partially enclosing the electrode and a liquid electrolyte, the pressure distributor would be associated with the electrode.

In certain embodiments, a force can be applied to electrochemical cell 921A or a component of electrochemical cell 921A (e.g., an electrode of the electrochemical cell) through pressure distributor 934. As used herein, a force is applied to a first component (e.g., an electrochemical cell) through a second component (e.g., a pressure distributor) when the second component at least partially transmits a force from the source of the force to the first component.

A force can be applied to an electrochemical cell or a component thereof through a pressure distributor in a variety of ways. In certain embodiments, applying a force to a pressure distributor comprises applying a force to an external surface of the pressure distributor. This can be achieved, for example, via pressure transmitter 936. For example, in FIG. 12C, pressure transmitter 936 can be positioned to apply an anisotropic force to electrochemical cell 921A through pressure distributor 934 by applying a force to surface 940 of pressure distributor 934. As used herein, a first component is positioned to apply an anisotropic force to a second component when the first and second components are positioned such that at least a portion of a force that is applied to and/or through the first component can be transmitted to the second component. In certain embodiments, pressure transmitter and the pressure distributor are in direct contact. In some embodiments, one or more materials (e.g., one or more solid and/or liquid materials) are positioned between the pressure transmitter and the pressure distributor, but a force can still be applied to the pressure distributor by the pressure transmitter. In certain embodiments, the pressure transmitter and the pressure distributor can be in indirect contact such that a continuous pathway can be traced through solid and/or liquid materials from the pressure distributor to the electrochemical cell. Such a pathway can be substantially (e.g., completely) straight, in certain embodiments.

In the set of embodiments illustrated in FIG. 12C, pressure transmitter 936 and electrochemical cell 921A are positioned on opposite sides of pressure distributor 934. Accordingly, when an anisotropic force (e.g., an anisotropic force in the direction of arrow 150) is applied to and/or by pressure transmitter 936 to surface 940, the force can be transmitted through pressure distributor 934 onto surface 942 of electrochemical cell 921A, and to the components of electrochemical cell 921A.

In some embodiments, applying a force to a pressure distributor comprises applying a force to an internal surface of the pressure distributor. For example, in certain embodiments, a force can be applied through the pressure distributor to the electrochemical cell by maintaining and/or increasing the pressure of the fluid within the pressure distributor. In the set of embodiments illustrated in FIG. 12C, a force can be applied through pressure distributor 934 to electrochemical cell 921A by transporting additional fluid through an inlet (not shown) of pressure distributor 934 (e.g., by inflating pressure distributor 934). In some such embodiments, when the pressure within a pressure distributor is maintained and/or increased, the movement of pressure transmitter can be restricted such that a force is produced on an external surface of the electrochemical cell and/or on a component of the electrochemical cell (e.g., an active surface of an electrode within the electrochemical cell). For example, in FIG. 12C, as additional fluid is added to pressure distributor 934, pressure transmitter 936 can be configured to restrict the movement of the boundaries of pressure distributor 934 such that a force is applied to surface 942 of electrochemical cell 921A.

In certain embodiments, fluid can be added to pressure distributor 934 before it is positioned between electrochemical cell 921A and pressure transmitter 936. After the fluid has been added, pressure distributor 934 can be compressed and positioned between electrochemical cell 921A and pressure transmitter 936, after which, the compression of the fluid within pressure distributor 934 can produce a force that is applied to surface 942 of electrochemical cell 921A (and, accordingly, to a surface of one or more components of the electrochemical cell, such as an active surface of an electrode). One of ordinary skill in the art, given the present disclosure, would be capable of designing additional systems and methods by which a force can be applied to an electrochemical cell through a pressure distributor.

The fluid within pressure distributor 934 can allow the pressure that is transmitted through pressure distributor 934 to be applied relatively evenly across the surface 942 of electrochemical cell 921A (and, accordingly, relatively evenly across a surface of one or more components of the electrochemical cell, such as an active surface of an electrode). Not wishing to be bound by any particular theory, it is believed that a presence of a fluid within pressure distributor 934 reduces and/or eliminates points of relatively high pressure on surface 942 as fluid within relatively high pressure regions is transported to regions of relatively low pressure.

In some embodiments, the degree to which the pressure distributor evenly distributes the force applied to electrochemical cell can be enhanced if the external surface of the pressure transmitter is appropriately aligned with an external surface of the electrochemical cell or a container thereof. For example, in the set of embodiments illustrated in FIG. 12C, external surface 940 of pressure transmitter 936 faces external surface 942 of electrochemical cell 921A. In certain embodiments, the external surface of the pressure transmitter is substantially parallel to the external surface of the electrochemical cell to which a force is applied. For example, in the set of embodiments illustrated in FIG. 12C, external surface 940 of pressure transmitter 936 is substantially parallel to external surface 942 of electrochemical cell 921A. As used herein, two surfaces are substantially parallel to each other when the two surfaces form angles of no greater than about 10 degrees. In certain embodiments, two substantially parallel surfaces form angles of no greater than about 5 degrees, no greater than about 3 degrees, no greater than about 1 degree, or no greater than about 0.1 degree.

The pressure distributor can have a variety of suitable forms. In certain embodiments, the pressure distributor can comprise a bag or other suitable container in which a fluid is contained. In some embodiments, the pressure distributor can comprise a bellows that is configured to deform along the direction in which the force is applied to the pressure distributor.

The pressure distributor container can be made of a variety of materials. In certain embodiments, the pressure distributor container can comprise a flexible material. For example, in certain embodiments, the pressure distributor container can comprise a polymer such as polyethylene (e.g., linear low density and/or ultra-low density polyethylene), polypropylene, polyvinylchloride, polyvinyldichloride, polyvinylidene chloride, ethylene vinyl acetate, polycarbonate, polymethacrylate, polyvinyl alcohol, nylon, silicone rubber (e.g., polydimethylsiloxane), and/or other natural or synthetic rubbers or plastics. In certain embodiments (e.g., in embodiments in which a gas is used as the fluid within the pressure distributor), the pressure distributor container can include a metal layer (e.g., an aluminum metal layer), which can enhance the degree to which fluid (e.g., a gas) is retained within the pressure distributor. The use of flexible materials can be advantageous, in certain embodiments, as they may allow for redistribution of the contents of the pressure distributor relatively easily, enhancing the degree to which the force is uniformly applied.

In some embodiments, the pressure distributor can comprise an elastic material. In certain embodiments, the elasticity of the material from which the pressure distributor is fabricated can be selected such that the pressure distributor transmits a desirable amount of a force applied to the pressure distributor to an adjacent component. To illustrate, in certain cases, if the pressure distributor is made of a very flexible material, a relatively high percentage of the force applied to the pressure distributor might be used to elastically deform the pressure distributor material, rather than being transmitted to an adjacent electrochemical cell. In certain embodiments, the pressure distributor can be formed of a material having a Young's modulus of less than about 1 GPa. One of ordinary skill in the art would be capable of measuring the Young's modulus of a given material by performing, for example, a tensile test (also sometimes referred to a tension test). Exemplary elastic polymers (i.e., elastomers) that could be used include the general classes of silicone polymers, epoxy polymers, and acrylate polymers.

In certain embodiments, the pressure distributor comprises an enclosed container containing a fluid. The pressure distributor can comprise an open container containing a fluid, in certain embodiments. For example, in some embodiments, the pressure distributor comprises a container fluidically connected to a device constructed and arranged to transport the fluid through the pressure distributor, as described in more detail below.

A variety of fluids can be used in association with the pressure distributor. As used herein, a "fluid" generally refers to a substance that tends to flow and to conform to the outline of its container. Examples of fluids include liquids, gases, gels, viscoelastic fluids, solutions, suspensions, fluidized particulates, and the like. Typically, fluids are materials that are unable to withstand a static shear stress, and when a shear stress is applied, the fluid experiences a continuing and permanent distortion. The fluid may have any suitable viscosity that permits flow and redistribution of an applied force.

In certain embodiments, the fluid within the pressure distributor comprises a gas (e.g., air, nitrogen, a noble gas (e.g., helium, neon, argon, krypton, xenon), a gas refrigerant, or mixtures of these). In certain embodiments, the gas within the pressure distributor can comprise a relatively high molecular weight (e.g., at least about 100 g/mol), which can limit the degree to which gas permeates through the walls of the pressure distributor. In some embodiments, the fluid within the pressure distributor comprises a liquid including, but not limited to, water, an electrolyte (e.g., a liquid electrolyte similar or identical to that used in the electrochemical cell), greases (e.g., petroleum jelly, Teflon grease, silicone grease), oils (e.g., mineral oil), and the like. In certain embodiments, the fluid within the pressure distributor comprises a gel. Suitable gels for use within the pressure distributor include, but are not limited to, hydrogels (e.g., silicone gel), organogels, or xerogels. In certain embodiments, the fluid comprises a fluidized bed of solid particles (e.g., sand, powders, and the like). Fluidization can be achieved, for example, by passing a gas and/or a liquid through the particles and/or by vibrating a substrate on which the particles are positioned such that the particles move relative to each other.

The fluid used in association with the pressure distributor can have any suitable viscosity. In certain embodiments, a Newtonian fluid can be used within the pressure distributor, although some embodiments are not so limited, and non-Newtonian fluids (e.g., a shear thinning fluid, a shear thickening fluid, etc.) can also be used. In certain embodiments, the pressure distributor can contain a Newtonian fluid with a steady-state shear viscosity of less than about $1\times10^7$ centipoise (cP), less than about $1\times10^6$ cP, less than about $1\times10^5$ cP less than about 1000 cP, less than about 100 cP, less than about 10 cP, or less than about 1 cP (and, in some embodiments, greater than about 0.001 cP, greater than about 0.01 cP, or greater than about 0.1 cP) at room temperature.

In certain embodiments, the fluid within the pressure distributor can be selected such that it is suitable for being transported into and/or out of the pressure distributor. For example, in certain embodiments, fluid may be transported into the pressure distributor to apply an anisotropic force to the electrochemical cell (e.g., by compressing the fluid within the pressure distributor when it is positioned between the electrochemical cell and the pressure transmitter). As another example, a fluid may be transported into and/or out of a pressure distributor to transfer heat to and/or away from a component of the system.

Pressure transmitter 936 can also adopt a variety of configurations. In certain embodiments, pressure transmitter 936 is moveable relative to electrochemical cell 921A. In some such embodiments, a force can be applied to electrochemical cell 921A through pressure distributor 934 by moving pressure transmitter 936 closer to electrochemical cell 921A and/or maintaining the separation between electrochemical cell 921A and pressure transmitter 936. As one particular example, in some embodiments the pressure transmitter 936 includes a compression spring, a first applicator structure, and a second applicator structure. First applicator structure can correspond to, for example, a flat plate of rigid material, or any other suitable structure. Second applicator structure can correspond to, for example, a second plate of rigid material, a portion of a wall of a container in which the electrochemical cell is housed, or any other suitable structure. In some embodiments, a force can be applied to surface 942 of electrochemical cell 921A when a compression spring is compressed between applicator structure and applicator structure. In certain embodiments, Belleville washers, machine screws, pneumatic devices, weights, air cylinders, and/or hydraulic cylinders could be used in place of, or in addition to, the compression spring. In some embodiments, a force can be applied to an electrochemical cell using a constricting element (e.g., an elastic band, a turnbuckle band, etc.) arranged around one or more external surfaces of the electrochemical cell. A variety of suitable methods for applying a force to an electrochemical cell are described, for example, in U.S. Patent Publication No. 2010/0035128 to Scordilis-Kelley et al. filed on Aug. 4, 2009, entitled "Application of Force in Electrochemical Cells," which is incorporated herein by reference in its entirety for all purposes.

In certain embodiments, pressure transmitter 936 is not substantially moveable relative to electrochemical cell 921A, and a force can be applied to the electrochemical cell, for example, by pressurizing the pressure distributor 934. In some such embodiments, pressurizing the pressure distributor can result in the application of a force to the electrochemical cell because the substantially immovable pressure transmitter 936 restricts the movement of one or more of the boundaries of pressure distributor 934, thereby applying an anisotropic force to electrochemical cell 921A.

In certain embodiments, pressure transmitter comprises all or part of a substantially rigid structure (e.g., a package enclosing an electrochemical cell), and the movement of the pressure transmitter can be restricted by the degree to which the substantially rigid structure is inflexible. In certain embodiments, the pressure transmitter can comprise a structure that is integrated with at least a portion of the other components of the system, which can restrict its movement. For example, in certain embodiments, the pressure transmitter can comprise at least a portion of one or more walls of a package within which electrochemical cell 921A and pressure distributor 934 are positioned. As one particular example, pressure transmitter 936 might form a first wall of a package containing electrochemical cell 921A while substrate 932 forms a second wall (e.g., opposite to the first wall) of the package. In certain embodiments, the movement of pressure transmitter 936 can be restricted by applying a force within and/or on the pressure transmitter such that its movement is restricted. In any of these cases, a force can be applied to the electrochemical cell, in certain embodiments, by adding fluid to and/or maintaining the amount of fluid within pressure distributor 934.

FIG. 12C illustrates a set of embodiments in which a single pressure transmitter and a single pressure distributor are used to apply a force to an electrochemical cell. In certain embodiments, however, more than one pressure distributor and/or more than one pressure transmitter can be employed. For example, in some embodiments, the system includes a second pressure distributor positioned under electrochemical cell 921A and a second pressure transmitter positioned under the second pressure distributor. In certain embodiments, a substantially evenly distributed force can be applied to an external surface of electrochemical cell 921A through the second pressure distributor, for example, by applying a force to and/or through the second pressure transmitter and onto a surface of the second pressure distributor.

In some embodiments, fluid can be transported into and/or out of the pressure distributor to transport heat to and/or away from electrochemical cell 921A. For example, pressure distributor 934 may include an inlet and an outlet configured to transport a fluid through pressure distributor 934. As fluid is transported through pressure distributor 934, it can absorb heat from electrochemical cell 921A and transport it away from the system via the outlet. Any suitable device can be used to transport the fluid through the pressure distributor such as, for example, a pump, a vacuum, or any other suitable device.

In certain embodiments, the fluid used in association with the pressure distributor can be selected such that it cools or heats the system to a desired degree. For example, in certain embodiments, the fluid within the pressure distributor can comprise a coolant such as water, ethylene glycol, diethylene glycol, propylene glycol, polyalkylene glycols (PAGs), oils (e.g., mineral oils, castor oil, silicone oils, fluorocarbon oils, and/or refrigerants (e.g., freons, chlorofluorocarbons, perfluorocarbons, and the like).

The embodiments described herein can be used with a variety of electrochemical cells. While primary (disposable) electrochemical cells and secondary (rechargeable) electrochemical cells can be used in association with the embodiments described herein, some embodiments advantageously make use of secondary electrochemical cells, for example, due to the benefits provided by uniform force application during the (re)charging process. In certain embodiments, the electrochemical cell comprises a lithium-based electrochemical cell such as a lithium-sulfur electrochemical cell (and assemblies of multiple cells, such as batteries thereof).

Figure 12D:
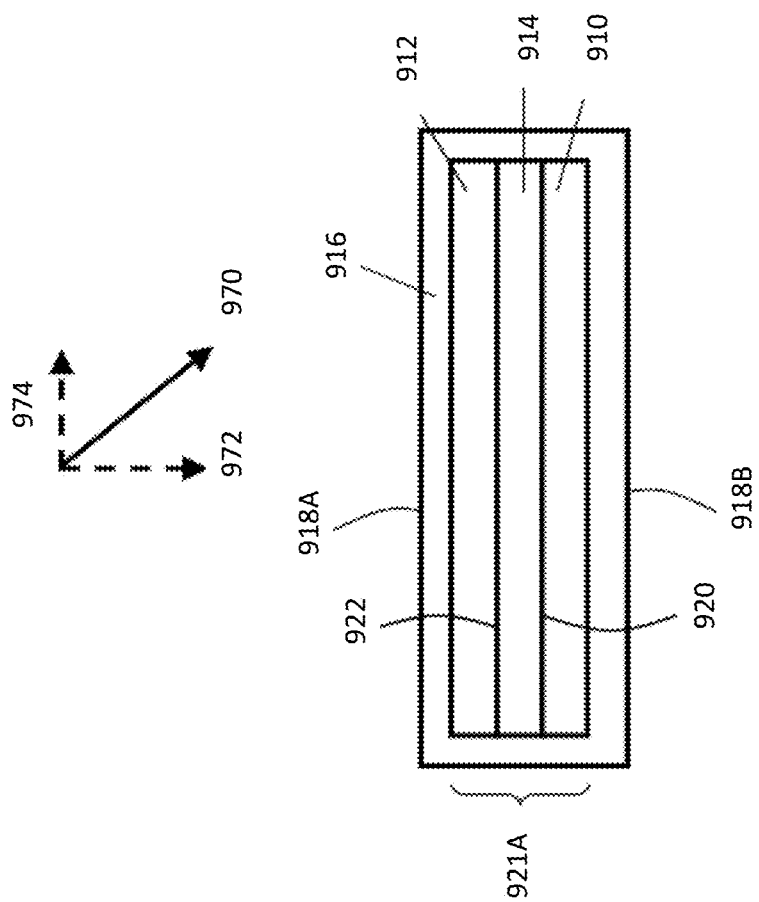
FIG. 12D is a cross-sectional schematic diagram of electrochemical cells, according to some embodiments.

Although some embodiments can find use in a wide variety of electrochemical devices, an example of one such device is provided in FIG. 12D for illustrative purposes only. In FIG. 12D, a general embodiment of electrochemical cell 921A includes cathode 910, anode 912, and electrolyte 914 in electrochemical communication with the cathode and the anode.

In some cases, electrochemical cell 921A may optionally be at least partially contained by containment structure 916. Containment structure 916 may comprise a variety of shapes including, but not limited to, cylinders, prisms (e.g., triangular prisms, rectangular prisms, etc.), cubes, or any other shape. In certain embodiments, a pressure distributor can be associated with electrochemical cell 921A by positioning the pressure distributor outside containment structure 916, in either direct or indirect contact with surface 918A and/or surface 918B. When positioned in this way, the pressure distributor can be configured to apply a force, directly or indirectly, to surfaces 918A and/or 918B of containment structure 916, as described above. In certain embodiments, a pressure distributor can be positioned between cathode 910 and containment structure 916, or between anode 912 and containment structure 916. In some such embodiments, containment structure can act as a pressure transmitter and/or a separate pressure transmitter can be configured to apply a force to the pressure distributor via the containment structure.

A typical electrochemical cell system also would include, of course, current collectors, external circuitry, and the like. Those of ordinary skill in the art are well aware of the many arrangements that can be utilized with the general schematic arrangement as shown in the figures and described herein.

The components of electrochemical cell 921A may be assembled, in some cases, such that the electrolyte is located between the cathode and the anode in a planar configuration. For example, in the embodiments illustrated in FIG. 12D, cathode 910 of electrochemical cell 921A is substantially planar. A substantially planar cathode can be formed, for example, by coating a cathode slurry on a planar substrate, such as a metal foil or other suitable substrate, which may be included in the assembly of electrochemical cell 921A (although not illustrated in FIG. 12D) or removed from cathode 910 prior to assembly of the electrochemical cell. In addition, in FIG. 12D, anode 912 is illustrated as being substantially planar. A substantially planar anode can be formed, for example, by forming a sheet of metallic lithium, by forming an anode slurry on a planar substrate, or by any other suitable method. Electrolyte 914 is also illustrated as being substantially planar in FIG. 3D.

In some embodiments, electrochemical plating of lithium may produce dense lithium films when starting with a slow rate and then increasing current density to increase deposition rate to grow the bulk of the film. For example, 25% of average current density may be applied during an entire charge. Alternatively, 25% of current density may be applied at an end of the charge, but the inventors have recognized and appreciated that this may be preferably before the "taper portion" of the charge. Alternatively or additionally, electrochemical plating of lithium may produce dense lithium films on top of already established lithium by removing a given amount of lithium electrochemically at a fast rate or current density and then depositing a starting lithium layer at 25% of the current density followed by a fast rate deposition of the main lithium film thickness. The inventors have recognized and appreciated that such techniques may establish a dense lithium coating on a metallic substrate, and they may provide reduced depletion of electrolyte components on the lithium surface and respectively lower accumulation of depletion products on the surface and slower electrical resistance buildup, as well as reduced depletion of metallic lithium and reduced creation of electrically isolated lithium "islands."

In certain embodiments, electrochemical cell 921A can comprise an electrode that comprises a metal such as an elemental metal and/or a metal alloy. As one particular example, in certain embodiments, electrochemical cell 921A can comprise an anode comprising elemental lithium (e.g., elemental lithium metal and/or a lithium alloy). In certain embodiments, the anisotropic force applied to the electrochemical cell is sufficiently large such that the application of the force affects the surface morphology of the metal within an electrode of the electrochemical cell, as described in more detail below.

While FIG. 12D illustrates an electrochemical cell arranged in a planar configuration, it is to be understood that any electrochemical cell arrangement can be constructed, employing the principles of some embodiments, in any configuration. In addition to the shape illustrated in FIG. 12D, the electrochemical cells described herein may be of any other shape including, but not limited to, cylinders, a folded multi-layer structure, prisms (e.g., triangular prisms, rectangular prisms, etc.), "Swiss-rolls," non-planar multi-layered structures, etc. Additional configurations are described in U.S. patent application Ser. No. 11/400,025, filed Apr. 6, 2006, entitled, "Electrode Protection in both Aqueous and Non-Aqueous Electrochemical Cells, including Rechargeable Lithium Batteries," to Affinito et al., which is incorporated herein by reference in its entirety.

In some embodiments, the cathode and/or the anode comprise at least one active surface. As used herein, the term "active surface" is used to describe a surface of an electrode that is in physical contact with the electrolyte and at which electrochemical reactions may take place. For example, in the set of embodiments illustrated in FIG. 12D, cathode 910 includes cathode active surface 920 and anode 912 includes anode active surface 22.

In certain embodiments, the anisotropic force applied to a pressure transmitter 936 and/or through pressure distributor 934 (and eventually in some cases to surface 942 of electrochemical cell 921A) comprises a component normal to the active surface of an electrode (e.g., an anode such as an anode containing lithium metal) within the electrochemical cell. Accordingly, applying an anisotropic force through pressure distributor 934 to the electrochemical cell can result in an anisotropic force being applied to an active surface of an electrode (e.g., an anode) within the electrochemical cell. In the case of a planar electrode surface, the applied force may comprise an anisotropic force with a component normal to the electrode active surface at the point at which the force is applied. For example, referring to the set of embodiments illustrated in FIG. 12C and FIG. 12D, an anisotropic force in the direction of arrow 970 may be applied to electrochemical cell 921A through pressure distributor 934. An anisotropic force applied in the direction of arrow 970 would include a component 972 that is normal to anode active surface 922 and normal to cathode active surface 920. In addition, an anisotropic force applied in the direction of arrow 970 would include a component 974 that is not normal (and is in fact parallel) to anode active surface 922 and cathode active surface 920.

In the case of a curved surface (e.g., a concave surface or a convex surface), the force applied to the electrochemical cell may comprise an anisotropic force with a component normal to a plane that is tangent to the curved surface at the point at which the force is applied.

In one set of embodiments, systems and methods are configured such that, during at least one period of time during charge and/or discharge of the cell, an anisotropic force with a component normal to the active surface of an electrode (e.g., the anode) is applied to the electrochemical cell. In some embodiments, the force may be applied continuously, over one period of time, or over multiple periods of time that may vary in duration and/or frequency.

The magnitude of the applied force is, in some embodiments, large enough to enhance the performance of the electrochemical cell. In certain embodiments, an electrode active surface (e.g., an anode active surface) and the anisotropic force may be together selected such that the anisotropic force affects surface morphology of the electrode active surface to inhibit an increase in electrode active surface area through charge and discharge and wherein, in the absence of the anisotropic force but under otherwise essentially identical conditions, the electrode active surface area is increased to a greater extent through cycles. "Essentially identical conditions," in this context, means conditions that are similar or identical other than the application and/or magnitude of the force. For example, otherwise identical conditions may mean a cell that is identical, but where it is not constructed (e.g., by brackets or other connections) to apply the anisotropic force on the subject electrochemical cell.

The electrode active surface and anisotropic force can be selected together, to achieve results described herein, easily by those of ordinary skill in the art. For example, where the electrode active surface is relatively soft, the component of the force normal to the electrode active surface may be selected to be lower. Where the electrode active surface is harder, the component of the force normal to the electrode active surface may be greater. Those of ordinary skill in the art, given the present disclosure, can easily select anode materials, alloys, mixtures, etc. with known or predictable properties, or readily test the hardness or softness of such surfaces, and readily select cell construction techniques and arrangements to provide appropriate forces to achieve what is described herein. Simple testing can be done, for example by arranging a series of active materials, each with a series of forces applied normal (or with a component normal) to the active surface, to determine the morphological effect of the force on the surface without cell cycling (for prediction of the selected combination during cell cycling) or with cell cycling with observation of a result relevant to the selection.

As noted above, in some embodiments, an anisotropic force with a component normal to an electrode active surface (e.g., of the anode) is applied, during at least one period of time during charge and/or discharge of the cell, to an extent effective to inhibit an increase in surface area of the electrode active surface relative to an increase in surface area absent the anisotropic force. The component of the anisotropic force normal to the electrode active surface may, for example, define a pressure of at least about 20, at least about 25, at least about 35, at least about 40, at least about 50, at least about 75, at least about 90, at least about 100, at least about 125, at least about 150, at least about 200, at least about 300, at least about 400, or at least about 500 Newtons per square centimeter. In certain embodiments, the component of the anisotropic force normal to the anode active surface may, for example, define a pressure of less than about 500, less than about 400, less than about 300, less than about 200, less than about 190, less than about 175, less than about 150, less than about 125, less than about 115, or less than about 110 Newtons per square centimeter. While forces and pressures are generally described herein in units of Newtons and Newtons per unit area, respectively, forces and pressures can also be expressed in units of kilograms-force and kilograms-force per unit area, respectively. One of ordinary skill in the art will be familiar with kilogram-force-based units, and will understand that 1 kilogram-force is equivalent to about 9.8 Newtons.

In certain embodiments, the component of the anisotropic force normal to the active surface of an electrode within the electrochemical cell defines a pressure that is at least about 50%, at least about 75%, at least about 100%, at least about 120% of the yield stress of that electrode (e.g., during charge and/or discharge of the electrochemical cell). In certain embodiments, the component of the anisotropic force normal to the active surface of an electrode within the electrochemical cell defines a pressure that is less than about 250% or less than about 200% of the yield stress of that electrode (e.g., during charge and/or discharge of the electrochemical cell). For example, in some embodiments, the electrochemical cell can comprise an anode (e.g., an anode comprising lithium metal and/or a lithium alloy), and the component of an applied anisotropic force that is normal to the anode active surface can define a pressure that is at least about 50%, at least about 75%, at least about 100%, or at least about 120% of the yield stress of the anode (and/or less than about 250% or less than about 200% of the yield stress of the anode). In some embodiments, the electrochemical cell can comprise a cathode, and the component of the anisotropic force normal to the cathode active surface can define a pressure that is at least about 50%, at least about 75%, at least about 100%, or at least about 120% of the yield stress of the cathode (and/or less than about 250% or less than about 200% of the yield stress of the cathode).

In some cases, the anisotropic force can define a pressure that is relatively uniform across one or more external surfaces of the electrochemical cell and/or across one or more active surfaces of electrode(s) within the electrochemical cell. In some embodiments, at least about 50%, at least about 75%, at least about 85%, at least about 90%, at least about 95%, or at least about 98% of the area of one or more external surfaces of an electrochemical cell and/or of the area of one or more active surfaces of an electrode (e.g., anode) defines a uniform area that includes a substantially uniform distribution of pressure defined by an anisotropic force. In this context, a "surface of an electrochemical cell" and a "surface of an electrode" refer to the geometric surfaces of the electrochemical cell and the electrode, which will be understood by those of ordinary skill in the art to refer to the surfaces defining the outer boundaries of the electrochemical cell and electrode, for example, the area that may be measured by a macroscopic measuring tool (e.g., a ruler) and does not include the internal surface area (e.g., area within pores of a porous material such as a foam, or surface area of those fibers of a mesh that are contained within the mesh and do not define the outer boundary, etc.).

In some embodiments, a pressure is substantially uniformly distributed across a surface when any continuous area that covers about 10%, about 5%, about 2%, or about 1% of the uniform area (described in the preceding paragraph) includes an average pressure that varies by less than about 25%, less than about 10%, less than about 5%, less than about 2%, or less than about 1% relative to the average pressure across the entirety of the uniform area.

Stated another way, in some embodiments, at least about 50% (or at least about 75%, at least about 85%, at least about 90%, at least about 95%, or at least about 98%) of the area of a surface of the electrochemical cell and/or of the active area of an electrode defines a first, continuous area of essentially uniform applied pressure, the first area having a first average applied pressure. In some cases, any continuous area that covers about 10% (or about 5%, about 2%, or about 1%) of the first, continuous area of the surface of the electrochemical cell and/or of the electrode includes a second average applied pressure that varies by less than about 25% (or less than about 10%, less than about 5%, less than about 2%, or less than about 1%) relative to the first average applied pressure across the first, continuous area.

One of ordinary skill in the art would be capable of determining an average applied pressure within a portion of a surface, for example, by determining the force level applied at a representative number of points within the surface portion, integrating a 3-dimensional plot of the applied pressure as a function of position on the surface portion, and dividing the integral by the surface area of the surface portion. One of ordinary skill in the art would be capable of producing a plot of the applied pressure across a surface portion by, for example, using a Tekscan I-Scan system for measuring the pressure field.

The anodes of the electrochemical cells described herein may comprise a variety of anode active materials. As used herein, the term "anode active material" refers to any electrochemically active species associated with the anode. For example, the anode may comprise a lithium-containing material, wherein lithium is the anode active material. Suitable electroactive materials for use as anode active materials in the anode of the electrochemical cells described herein include, but are not limited to, lithium metal such as lithium foil and lithium deposited onto a conductive substrate, and lithium alloys (e.g., lithium-aluminum alloys and lithium-tin alloys). Methods for depositing a negative electrode material (e.g., an alkali metal anode such as lithium) onto a substrate may include methods such as thermal evaporation, sputtering, jet vapor deposition, and laser ablation. Alternatively, where the anode comprises a lithium foil, or a lithium foil and a substrate, these can be laminated together by a lamination process as known in the art to form an anode.

In one embodiment, an electroactive lithium-containing material of an anode active layer comprises greater than 50% by weight of lithium. In another embodiment, the electroactive lithium-containing material of an anode active layer comprises greater than 75% by weight of lithium. In yet another embodiment, the electroactive lithium-containing material of an anode active layer comprises greater than 90% by weight of lithium. Additional materials and arrangements suitable for use in the anode are described, for example, in U.S. Patent Publication No. 2010/0035128 to Scordilis-Kelley et al. filed on Aug. 4, 2009, entitled "Application of Force in Electrochemical Cells," which is incorporated herein by reference in its entirety for all purposes.

The cathodes in the electrochemical cells described herein may comprise a variety of cathode active materials. As used herein, the term "cathode active material" refers to any electrochemically active species associated with the cathode. Suitable electroactive materials for use as cathode active materials in the cathode of the electrochemical cells of some embodiments include, but are not limited to, one or more metal oxides, one or more intercalation materials, electroactive transition metal chalcogenides, electroactive conductive polymers, sulfur, carbon and/or combinations thereof.

In some embodiments, the cathode active material comprises one or more metal oxides. In some embodiments, an intercalation cathode (e.g., a lithium-intercalation cathode) may be used. Non-limiting examples of suitable materials that may intercalate ions of an electroactive material (e.g., alkaline metal ions) include metal oxides, titanium sulfide, and iron sulfide. In some embodiments, the cathode is an intercalation cathode comprising a lithium transition metal oxide or a lithium transition metal phosphate. Additional examples include $Li_xCoO_2$ (e.g., $Li_{1.1}CoO_2$), $Li_xNiO_2$, $Li_xMnO_2$, $Li_xMn_2O_4$ (e.g., $Li_{1.05}Mn_2O_4$), $Li_xCoPO_4$, $Li_xMnPO_4$, $LiCo_xNi_{(1-x)}O_2$, and $LiCo_xNi_yMn_{(1-x-y)}O_2$ (e.g., $LiNi_{1/3}Mn_{1/3}Co_{1/3}O_2$, $LiNi_{3/5}Mn_{1/5}Co_{1/5}O_2$, $LiNi_{4/5}Mn_{1/10}Co_{1/10}O_2$, $LiNi_{1/2}Mn_{3/10}Co_{1/5}O_2$). X may be greater than or equal to 0 and less than or equal to 2. X is typically greater than or equal to 1 and less than or equal to 2 when the electrochemical cell is fully discharged, and less than 1 when the electrochemical cell is fully charged. In some embodiments, a fully charged electrochemical cell may have a value of x that is greater than or equal to 1 and less than or equal to 1.05, greater than or equal to 1 and less than or equal to 1.1, or greater than or equal to 1 and less than or equal to 1.2. Further examples include $Li_xNiPO_4$, where $(0<x\leq1)$, $LiMn_xNi_yO_4$ where $(x+y=2)$ (e.g., $LiMn_{1.5}Ni_{0.5}O_4$), $LiNi_xCo_yAl_zO_2$ where $(x+y+z=1)$, $LiFePO_4$, and combinations thereof. In some embodiments, the electroactive material within the cathode comprises lithium transition metal phosphates (e.g., $LiFePO_4$), which can, in certain embodiments, be substituted with borates and/or silicates.

As noted above, in some embodiments, the cathode active material comprises one or more chalcogenides. As used herein, the term "chalcogenides" pertains to compounds that contain one or more of the elements of oxygen, sulfur, and selenium. Examples of suitable transition metal chalcogenides include, but are not limited to, the electroactive oxides, sulfides, and selenides of transition metals selected from the group consisting of Mn, V, Cr, Ti, Fe, Co, Ni, Cu, Y, Zr, Nb, Mo, Ru, Rh, Pd, Ag, Hf, Ta, W, Re, Os, and Ir. In one embodiment, the transition metal chalcogenide is selected from the group consisting of the electroactive oxides of nickel, manganese, cobalt, and vanadium, and the electroactive sulfides of iron. In one embodiment, a cathode includes one or more of the following materials: manganese dioxide, iodine, silver chromate, silver oxide and vanadium pentoxide, copper oxide, copper oxyphosphate, lead sulfide, copper sulfide, iron sulfide, lead bismuthate, bismuth trioxide, cobalt dioxide, copper chloride, manganese dioxide, and carbon. In another embodiment, the cathode active layer comprises an electroactive conductive polymer. Examples of suitable electroactive conductive polymers include, but are not limited to, electroactive and electronically conductive polymers selected from the group consisting of polypyrroles, polyanilines, polyphenylenes, polythiophenes, and polyacetylenes. Examples of conductive polymers include polypyrroles, polyanilines, and polyacetylenes.

In some embodiments, electroactive materials for use as cathode active materials in electrochemical cells described herein include electroactive sulfur-containing materials. "Electroactive sulfur-containing materials," as used herein, relates to cathode active materials which comprise the element sulfur in any form, wherein the electrochemical activity involves the oxidation or reduction of sulfur atoms or moieties. The nature of the electroactive sulfur-containing materials useful in the practice of some embodiments may vary widely, as known in the art. For example, in one embodiment, the electroactive sulfur-containing material comprises elemental sulfur. In another embodiment, the electroactive sulfur-containing material comprises a mixture of elemental sulfur and a sulfur-containing polymer. Thus, suitable electroactive sulfur-containing materials may include, but are not limited to, elemental sulfur and organic materials comprising sulfur atoms and carbon atoms, which may or may not be polymeric. Suitable organic materials include those further comprising heteroatoms, conductive polymer segments, composites, and conductive polymers.

In some embodiments, an electroactive sulfur-containing material of a cathode active layer comprises greater than 50% by weight of sulfur. In another embodiment, the electroactive sulfur-containing material comprises greater than 75% by weight of sulfur. In yet another embodiment, the electroactive sulfur-containing material comprises greater than 90% by weight of sulfur.

The cathode active layers of some embodiments may comprise from about 20 to 100% by weight of electroactive cathode materials (e.g., as measured after an appropriate amount of solvent has been removed from the cathode active layer and/or after the layer has been appropriately cured). In one embodiment, the amount of electroactive sulfur-containing material in the cathode active layer is in the range of 5-30% by weight of the cathode active layer. In another embodiment, the amount of electroactive sulfur-containing material in the cathode active layer is in the range of 20% to 90% by weight of the cathode active layer.

Additional materials suitable for use in the cathode, and suitable methods for making the cathodes, are described, for example, in U.S. Pat. No. 5,919,587, filed May 21, 1997, entitled "Novel Composite Cathodes, Electrochemical Cells Comprising Novel Composite Cathodes, and Processes for Fabricating Same," and U.S. Patent Publication No. 2010/0035128 to Scordilis-Kelley et al. filed on Aug. 4, 2009, entitled "Application of Force in Electrochemical Cells," each of which is incorporated herein by reference in its entirety for all purposes.

A variety of electrolytes can be used in association with the electrochemical cells described herein. In some embodiments, the electrolyte may comprise a non-solid electrolyte, which may or may not be incorporated with a porous separator. As used herein, the term "non-solid" is used to refer to materials that are unable to withstand a static shear stress, and when a shear stress is applied, the non-solid experiences a continuing and permanent distortion. Examples of non-solids include, for example, liquids, deformable gels, and the like.

The electrolytes used in electrochemical cells described herein can function as a medium for the storage and transport of ions, and in the special case of solid electrolytes and gel electrolytes, these materials may additionally function as a separator between the anode and the cathode. Any liquid, solid, or gel material capable of storing and transporting ions may be used, so long as the material facilitates the transport of ions (e.g., lithium ions) between the anode and the cathode. Exemplary materials suitable for use in the electrolyte are described, for example, in U.S. Patent Publication No. 2010/0035128 to Scordilis-Kelley et al. filed on Aug. 4, 2009, entitled "Application of Force in Electrochemical Cells," which is incorporated herein by reference in its entirety for all purposes.

U.S. application Ser. No. 16/670,905, filed Oct. 31, 2019, and entitled "SYSTEM AND METHOD FOR OPERATING A RECHARGEABLE ELECTROCHEMICAL CELL OR BATTERY" is incorporated herein by reference in its entirety for all purposes.

The following applications are incorporated herein by reference, in their entirety, for all purposes: U.S. Publication No. US-2007-0221265-A1 published on Sep. 27, 2007, filed as U.S. application Ser. No. 11/400,781 on Apr. 6, 2006, and entitled "RECHARGEABLE LITHIUM/WATER, LITHIUM/AIR BATTERIES"; U.S. Publication No. US-2009-0035646-A1, published on Feb. 5, 2009, filed as U.S. application Ser. No. 11/888,339 on Jul. 31, 2007, and entitled "SWELLING INHIBITION IN BATTERIES"; U.S. Publication No. US-2010-0129699-A1 published on May 17, 2010, filed as U.S. application Ser. No. 12/312,764 on Feb. 2, 2010; patented as U.S. Pat. No. 8,617,748 on Dec. 31, 2013, and entitled "SEPARATION OF ELECTROLYTES"; U.S. Publication No. US-2010-0291442-A1 published on Nov. 18, 2010, filed as U.S. application Ser. No. 12/682,011 on Jul. 30, 2010, patented as U.S. Pat. No. 8,871,387 on Oct. 28, 2014, and entitled "PRIMER FOR BATTERY ELECTRODE"; U.S. Publication No. US-2009-0200986-A1 published on Aug. 13, 2009, filed as U.S. application Ser. No. 12/069,335 on Feb. 8, 2008, patented as U.S. Pat. No. 8,264,205 on Sep. 11, 2012, and entitled "CIRCUIT FOR CHARGE AND/OR DISCHARGE PROTECTION IN AN ENERGY-STORAGE DEVICE"; U.S. Publication No. US-2007-0224502-A1 published on Sep. 27, 2007, filed as U.S. application Ser. No. 11/400,025 on Apr. 6, 2006, patented as U.S. Pat. No. 7,771,870 on Aug. 10, 2010, and entitled "ELECTRODE PROTECTION IN BOTH AQUEOUS AND NON-AQUEOUS ELECTROCHEMICAL CELLS, INCLUDING RECHARGEABLE LITHIUM BATTERIES"; U.S. Publication No. US-2008-0318128-A1 published on Dec. 25, 2008, filed as U.S. application Ser. No. 11/821,576 on Jun. 22, 2007, and entitled "LITHIUM ALLOY/SULFUR BATTERIES"; U.S. Publication No. US-2002-0055040-A1 published on May 9, 2002, filed as U.S. application Ser. No. 09/795,915 on Feb. 27, 2001, patented as U.S. Pat. No. 7,939,198 on May 10, 2011, and entitled "NOVEL COMPOSITE CATHODES, ELECTROCHEMICAL CELLS COMPRISING NOVEL COMPOSITE CATHODES, AND PROCESSES FOR FABRICATING SAME"; U.S. Publication No. US-2006-0238203-A1 published on Oct. 26, 2006, filed as U.S. application Ser. No. 11/111,262 on Apr. 20, 2005, patented as U.S. Pat. No. 7,688,075 on Mar. 30, 2010, and entitled "LITHIUM SULFUR RECHARGEABLE BATTERY FUEL GAUGE SYSTEMS AND METHODS"; U.S. Publication No. US-2008-0187663-A1 published on Aug. 7, 2008, filed as U.S. application Ser. No. 11/728,197 on Mar. 23, 2007, patented as U.S. Pat. No. 8,084,102 on Dec. 27, 2011, and entitled "METHODS FOR CO-FLASH EVAPORATION OF POLYMERIZABLE MONOMERS AND NON-POLYMERIZABLE CARRIER SOLVENT/SALT MIXTURES/SOLUTIONS"; U.S. Publication No. US-2011-0006738-A1 published on Jan. 13, 2011, filed as U.S. application Ser. No. 12/679,371 on Sep. 23, 2010, and entitled "ELECTROLYTE ADDITIVES FOR LITHIUM BATTERIES AND RELATED METHODS"; U.S. Publication No. US-2011-0008531-A1 published on Jan. 13, 2011, filed as U.S. application Ser. No. 12/811,576 on Sep. 23, 2010, patented as U.S. Pat. No. 9,034,421 on May 19, 2015, and entitled "METHODS OF FORMING ELECTRODES COMPRISING SULFUR AND POROUS MATERIAL COMPRISING CARBON"; U.S. Publication No. US-2010-0035128-A1 published on Feb. 11, 2010, filed as U.S. application Ser. No. 12/535,328 on Aug. 4, 2009, patented as U.S. Pat. No. 9,105,938 on Aug. 11, 2015, and entitled "APPLICATION OF FORCE IN ELECTROCHEMICAL CELLS"; U.S. Publication No. US-2011-0165471-A9 published on Jul. 15, 2011, filed as U.S. application Ser. No. 12/180,379 on Jul. 25, 2008, and entitled "PROTECTION OF ANODES FOR ELECTROCHEMICAL CELLS"; U.S. Publication No. US-2006-0222954-A1 published on Oct. 5, 2006, filed as U.S. application Ser. No. 11/452,445 on Jun.

13, 2006, patented as U.S. Pat. No. 8,415,054 on Apr. 9, 2013, and entitled "LITHIUM ANODES FOR ELECTROCHEMICAL CELLS"; U.S. Publication No. US-2010-0239914-A1 published on Sep. 23, 2010, filed as U.S. application Ser. No. 12/727,862 on Mar. 19, 2010, and entitled "CATHODE FOR LITHIUM BATTERY"; U.S. Publication No. US-2010-0294049-A1 published on Nov. 25, 2010, filed as U.S. application Ser. No. 12/471,095 on May 22, 2009, patented as U.S. Pat. No. 8,087,309 on Jan. 3, 2012, and entitled "HERMETIC SAMPLE HOLDER AND METHOD FOR PERFORMING MICROANALYSIS UNDER CONTROLLED ATMOSPHERE ENVIRONMENT"; U.S. Publication No. US-2011-0076560-A1 published on Mar. 31, 2011, filed as U.S. application Ser. No. 12/862,581 on Aug. 24, 2010, and entitled "ELECTROCHEMICAL CELLS COMPRISING POROUS STRUCTURES COMPRISING SULFUR"; U.S. Publication No. US-2011-0068001-A1 published on Mar. 24, 2011, filed as U.S. application Ser. No. 12/862,513 on Aug. 24, 2010, and entitled "RELEASE SYSTEM FOR ELECTROCHEMICAL CELLS"; U.S. Publication No. US-2012-0048729-A1 published on Mar. 1, 2012, filed as U.S. application Ser. No. 13/216,559 on Aug. 24, 2011, and entitled "ELECTRICALLY NON-CONDUCTIVE MATERIALS FOR ELECTROCHEMICAL CELLS"; U.S. Publication No. US-2011-0177398-A1 published on Jul. 21, 2011, filed as U.S. application Ser. No. 12/862,528 on Aug. 24, 2010, patented as U.S. Pat. No. 10,629,947 on Apr. 21, 2020, and entitled "ELECTROCHEMICAL CELL"; U.S. Publication No. US-2011-0070494-A1 published on Mar. 24, 2011, filed as U.S. application Ser. No. 12/862,563 on Aug. 24, 2010, and entitled "ELECTROCHEMICAL CELLS COMPRISING POROUS STRUCTURES COMPRISING SULFUR"; U.S. Publication No. US-2011-0070491-A1 published on Mar. 24, 2011, filed as U.S. application Ser. No. 12/862,551 on Aug. 24, 2010, and entitled "ELECTROCHEMICAL CELLS COMPRISING POROUS STRUCTURES COMPRISING SULFUR"; U.S. Publication No. US-2011-0059361-A1 published on Mar. 10, 2011, filed as U.S. application Ser. No. 12/862,576 on Aug. 24, 2010, patented as U.S. Pat. No. 9,005,809 on Apr. 14, 2015, and entitled "ELECTROCHEMICAL CELLS COMPRISING POROUS STRUCTURES COMPRISING SULFUR"; U.S. Publication No. US-2012-0052339-A1 published on Mar. 1, 2012, filed as U.S. application Ser. No. 13/216,579 on Aug. 24, 2011, and entitled "ELECTROLYTE MATERIALS FOR USE IN ELECTROCHEMICAL CELLS"; U.S. Publication No. US-2012-0070746-A1 published on Mar. 22, 2012, filed as U.S. application Ser. No. 13/240,113 on Sep. 22, 2011, and entitled "LOW ELECTROLYTE ELECTROCHEMICAL CELLS"; U.S. Publication No. US-2011-0206992-A1 published on Aug. 25, 2011, filed as U.S. application Ser. No. 13/033,419 on Feb. 23, 2011, and entitled "POROUS STRUCTURES FOR ENERGY STORAGE DEVICES"; U.S. Publication No. US-2012-0082872-A1 published on Apr. 5, 2012, filed as U.S. application Ser. No. 13/249,605 on Sep. 30, 2011, and entitled "ADDITIVE FOR ELECTROLYTES"; U.S. Publication No. US-2012-0082901-A1 published on Apr. 5, 2012, filed as U.S. application Ser. No. 13/249,632 on Sep. 30, 2011, and entitled "LITHIUM-BASED ANODE WITH IONIC LIQUID POLYMER GEL"; U.S. Publication No. US-2013-0164635-A1 published on Jun. 27, 2013, filed as U.S. application Ser. No. 13/700,696 on Mar. 6, 2013, patented as U.S. Pat. No. 9,577,243 on Feb. 21, 2017, and entitled "USE OF EXPANDED GRAPHITE IN LITHIUM/SULPHUR BATTERIES"; U.S. Publication No. US-2013-0017441-A1 published on Jan. 17, 2013, filed as U.S. application Ser. No. 13/524,662 on Jun. 15, 2012, patented as U.S. Pat. No. 9,548,492 on Jan. 17, 2017, and entitled "PLATING TECHNIQUE FOR ELECTRODE"; U.S. Publication No. US-2013-0224601-A1 published on Aug. 29, 2013, filed as U.S. application Ser. No. 13/766,862 on Feb. 14, 2013, patented as U.S. Pat. No. 9,077,041 on Jul. 7, 2015, and entitled "ELECTRODE STRUCTURE FOR ELECTROCHEMICAL CELL"; U.S. Publication No. US-2013-0252103-A1 published on Sep. 26, 2013, filed as U.S. application Ser. No. 13/789,783 on Mar. 8, 2013, patented as U.S. Pat. No. 9,214,678 on Dec. 15, 2015, and entitled "POROUS SUPPORT STRUCTURES, ELECTRODES CONTAINING SAME, AND ASSOCIATED METHODS"; U.S. Publication No. US-2015-0287998-A1 published on Oct. 8, 2015, filed as U.S. application Ser. No. 14/743,304 on Jun. 18, 2015, patented as U.S. Pat. No. 9,577,267 on Feb. 21, 2017, and entitled "ELECTRODE STRUCTURE AND METHOD FOR MAKING SAME"; U.S. Publication No. US-2013-0095380-A1 published on Apr. 18, 2013, filed as U.S. application Ser. No. 13/644,933 on Oct. 4, 2012, patented as U.S. Pat. No. 8,936,870 on Jan. 20, 2015, and entitled "ELECTRODE STRUCTURE AND METHOD FOR MAKING THE SAME"; U.S. Publication No. US-2012-0052397-A1 published on Mar. 1, 2012, filed as U.S. application Ser. No. 13/216,538 on Aug. 24, 2011, patented as U.S. Pat. No. 9,853,287 on Dec. 26, 2017, and entitled "ELECTROLYTE MATERIALS FOR USE IN ELECTROCHEMICAL CELLS"; U.S. Publication No. US-2014-0123477-A1 published on May 8, 2014, filed as U.S. application Ser. No. 14/069,698 on Nov. 1, 2013, patented as U.S. Pat. No. 9,005,311 on Apr. 14, 2015, and entitled "ELECTRODE ACTIVE SURFACE PRETREATMENT"; U.S. Publication No. US-2014-0193723-A1 published on Jul. 10, 2014, filed as U.S. application Ser. No. 14/150,156 on Jan. 8, 2014, patented as U.S. Pat. No. 9,559,348 on Jan. 31, 2017, and entitled "CONDUCTIVITY CONTROL IN ELECTROCHEMICAL CELLS"; U.S. Publication No. US-2014-0255780-A1 published on Sep. 11, 2014, filed as U.S. application Ser. No. 14/197,782 on Mar. 5, 2014, patented as U.S. Pat. No. 9,490,478 on Nov. 8, 2016, and entitled "ELECTROCHEMICAL CELLS COMPRISING FIBRIL MATERIALS"; U.S. Publication No. US-2014-0272594-A1 published on Sep. 18, 2014, filed as U.S. application Ser. No. 13/833,377 on Mar. 15, 2013, and entitled "PROTECTIVE STRUCTURES FOR ELECTRODES"; U.S. Publication No. US-2014-0272597-A1 published on Sep. 18, 2014, filed as U.S. application Ser. No. 14/209,274 on Mar. 13, 2014, patented as U.S. Pat. No. 9,728,768 on Aug. 8, 2017, and entitled "PROTECTED ELECTRODE STRUCTURES AND METHODS"; U.S. Publication No. US-2015-0280277-A1 published on Oct. 1, 2015, filed as U.S. application Ser. No. 14/668,102 on Mar. 25, 2015, patented as U.S. Pat. No. 9,755,268 on Sep. 5, 2017, and entitled "GEL ELECTROLYTES AND ELECTRODES"; U.S. Publication No. US-2015-0180037-A1 published on Jun. 25, 2015, filed as U.S. application Ser. No. 14/576,570 on Dec. 19, 2014, patented as U.S. Pat. No. 10,020,512 on Jul. 10, 2018, and entitled "POLYMER FOR USE AS PROTECTIVE LAYERS AND OTHER COMPONENTS IN ELECTROCHEMICAL CELLS"; U.S. Publication No. US-2015-0349310-A1 published on Dec. 3, 2015, filed as U.S. application Ser. No. 14/723,132 on May 27, 2015, patented as U.S. Pat. No. 9,735,411 on Aug. 15, 2017, and entitled "POLYMER FOR USE AS PROTECTIVE LAYERS AND OTHER COMPONENTS IN ELECTROCHEMICAL CELLS"; U.S. Publication No. US-2014-

0272595-A1 published on Sep. 18, 2014, filed as U.S. application Ser. No. 14/203,802 on Mar. 11, 2014, and entitled "COMPOSITIONS FOR USE AS PROTECTIVE LAYERS AND OTHER COMPONENTS IN ELECTROCHEMICAL CELLS"; U.S. Publication No. US-2019-0006699-A1 published on Jan. 3, 2019, filed as U.S. application Ser. No. 15/727,438 on Oct. 6, 2017, and entitled "PRESSURE AND/OR TEMPERATURE MANAGEMENT IN ELECTROCHEMICAL SYSTEMS"; U.S. Publication No. US-2014-0193713-A1 published on Jul. 10, 2014, filed as U.S. application Ser. No. 14/150,196 on Jan. 8, 2014, patented as U.S. Pat. No. 9,531,009 on Dec. 27, 2016, and entitled "PASSIVATION OF ELECTRODES IN ELECTROCHEMICAL CELLS"; U.S. Publication No. US-2014-0127577-A1 published on May 8, 2014, filed as U.S. application Ser. No. 14/068,333 on Oct. 31, 2013, patented as U.S. Pat. No. 10,243,202 on Mar. 26, 2019, and entitled "POLYMERS FOR USE AS PROTECTIVE LAYERS AND OTHER COMPONENTS IN ELECTROCHEMICAL CELLS"; U.S. Publication No. US-2015-0318539-A1 published on Nov. 5, 2015, filed as U.S. application Ser. No. 14/700,258 on Apr. 30, 2015, patented as U.S. Pat. No. 9,711,784 on Jul. 18, 2017, and entitled "ELECTRODE FABRICATION METHODS AND ASSOCIATED SYSTEMS AND ARTICLES"; U.S. Publication No. US-2014-0272565-A1 published on Sep. 18, 2014, filed as U.S. application Ser. No. 14/209,396 on Mar. 13, 2014, and entitled "PROTECTED ELECTRODE STRUCTURES"; U.S. Publication No. US-2015-0010804-A1 published on Jan. 8, 2015, filed as U.S. application Ser. No. 14/323,269 on Jul. 3, 2014, patented as U.S. Pat. No. 9,994,959 on Jun. 12, 2018, and entitled "CERAMIC/POLYMER MATRIX FOR ELECTRODE PROTECTION IN ELECTROCHEMICAL CELLS, INCLUDING RECHARGEABLE LITHIUM BATTERIES"; U.S. Publication No. US-2015-0162586-A1 published on Jun. 11, 2015, filed as U.S. application Ser. No. 14/561,305 on Dec. 5, 2014, and entitled "NEW SEPARATOR"; U.S. Publication No. US-2015-0044517-A1 published on Feb. 12, 2015, filed as U.S. application Ser. No. 14/455,230 on Aug. 8, 2014, patented as U.S. Pat. No. 10,020,479 on Jul. 10, 2018, and entitled "SELF-HEALING ELECTRODE PROTECTION IN ELECTROCHEMICAL CELLS"; U.S. Publication No. US-2015-0236322-A1 published on Aug. 20, 2015, filed as U.S. application Ser. No. 14/184,037 on Feb. 19, 2014, patented as U.S. Pat. No. 10,490,796 on Nov. 26, 2019, and entitled "ELECTRODE PROTECTION USING ELECTROLYTE-INHIBITING ION CONDUCTOR"; U.S. Publication No. US-2015-0236320-A1 published on Aug. 20, 2015, filed as U.S. Application Ser. No. 14/624,641 on Feb. 18, 2015, patented as U.S. Pat. No. 9,653,750 on May 16, 2017, and entitled "ELECTRODE PROTECTION USING A COMPOSITE COMPRISING AN ELECTROLYTE-INHIBITING ION CONDUCTOR"; U.S. Publication No. US-2016-0118638-A1 published on Apr. 28, 2016, filed as U.S. application Ser. No. 14/921,381 on Oct. 23, 2015, and entitled "COMPOSITIONS FOR USE AS PROTECTIVE LAYERS AND OTHER COMPONENTS IN ELECTROCHEMICAL CELLS"; U.S. Publication No. US-2016-0118651-A1 published on Apr. 28, 2016, filed as U.S. application Ser. No. 14/918,672 on Oct. 21, 2015, and entitled "ION-CONDUCTIVE COMPOSITE FOR ELECTROCHEMICAL CELLS"; U.S. Publication No. US-2016-0072132-A1 published on Mar. 10, 2016, filed as U.S. Application Ser. No. 14/848,659 on Sep. 9, 2015, and entitled "PROTECTIVE LAYERS IN LITHIUM-ION ELECTROCHEMICAL CELLS AND ASSOCIATED ELECTRODES AND METHODS"; U.S. Publication No. US-2018-0138542-A1 published on May 17, 2018, filed as U.S. application Ser. No. 15/567,534 on Oct. 18, 2017, and entitled "GLASS-CERAMIC ELECTROLYTES FOR LITHIUM-SULFUR BATTERIES"; U.S. Publication No. US-2016-0344067-A1 published on Nov. 24, 2016, filed as U.S. application Ser. No. 15/160,191 on May 20, 2016, patented as U.S. Pat. No. 10,461,372 on Oct. 29, 2019, and entitled "PROTECTIVE LAYERS FOR ELECTROCHEMICAL CELLS"; U.S. Publication No. US-2020-0099108-A1 published on Mar. 26, 2020, filed as U.S. application Ser. No. 16/587,939 on Sep. 30, 2019, and entitled "PROTECTIVE LAYERS FOR ELECTROCHEMICAL CELLS"; U.S. Publication No. US-2017-0141385-A1 published on May 18, 2017, filed as U.S. application Ser. No. 15/343,890 on Nov. 4, 2016, and entitled "LAYER COMPOSITE AND ELECTRODE HAVING A SMOOTH SURFACE, AND ASSOCIATED METHODS"; U.S. Publication No. US-2017-0141442-A1 published on May 18, 2017, filed as U.S. application Ser. No. 15/349,140 on Nov. 11, 2016, and entitled "ADDITIVES FOR ELECTROCHEMICAL CELLS"; patented as U.S. patent. Ser. No. 10/320,031 on Jun. 11, 2019, and entitled "ADDITIVES FOR ELECTROCHEMICAL CELLS"; U.S. Publication No. US-2017-0149086-A1 published on May 25, 2017, filed as U.S. application Ser. No. 15/343,635 on Nov. 4, 2016, patented as U.S. Pat. No. 9,825,328 on Nov. 21, 2017, and entitled "IONICALLY CONDUCTIVE COMPOUNDS AND RELATED USES"; U.S. Publication No. US-2018-0337406-A1 published on Nov. 22, 2018, filed as U.S. application Ser. No. 15/983,352 on May 18, 2018, and entitled "PASSIVATING AGENTS FOR ELECTROCHEMICAL CELLS"; U.S. Publication No. US-2018-0261820-A1 published on Sep. 13, 2018, filed as U.S. application Ser. No. 15/916,588 on Mar. 9, 2018, and entitled "ELECTROCHEMICAL CELLS COMPRISING SHORT-CIRCUIT RESISTANT ELECTRONICALLY INSULATING REGIONS"; U.S. Publication No. US-2020-0243824-A1 published on Jul. 30, 2020, filed as U.S. application Ser. No. 16/098,654 on Nov. 2, 2018, and entitled "COATINGS FOR COMPONENTS OF ELECTROCHEMICAL CELLS"; U.S. Publication No. US-2018-0351158-A1 published on Dec. 6, 2018, filed as U.S. application Ser. No. 15/983,363 on May 18, 2018, and entitled "PASSIVATING AGENTS FOR ELECTROCHEMICAL CELLS"; U.S. Publication No. US-2018-0277850-A1, published on Sep. 27, 2018, filed as U.S. application Ser. No. 15/923,342 on Mar. 16, 2018, and patented as U.S. Pat. No. 10,720,648 on Jul. 21, 2020, and entitled "ELECTRODE EDGE PROTECTION IN ELECTROCHEMICAL CELLS"; U.S. Publication No. US-2018-0358651-A1, published on Dec. 13, 2018, filed as U.S. application Ser. No. 16/002,097 on Jun. 7, 2018, and patented as U.S. Pat. No. 10,608,278 on Mar. 31, 2020, and entitled "IN SITU CURRENT COLLECTOR"; U.S. Publication No. US-2017-0338475-A1, published on Nov. 23, 2017, filed as U.S. application Ser. No. 15/599,595 on May 19, 2017, and entitled "PROTECTIVE LAYERS FOR ELECTRODES AND ELECTROCHEMICAL CELLS"; U.S. Publication No. US-2019-0088958-A1, published on Mar. 21, 2019, filed as U.S. application Ser. No. 16/124,384 on Sep. 7, 2018, and entitled "PROTECTIVE MEMBRANE FOR ELECTROCHEMICAL CELLS"; U.S. Publication No. US-2019-0348672-A1, published on Nov. 14, 2019, filed as U.S. application Ser. No. 16/470,708 on Jun. 18, 2019, and entitled "PROTECTIVE LAYERS COMPRISING METALS FOR ELECTROCHEMICAL CELLS"; U.S. Publication No. US-2017-0200975-A1, published Jul. 13, 2017, filed as U.S. Application Ser. No. 15/429,439 on Feb. 10, 2017, and patented as U.S. Pat. No. 10,050,308 on Aug. 14, 2018, and entitled "LITHIUM-ION ELECTROCHEMICAL CELL, COMPONENTS THEREOF, AND METHODS OF MAKING AND USING SAME"; U.S. Publication No. US-2018-0351148-A1, published Dec. 6, 2018, filed as U.S. application Ser. No. 15/988,182 on May 24, 2018, and entitled "IONICALLY CONDUCTIVE COMPOUNDS AND RELATED USES"; U.S. Publication No. US-2018-0254516-A1, published Sep. 6, 2018, filed as U.S. application Ser. No. 15/765,362 on Apr. 2, 2018, and entitled "NON-AQUEOUS ELECTROLYTES FOR HIGH ENERGY LITHIUM-ION BATTERIES"; U.S. Publication No. US-2020-0044460-A1, published Feb. 6, 2020, filed as U.S. Application No. 16,527,903 on Jul. 31, 2019, and entitled "MULTIPLEXED CHARGE DISCHARGE BATTERY MANAGEMENT SYSTEM"; U.S. Publication No. US-2020-0044460-A1, published Feb. 6, 2020, filed as U.S. Application No. 16,527,903 on Jul. 31, 2019, and entitled "MULTIPLEXED CHARGE DISCHARGE BATTERY MANAGEMENT SYSTEM"; U.S. Publication No. US-2020-0220146-A1, published Jul. 9, 2020, filed as U.S. application Ser. No. 16/724,586 on Dec. 23, 2019, and entitled "ISOLATABLE ELECTRODES AND ASSOCIATED ARTICLES AND METHODS"; U.S. Publication No. US-2020-0220149-A1, published Jul. 9, 2020, filed as U.S. application Ser. No. 16/724,596 on Dec. 23, 2019, and entitled "ELECTRODES, HEATERS, SENSORS, AND ASSOCIATED ARTICLES AND METHODS"; U.S. Publication No. US-2020-0220197-A1, published Jul. 9, 2020, filed as U.S. application Ser. No. 16/724,612 on Dec. 23, 2019, and entitled "FOLDED ELECTROCHEMICAL DEVICES AND ASSOCIATED METHODS AND SYSTEMS". All other patents and patent applications disclosed herein are also incorporated by reference in their entirety for all purposes.

The inventors have recognized and appreciated that some embodiments described above may produce results showing various improvements over conventional techniques when implemented.

In the following Examples 1-5 and Tables 1-4, cells are cycled under pressure of 10-12 kg/cm$^2$.

Example 1: Example 1 shows that cycle life was short when cells were cycled at the same charge and discharge rates (currents or times) in the wide range of rates. Cells with NCM111 cathode, 15 μm vapor-deposited lithium anode, and an electrolyte were cycled under 10 kg/cm$^2$ pressure. The electrolyte included a 1 molar solution of lithium hexafluorophosphate in a 2:1 weight ratio of ethylene carbonate to dimethyl carbonate. Total cell active electrodes area was 99.4 cm$^2$ and cell capacity was 200 mAh. Cell were charged to 4.35 volts and discharged to 3.2 volts at currents in Table 1 below. Charge and discharge current were equal. All cells showed short cycle life of 38-56 cycles for the range of charge discharge currents from 40 to 200 mA (5 times different currents).

TABLE 1

| Discharge mA | Charge mA | Cycle Life to 110 mAh |
|---|---|---|
| 40 | 40 | 56 |
| 67 | 67 | 44 |
| 150 | 150 | 38 |
| 200 | 200 | 38 |

Example 2: Example 2 shows that cycle life improved when discharge current was fixed but charge currents were substantially lower. Higher discharge/charge currents ratio led to longer cycle life.

Cells similar to Example 1 but with NCM622 cathode. Cell capacity was 330 mAh. Cells were charged to 4.35 volts and discharged to 3.2 volts at currents in Table 2 below.

TABLE 2

| Discharge mA | Charge mA | Discharge/Charge Current Ratio | Cycle Life to 250 mAh |
|---|---|---|---|
| 300 | 100 | 3 | 96 |
| 300 | 50 | 6 | 140 |
| 300 | 40 | 7.5 | 146 |
| 300 | 30 | 10 | 159 |

Cycle life in Table 2 increased with higher discharge/charge current ratio. The biggest gain was for 3-6 ratio with diminishing additional gain at higher ratio values and respectively longer charge.

Example 3: Example 3 shows that cycle life improved when charge current was fixed but discharge current was substantially higher. Higher discharge/charge currents ratio led to longer cycle life.

Cells are similar to Example 2 but with electrolyte LiIon1401. Cell capacity was 330 mAh. Cells were charged to 4.35 volts and discharged to 3.2 volts at currents in Table 3 below.

TABLE 3

| Discharge mA | Charge mA | Discharge/Charge Current Ratio | Cycle Life to 250 mAh |
|---|---|---|---|
| 75 | 75 | 1 | 54 |
| 300 | 75 | 4 | 334 |

Change of discharge/charge currents ratio from 1 to 4 at fixed charge current lead to dramatic, 6-fold cycle life improvement.

Example 4: Example 4 shows that cycle life improved when charge current was fixed and discharge current was substantially higher but was not necessarily continuous. The cell was discharged at conditions when discharge was periodically suspended for a certain period of time and resumed again.

Cells are similar to Example 3. Cell capacity was 330 mAh. Cells were charged to 4.35 volts and discharged to 3.2 volts at currents in Table 3 below. Charge and discharge currents of 100 mA were continuous.

Discharge process at 400 mA was not continuous. Discharge at 400 mA lasted for 10 s, then was suspended for 30 s and resumed again. This process was periodical. Cycle life data obtained at these two processes are in Table 4.

TABLE 4

| Discharge mA | Charge mA | Discharge/Charge Current Ratio | Cycle Life to 250 mAh |
|---|---|---|---|
| 100 | 100 | 1 | 51 |
| 400 | 100 | 4 | 277 |

Example 5: Example 5 shows that cycle life improved only if higher discharge/charge current ratio is applicable for substantial part of discharge time or capacity. If higher current discharge conditions are just a small portion of entire discharge time the cycle life gain is not substantial.

Cells are similar to Example 4 but with NCM721 cathode. Cell capacity was 360 mAh. Cells were charged to 4.4 volts and discharged to 3.2 volts.

The first portion of the cells experienced equal 100 mA charge and discharge currents and delivered cycle life of 43 cycle at 250 mAh cutoff.

The second portion of the cells was charged at constant current of 100 mA and discharged at two steps: 100 mA to 95% of capacity and then at 400 mA to get remaining 5% of capacity.

The cycle life of these cells was 52 cycles. This was 9 cycles or ~21% of cycle life gain based on higher discharge/charge current ratio of 4 being applied for 5% of total capacity. The inventors have recognized and appreciated that better cycle life can be expected with 5% of capacity obtained at higher discharge/charge current ratio, such as where an average discharging rate or current during the previous discharging step is equal to or less than an average charging rate or current during the charging step, and an average discharging rate or current during discharge of at least 5% of the capacity of the cell during the previous discharging step is at least 2 times higher or is 4 times higher than the average charging rate or current during the charging step.

The inventors have recognized and appreciated that some embodiments described above may produce results showing various improvements over conventional techniques when implemented. For example, in one implementation, cells were made of NCMA622 cathode (BASF) with 50 μm Li foil and 25 μm Celgard 2325 separator filled with F9 (BASF) electrolyte containing 1% by weight of lithium bis(oxalato) borate (LiBOB), with an active electrode area of 99.41 cm$^2$. The cells were assembled into 13 batteries containing 4 cells each. The batteries were subjected to 13 electrical charge-discharge cycling tests performed using some embodiments at conditions summarized in Table 5 and Table 6 below. The cells in the batteries were kept at pressure of 12 kg/cm$^2$ and temperature of 18° C. during cycling tests.

TABLE 5

Battery test data for 4 cells simultaneously discharged with even current distribution.

| Test # | Battery Discharge Current mA | Battery Charge Current mA | Battery Cycle Life to 800 mAh Cutoff | Battery 5$^{th}$ Cycle Capacity mAh | Cell Discharge Current mA | Cell Charge Current mA |
|---|---|---|---|---|---|---|
| 1 | 800 | 800 | 29 | 1344 | 200 | 200 |
| 2 | 400 | 400 | 52 | 1380 | 100 | 100 |
| 3 | 300 | 300 | 53 | 1412 | 75 | 75 |

TABLE 6

Battery test data for 4 cells sequentially discharged at various discharge pulse durations.

| Test # | Battery Discharge Current mA | Battery Charge Current mA | Battery Cycle Life to 800 mAh Cutoff | Battery 5$^{th}$ Cycle Capacity mAh | Cell Discharge Pulse Current mA | Cell Discharge Pulse Duration s | Cell No Current Duration s | Cell Charge Current mA | Level of Cell Discharge at Single Pulse |
|---|---|---|---|---|---|---|---|---|---|
| 4 | 800 | 800 | 94 | 1064 | 800 | 1197 | 0 | 200 | Full |
| 5 | 800 | 800 | 131 | 1208 | 800 | 10 | 30 | 200 | Partial |
| 6 | 800 | 800 | 125 | 1252 | 800 | 1 | 3 | 200 | Partial |
| 7 | 800 | 800 | 46 | 1260 | 800 | 0.1 | 0.3 | 200 | Partial |
| 8 | 400 | 400 | 263 | 1260 | 400 | 2835 | 0 | 100 | Full |
| 9 | 400 | 400 | 283 | 1284 | 400 | 10 | 30 | 100 | Partial |
| 10 | 400 | 400 | 217 | 1352 | 400 | 1 | 3 | 100 | Partial |
| 11 | 400 | 400 | 59 | 1368 | 400 | 0.1 | 0.3 | 100 | Partial |
| 12 | 300 | 300 | 334 | 1304 | 300 | 3912 | 0 | 75 | Full |
| 13 | 300 | 300 | 298 | 1412 | 300 | 10 | 30 | 75 | Partial |

Table 5 (Tests #1-#3) represents comparative examples (as performed by conventional techniques) and summarizes test results when batteries were charged and discharged at constant currents with cells connected in parallel and with charge and discharge currents distributed evenly among 4 cells. Charge cutoff voltage was 4.35 volts and discharge cutoff voltage was 3.2 V. Charge-discharge cycling stopped when battery capacity reached 800 mAh.

Table 6 (Tests #4-#13) summarizes test results when batteries were charged to 4.35 volts at constant currents with cells connected in parallel and with charge discharge currents distributed evenly among 4 cells. Discharge of these batteries was performed in a way that the battery as a whole experienced constant discharge current. However, individual cells were connected to and disconnected from the load sequentially, providing discharge current pulse only for one of four cells at a time. At the end of this pulse, the next cell was connected and the previous one was disconnected. Cells experienced discharge pulses in sequences (e.g., Cell #1, 2, 3, 4, 1, 2, 3, 4, etc.) during a certain pulse time or until discharge voltage reached 3.2 V. Tests #4, #8, and #12 provided full cell discharge at single pulse. Other tests provided partial cell discharge at single pulse with durations of 0.1, 1, and 10 s. Charge-discharge cycling stopped when battery capacity reached 800 mAh.

Figure 13A:
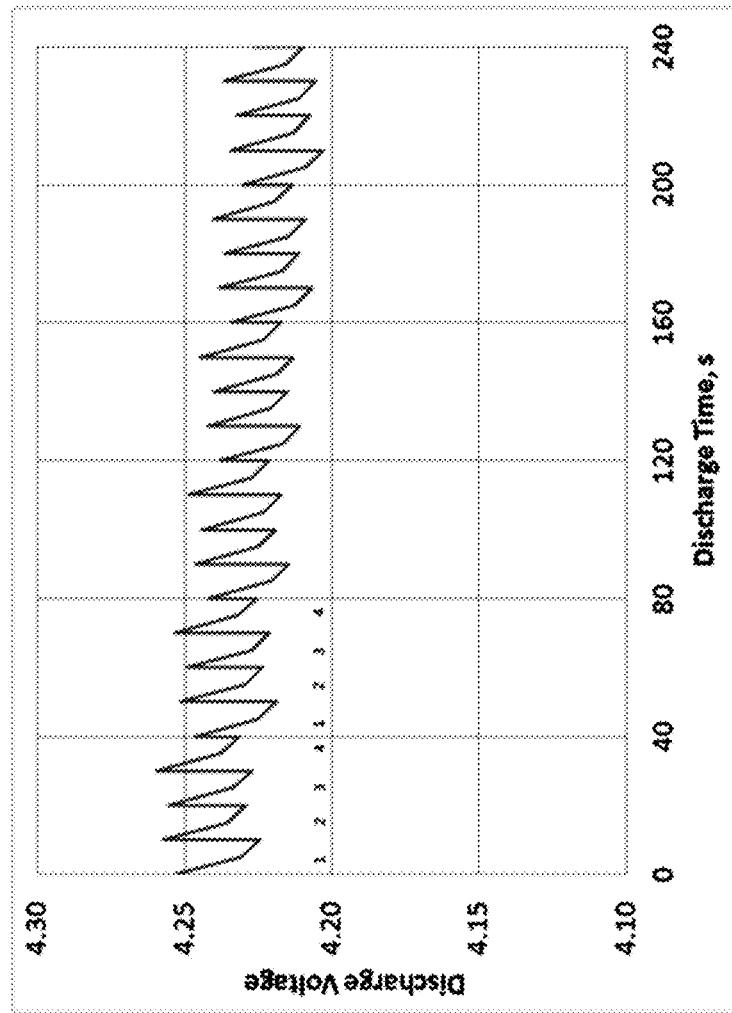
FIG. 13A is a chart depicting an exemplary discharge profile, according to some embodiments.
Figure 13B:
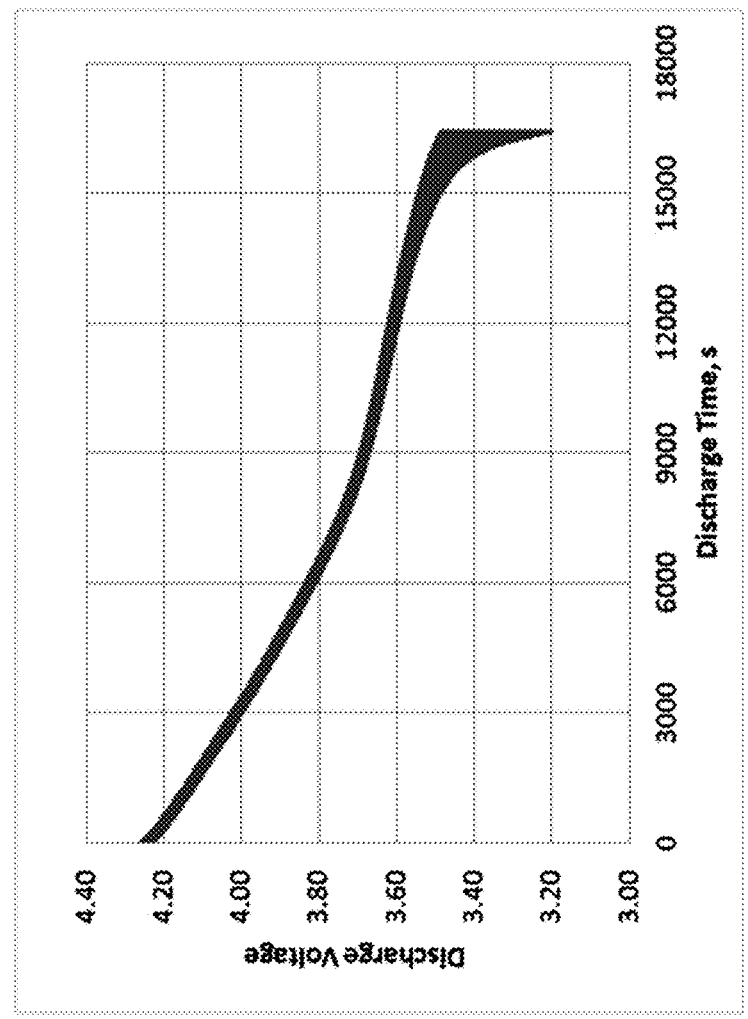
FIG. 13B is a chart depicting an exemplary full discharge profile, according to some embodiments.

FIG. 13A, corresponding to Test #13, shows the battery voltage profile at the beginning of the 10 second pulse discharge for the first 240 seconds, and FIG. 13B shows the full discharge profile to a voltage of 3.2 V. In FIG. 13A, the cell numbers affected by the 10 second 300 mA pulses at repeated sequences are shown for the first 80 seconds.

Figure 13C:
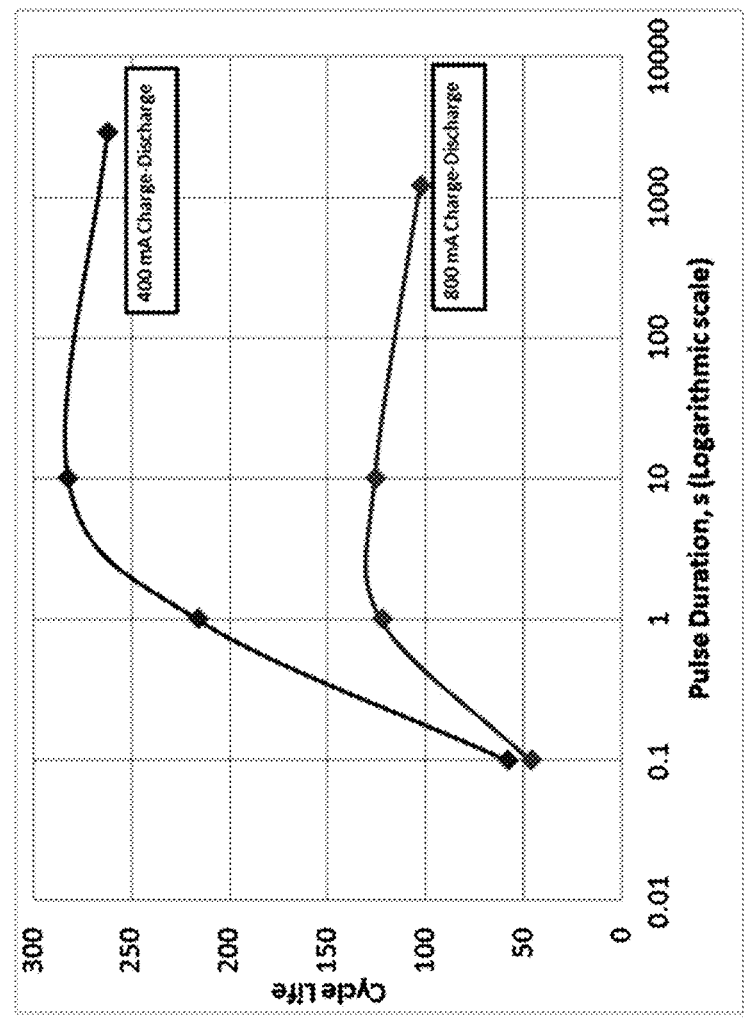
FIG. 13C is a chart depicting an exemplary battery cycle life, according to some embodiments.

Referring back to Table 5 and Table 6, the inventors have recognized and appreciated that applying whole battery discharge current to the portion of the battery cells in sequence (Table 6) has led to surprising and dramatic cycle life improvement compared with homogeneous current distribution among all battery cells (Table 5), as has been done in conventional techniques. This cycle life improvement may be up to six-fold, and the inventors recognized it may be a function of discharge pulse duration as well as charge-discharge rate. FIG. 13C, which illustrates battery cycle life as a function of pulse duration at two charge-discharge rates (corresponding to Tests #4-#11), shows that cycle life may be especially improved with pulse time longer than 0.1 seconds and pulse duration around 10 seconds. The inventors have recognized and appreciated that improvements to battery cycle life described herein are even available using some embodiments at partial discharge, as FIG. 13C shows and as would not have been expected based on experience with conventional techniques. Additionally, the full capacity of all cells, even when far from uniform, can be utilized with some embodiments.

In the following examples, different charging conditions were used. In one implementation, nine pouch cells were tested comprising NCM811 cathode as a positive electrode, copper foil as a negative electrode, and 9 micrometer thick polyolefin separator filled with liquid electrolyte. The liquid electrolyte comprised linear carbonates, cyclic carbonates, and $LiPF_6$ salt. Each cell had 99.4 $cm^2$ active electrode area and contained 0.5 mL of electrolyte. During electric testing, the cells were subjected to 12 $kg/cm^2$ pressure.

The first three cycles were formation cycles started with charging at 30 mA to 4.35 volts and discharging at 120 mA to 3.0 volts.

After formation the cells were divided into three groups, 3 cells each for further cycling. Group 1 had approximately constant charging rate. Group 2 started with low charging rate and linearly increasing rates to the end of the charging step. Group 3 started with high charging rate and linearly decreasing rates to the end of the charging step.

Group 1 was cycled with the following conditions: The group was charged at constant current of 576 mA for 15 minutes. If the cell voltage reached 4.35 volts at the end of the charging step, it kept constant tapering current until total charge time reached 15 minutes. The group was discharged at 232 mA to 3.0 volts.

Group 2 was cycled with the following conditions: The group was charged at a starting current of 60 mA with increasing current at a rate of 68.8 mA/minute over 15 minutes with an expectation to reach maximal current of 1092 mA at the end of the charging step. If cell voltage reached 4.35 volts at the end of the charging step, it kept constant tapering current until total charge time reached 15 minutes. The group was discharged at 232 mA to 3.0 volts.

Group 3 was cycled with the following conditions: The group was charged at a starting current of 1092 mA with decreasing current at a rate of −68.8 mA/minute over 15 minutes with an expectation to reach minimal current of 60 mA at the end of the charging step. If cell voltage reached 4.35 volts at the end of the charging step, it kept constant tapering current until total charge time reached 15 minutes. The group was discharged at 232 mA to 3.0 volts.

Three charge conditions for groups 1, 2, and 3 were designed to reach charge capacity of 144 mAh within 15 minutes. Three groups of cells delivered discharge capacity in the range of 142-143 mAh at initial cycles. Cells were cycled until they reached a discharge cutoff capacity of 100 mAh and cycle life (the number of charges performed prior to reaching cutoff capacity) was determined at this point.

The results were as follows: Group 1 of three cells delivered 29, 30, and 32 cycles. Group 2 of three cells delivered 45, 47, and 47 cycles. Group 3 of three cells delivered 24, 27, and 28 cycles.

As discussed herein, the inventors have recognized and appreciated that starting a charging step with lower current with gradual increase to the end of the charging step can deliver 50% longer cycle life compared with constant current or decreasing current charge conditions.

Figure 13D:
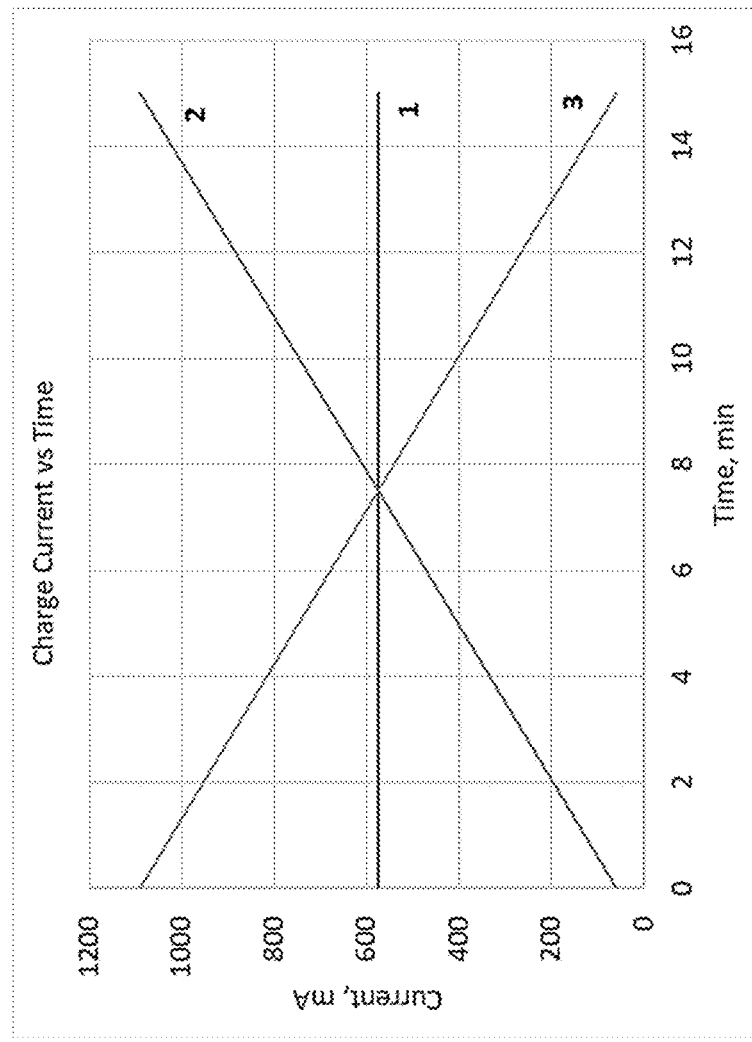
FIG. 13D is a chart depicting exemplary charging rate profiles, according to some embodiments.
Figure 13E:
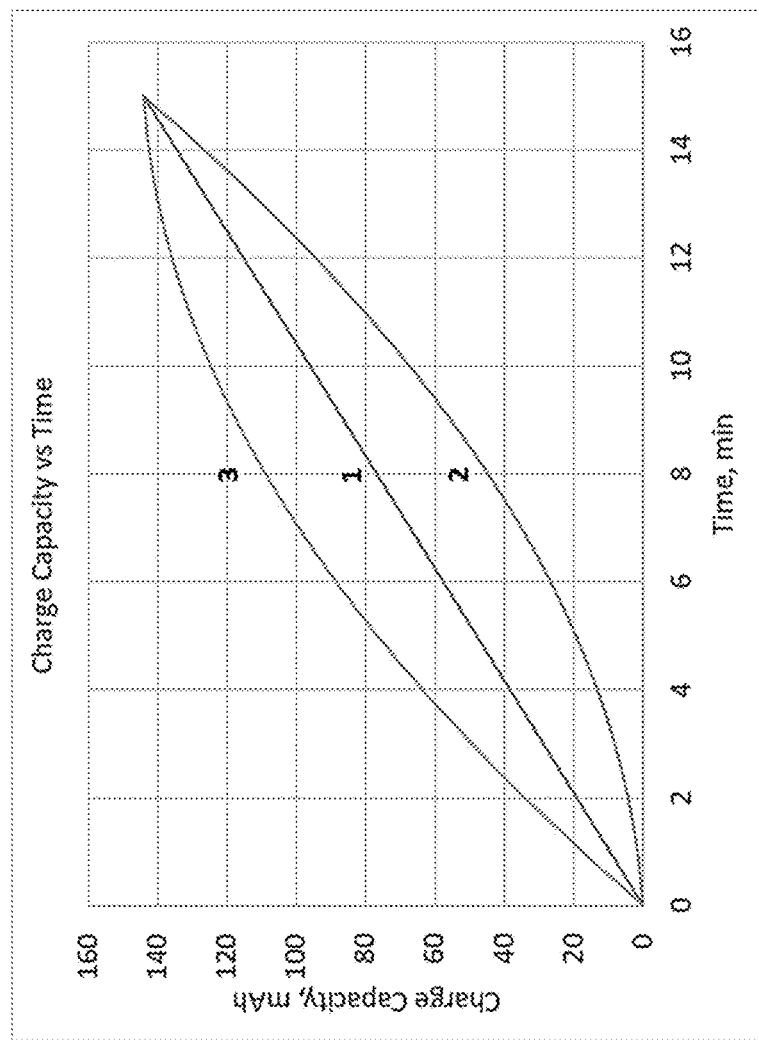
FIG. 13E is a chart depicting exemplary charging capacity profiles, according to some embodiments.
Figure 13F:
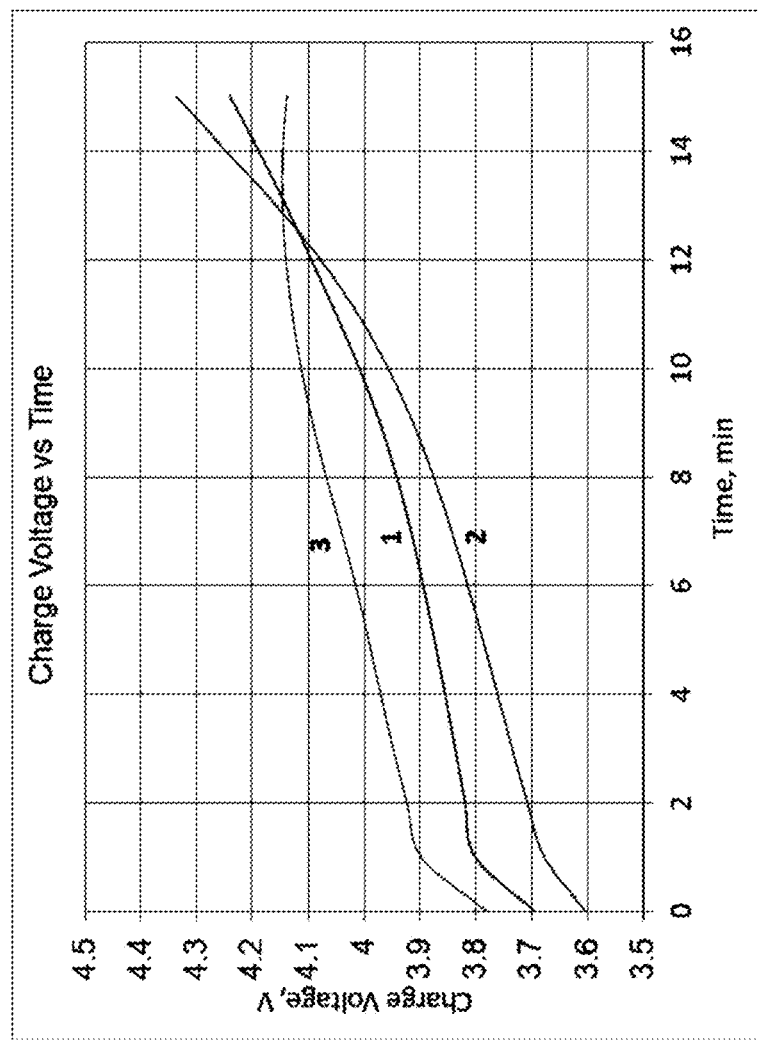
FIG. 13F is a chart depicting exemplary charging voltage profiles, according to some embodiments.

The charts in FIGS. 13D, 13E, and 13F show respective Charge Current, Charge Capacity, and Charge Voltage Profiles for cells selected from groups 1, 2, and 3. The data on these charts correspond to a fourth charge (Cycle 4). Number marks near curves correspond to the respective cell from groups 1, 2, and 3. The inventors have recognized and appreciated, as group 2 shows, that starting charge current at monotonic current increase conditions can be as low as about 10% of average charge current, and respectively the highest charge current at such conditions can be about 200% of average charge current.

Figure 13G:
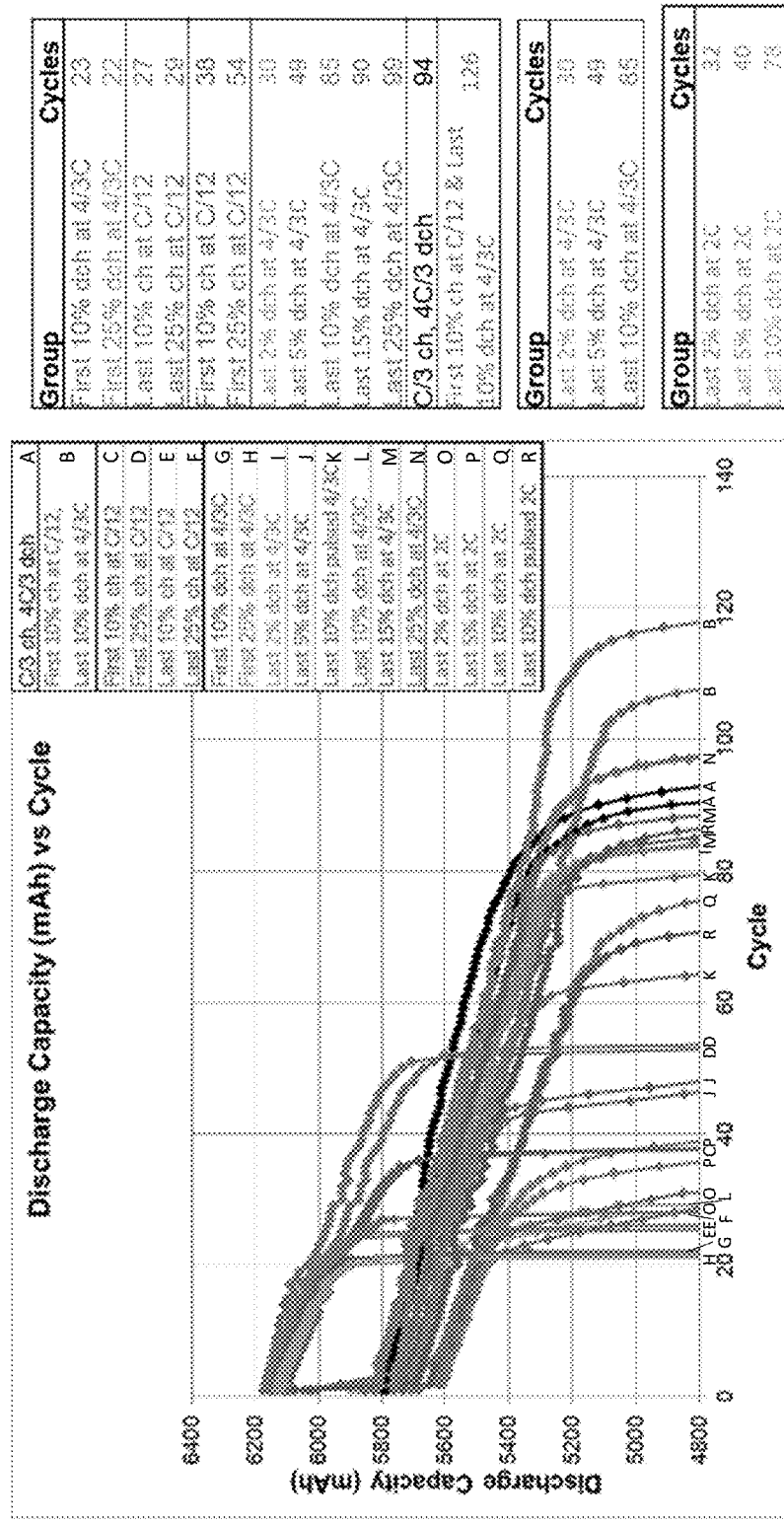
FIG. 13G is a capacity-cycle graph for a representative electrochemical cell management system, according to some embodiments.

FIG. 13G is an exemplary capacity-cycle graph for a representative electrochemical cell management system managing an electrochemical cell (e.g., electrochemical cell 121A). FIG. 13G includes 18 groups of plots. The inventors have recognized and appreciated, as FIG. 13G shows, increasing the discharging rate at the beginning of a discharging step or decreasing the charge rate at the end of a charging step may cause no improvement to cell cycle life. However, the inventors recognized and appreciated that cell cycle life did improve by increasing the discharging rate at the end of a discharging step and decreasing the charging rate at the beginning of a charging step (e.g., following an additive process). The inventors recognized and appreciated that cell cycle life may also improve more by modifying a larger SOC range breadth.

Figure 13H:
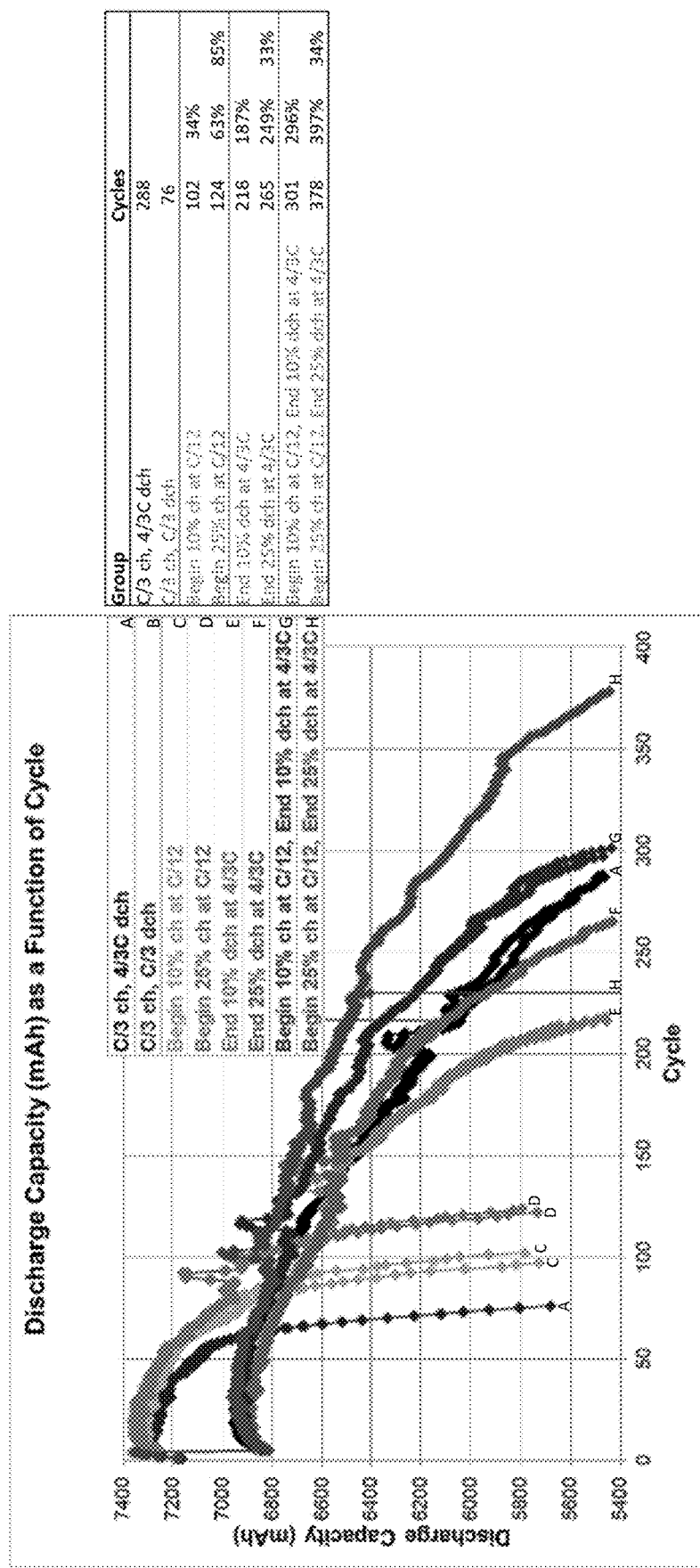
FIG. 13H is a capacity-cycle graph for an additional representative electrochemical cell management system, according to some embodiments.

FIG. 13H is an exemplary capacity-cycle graph for an additional representative electrochemical cell management system managing an electrochemical cell (e.g., electrochemical cell 121A). FIG. 13H includes 8 groups of lots. The inventors have recognized and appreciated, as FIG. 13H shows, modifying the beginning of a charging step may provide modest improvement to cell cycle life compared to modifying the same SOC range breadth at the end of a discharging step. The inventors further recognized and appreciated that further improvement to cell cycle life can be obtained by combining a modification of the beginning of a charging step and the end of a discharging step. Additionally, the inventors recognized and appreciated that an additional 25% improvement to cell cycle life may occur by modifying a SOC range with breadth of 25% as compared to a SOC range with breadth of 10%. Similarly, the inventors recognized and appreciated that increasing the breadth of the state of charge range at the preferred rate showed further improvement to cell cycle life.

Figure 13I:
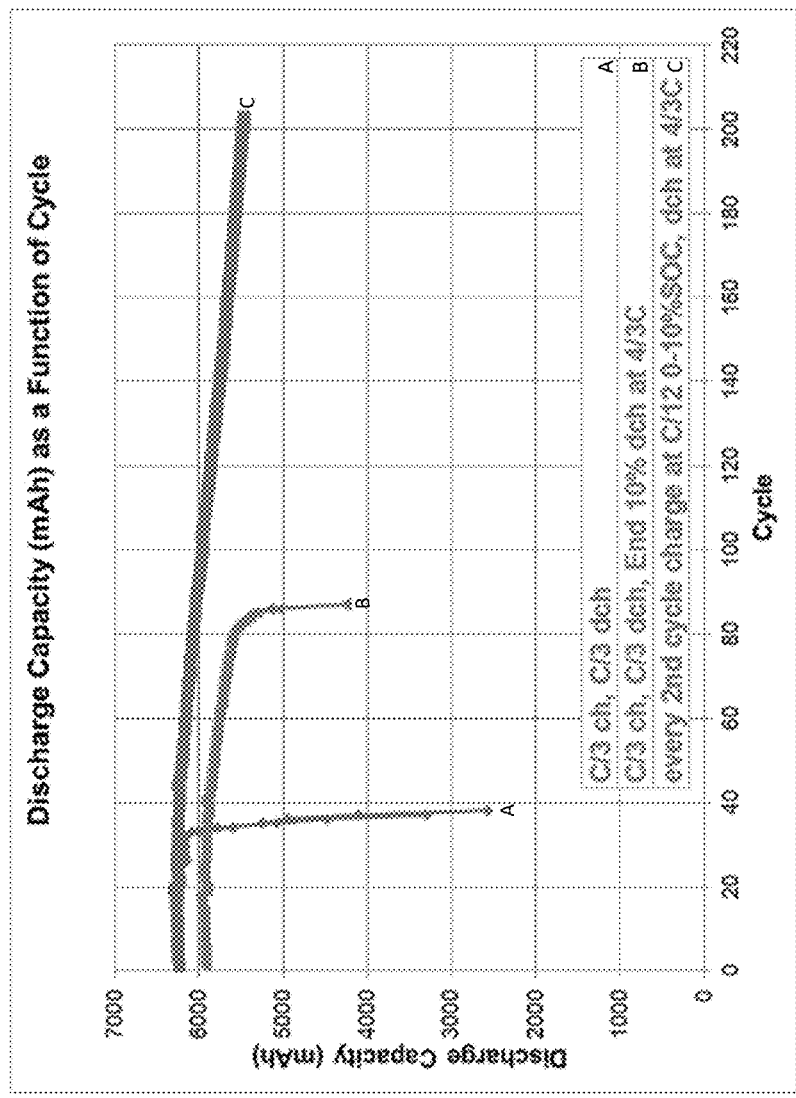
FIG. 13I is a capacity-cycle graph for an additional representative electrochemical cell management system, according to some embodiments.

FIG. 13I is an exemplary capacity-cycle graph for an additional representative electrochemical cell management system managing an electrochemical cell (e.g., electrochemical cell 121A). FIG. 13I includes 3 plots. The inventors have recognized and appreciated, as FIG. 13I shows, that for charging at a rate of C/3 with a discharging rate of C/3, cell cycle life may improve from 40 to 80 cycles by ending the discharge at a rate of 4/3C (from 10% to 0% SOC), while inserting a "mini-cycle" every other cycle may keep the cell above 80% capacity even after 200 cycles.

In some embodiments, a controller (e.g., controller 114 of FIG. 1A) may control one or more cells to charge slower at the beginning of charge than later to help recover the anode surface at the expense of other cells. In some embodiments, the controller may rotate between cells and combinations of charging and discharging. In some embodiments, recovery "mini-cycles" may be created by discharging a cell faster for 1-10% SOC (or DOD) than otherwise and using that energy to charge the remaining cells more slowly than otherwise.

Figure 13J:
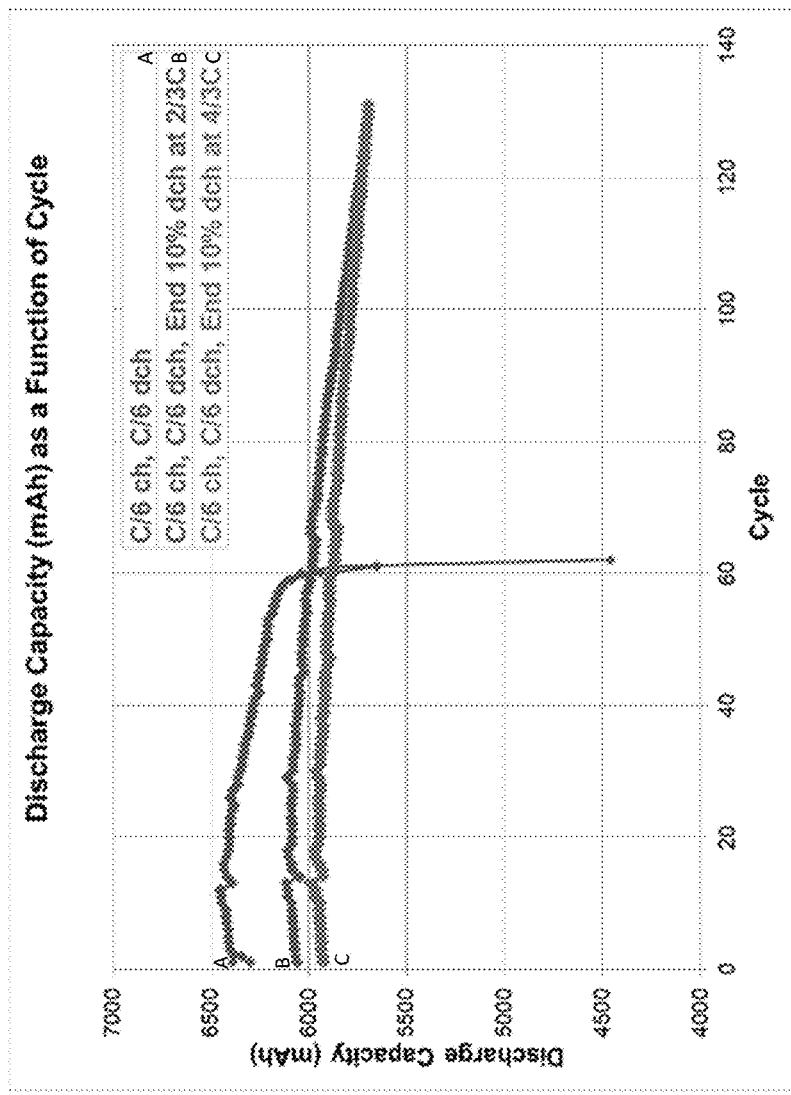
FIG. 13J is a capacity-cycle graph for an additional representative electrochemical cell management system, according to some embodiments.

FIG. 13J is an exemplary capacity-cycle graph for an additional representative electrochemical cell management system managing an electrochemical cell (e.g., electrochemical cell 121A). FIG. 13J includes 3 plots. The inventors have recognized and appreciated, as FIG. 13J shows, for charging at a rate of C/6 with a discharging rate of C/6, fade rate may be reduced by ending a discharging step at a rate of 4/3C (from 10% to 0% SOC) as compared to a rate of 2/3C.

Figure 13K:
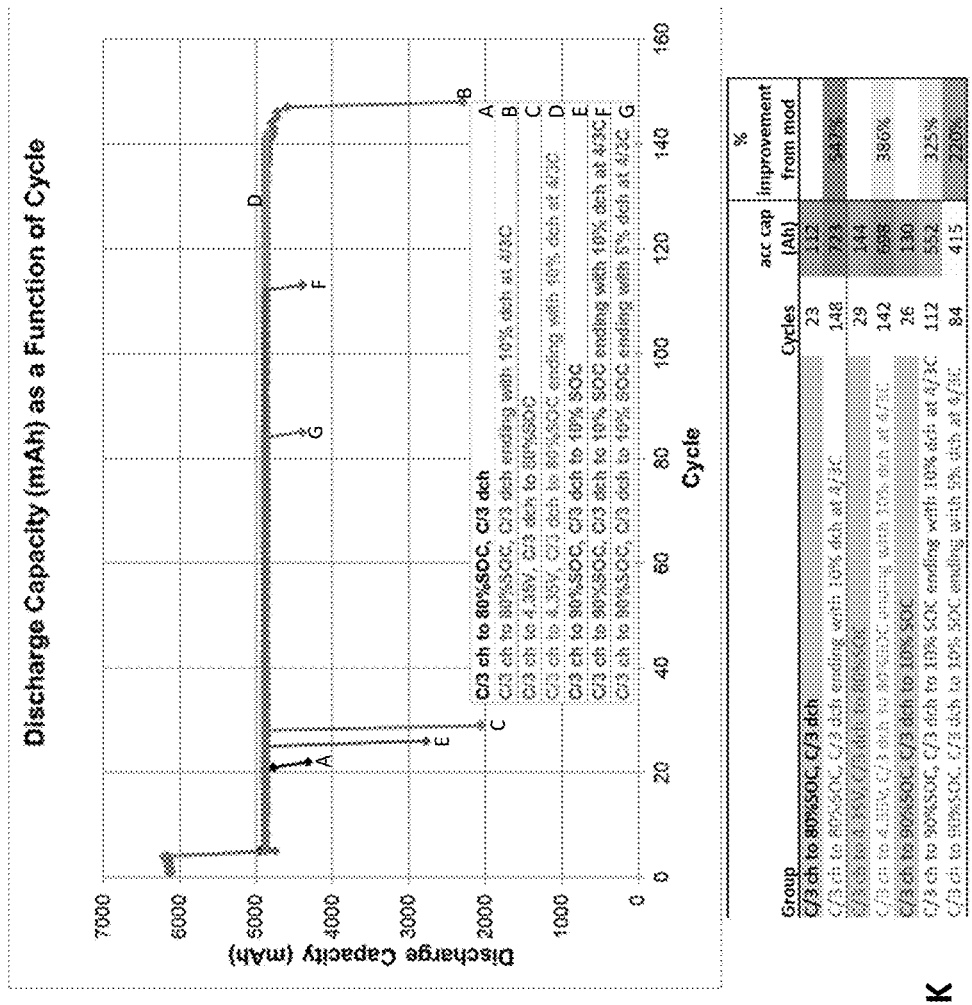
FIG. 13K is a capacity-cycle graph for an additional representative electrochemical cell management system, according to some embodiments.

FIG. 13K is an exemplary capacity-cycle graph for an additional representative electrochemical cell management system managing an electrochemical cell (e.g., electrochemical cell 121A). FIG. 13K includes 7 plots. The inventors have recognized and appreciated, as FIG. 13K shows, that for charging (0-80% SOC) at a rate of C/3 and discharging at a rate of C/3, cell cycle life may improve from 20 to 150 cycles by ending the last 10% SOC of a discharging at 4/3C. The inventors also recognized and appreciated that, for charging (20-100% SOC) at a rate of C/3 and discharging at a rate of C/3, cycle life may improve from 30 to 140 cycles by ending the last 10% discharge at 4/3C. The inventors further recognized and appreciated that, for charging (10-90% SOC) at a rate of C/3 and discharging at a rate of C/3, cycle life may improve from 25 to 85 cycles by ending the last 5% discharge at 4/3C and to 110 cycles by ending the last 10% discharge at 4/3C.

Figure 13L:
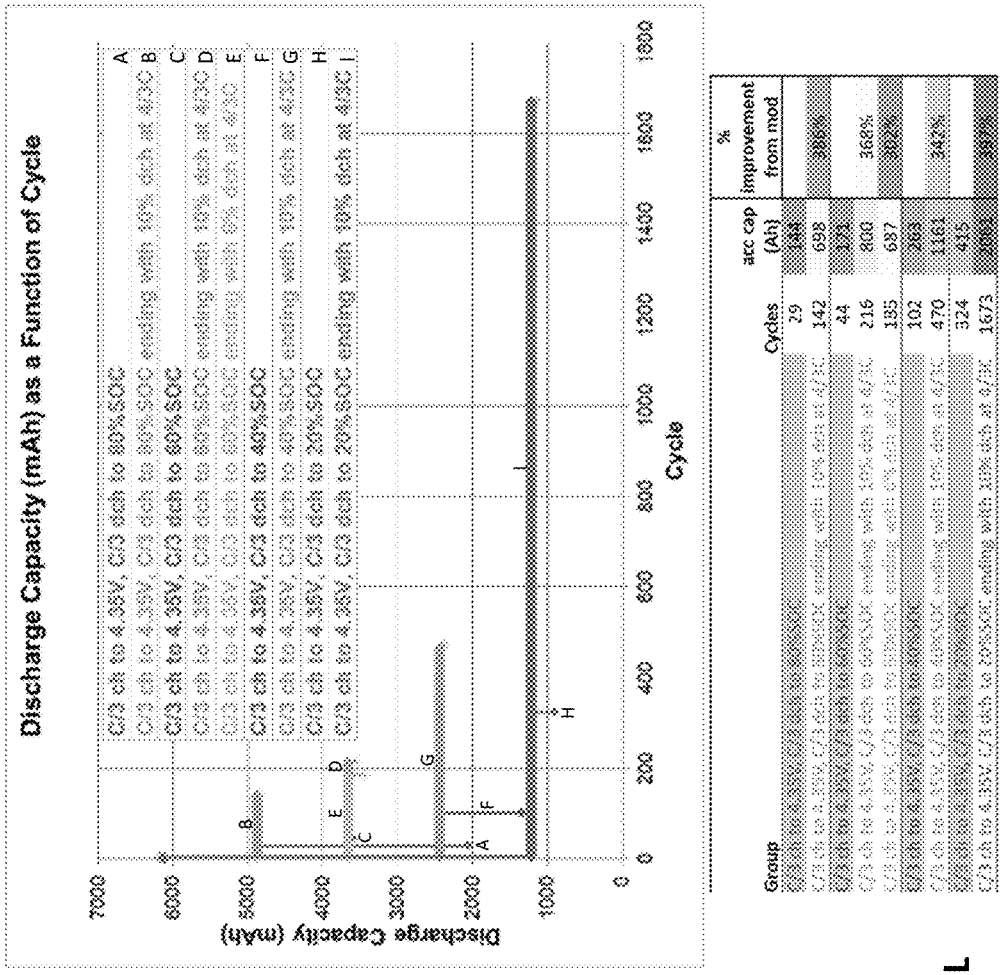
FIG. 13L is a capacity-cycle graph for an additional representative electrochemical cell management system, according to some embodiments.

FIG. 13L is an exemplary capacity-cycle graph for an additional representative electrochemical cell management system managing an electrochemical cell (e.g., electrochemical cell 121A). FIG. 13L includes 9 plots. The inventors have recognized and appreciated, as FIG. 13L shows, for charging at a rate of C/3 and discharging at a rate of C/3, cell cycle life may be improved almost 4 times at lower depths of discharge by ending the last 10% of a discharging step at 4/3C, and may be improved 3 times by ending the last 6% of a discharging step at 4/3C.

Figure 15A:
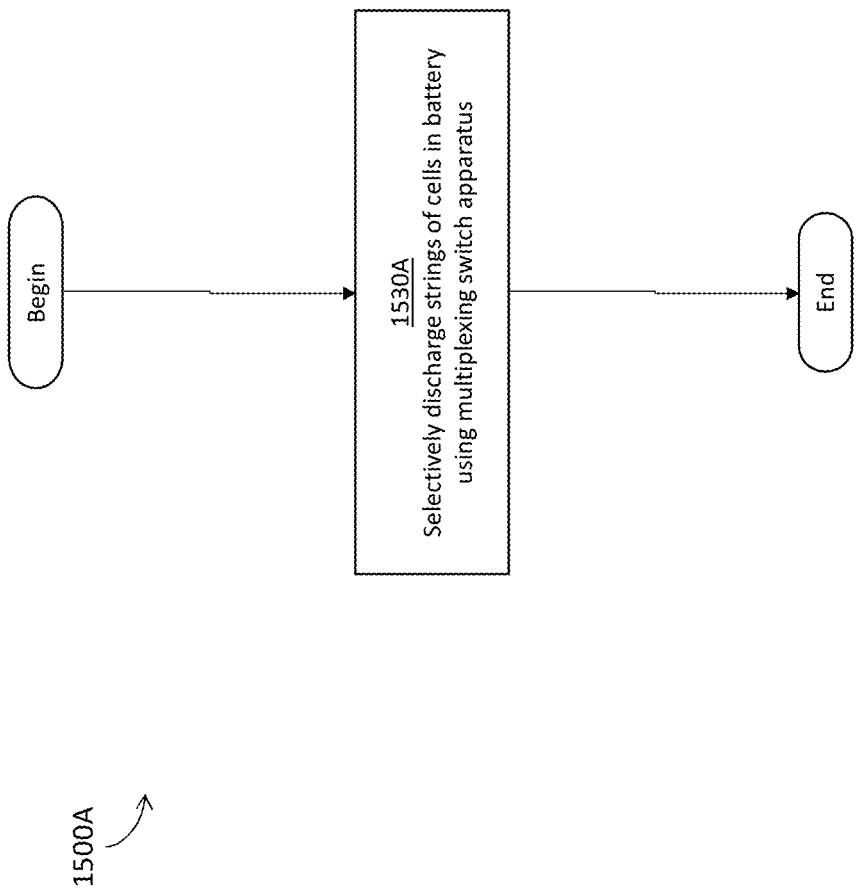
FIG. 15A is a flow chart depicting a representative process for discharging strings of cells of a battery, according to some embodiments.

FIG. 15A depicts a representative high-level process 1500A for discharging strings of cells of a battery. The acts comprising representative process 1500A are described in detail in the paragraphs that follow.

In some embodiments, representative process 1500A may include act 1530A, wherein strings of cells in a battery may be selectively discharged using a multiplexing switch apparatus (such as multiplexing switch apparatus 112 described above). Additionally, the multiplexing switch apparatus may be connected to two or more strings (e.g., 121, 122, 123, and/or 124) of cells or modules (e.g., 121A-C) of at least one battery (e.g., 120-150). Each set or module of cells may comprise one or more cells.

In some embodiments, process 1500A may then end or repeat as necessary.

Figure 15B:
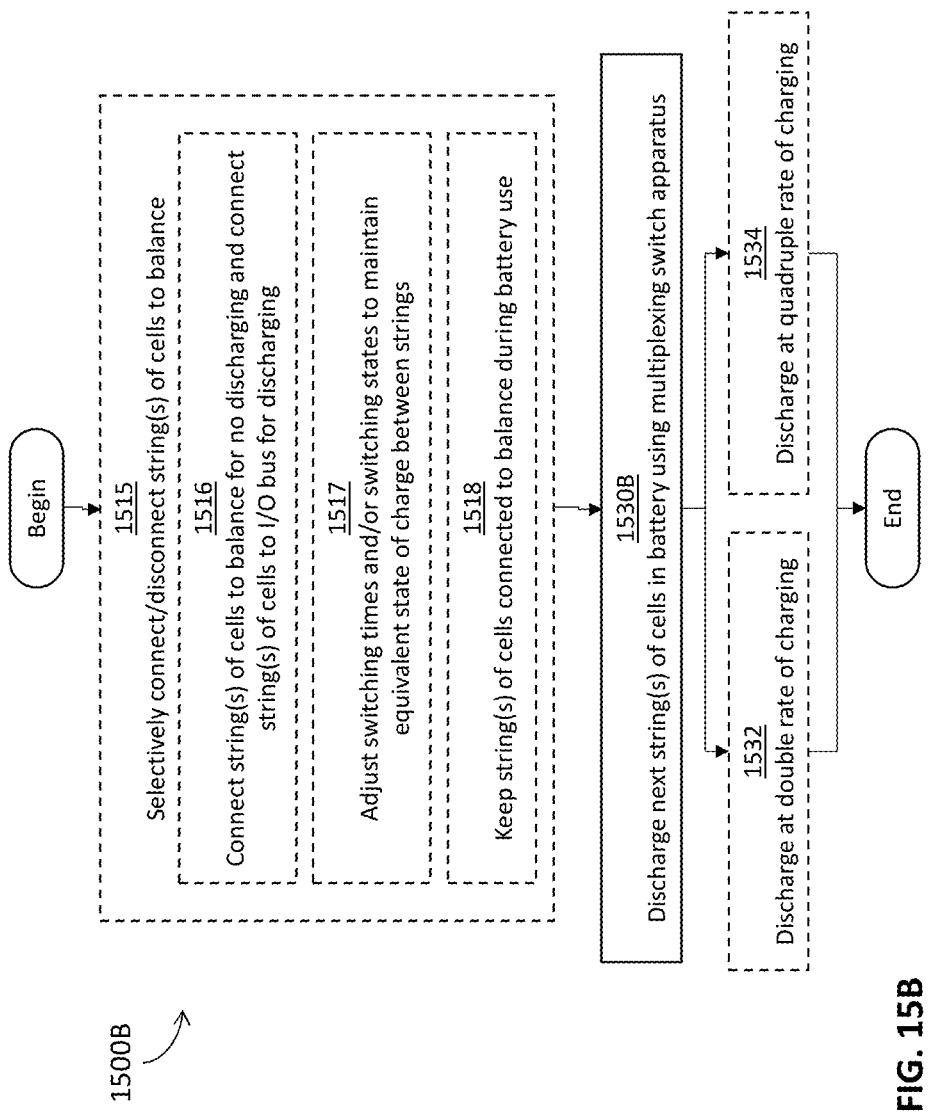
FIG. 15B is a flow chart depicting an additional representative process for discharging strings of cells of a battery, according to some embodiments.

FIG. 15B depicts a representative high-level process 1500B for discharging strings of cells of a battery. The acts comprising representative process 1500B are described in detail in the paragraphs that follow.

In some embodiments, representative process 1500B optionally may begin at act 1515, wherein the multiplexing switch apparatus may be used to selectively connect or disconnect string(s) of cells to a balance rail (e.g., 160).

In some embodiments, act 1515 may optionally include act 1516, wherein the multiplexing switch apparatus may be used to connect one or more strings of cells to the balance for no discharging of those strings and to connect another string of cells to an input/output bus (e.g., 32110) for discharging of that string to the load (e.g., 229).

In some embodiments, act 1515 may optionally include act 1517, wherein the multiplexing switch apparatus may be used to maintain an equivalent state of charge between the strings of cells by adjusting switching times and/or switching states.

In some embodiments, act 1515 may optionally include act 1518, wherein the multiplexing switch apparatus may be used to keep at least one of the strings of cells connected to the balance rail during use of the battery.

Acts 1516-1518 may be performed in any order.

In some embodiments, if the criterion has been met, representative process 1500B may then proceed to act 1530B, wherein the next string of cells in the battery may be selectively discharged using the multiplexing switch apparatus. For example, if the currently discharging string of cells has met some appropriate criterion or criteria, that string of cells may be disconnected from the load and the next string of cells may be connected (where the next set may be determined by a criterion or criteria which may be the same or different from those discussed herein) as described herein. Alternatively, if the criterion has not been met, it may continue to be monitored. According to some embodiments, the connection between a single cell and the load may be at least 0.01 seconds in duration. The inventors have recognized and appreciated that a shorter connection duration than 0.01 seconds may surprisingly produce more noise than at 0.01 seconds and may not allow the electrochemistry of the cell to accomplish anything non-negligible.

In some embodiments, representative process 1500B may then optionally proceed to any of acts 1532 and/or 1534. For example, if process 1500B proceeds from act 1530B to act 1532, the multiplexing switch apparatus may be used to selectively discharge the sets of cells at a first rate at least 2 times higher than a second rate of charging the sets of cells.

Alternatively or additionally, process 1500B may proceed from act 1530B to act 1534, wherein the multiplexing switch apparatus may be used to selectively discharge the sets of cells at a first rate at least 4 times higher than a second rate of charging the sets of cells.

It should be appreciated that any of acts 1532 and/or 1534 may actually be integral to act 1530B, although they are represented as separate acts in FIG. 15B.

In some embodiments, process 1500B may then end or repeat as necessary. For example, process 1500B may repeat through any suitable number of cycles. According to some embodiments, for each cycle or some cycles, each string or individual cell may be discharged once before any string or cell is discharged twice.

Figure 15C:
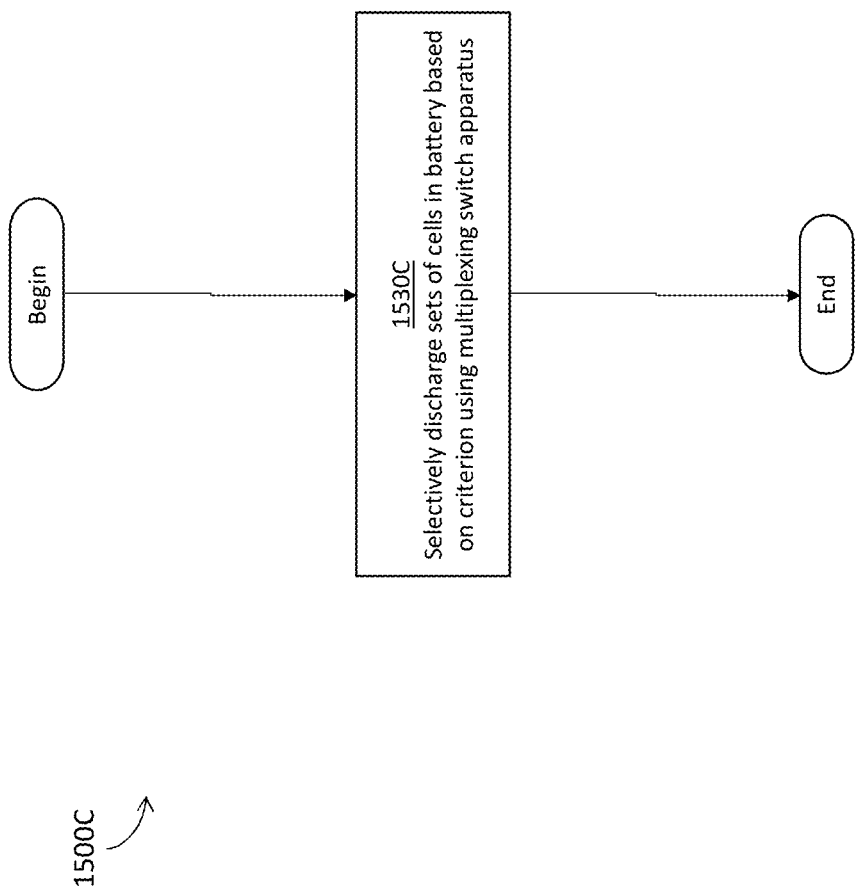
FIG. 15C is a flow chart depicting a representative process for discharging sets of cells of a battery, according to some embodiments.

FIG. 15C depicts a representative high-level process 1500C for discharging sets of cells of a battery. The acts comprising representative process 1500C are described in detail in the paragraphs that follow.

In some embodiments, representative process 1500C may include act 1530, wherein sets of cells in a battery may be selectively discharged based on at least one criterion using a multiplexing switch apparatus (such as multiplexing switch apparatus 112 described above). Additionally, the multiplexing switch apparatus may be connected to two or more sets (e.g., 121, 122, 123, and/or 124) of cells or modules (e.g., 121A-C) of at least one battery (e.g., 120-150). Each set of cells may comprise one or more cells.

In some embodiments, process 1500C may then end or repeat as necessary.

Figure 15D:
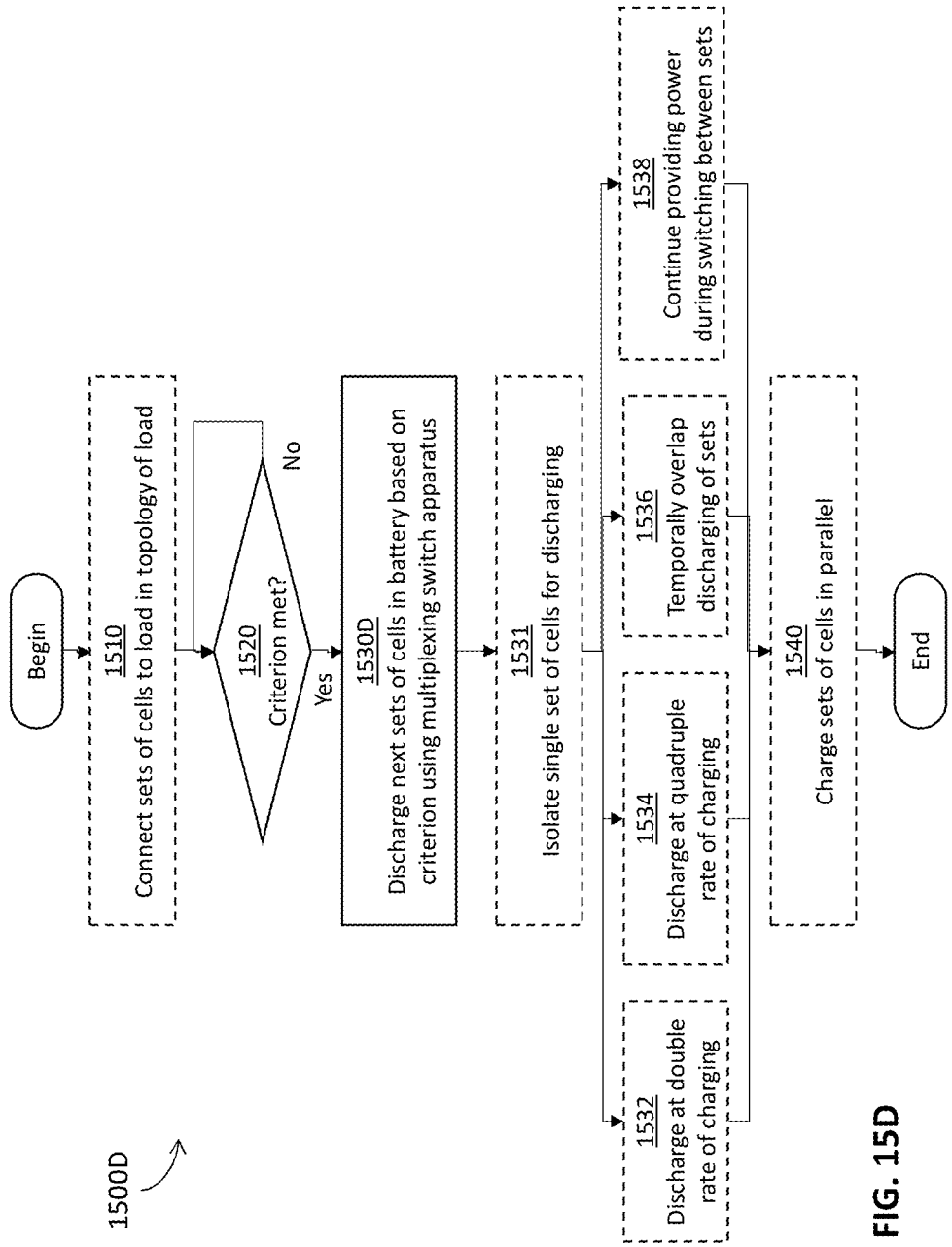
FIG. 15D is a flow chart depicting an additional representative process for discharging sets of cells of a battery, according to some embodiments.

FIG. 15D depicts a representative high-level process 1500D for discharging sets of cells of a battery. The acts comprising representative process 1500D are described in detail in the paragraphs that follow.

In some embodiments, representative process 1500D optionally may begin at act 1510, wherein the multiplexing switch apparatus may be used to connect the sets of cells to a load in a topology employed by the load. The batteries (e.g., 120-150) may include sets (e.g., 121, 122, 123, and/or 124) of the cells or modules (e.g., 121A-C), and each set of cells may comprise one or more cells. For example, the multiplexing switch apparatus may connect the cells to the load in series, parallel, serial/parallel, or any other suitable topology required to meet the voltage and current requirements of the load or the desires of the given application or user.

In some embodiments, representative process 1500D may then optionally proceed to act 1520, wherein at least one criterion, and/or some parameter of a criterion, may be measured or otherwise monitored in relation to the cells of the battery or batteries, which may already be discharging or have discharged at least one cell or set of cells, to determine whether the criterion has been met.

For example, a sensor (such as 116 in FIG. 1A) may measure the delivered discharge capacity at a connection between a load and a set of cells currently connected to the load, or it may measure the current of the set of cells. Alternatively or additionally, the sensor may measure any of the following: a duration of the connection (which may be at least 0.01 seconds in some embodiments), a capacity accumulated over several connections between the load and the set of cells, a voltage of the set of cells and/or of at least one other set of cells, a cutoff discharge voltage of the set of cells, a power of the set of cells, an energy of the set of cells, a number of charge or discharge cycles of the set of cells, an impedance of the set of cells, a rate of voltage fading of the set of cells during the connection, a temperature of the set of cells, and a pressure of the set of cells.

In some embodiments, the criterion may include a sequence in which to discharge the cells or sets of cells. Alternatively or additionally, the criterion may be the value of a function that has any of the above as parameters. According to some embodiments, the criterion does not include a number of prior discharge cycles of the sets of cells.

In some embodiments, if the criterion has been met, representative process 1500D may then proceed to act 1530, wherein the next set of cells in the battery may be selectively discharged based on the criterion using a multiplexing switch apparatus (such as multiplexing switch apparatus 112 described above). For example, if the currently discharging set of cells has met whatever criterion or criteria is required, that set of cells may be disconnected and the next set of cells may be connected (where the next set may be determined by a criterion or criteria which may be the same or different from those discussed above) as described herein. Alternatively, if the criterion has not been met, it may continue to be monitored. According to some embodiments, the connection between a single cell and the load may be at least 0.01 seconds in duration. The inventors have recognized and appreciated that a shorter connection duration than 0.01 seconds may surprisingly produce more noise than at 0.01 seconds and may not allow the electrochemistry of the cell to accomplish anything non-negligible.

In some embodiments, representative process 1500D may then optionally proceed to act 1531, wherein the multiplexing switch apparatus may be used to isolate a single set of cells for discharging while other sets of cells are not discharging. For example, when a controller (e.g., 114 of FIG. 1A) determines that cell 121B should be discharged, it may cause the multiplexing switch apparatus to isolate cell 121B for discharging while cells 121A and 121C are not discharging.

In some embodiments, representative process 1500D may then optionally proceed to any of acts 1532, 1534, 1536, and/or 1538. For example, if process 1500D proceeds from act 1531 to act 1532, the multiplexing switch apparatus may be used to selectively discharge the sets of cells at a first rate at least 2 times higher than a second rate of charging the sets of cells.

Alternatively or additionally, process 1500D may proceed from act 1531 to act 1534, wherein the multiplexing switch apparatus may be used to selectively discharge the sets of cells at a first rate at least 4 times higher than a second rate of charging the sets of cells.

Alternatively or additionally, process 1500D may proceed from act 1531 to act 1536, wherein discharge of the sets of cells may be temporally overlapping, such as by using the multiplexing switch apparatus as discussed above.

Alternatively or additionally, process 1500D may proceed from act 1531 to act 1538, wherein power may continue to be provided from the sets of cells during switching between different sets.

It should be appreciated that any of acts 1531, 1532, 1534, 1536, and/or 1538 may actually be integral to act 1530, although they are represented as separate acts in FIG. 15B.

In some embodiments, representative process 1500D may then optionally proceed to act 1540, wherein the multiplexing switch apparatus may be used to charge the sets of cells in parallel, such as is described above.

According to some embodiments, any number of sets of cells, including all the sets of cells in the battery, battery pack, or system, may be discharged simultaneously. For example, with a battery having 4 cells, all 4 cells (or only 2 or 3) could be discharged at the same time, producing whatever discharge current is desirable for the load or application and possible for the cells. Additionally, in some embodiments, the number of cells or sets discharged or charged is selected based on the at least one criterion, such as discharge current for discharging. In certain embodiments, the sequence in which the number of cells or sets of cells is discharged or charged is selected based on the at least one criterion, such as discharge current for discharging. In some embodiments, both the number of cells or sets discharged or charged and the sequence of doing so is selected based on the at least one criterion, such as discharge current for discharging.

In some embodiments, process 1500D may then end or repeat as necessary. For example, process 1500D may repeat through any suitable number of cycles. According to some embodiments, for each cycle or some cycles, each cell may be discharged once before any cell is discharged twice.

Figure 16:
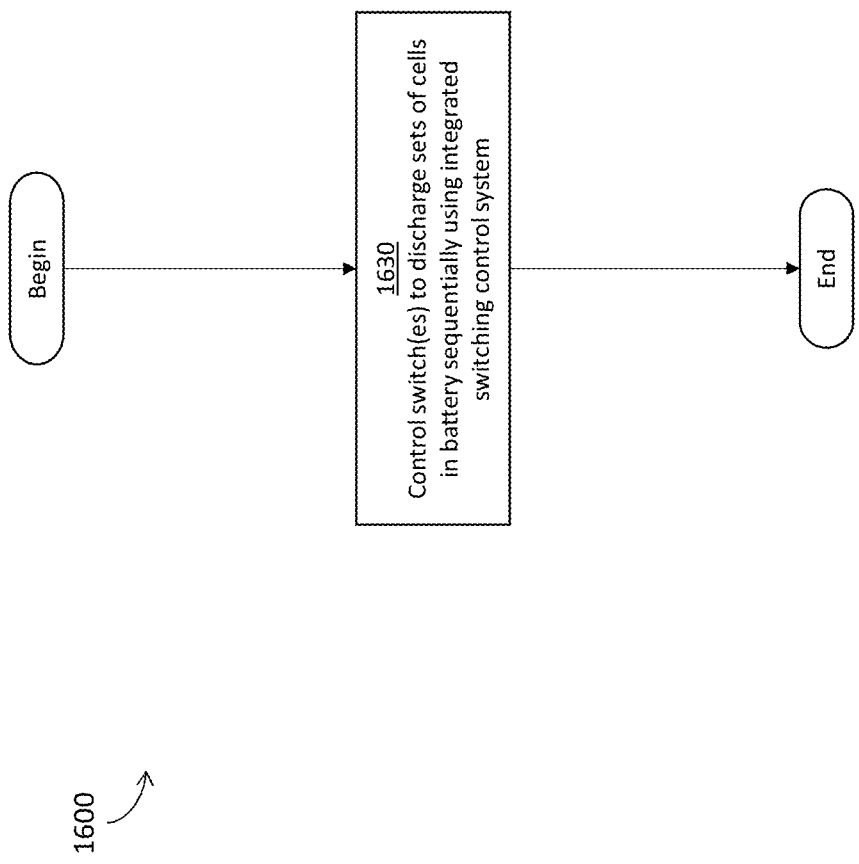
FIG. 16 is a flow chart depicting a representative process for controlling a battery pack, according to some embodiments.

FIG. 16 depicts a representative high-level process 1600 for controlling a battery pack. The acts comprising representative process 1600 are described in detail in the paragraphs that follow.

In some embodiments, representative process 1600 may include act 1630, wherein switches may be controlled (e.g., by a controller such as 114 described above) to discharge sets (e.g., 121, 122, 123, and/or 124) of cells or modules (e.g., 121A-C) in the battery pack (e.g., 210) sequentially using an integrated switching control system. Additionally, the multiplexing switch apparatus may be connected to two or more sets of cells of the battery or batteries. Each set of cells may comprise one or more cells.

In some embodiments, process 1600 may then end or repeat as necessary.

Figure 17A:
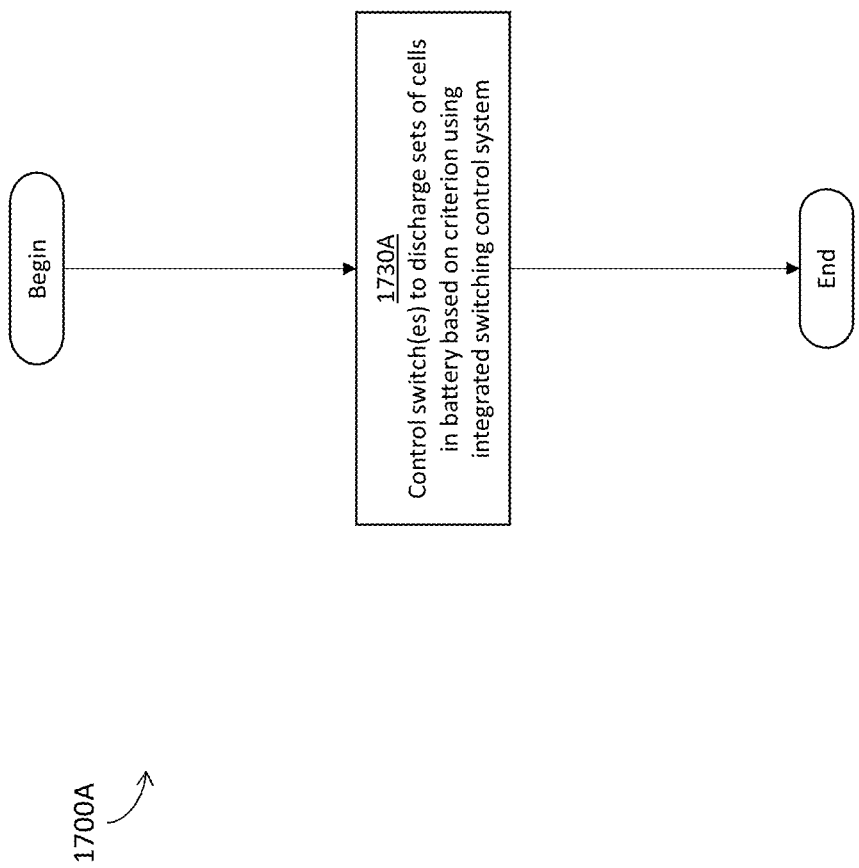
FIG. 17A is a flow chart depicting an additional representative process for controlling a battery pack, according to some embodiments.
Figure 17B:
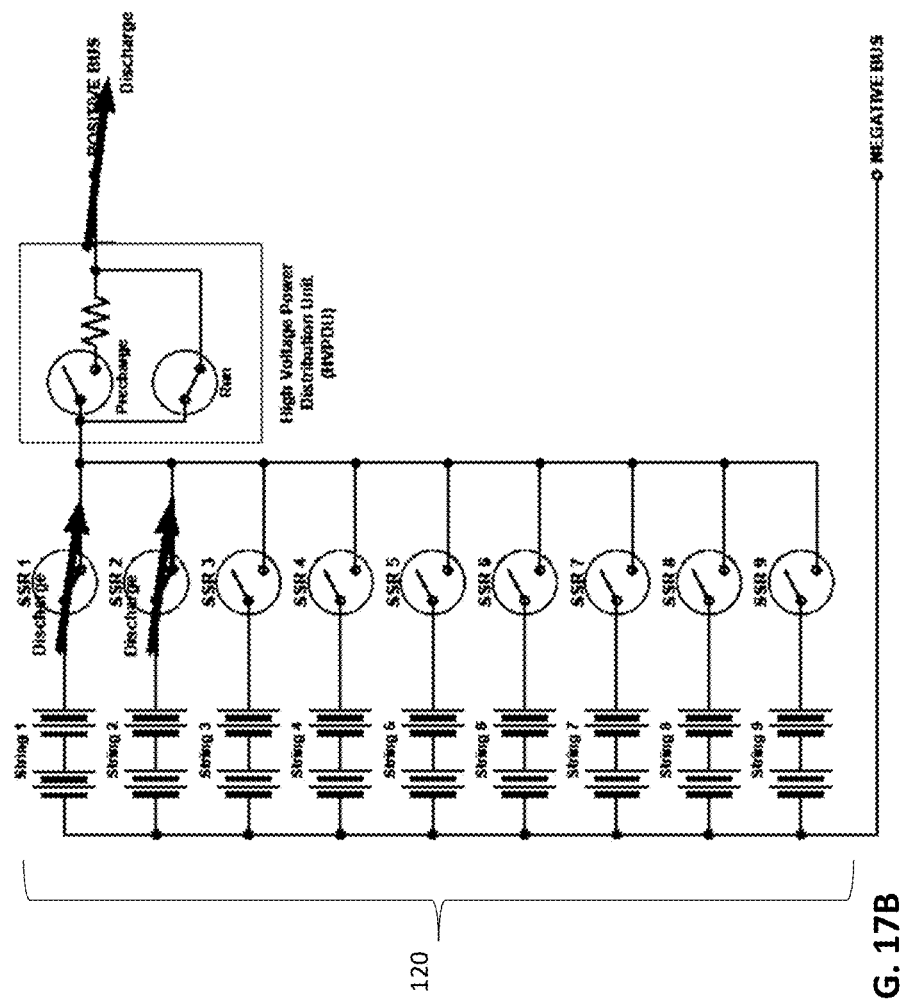
FIG. 17B is a schematic depicting a representative battery management system, according to some embodiments.

FIG. 17A depicts a representative high-level process 1700A for controlling a battery pack. The acts comprising representative process 1700A are described in detail in the paragraphs that follow.

In some embodiments, representative process 1700A may include act 1730A, wherein switches may be controlled (e.g., by a controller such as 114 described above) to discharge sets (e.g., 121, 122, 123, and/or 124) of cells or modules (e.g., 121A-C) in the battery pack (e.g., 210) based on a criterion using an integrated switching control system. Additionally, the multiplexing switch apparatus may be connected to two or more sets of cells of the battery or batteries. Each set of cells may comprise one or more cells. In some embodiments, the criterion may include any of the following: a duration of a connection between a load and a set of cells currently connected to the load, a delivered discharge capacity at the connection, and a value of a function having one or more parameters.

In some embodiments, process 1700A may then end or repeat as necessary.

Figure 17C:
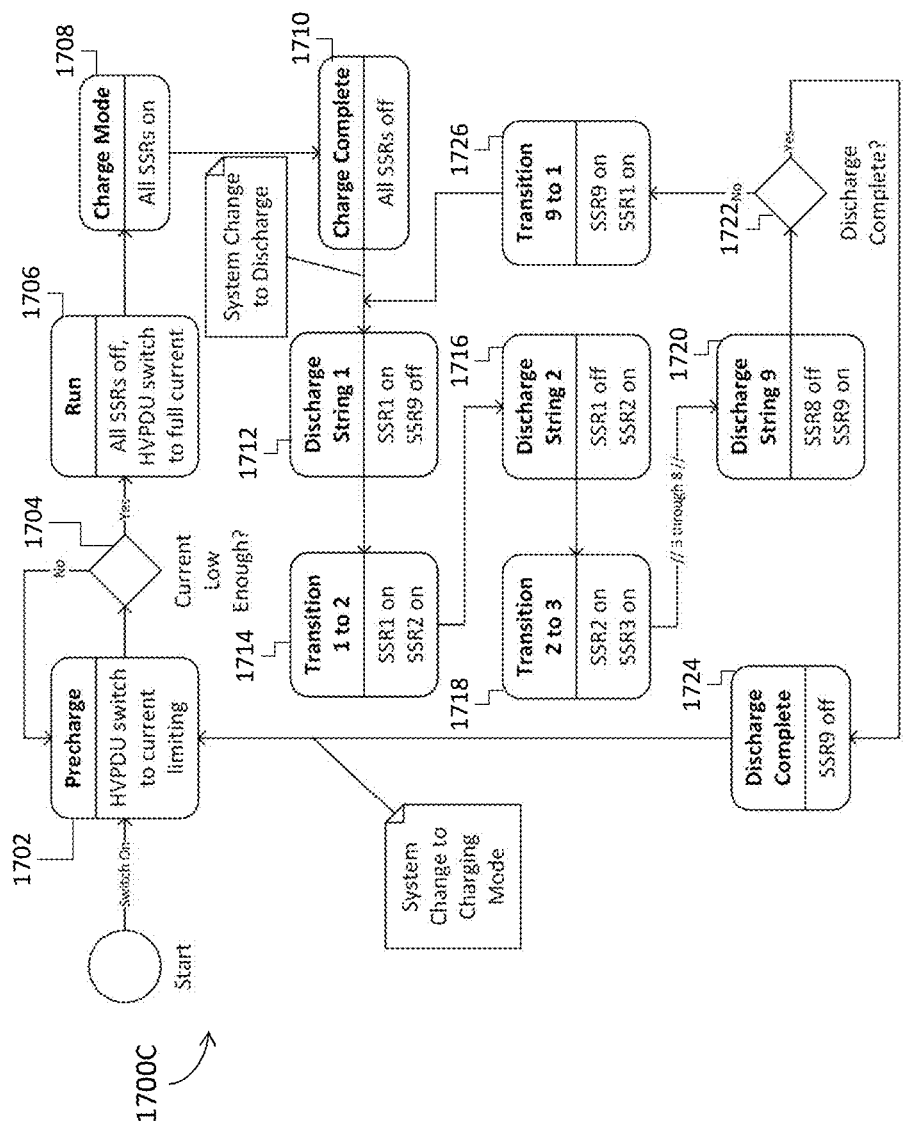
FIG. 17C is a flow chart depicting an additional representative process for discharging strings of cells of a battery, according to some embodiments.

FIG. 17C depicts a representative high-level process 1700C for discharging strings of cells of a battery. The acts comprising representative process 1700C are described in detail in the paragraphs that follow.

In some embodiments, representative process 1700C may include act 1702, wherein after the battery is activated, a high voltage power distribution unit (HVPDU) may switch to current limiting mode (e.g., during pre-charging mode). The HVPDU may distribute battery power throughout a load, such as a vehicle. In some embodiments, process 1700C may then proceed to act 1704, wherein the current is compared to a threshold (e.g., to determine if the current is at least as low as the threshold). If the current satisfies the threshold (e.g., the current is low enough), process 1700C may proceed to act 1706, wherein all solid state relays (SSR) may be off (e.g., in running mode), and the HVPDU may switch to full current. If the current does not satisfy the threshold (e.g., the current is too high), process 1700C may return to act 1702.

In some embodiments, process 1700C may proceed from act 1706 to act 1708, wherein all solid state relays may be on (e.g., in charging mode). In some embodiments, process 1700C may proceed to act 1710, wherein all solid state relays may be off (e.g., in charging complete mode). In some embodiments, process 1700C may proceed to act 1712, wherein string 1 is discharged, with SSR1 on and SSR9 off, after the system changes to discharging mode. For example, string 1 may be discharged from 4.35 volts to 4 volts per cell. In some embodiments, string 1's voltage may go from 72 cells at 4.35 volts (313.2 volts combined) down to 72 cells at 4 volts (288 volts combined), while string 2 may still be at 313.2 volts combined. In some embodiments, when string 2 is connected to the common bus while string 1 is still connected, string 2 may discharge into string 1 at a current proportional to the voltage difference between the strings.

In some embodiments, process 1700C may proceed to act 1714, wherein the system may transition from string 1 to string 2, with both SSR1 and SSR2 on. In some embodiments, process 1700C may proceed to act 1716, wherein string 2 may be discharged, with SSR1 off and SSR2 on. In some embodiments, process 1700C may proceed to act 1718, wherein the system may transition from string 2 to string 3, with SSR2 and SSR3 both on. In some embodiments, process 1700C may proceed to act 1720, before which this pattern may be followed for discharging strings 3 through 8, wherein string 9 may be discharged, with SSR8 off and SSR9 on. In some embodiments, process 1700C may proceed to act 1722, wherein the system may check whether discharge is complete. If the discharge is complete, process 1700C may proceed from act 1722 to act 1724, with SSR9 off and then to act 1702, with the system changing to charging mode. If the discharge is not complete, process 1700C may proceed to act 1726, wherein the system may transition from string 9 to string 1, with SSR9 and SSR1 both on, and then return to act 1712.

In some embodiments, process 1700C may then end or repeat as necessary.

For example, nine parallel strings in a battery pack may be charged in parallel. At the end of charging, the parallel strings may be disconnected from a common high voltage bus. During discharging, one parallel string (e.g., string 1) may be connected to the bus and pulse discharged for about 30 seconds. Following the pulse discharging, the second parallel string (e.g., string 2) may be connected to the common high voltage bus, the first string may be disconnected, and the second string may complete its pulse discharge. This process may be repeated over and over through the discharging phase.

It should be appreciated that, in some embodiments, the methods described above with reference to FIGS. 2A, 2B, 2C, 3A, 3C, 4A, 5A, 6A, 7A, 8A, 9A, 10A, 11A, 15A-15D, 17A, and 17C may vary, in any of numerous ways. For example, in some embodiments, the steps of the methods described above may be performed in a different sequence than that which is described, a method may involve additional steps not described above, and/or a method may not involve all of the steps described above. The inventors have appreciated that the methods and techniques provided herein may be used to improve lithium morphology and surface impedance, cell thickness, cell resistance, and/or the like.

Figure 14:
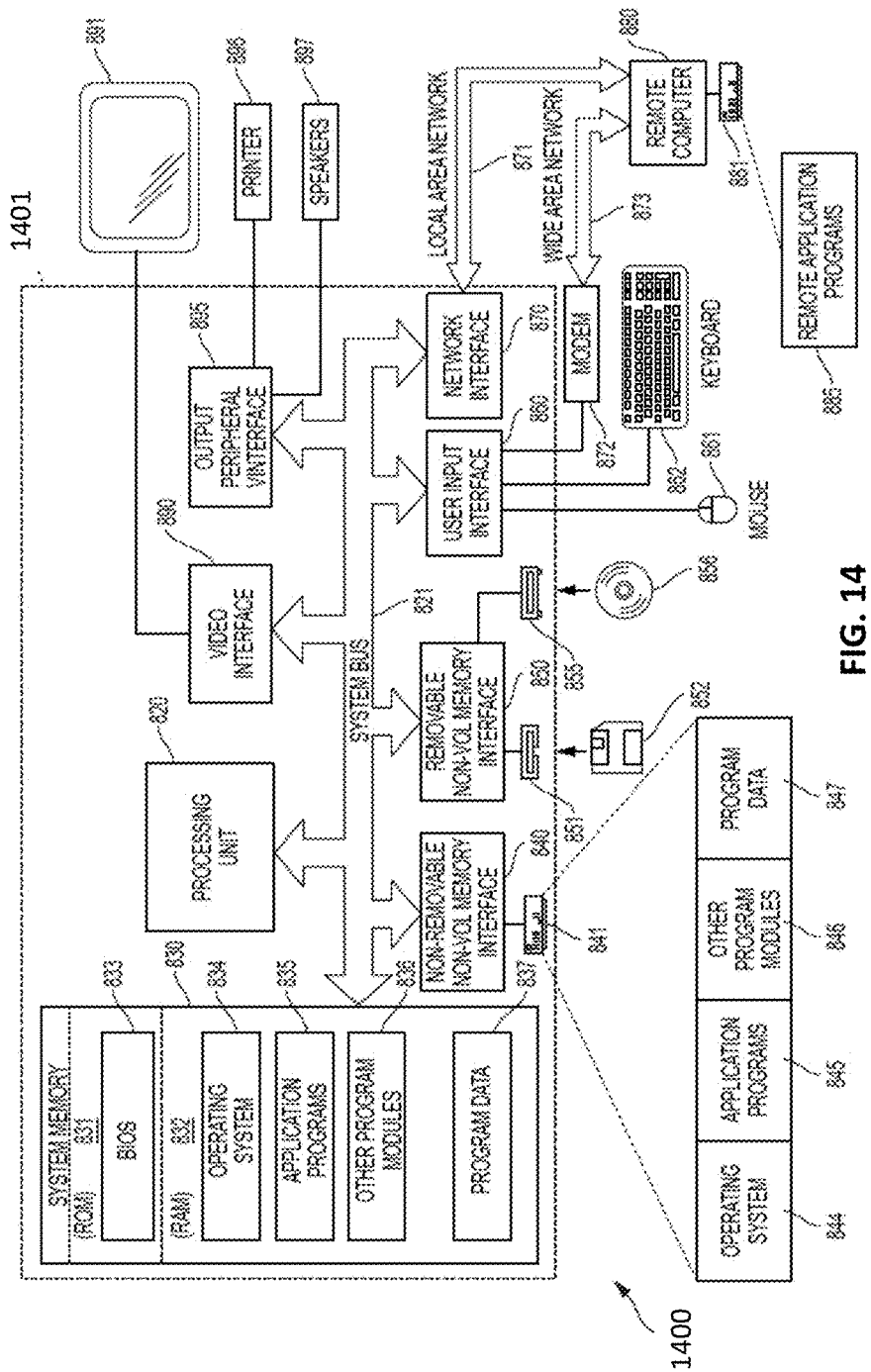
FIG. 14 is a block diagram depicting a representative computing system that may be used to implement certain aspects.

It should further be appreciated from the foregoing description that some aspects may be implemented using a computing device. FIG. 14 depicts a general purpose computing device in system 1400, in the form of a computer 1401, which may be used to implement certain aspects, such as any of the controllers described above (e.g., 114).

In computer 1401, components include, but are not limited to, a processing unit 820, a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 1401 typically includes a variety of computer readable media. Computer readable media can be any available media that can be accessed by computer 1401 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other media that may be used to store the desired information and may be accessed by computer 1401. Communication media typically embody computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared and other wireless media. Combinations of the any of the above should also be included within the scope of computer readable media.

The system memory 830 includes computer storage media in the form of volatile and/or nonvolatile memory such as read only memory (ROM) 831 and random access memory (RAM) 832. A basic input/output system 833 (BIOS), containing the basic routines that help to transfer information between elements within computer 1401, such as during start-up, is typically stored in ROM 831. RAM 832 typically contains data and/or program modules that are immediately accessible to and/or presently being operated on by processing unit 820. By way of example, and not limitation, FIG. 14 illustrates operating system 834, application programs 835, other program modules 839 and program data 837.

The computer 1401 may also include other removable/non-removable, volatile/nonvolatile computer storage media. By way of example only, FIG. 14 illustrates a hard disk drive 841 that reads from or writes to non-removable, nonvolatile magnetic media, a magnetic disk drive 851 that reads from or writes to a removable, nonvolatile magnetic disk 852, and an optical disk drive 855 that reads from or writes to a removable, nonvolatile optical disk 859 such as a CD ROM or other optical media. Other removable/non-removable, volatile/nonvolatile computer storage media that can be used in the exemplary computing system include, but are not limited to, magnetic tape cassettes, flash memory cards, digital versatile disks, digital video tape, solid state RAM, solid state ROM, and the like. The hard disk drive 841 is typically connected to the system bus 821 through an non-removable memory interface such as interface 840, and magnetic disk drive 851 and optical disk drive 855 are typically connected to the system bus 821 by a removable memory interface, such as interface 850.

The drives and their associated computer storage media discussed above and illustrated in FIG. 14, provide storage of computer readable instructions, data structures, program modules and other data for the computer 1401. In FIG. 14, for example, hard disk drive 841 is illustrated as storing operating system 844, application programs 845, other program modules 849, and program data 847. Note that these components can either be the same as or different from operating system 834, application programs 835, other program modules 539, and program data 837. Operating system 844, application programs 845, other program modules 849, and program data 847 are given different numbers here to illustrate that, at a minimum, they are different copies. A user may enter commands and information into the computer 1401 through input devices such as a keyboard 892 and pointing device 891, commonly referred to as a mouse, trackball or touch pad. Other input devices (not shown) may include a microphone, joystick, game pad, satellite dish, scanner, or the like. These and other input devices are often connected to the processing unit 820 through a user input interface 590 that is coupled to the system bus, but may be connected by other interface and bus structures, such as a parallel port, game port or a universal serial bus (USB). A monitor 891 or other type of display device is also connected to the system bus 821 via an interface, such as a video interface 890. In addition to the monitor, computers may also include other peripheral output devices such as speakers 897 and printer 899, which may be connected through a output peripheral interface 895.

The computer 1401 may operate in a networked environment using logical connections to one or more remote computers, such as a remote computer 880. The remote computer 880 may be a personal computer, a server, a router, a network PC, a peer device or other common network node, and typically includes many or all of the elements described above relative to the computer 1401, although only a memory storage device 881 has been illustrated in FIG. 14. The logical connections depicted in FIG. 14 include a local area network (LAN) 871 and a wide area network (WAN) 873, but may also include other networks. Such networking environments are commonplace in offices, enterprise-wide computer networks, intranets and the Internet.

When used in a LAN networking environment, the computer 1401 is connected to the LAN 871 through a network interface or adapter 870. When used in a WAN networking environment, the computer 1401 typically includes a modem 872 or other means for establishing communications over the WAN 873, such as the Internet. The modem 872, which may be internal or external, may be connected to the system bus 821 via the user input interface 890, or other appropriate mechanism. In a networked environment, program modules depicted relative to the computer 1401, or portions thereof, may be stored in the remote memory storage device. By way of example, and not limitation, FIG. 14 illustrates remote application programs 885 as residing on memory device 881. It will be appreciated that the network connections shown are exemplary and other means of establishing a communications link between the computers may be used.

Embodiments may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments discussed above. As is apparent from the foregoing examples, a computer readable storage medium may retain information for a sufficient time to provide computer executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a tangible machine, mechanism or device from which a computer may read information. Alternatively or additionally, some embodiments may be embodied as a computer readable medium other than a computer-readable storage medium. Examples of computer readable media that are not computer readable storage media include transitory media, like propagating signals.

U.S. patent application Ser. No. 16/527,903, filed Jul. 31, 2019, published as U.S. Pub. No. US2020-0044460, and entitled "Multiplexed Charge Discharge Battery Management System" is incorporated herein by reference in its entirety for all purposes.

The following documents are incorporated herein by reference in their entireties for all purposes: U.S. Pat. No. 7,247,408, filed May 23, 2001, entitled "Lithium Anodes for Electrochemical Cells"; U.S. Pat. No. 5,648,187, filed Mar. 19, 1996, entitled "Stabilized Anode for Lithium-Polymer Batteries"; U.S. Pat. No. 5,961,672, filed Jul. 7, 1997, entitled "Stabilized Anode for Lithium-Polymer Batteries"; U.S. Pat. No. 5,919,587, filed May 21, 1997, entitled "Novel Composite Cathodes, Electrochemical Cells Comprising Novel Composite Cathodes, and Processes for Fabricating Same"; U.S. patent application Ser. No. 11/400,781, filed Apr. 6, 2006, published as U. S. Pub. No. 2007-0221265, and entitled "Rechargeable Lithium/Water, Lithium/Air Batteries"; International Patent Apl. Serial No. PCT/US2008/009158, filed Jul. 29, 2008, published as International Pub. No. WO/2009017726, and entitled "Swelling Inhibition in Lithium Batteries"; U.S. patent application Ser. No. 12/312,764, filed May 26, 2009, published as U.S. Pub. No. 2010-0129699, and entitled "Separation of Electrolytes"; International Patent Apl. Serial No. PCT/US2008/012042, filed Oct. 23, 2008, published as International Pub. No. WO/2009054987, and entitled "Primer for Battery Electrode"; U.S. patent application Ser. No. 12/069,335, filed Feb. 8, 2008, published as U.S. Pub. No. 2009-0200986, and entitled "Protective Circuit for Energy-Storage Device"; U.S. patent application Ser. No. 11/400,025, filed Apr. 6, 2006, published as U.S. Pub. No. 2007-0224502, and entitled "Electrode Protection in both Aqueous and Non-Aqueous Electrochemical Cells, including Rechargeable Lithium Batteries"; U.S. patent application Ser. No. 11/821,576, filed Jun. 22, 2007, published as U.S. Pub. No. 2008/0318128, and entitled "Lithium Alloy/Sulfur Batteries"; patent application Ser. No. 11/111,262, filed Apr. 20, 2005, published as U.S. Pub. No. 2006-0238203, and entitled "Lithium Sulfur Rechargeable Battery Fuel Gauge Systems and Methods"; U.S. patent application Ser. No. 11/728,197, filed Mar. 23, 2007, published as U.S. Pub. No. 2008-0187663, and entitled "Co-Flash Evaporation of Polymerizable Monomers and Non-Polymerizable Carrier Solvent/Salt Mixtures/Solutions"; International Patent Apl. Serial No. PCT/US2008/010894, filed Sep. 19, 2008, published as International Pub. No. WO/2009042071, and entitled "Electrolyte Additives for Lithium Batteries and Related Methods"; International Patent Apl. Serial No. PCT/US2009/000090, filed Jan. 8, 2009, published as International Pub. No. WO/2009/089018, and entitled "Porous Electrodes and Associated Methods"; U.S. patent application Ser. No. 12/535,328, filed Aug. 4, 2009, published as U.S. Pub. No. 2010/0035128, and entitled "Application of Force In Electrochemical Cells"; U.S. patent application Ser. No. 12/727,862, filed Mar. 19, 2010, entitled "Cathode for Lithium Battery"; U.S. patent application Ser. No. 12/471,095, filed May 22, 2009, entitled "Hermetic Sample Holder and Method for Performing Microanalysis Under Controlled Atmosphere Environment"; U.S. patent application Ser. No. 12/862,513, filed on Aug. 24, 2010, entitled "Release System for Electrochemical cells (which claims priority to Provisional Patent Apl. Ser. No. 61/236,322, filed Aug. 24, 2009, entitled "Release System for Electrochemical Cells"); U.S. Provisional Patent Apl. Ser. No. 61/376,554, filed on Aug. 24, 2010, entitled "Electrically Non-Conductive Materials for Electrochemical Cells;" U.S. Provisional patent application Ser. No. 12/862,528, filed on Aug. 24, 2010, entitled "Electrochemical Cell;" U.S. patent application Ser. No. 12/862,563, filed on Aug. 24, 2010, published as U.S. Pub. No. 2011/0070494, entitled "Electrochemical Cells Comprising Porous Structures Comprising Sulfur"; U.S. patent application Ser. No. 12/862,551, filed on Aug. 24, 2010, published as U.S. Pub. No. 2011/0070491, entitled "Electrochemical Cells Comprising Porous Structures Comprising Sulfur"; U.S. patent application Ser. No. 12/862,576, filed on Aug. 24, 2010, published as U.S. Pub. No. 2011/0059361, entitled "Electrochemical Cells Comprising Porous Structures Comprising Sulfur"; U.S. patent application Ser. No. 12/862,581, filed on Aug. 24, 2010, published as U.S. Pub. No. 2011/0076560, entitled "Electrochemical Cells Comprising Porous Structures Comprising Sulfur"; U.S. Patent Apl. Ser. No. 61/385,343, filed on Sep. 22, 2010, entitled "Low Electrolyte Electrochemical Cells"; U.S. patent application Ser. No. 13/033,419, filed Feb. 23, 2011, entitled "Porous Structures for Energy Storage Devices"; U.S. patent application Ser. No. 16/670,933, filed Oct. 31, 2019, entitled "System And Method For Operating A Rechargeable Electrochemical Cell Or Battery"; U.S. patent application Ser. No. 16/670,905, filed Oct. 31, 2019, entitled "System And Method For Operating A Rechargeable Electrochemical Cell Or Battery"; and International Patent Apl. Serial No. PCT/US2019/059142, filed Oct. 31, 2019, entitled "System And Method For Operating A Rechargeable Electrochemical Cell Or Battery". All other patents and patent applications disclosed herein are also incorporated by reference in their entirety for all purposes.

U.S. Provisional Patent Application No. 63/146,512, filed Feb. 5, 2021, and entitled "Charge/Discharge Management in Electrochemical Cells, Including Partial Cycle Control," U.S. Provisional Patent Application No. 63/184,639, filed May 5, 2021, and entitled "Charge/Discharge Management in Electrochemical Cells, Including Partial Cycle Control," and U.S. Provisional Patent Application No. 63/240,859, filed Sep. 3, 2021, and entitled "Charge/Discharge Management in Electrochemical Cells, Including Partial Cycle Control," are each incorporated herein by reference in their entireties for all purposes.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention may include each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Some embodiments may be embodied as a method, of which various examples have been described. The acts performed as part of the methods may be ordered in any suitable way. Accordingly, embodiments may be constructed in which acts are performed in an order different than illustrated, which may include different (e.g., more or less) acts than those that are described, and/or that may involve performing some acts simultaneously, even though the acts are shown as being performed sequentially in the embodiments specifically described above.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An electrochemical cell management system comprising:
    an electrochemical cell; and
    at least one controller configured to:
        control the cell such that the cell is charged over a first state of charge range having breadth of at least 20%,
        wherein an average charging rate over a first portion of the first state of charge range is lower than an average charging rate over a second portion of the first state of charge range,
        wherein the first portion spans at least 2% of the first state of charge range and the second portion spans at least 2% of the first state of charge range,
        wherein the first portion occurs before the second portion, and
        wherein the at least one controller is configured to:
            control the cell such that the cell is discharged over a second state of charge range having breadth of at least 2% and at most 90%, and then discharged over a third state of charge range having breadth of at least 2%,
            wherein an average discharging rate over the second state of charge range is at least 2 times an average discharging rate over the third state of charge range.

2. An electrochemical cell management system comprising:
    an electrochemical cell; and
    at least one controller configured to:
        control the cell such that the cell is charged over a first state of charge range having breadth of at least 2% and at most 90%, and then charged over a second state of charge range,
        wherein an average charging rate over the first state of charge range is at most 0.5 times an average charging rate over the second state of charge range,
        wherein the at least one controller is configured to:
            control the cell such that the cell is discharged over a third state of charge range having breadth of at least 2% and at most 90%, and then discharged over a fourth state of charge range having breadth of at least 2%,
            wherein an average discharging rate over the third state of charge range is at least 2 times an average discharging rate over the fourth state of charge range.

3. An electrochemical cell management system comprising:
- an electrochemical cell; and
- at least one controller configured to:
  - control the cell such that the cell is charged over a first state of charge range having breadth of at least 20%,
  - wherein an average charging rate over a first portion of the first state of charge range is lower than an average charging rate over a second portion of the first state of charge range,
  - wherein the first portion spans at least 2% of the first state of charge range and the second portion spans at least 2% of the first state of charge range,
  - wherein the first portion occurs before the second portion, and
  - wherein the at least one controller is configured to:
    - control the cell such that the cell is discharged over a second state of charge range having breadth of at least 2% and at most 90%, then discharged over a third state of charge range having breadth of at least 2%, and then discharged over a fourth state of charge range having breadth of at least 2%,
    - wherein an average discharging rate over the second state of charge range is higher than an average discharging rate over the third state of charge range, and
    - wherein the average discharging rate over the third state of charge range is higher than an average discharging rate over the fourth state of charge range.

4. The electrochemical cell management system of claim 1, wherein the cell is discharged over the third state of charge range after the cell is charged over the second state of charge range.

5. The electrochemical cell management system of claim 2, wherein the at least one controller is configured to:
- control the cell such that the cell is discharged over a third state of charge range having breadth of at least 2% and at most 90%, then discharged over a fourth state of charge range having breadth of at least 2%, and then discharged over a fifth state of charge range having breadth of at least 2%,
- wherein an average discharging rate over the third state of charge range is higher than an average discharging rate over the fourth state of charge range, and
- wherein the average discharging rate over the fourth state of charge range is higher than an average discharging rate over the fifth state of charge range.

6. The electrochemical cell management system of claim 2, wherein the cell is discharged over the third state of charge range after the cell is charged over the second state of charge range.

7. An electrochemical cell management system comprising:
- an electrochemical cell; and
- at least one controller configured to:
  - control the cell such that the cell is charged over a first state of charge range having breadth of at least 2% and at most 90%, and then charged over a second state of charge range,
  - wherein an average charging rate over the first state of charge range is at most 0.5 times an average charging rate over the second state of charge range, and
  - wherein the at least one controller is configured to:
    - control the cell such that the cell is discharged over a fourth state of charge range having breadth of at least 2% and at most 90%, and then discharged over a fifth state of charge range having breadth of at least 2%,
    - wherein an average discharging rate over the fourth state of charge range is at least 2 times an average discharging rate over the fifth state of charge range.

8. An electrochemical cell management method comprising:
- controlling an electrochemical cell such that the cell is charged over a first state of charge range having breadth of at least 20%,
- wherein an average charging rate over a first portion of the first state of charge range is lower than an average charging rate over a second portion of the first state of charge range,
- wherein the first portion spans at least 2% of the first state of charge range and the second portion spans at least 2% of the first state of charge range,
- wherein the first portion occurs before the second portion,
- wherein the method comprises controlling the cell such that the cell is discharged over a second state of charge range having breadth of at least 2% and at most 90%, and then discharged over a third state of charge range having breadth of at least 2%, and
- wherein an average discharging rate over the second state of charge range is at least 2 times an average discharging rate over the third state of charge range.

9. An electrochemical cell management method comprising:
- controlling an electrochemical cell such that the cell is charged over a first state of charge range having breadth of at least 2% and at most 90%, and then charged over a second state of charge range,
- wherein an average charging rate over the first state of charge range is at most 0.5 times an average charging rate over the second state of charge range,
- wherein the method comprises controlling the cell such that the cell is discharged over a third state of charge range having breadth of at least 2% and at most 90%, and then discharged over a fourth state of charge range having breadth of at least 2%, and
- wherein an average discharging rate over the third state of charge range is at least 2 times an average discharging rate over the fourth state of charge range.

10. An electrochemical cell management method, comprising:
- controlling an electrochemical cell such that the cell is charged over a first state of charge range having breadth of at least 20%,
- wherein an average charging rate over a first portion of the first state of charge range is lower than an average charging rate over a second portion of the first state of charge range,
- wherein the first portion spans at least 2% of the first state of charge range and the second portion spans at least 2% of the first state of charge range,
- wherein the first portion occurs before the second portion,
- wherein the method comprises controlling the cell such that the cell is discharged over a second state of charge range having breadth of at least 2% and at most 90%, then discharged over a third state of charge range having breadth of at least 2%, and then discharged over a fourth state of charge range having breadth of at least 2%,
- wherein an average discharging rate over the second state of charge range is higher than an average discharging rate over the third state of charge range, and wherein the average discharging rate over the third state of charge range is higher than an average discharging rate over the fourth state of charge range.

11. The electrochemical cell management method of claim 8, wherein the cell is discharged over the third state of charge range after the cell is charged over the second state of charge range.

12. The electrochemical cell management method of claim 9, comprising:
controlling the cell such that the cell is discharged over a third state of charge range having breadth of at least 2% and at most 90%, then discharged over a fourth state of charge range having breadth of at least 2%, and then discharged over a fifth state of charge range having breadth of at least 2%,
wherein an average discharging rate over the third state of charge range is higher than an average discharging rate over the fourth state of charge range, and
wherein the average discharging rate over the fourth state of charge range is higher than an average discharging rate over the fifth state of charge range.

13. The electrochemical cell management method of claim 9, wherein the cell is discharged over the third state of charge range after the cell is charged over the second state of charge range.

14. An electrochemical cell management method, comprising:
controlling an electrochemical cell such that the cell is charged over a first state of charge range having breadth of at least 2% and at most 90%, and then charged over a second state of charge range,
wherein an average charging rate over the first state of charge range is at most 0.5 times an average charging rate over the second state of charge range, and
controlling the cell such that the cell is discharged over a fourth state of charge range having breadth of at least 2% and at most 90%, and then discharged over a fifth state of charge range having breadth of at least 2%,
wherein an average discharging rate over the fourth state of charge range is at least 2 times an average discharging rate over the fifth state of charge range.

* * * * *